(12) United States Patent
Shimomura et al.

(10) Patent No.: US 9,559,174 B2
(45) Date of Patent: Jan. 31, 2017

(54) SEMICONDUCTOR FILM, TRANSISTOR, SEMICONDUCTOR DEVICE, DISPLAY DEVICE, AND ELECTRONIC APPLIANCE

(71) Applicant: Semiconductor Energy Laboratory Co., Ltd., Atsugi-shi, Kanagawa-ken (JP)

(72) Inventors: Akihisa Shimomura, Kanagawa (JP); Yasumasa Yamane, Kanagawa (JP); Yuhei Sato, Kanagawa (JP); Takahisa Ishiyama, Kanagawa (JP); Kenichi Okazaki, Tochigi (JP); Chiho Kawanabe, Tochigi (JP); Masashi Oota, Kanagawa (JP); Noritaka Ishihara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/068,708

(22) Filed: Mar. 14, 2016

(65) Prior Publication Data
US 2016/0197193 A1    Jul. 7, 2016

Related U.S. Application Data

(63) Continuation of application No. 14/626,049, filed on Feb. 19, 2015.

(30) Foreign Application Priority Data

Feb. 21, 2014  (JP) .................................. 2014-032192
May 9, 2014    (JP) .................................. 2014-098071
(Continued)

(51) Int. Cl.
*H01L 29/78*    (2006.01)
*H01L 27/12*    (2006.01)
(Continued)

(52) U.S. Cl.
CPC ............. *H01L 29/24* (2013.01); *C01G 15/006* (2013.01); *H01L 29/045* (2013.01);
(Continued)

(58) Field of Classification Search
CPC ...... H01L 29/24; H01L 29/7869; H01L 21/00; H01L 21/16; H01L 21/479; H01L 27/12; H01L 27/1225
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

(Continued)

*Primary Examiner* — Monica D Harrison
(74) *Attorney, Agent, or Firm* — Fish & Richardson P.C.

(57) ABSTRACT

Favorable electrical characteristics are given to a semiconductor device. Furthermore, a semiconductor device having high reliability is provided. One embodiment of the present invention is an oxide semiconductor film having a plurality of electron diffraction patterns which are observed in such a manner that a surface where the oxide semiconductor film is formed is irradiated with an electron beam having a probe diameter whose half-width is 1 nm. The plurality of electron (Continued)

diffraction patterns include 50 or more electron diffraction patterns which are observed in different areas, the sum of the percentage of first electron diffraction patterns and the percentage of second electron diffraction patterns accounts for 100%, the first electron diffraction patterns account for 90% or more, the first electron diffraction pattern includes observed points which indicates that a c-axis is oriented in a direction substantially perpendicular to the surface where the oxide semiconductor film is formed.

21 Claims, 89 Drawing Sheets

(30) Foreign Application Priority Data

| Jun. 13, 2014 | (JP) | 2014-122792 |
|---|---|---|
| Jun. 26, 2014 | (JP) | 2014-131834 |
| Oct. 27, 2014 | (JP) | 2014-218310 |

(51) Int. Cl.
H01L 29/24 (2006.01)
C01G 15/00 (2006.01)
H01L 29/04 (2006.01)
H01L 29/786 (2006.01)

(52) U.S. Cl.
CPC ...... H01L 29/7869 (2013.01); C01P 2002/72 (2013.01); C01P 2002/89 (2013.01); C01P 2004/04 (2013.01); C01P 2006/40 (2013.01)

(58) Field of Classification Search
USPC .......................................................... 257/43
See application file for complete search history.

(56) References Cited

U.S. PATENT DOCUMENTS

| 6,294,274 | B1 | 9/2001 | Kawazoe et al. |
|---|---|---|---|
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,994,500 | B2 | 8/2011 | Kim et al. |
| 8,058,645 | B2 | 11/2011 | Jeong et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0189153 | A1 | 7/2009 | Iwasaki et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0320458 | A1 | 12/2010 | Umeda et al. |
| 2010/0320459 | A1 | 12/2010 | Umeda et al. |
| 2011/0175081 | A1 | 7/2011 | Goyal et al. |
| 2011/0193083 | A1 | 8/2011 | Kim et al. |
| 2012/0119205 | A1 | 5/2012 | Taniguchi et al. |
| 2014/0070211 | A1 | 3/2014 | Iwasaki et al. |
| 2014/0175436 | A1 | 6/2014 | Yamazaki |
| 2015/0179803 | A1 | 6/2015 | Yamazaki et al. |

FOREIGN PATENT DOCUMENTS

| JP | 60-198861 A | 10/1985 |
|---|---|---|
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B(Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327. (Full English Translation).

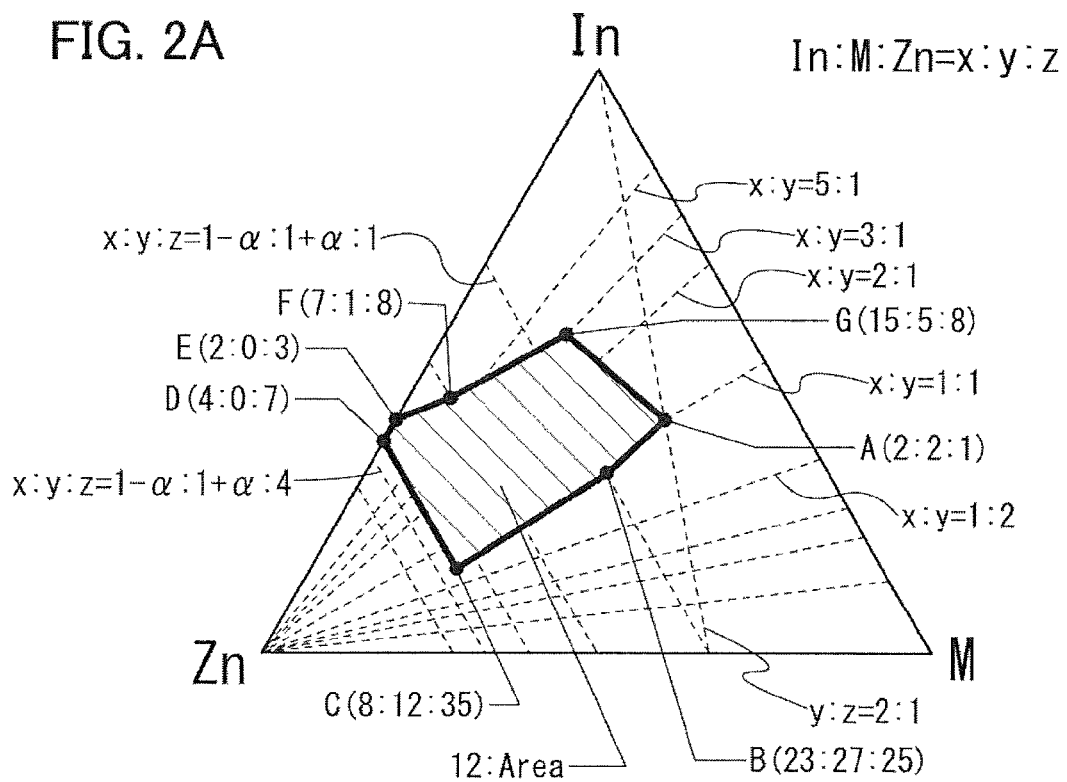
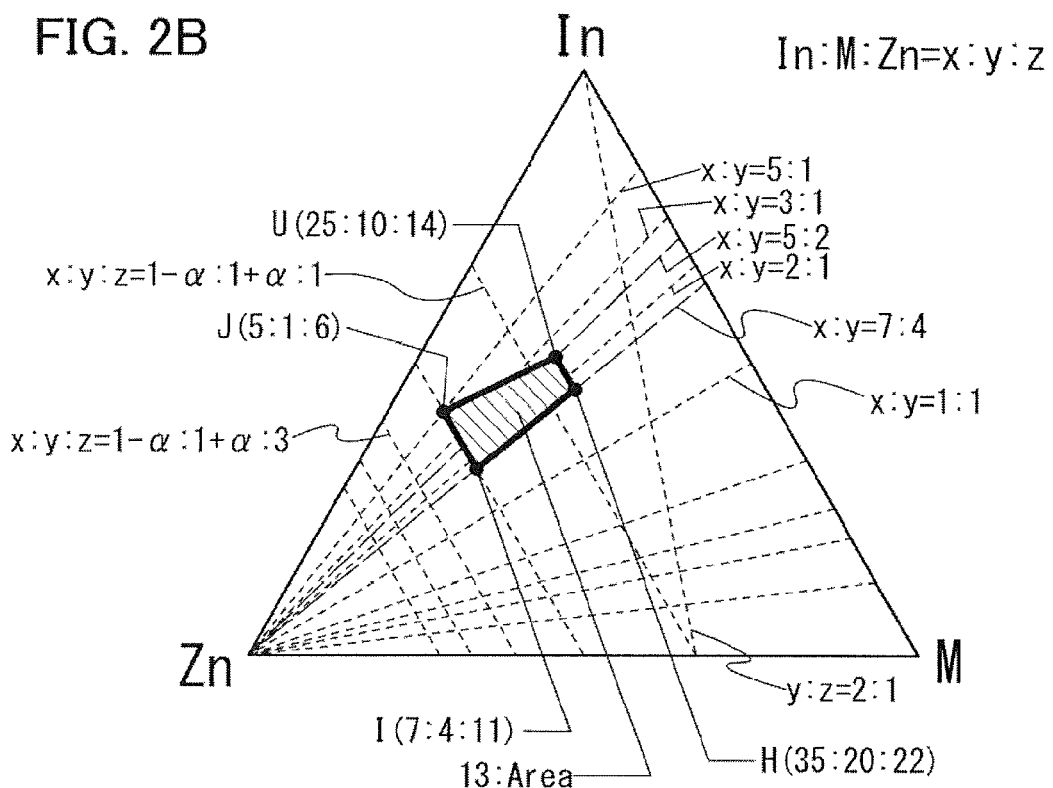

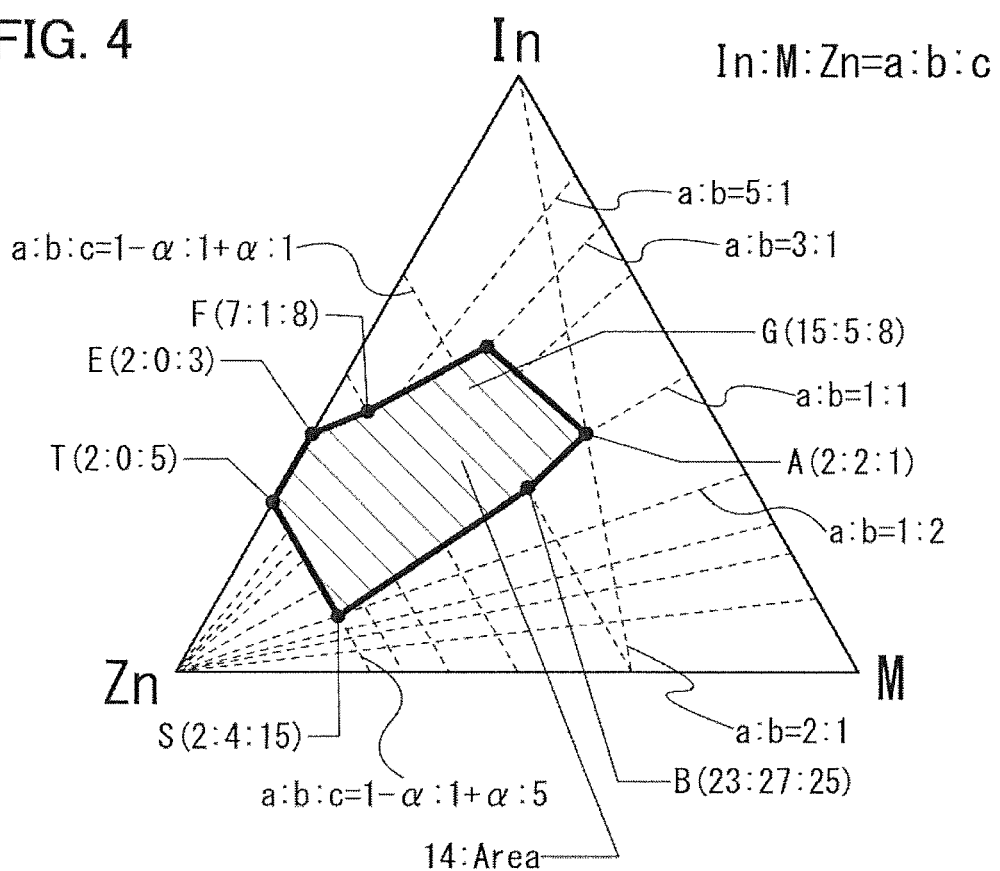

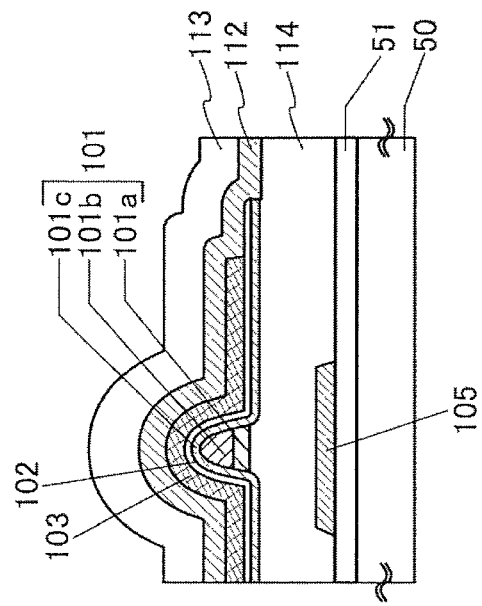
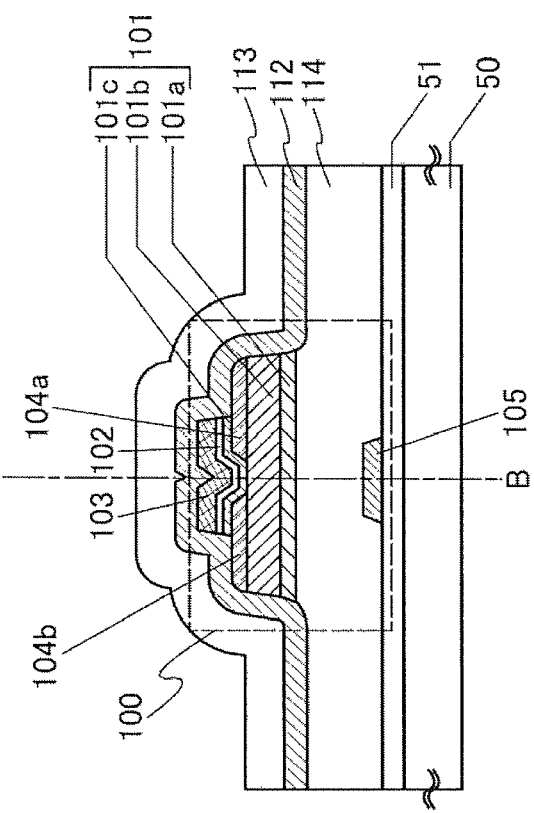

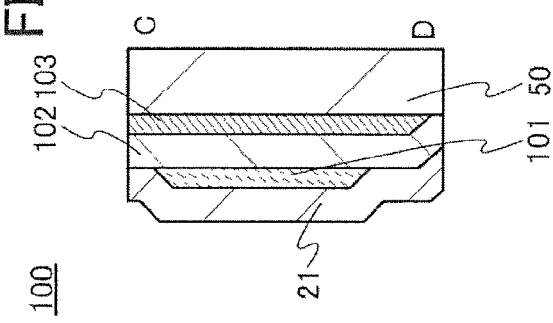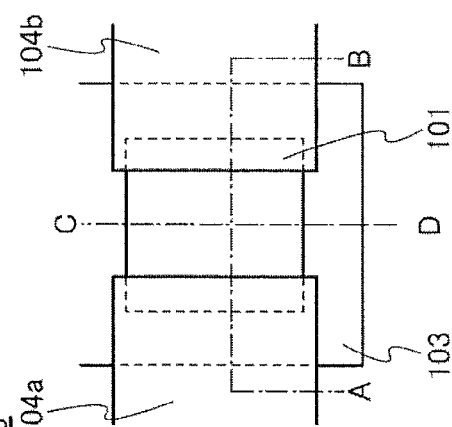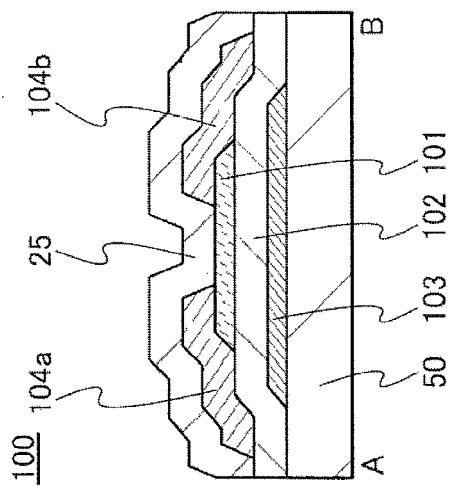

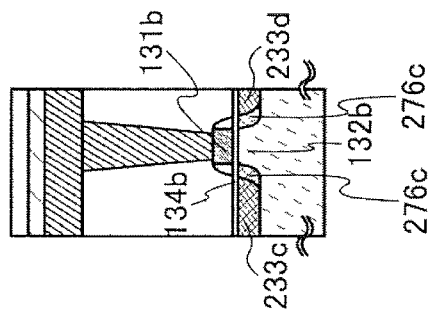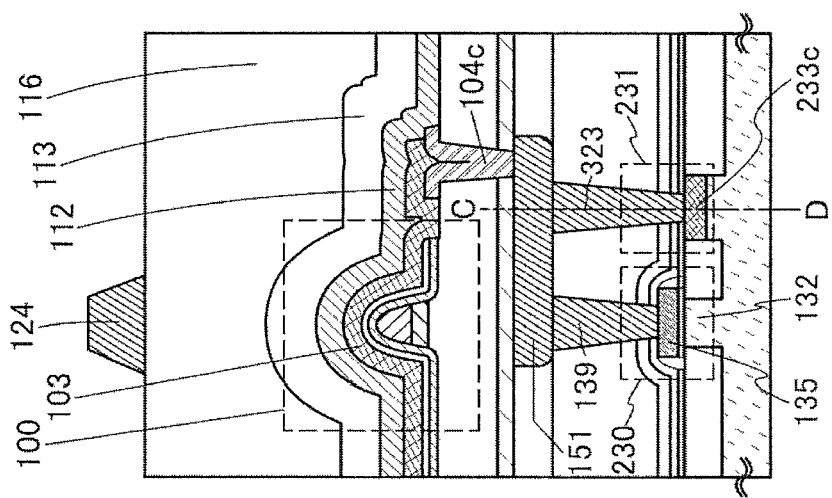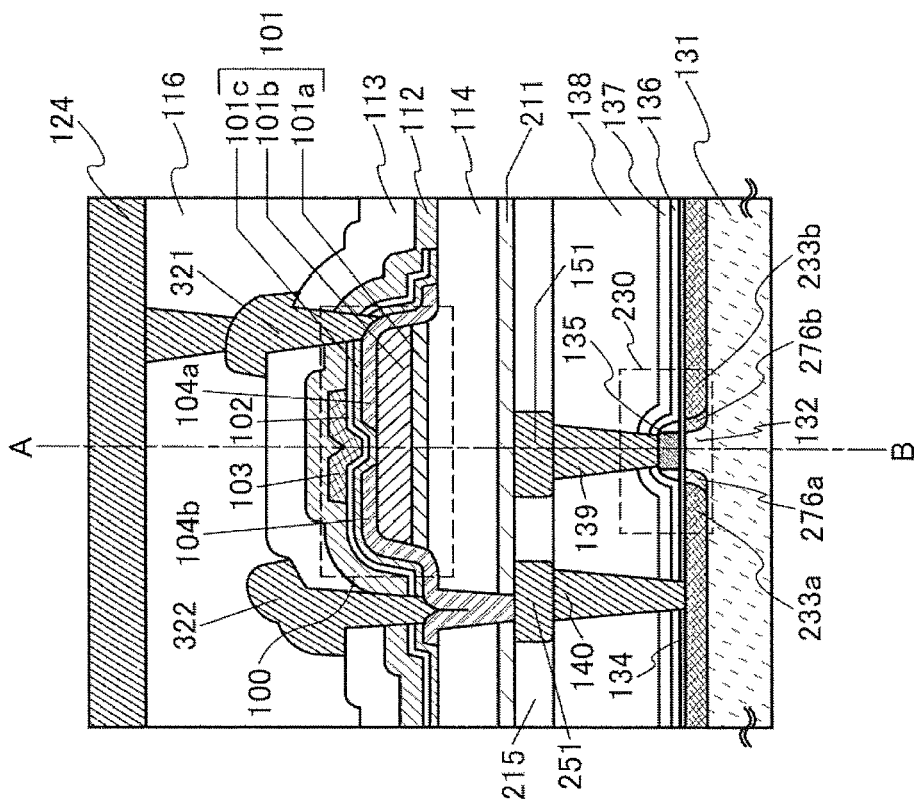

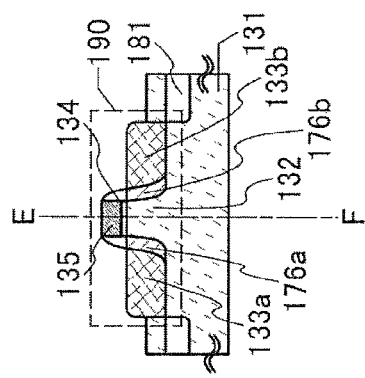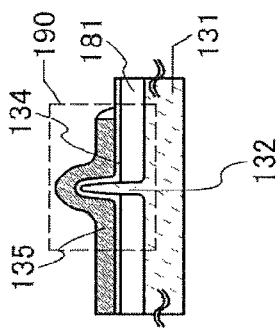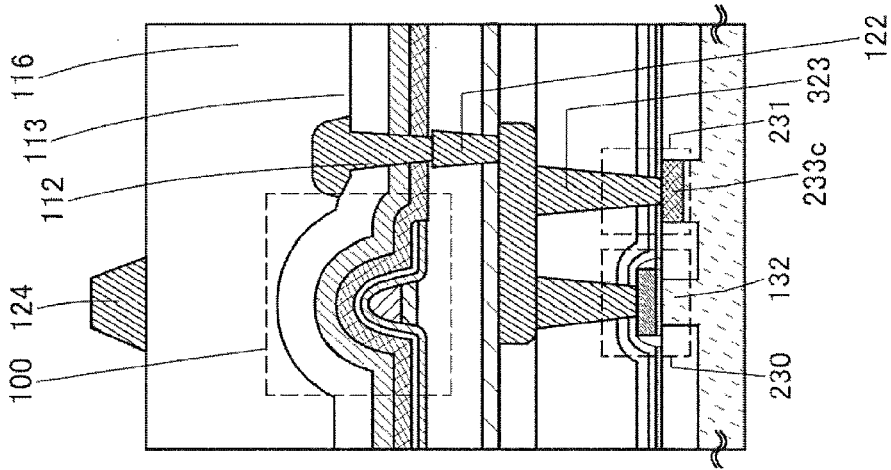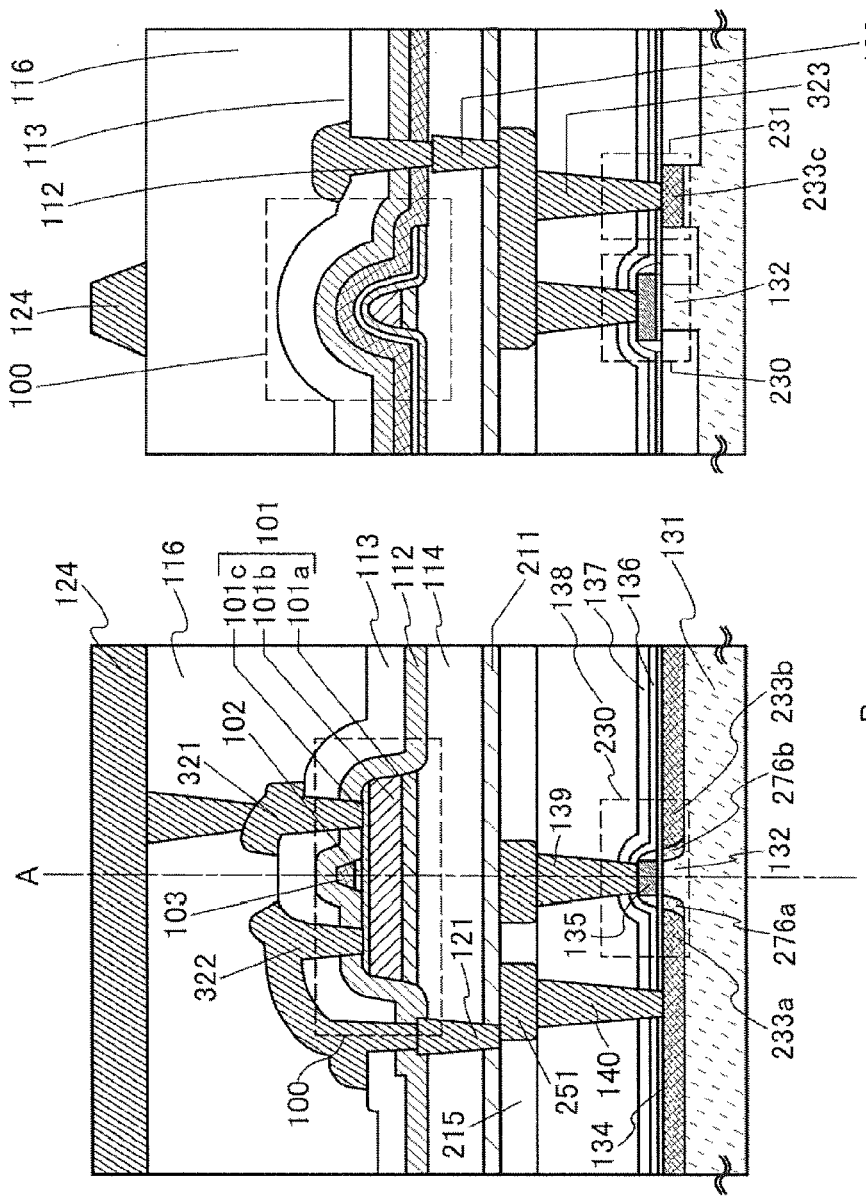

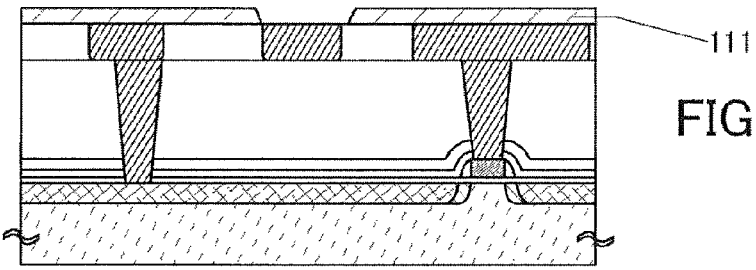
FIG. 17A
FIG. 17B
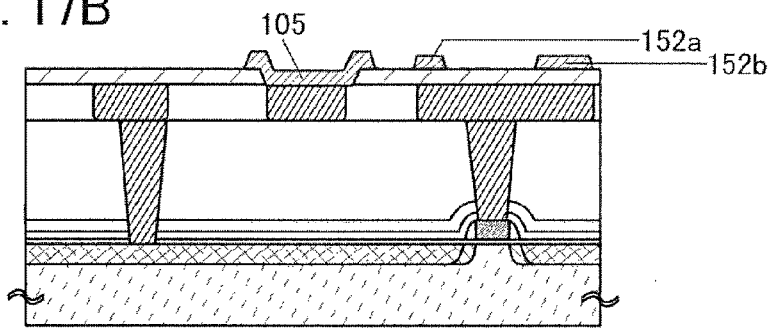
FIG. 17C
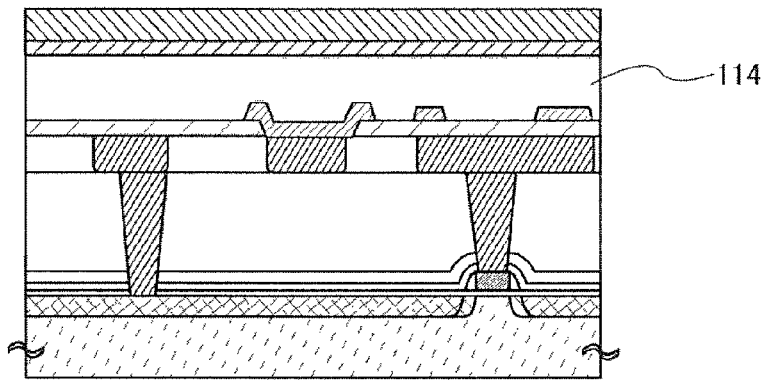
FIG. 17D
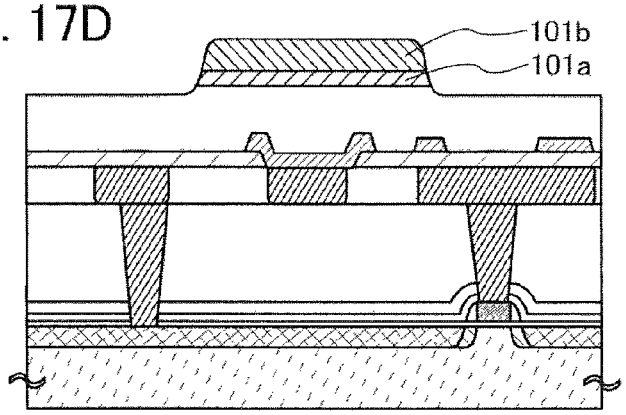

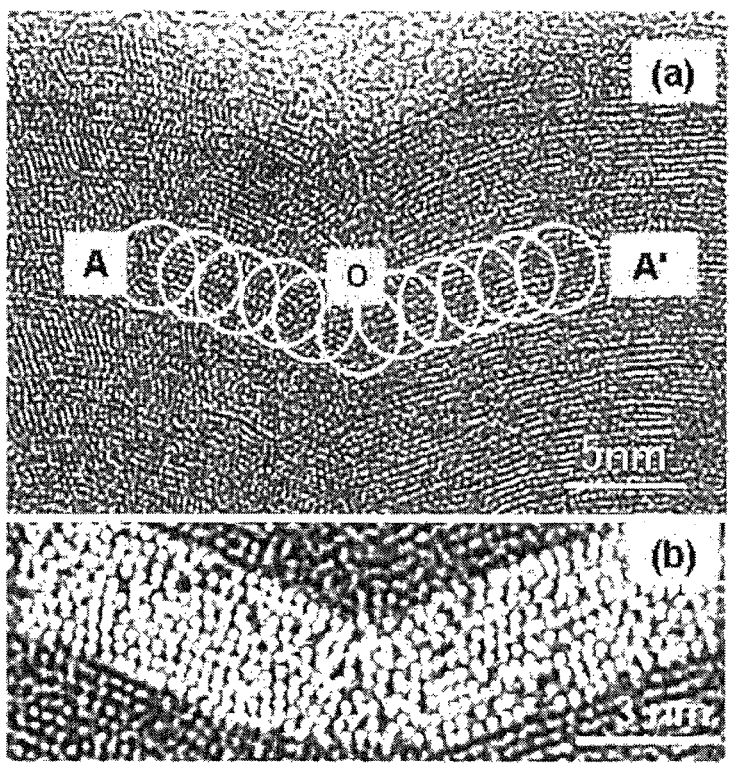
FIG. 21A
FIG. 21B
FIG. 21C
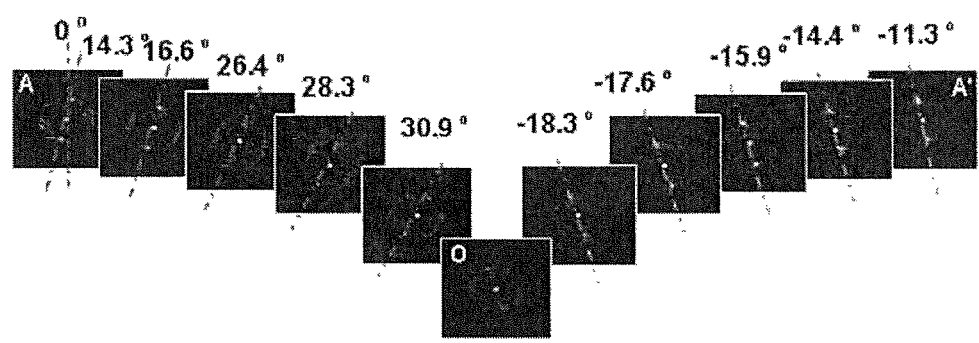

CAAC-OS nc-OS as-sputtered after heat treatment at 450 °C

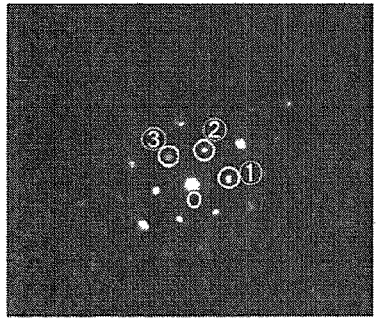

incident direction <0 0 1>

Observed value
d value
① d=0.285nm
② d=0.291nm
③ d=0.291nm
Angle
∠①O②=60°
∠①O③=120°
∠②O③=60°

Reference value
InGaZn2O5
(JCPDS:40-252)
d value
① 0-1 0   d=0.285nm
② 1-1 0   d=0.285nm
③ 1 0 0   d=0.285nm
Angle (calculation value)
∠①O②=60°
∠①O③=120°
∠②O③=60°

FIG. 56B

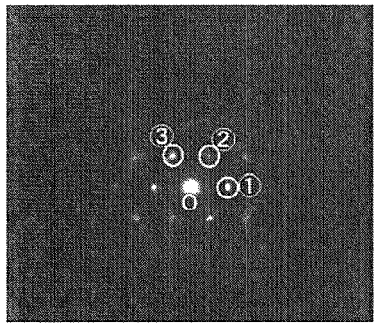

incident direction <0 0 1>

Observed value
d value
① d=0.287nm
② d=0.291nm
③ d=0.291nm
Angle
∠①O②=59°
∠①O③=119°
∠②O③=60°

Reference value
InGaZn2O5
(JCPDS:40-252)
d value
① 0-1 0   d=0.285nm
② 1-1 0   d=0.285nm
③ 1 0 0   d=0.285nm
Angle (calculation value)
∠①O②=60°
∠①O③=120°
∠②O③=60°

FIG. 56C

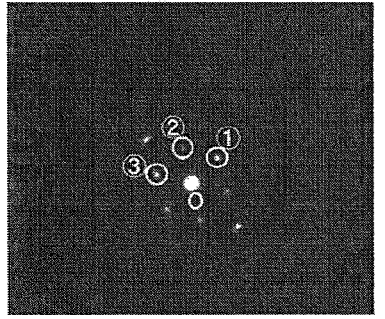

incident direction <0 0 1>

Observed value
d value
① d=0.287nm
② d=0.287nm
③ d=0.291nm
Angle
∠①O②=58°
∠①O③=119°
∠②O③=61°

Reference value
InGaZn2O5
(JCPDS:40-252)
d value
① 0-1 0   d=0.285nm
② 1-1 0   d=0.285nm
③ 1 0 0   d=0.285nm
Angle (calculation value)
∠①O②=60°
∠①O③=120°
∠②O③=60°

SEMICONDUCTOR FILM, TRANSISTOR, SEMICONDUCTOR DEVICE, DISPLAY DEVICE, AND ELECTRONIC APPLIANCE

CROSS-REFERENCE TO RELATED APPLICATIONS

This application is a continuation of U.S. application Ser. No. 14/626,049, filed Feb. 19, 2015, now pending, which claims the benefit of foreign priority applications filed in Japan as Serial No. 2014-032192 on Feb. 21, 2014, Serial No. 2014-098071 on May 9, 2014, Serial No. 2014-122792 on Jun. 13, 2014, Serial No. 2014-131834 on Jun. 26, 2014 and Serial No. 2014-218310 on Oct. 27, 2014, all of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A transistor and a semiconductor circuit are embodiments of semiconductor devices. An arithmetic device, a memory device, an imaging device, an electro-optical device, a power generation device (e.g., a thin film solar cell and an organic thin film solar cell), and an electronic appliance each may include a semiconductor device.

2. Description of the Related Art

Non-Patent Document 1 discloses that a homologous series represented by $In_{1-x}Ga_{1+x}O_3(ZnO)_m$ ($-1 \leq x \leq 1$, and m is a natural number) exists. Furthermore, Non-Patent Document 1 discloses a solid solution range of a homologous series. For example, in the case of a solid solution range of a homologous series when m is 1, x is within a range from −0.33 to 0.08, and in the case of a solid solution range of a homologous series when m is 2, x is within a range from −0.68 to 0.32.

A compound represented by $AB_2O_4$ (A and B are metal elements) is known as a compound having a spinel crystal structure. In addition, Non-Patent Document 1 discloses an example of $In_xZn_yGa_zO_w$, and when x, y, and z are set so that a composition in the neighborhood of $ZnGa_2O_4$ is obtained, i.e., x, y, and z are close to 0, 1, and 2, respectively, a spinel crystal structure is formed or is likely to be mixed.

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

For example, a technique for formation of a transistor using zinc oxide or an In—Ga—Zn oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic appliances.

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", J. Solid State Chem., Vol. 93, 1991, pp. 298-315.

SUMMARY OF THE INVENTION

An object of one embodiment of the present invention is to give favorable electrical characteristics to a semiconductor device. Another object is to provide a highly reliable semiconductor device.

Another object is to provide a favorable transistor with small variation in characteristics. Another object is to provide a semiconductor device including a memory element with favorable retention characteristics. Another object is to provide a semiconductor device that is suitable for miniaturization. Another object is to provide a semiconductor device having a reduced circuit area. Another object is to provide a semiconductor device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an oxide semiconductor film having a plurality of electron diffraction patterns which are observed in such a manner that a surface where the oxide semiconductor film is formed is irradiated with an electron beam having a probe diameter whose half-width is 1 nm while the position of the oxide semiconductor film and the position of the electron beam are relatively moved. The plurality of electron diffraction patterns include 50 or more electron diffraction patterns which are observed in different areas, the plurality of electron diffraction patterns are oriented randomly, first diffraction patterns account for 90% or more of the plurality of electron diffraction patterns, and the first electron diffraction pattern includes observed points which indicates that a c-axis is oriented in a direction substantially perpendicular to the surface where the oxide semiconductor film is formed.

Another embodiment of the present invention is an oxide semiconductor film having a plurality of electron diffraction patterns which are observed in such a manner that a surface where the oxide semiconductor film is formed is irradiated with an electron beam having a probe diameter whose half-width is 1 nm while the position of the oxide semiconductor film and the position of the electron beam are relatively moved. The plurality of electron diffraction patterns include 50 or more electron diffraction pattern which are observed in different areas, the plurality of electron diffraction patterns are oriented randomly, the sum of the percentage of first electron diffraction patterns and the percentage of second electron diffraction patterns accounts for 100% of the 50 or more electron diffraction patterns, the first electron diffraction patterns account for 90% or more of the 50 or more electron diffraction patterns, the first electron diffraction pattern includes observed points which indicates that a c-axis is oriented in a direction substantially perpendicular to the surface where the oxide semiconductor film is formed, and the second electron diffraction pattern includes observed points that is not symmetry or an observed region disposed in a circular shape (ring shape).

Another embodiment of the present invention is an oxide semiconductor film having a plurality of electron diffraction patterns which are observed in such a manner that a surface where the oxide semiconductor film is formed is irradiated with an electron beam having a probe diameter whose half-width is 1 nm while the position of the oxide semiconductor film and the position of the electron beam are relatively moved. The plurality of electron diffraction patterns include 50 or more electron diffraction patterns which are observed in different areas, first electron diffraction patterns account for 100% of the 50 or more electron diffraction patterns, the first electron diffraction pattern includes observed points which indicates that a c-axis is oriented in a direction substantially perpendicular to the surface where the oxide semiconductor film is formed, and the plurality of electron diffraction patterns are oriented randomly.

Furthermore, in the above structure, a region where the second electron diffraction pattern is observed is preferably an oxide semiconductor film including a nanocrystal.

Another embodiment of the present invention is an oxide semiconductor film including In, an element M, and Zn. The element M is at least one of aluminum, gallium, yttrium, and tin. The atomic ratio of In to the element M and Zn satisfies In:M:Zn=x:y:z. In an equilibrium diagram with vertices of the three elements of In, the element M, and Zn, x:y:z is an atomic ratio within a range of an area surrounded by line segments that connect first coordinates (x:y:z=2:2:1), second coordinates (x:y:z=23:27:25), third coordinates (x:y:z=8:12:35), fourth coordinates (x:y:z=4:0:7), fifth coordinates (x:y:z=2:0:3), sixth coordinates (x:y:z=7:1:8), seventh coordinates (x:y:z=15:5:8), and the first coordinates, in this order.

In the above structure, the following is preferable: the oxide semiconductor film is formed by a sputtering method using a target including In, the element M, and Zn; the element M is at least one of aluminum, gallium, yttrium, and tin; the atomic ratio of In to the element M and Zn of the target satisfies In:M:Zn=a:b:c; and in an equilibrium diagram with vertices of the three elements of In, the element M, and Zn, a:b:c is an atomic ratio within a range of an area surrounded by line segments that connect first coordinates (a:b:c=2:2:1), second coordinates (a:b:c=23:27:25), third coordinates (a:b:c=1:2:9), fourth coordinates (a:b:c=1:0:3), fifth coordinates (a:b:c=2:0:3), sixth coordinates (a:b:c=7:1:8), seventh coordinates (a:b:c=10:4:7), and the first coordinates, in this order.

Another embodiment of the present invention is an oxide semiconductor film including In, Ga, and Zn. The atomic ratio of In to Ga and Zn satisfies In:Ga:Zn=x:y:z. In an equilibrium diagram with vertices of the three elements of In, Ga, and Zn, x:y:z is an atomic ratio within a range of an area surrounded by line segments that connect first coordinates (x:y:z=2:2:1), second coordinates (x:y:z=23:27:25), third coordinates (x:y:z=8:12:35), fourth coordinates (x:y:z=4:0:7), fifth coordinates (x:y:z=2:0:3), sixth coordinates (x:y:z=7:1:8), seventh coordinates (x:y:z=15:5:8), and the first coordinates, in this order.

Another embodiment of the present invention is a semiconductor device including the above-described oxide semiconductor film.

Another embodiment of the present invention is a transistor including the above-described oxide semiconductor film in a channel region.

In any of the above structures, it is preferable that a second oxide film and a third oxide film be included, the oxide semiconductor film be in contact with a top surface of the second oxide film, and that the third oxide film is in contact with a top surface of the oxide semiconductor film. In any of the above structures the third oxide film is preferably in contact with a side surface of the second oxide film, and a side surface and the top surface of the oxide semiconductor film. In any of the above structures, it is preferable that the electron affinity of oxide included in the oxide semiconductor film be larger than the electron affinity of oxide included in the second oxide film and the electron affinity of oxide included in the third oxide film.

Another embodiment of the present invention is a semiconductor device including a first oxide film and a second oxide film in contact with the first oxide film. The first oxide film includes In, an element M, and Zn. The atomic ratio of In to the element M and Zn of the first oxide film satisfies In:M:Zn=$x_a$:$y_a$:$z_a$. Furthermore, $x_a$, $y_a$, $z_a$, and $\alpha$ satisfy any one of: $x_a$:$y_a$:$z_a$=(1−α):(1+α):1 and −0.33≤α+0.08; $x_a$:$y_a$:$z_a$=(1−α):(1+α):2 and −0.680≤α≤+0.32; $x_a$:$y_a$:$z_a$=(1−α):(1+α):3 and −1≤α≤+0.46; $x_a$:$y_a$:$z_a$=(1−α):(1+α):4 and −1≤α≤+0.54; and $x_a$:$y_a$:$z_a$=(1−α):(1+α):5 and −1≤α≤+0.72.

Another embodiment of the present invention is a semiconductor device including a first oxide film and a second oxide film in contact with the first oxide film. The first oxide film includes In, the element M, and Zn. The atomic ratio of In to the element M and Zn of the first oxide film satisfies In:M:Zn=$x_a$:$y_a$:$z_a$. The second oxide film includes In, the element M, and Zn. The atomic ratio of In to the element M and Zn of the second oxide film satisfies In:M:Zn=$x_b$:$y_b$:$z_b$. In an equilibrium diagram with vertices of the three elements of In, the element M, and Zn, $x_a$:$y_a$:$z_a$ is an atomic ratio within a range of an area surrounded by line segments that connect first coordinates ($x_a$:$y_a$:$z_a$=8:14:7), second coordinates ($x_a$:$y_a$:$z_a$=2:5:7), third coordinates ($x_a$:$y_a$:$z_a$=51:149:300), fourth coordinates ($x_a$:$y_a$:$z_a$=46:288:833), fifth coordinates ($x_a$:$y_a$:$z_a$=0:2:11), sixth coordinates ($x_a$:$y_a$:$z_a$=0:0:1), seventh coordinates ($x_a$:$y_a$:$z_a$=2:2:1), and the first coordinates, in this order. In an equilibrium diagram with vertices of the three elements of In, the element M, and Zn, $x_b$:$y_b$:$z_b$ is an atomic ratio within a range of an area surrounded by line segments that connect first coordinates ($x_b$:$y_b$:$z_b$=2:2:1), second coordinates ($x_b$:$y_b$:$z_b$=23:27:25), third coordinates ($x_b$:$y_b$:$z_b$=8:12:35), fourth coordinates ($x_b$:$y_b$:$z_b$=4:0:7), fifth coordinates ($x_b$:$y_b$:$z_b$=2:0:3), sixth coordinates ($x_b$:$y_b$:$z_b$=7:1:8), seventh coordinates ($x_b$:$y_b$:$z_b$=10:4:7), and the first coordinates, in this order.

In any of the above structures, it is preferable that the semiconductor device include a first transistor, and that the second oxide film function as a channel region of the first transistor. In any of the above structures, $x_b$>$y_b$ is preferably satisfied. In any of the above structures, the electron affinity of the first oxide film is preferably smaller than the electron affinity of the second oxide film. In any of the above structures, it is preferable that the semiconductor device include a third oxide film in contact with the second oxide film, and that the electron affinity of the third oxide film be smaller than the electron affinity of the second oxide film.

In any of the above structures, $x_a$, $y_a$, $z_a$, and $\alpha$ preferably satisfy any one of: $x_a:y_a:z_a=(1-\alpha):(1+\alpha):1$ and $-0.33\leq\alpha\leq+0.08$; $x_a:y_a:z_a=(1-\alpha):(1+\alpha):2$ and $-0.68\leq\alpha\leq+0.32$; $x_a:y_a:z_a=(1-\alpha):(1+\alpha):3$ and $-1\leq\alpha\leq+0.46$; $x_a:y_a:z_a=(1-\alpha):(1+\alpha):4$ and $-1\leq\alpha\leq+0.54$; and $x_a:y_a:z_a=(1-\alpha):(1+\alpha):5$ and $-1\leq\alpha\leq+0.72$.

In any of the above structures, $x_b$, $y_b$, $z_b$, and $\beta$ preferably satisfy any one of: $x_b:y_b:z_b=(1-\beta):(1+\beta):1$ and $-0.33\leq\beta\leq+0.08$; $x_b:y_b:z_b=(1-\beta):(1+\beta):2$ and $-0.68\leq\beta\leq+0.32$; $x_b:y_b:z_b=(1-\beta):(1+\beta):3$ and $-1\leq\beta\leq+0.46$; $x_b:y_b:z_b=(1-\beta):(1+62):4$ and $-1\leq\beta\leq+0.54$; and $x_b:y_b:z_b=(1-3):(1+\beta):5$ and $-1\leq\beta\leq+0.72$.

According to one embodiment of the present invention, a semiconductor device with favorable electrical characteristics can be provided. Further, a semiconductor device having high reliability can be provided.

A favorable transistor with small variation in characteristics can be provided. A semiconductor device including a memory element with favorable retention characteristics can be provided. A semiconductor device that is suitable for miniaturization can be provided. Furthermore, a semiconductor device having a reduced circuit area can be provided. A semiconductor device with a novel structure can be provided. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

FIGS. 2A and 2B are phase diagrams for explaining an atomic ratio of an oxide film of one embodiment of the present invention.

FIG. 4 is a phase diagram for explaining an atomic ratio of a target of one embodiment of the present invention.

FIGS. 6A and 6B illustrate an example of a transistor of one embodiment of the present invention.

FIGS. 11A to 11C illustrate an example of a transistor of one embodiment of the present invention.

FIGS. 14A to 14C illustrate an example of a semiconductor device of one embodiment of the present invention;

FIGS. 15A to 15D illustrate an example of a semiconductor device of one embodiment of the present invention.

FIGS. 17A to 17D illustrate a method for manufacturing a semiconductor device of one embodiment of the present invention.

FIG. 20A illustrates the band structure of part of a transistor of one embodiment of the present invention and FIG. 20B illustrates a current path when the transistor is on.

FIGS. 21A to 21C are cross-sectional TEM images and a local Fourier transform image of an oxide semiconductor.

FIGS. 56A to 56C are electron diffraction patterns of oxide semiconductor films.

DETAILED DESCRIPTION OF THE INVENTION

Figure 1A:
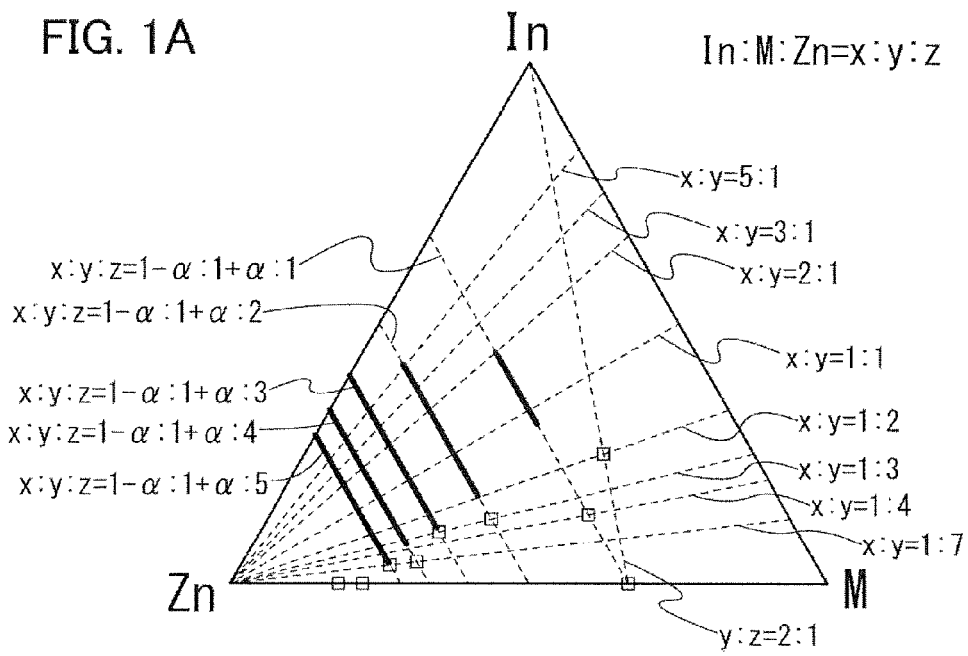
FIGS. 1A and 1B show an atomic ratio of an oxide film of one embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, an oxide semiconductor film which is one embodiment of the present invention is described.

Here, an oxide semiconductor is an oxide semiconductor containing indium, for example. An oxide semiconductor has a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Further, the oxide semiconductor preferably contains zinc. When the oxide semiconductor contains zinc, the oxide semiconductor is easily to be crystallized, for example.

<Structure of Oxide Semiconductor Film>

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, by high-resolution TEM, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

FIG. 21A is a high-resolution cross-sectional TEM image of a CAAC-OS film. FIG. 21B is a high-resolution cross-sectional TEM image obtained by enlarging the image of FIG. 21A. In FIG. 21B, atomic arrangement is highlighted for easy understanding.

FIG. 21C is local Fourier transform images of regions each surrounded by a circle (the diameter is about 4 nm) between A and O and between O and A' in FIG. 21A. C-axis alignment can be observed in each region in FIG. 21C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Note that in an electron diffraction pattern of the CAAC-OS film, spots (bright spots) having alignment are shown. For example, when electron diffraction with an electron beam having a diameter of 1 nm or greater and 30 nm or less (such electron diffraction is also referred to as nanobeam electron diffraction) is performed on the top surface of the CAAC-OS film, spots are observed (see FIG. 22A).

The high-resolution cross-sectional TEM image and the high-resolution plan TEM image show that the crystal parts in the CAAC-OS film have alignment.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan high-resolution TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak at 2θ of around 36° indicates that a crystal having no c-axis alignment, typically, a crystal having a spinel crystal structure, is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Here, the case where the oxide semiconductor film is used for a transistor is described. The transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases. The CAAC-OS film having small amounts of impurities and oxygen vacancy is an oxide semiconductor film with low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC-OS film has a low impurity concentration and a low density of defect states. Thus, the CAAC-OS can be referred to as an oxide semiconductor having stable characteristics.

With the use of the CAAC-OS film in a transistor, variation in the electrical characteristics of the transistor due to irradiation with visible light or ultraviolet light is small.

Next, a polycrystalline oxide semiconductor film is described.

By high-resolution TEM, crystal grains are observed in the polycrystalline oxide semiconductor film. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a boundary between crystals may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an InGaZnO$_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 22B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (a small amount of oxygen vacancy). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that a single crystal can be formed by sintering at a high temperature, e.g., 1000° C. or higher. In contrast, a CAAC-OS film can be formed at a low temperature from room temperature to approximately 500° C., which is industrially favorable.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the amorphous-like OS film, crystallization occurs by a slight amount of electron beam used for TEM observation and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, a CAAC-OS film is favorable also in terms of industrialization. Furthermore, a CAAC-OS film has an advantage that a reduction in carrier mobility is less likely to occur because carrier scattering due to a grain boundary is smaller in a CAAC-OS film than that in a polycrystalline or microcrystalline OS film. Furthermore, a CAAC-OS film is an oxide semiconductor film with a low density of defect states and carrier trap is less likely to occur therein; therefore, a transistor formed using a CAAC-OS film has small variation in electrical characteristics and thus has high reliability.

Here, a CAAC-OS film may have a plurality of structures. In the case where a CAAC-OS film has a plurality of structures, nanobeam electron diffraction, which is described later, enables analysis of the structures in some cases. Here, a plurality of crystal parts with c-axis alignment is referred to as a CAAC structure. Furthermore, a diffraction pattern which is typically observed in a CAAC-OS film, that is, a diffraction pattern indicating c-axis alignment, is referred to as a CAAC-structure diffraction pattern. For example, when a CAAC-OS film having a plurality of crystal parts with c-axis alignment, that is having a CAAC structure, is subjected to nanobeam electron diffraction, one or more diffraction patterns other than a CAAC-structure diffraction pattern are observed in some cases. For example, a diffraction pattern similar to that of an nc-OS film, that is an nc-structure diffraction pattern, is observed, or a diffraction pattern of a spinel crystal structure (spinel-crystal-structure diffraction pattern) is observed in some cases. In the case where an oxide semiconductor film has a plurality of structures in the above manner, for example, carrier scattering is increased at the boundaries between these structures and a region where a diffraction pattern of a CAAC-OS film is observed, which may reduce the carrier mobility. Furthermore, the boundary portion tends to serve as a movement path of impurities and capture impurities easily; thus, the impurity concentration of the CAAC-OS might be increased.

[Nanobeam Electron Diffraction]

Next, nanobeam electron diffraction is described. In the case where the oxide semiconductor film has a plurality of structures, the structures can be analyzed using nanobeam electron diffraction in some cases.

Figure 22A:
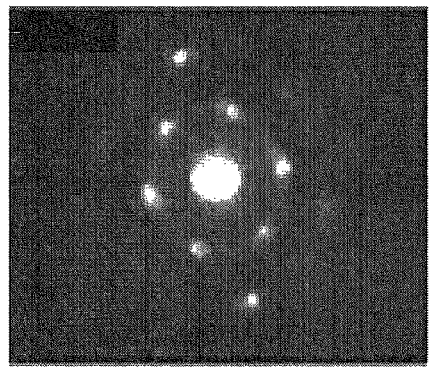
FIGS. 22A and 22B show nanobeam electron diffraction patterns of oxide semiconductor films and FIGS. 22C and 22D illustrate an example of a transmission electron diffraction measurement apparatus.
Figure 22B:
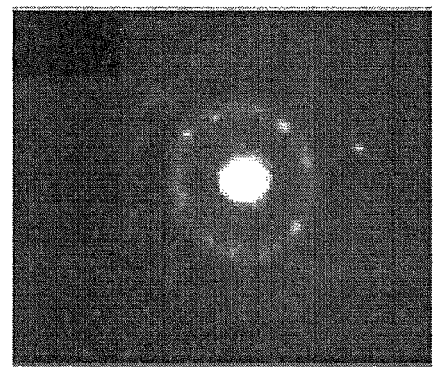
Figure 22C:
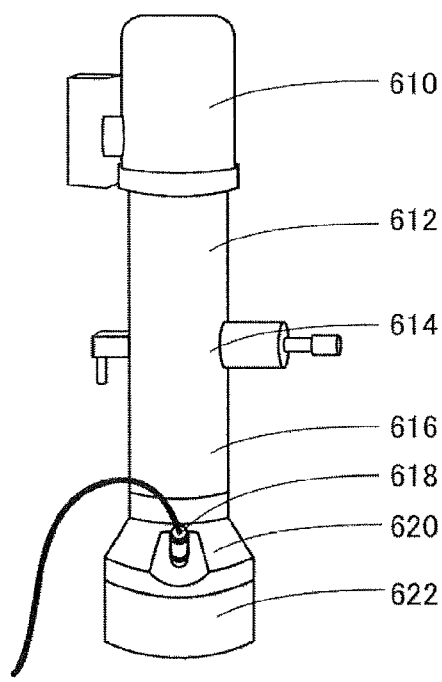

FIG. 22C illustrates a transmission electron diffraction measurement apparatus that includes an electron gun chamber 610, an optical system 612 below the electron gun chamber 610, a sample chamber 614 below the optical system 612, an optical system 616 below the sample chamber 614, an observation chamber 620 below the optical system 616, a camera 618 installed in the observation chamber 620, and a film chamber 622 below the observation chamber 620. The camera 618 is provided to face the inside of the observation chamber 620. Note that the film chamber 622 is not necessarily provided.

Figure 22D:
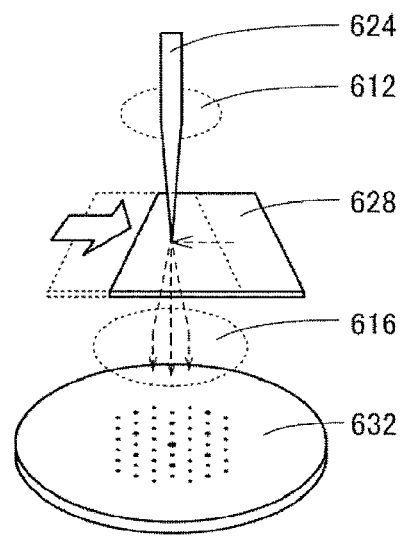

FIG. 22D illustrates an internal structure of the transmission electron diffraction measurement apparatus illustrated in FIG. 22C. In the transmission electron diffraction measurement apparatus, a substance 628 provided in the sample chamber 614 is irradiated with electrons ejected from an electron gun provided in the electron gun chamber 610 through the optical system 612. The electrons that have passed through the substance 628 enter a fluorescent plate 632 provided in the observation chamber 620 through the optical system 616. On the fluorescent plate 632, a pattern corresponding to the intensity of entered electron appears, which allows measurement of a transmission electron diffraction pattern.

The camera 618 is set toward the fluorescent plate 632 so that a pattern on the fluorescent plate 632 can be taken. An angle formed by a straight line that passes through the center of a lens of the camera 618 and the center of the fluorescent plate 632 and an upper surface of the fluorescent plate 632 is, for example, 15° or more and 80° or less, 30° or more and 75° or less, or 45° or more and 70° or less. As the angle is reduced, distortion of the transmission electron diffraction pattern taken by the camera 618 becomes larger. Note that if the angle is obtained in advance, the distortion of an obtained transmission electron diffraction pattern can be corrected. Note that the film chamber 622 may be provided with the camera 618. For example, the camera 618 may be set in the film chamber 622 so as to be opposite to the incident direction of electrons 624. In this case, a transmission electron diffraction pattern with less distortion can be taken from the rear surface of the fluorescent plate 632.

A holder for fixing the substance 628 that is a sample is provided in the sample chamber 614. The holder transmits electrons passing through the substance 628. The holder may have, for example, a function of moving the substance 628 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 628.

Then, a method for measuring a transmission electron diffraction pattern of a substance by the transmission electron diffraction measurement apparatus described above will be described.

For example, changes in the structure of a substance can be observed by changing the irradiation position of the electrons 624 that are a nanobeam in the substance (scanning) as illustrated in FIG. 22D. At this time, when the substance 628 is a CAAC-OS film, a diffraction pattern shown in FIG. 22A can be observed. When the substance 628 is an nc-OS film, a ring-like diffraction pattern with bright spots shown in FIG. 22B can be observed.

As shown in FIG. 22A, for example, spots corresponding to the vertices of a hexagon appear in a diffraction pattern of the CAAC-OS film. By changing the irradiation position in the CAAC-OS film (scanning the CAAC-OS film), the orientation of the hexagon is varied and rotated gradually. In addition, the angle of the rotation has a certain range.

Alternatively, by changing the irradiation position (scanning), the diffraction pattern of the CAAC-OS film is gradually rotated with the c-axis. In other words, a plane formed by the a-axis and the b-axis is rotated, for example.

[CAAC Proportion]

Even when the substance 628 is a CAAC-OS film, a diffraction pattern similar to that of an nc structure or the like is partly observed in some cases. Therefore, whether or not a CAAC-OS film is favorable can be determined by the proportion of a region where a diffraction pattern of a CAAC-OS film is observed in a predetermined area (also referred to as CAAC proportion). The CAAC proportion is preferably higher than or equal to 90%, further preferably higher than or equal to 95%, still further preferably higher than or equal to 97% and lower than or equal to 100%.

A method for evaluating the CAAC proportion of a CAAC-OS film is described below. Measurement points are randomly selected, transmission electron diffraction patterns thereof are obtained, and the percentage of the number of measurement points where a CAAC-structure diffraction pattern is observed in the total measurement points is calculated. The number of total measurement points is preferably larger than or equal to 50, further preferably larger than or equal to 100.

As a way to randomly select measurement points, for example, the irradiation position is changed (scan is performed) linearly to obtain diffraction patterns at even time intervals, which is preferable because the boundary between a region having a CAAC structure and another region can be obtained.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the CAAC proportion was obtained in such a manner that diffraction patterns were observed by scanning for 60 seconds at a rate of 5 nm/second and the obtained diffraction patterns were converted into still images for every 0.5 seconds. Note that as an electron beam, a nanobeam with a probe diameter of 1 nm was used. The above measurement was performed on six samples. The CAAC proportion was calculated using the average value of the six samples.

It is preferable that a crystal structure not be changed by electron-beam irradiation of TEM observation, measurement with electron diffraction, or the like. For example, in the case where H-9000NAR manufacture by Hitachi High-Technologies Corporation is used, it is preferable that the accelerating voltage be less than or equal to 300 kV and the cumulative electron dose (current density ×time) be less than or equal to $1 \times 10^7$ e$^-$/nm$^2$. Furthermore, it is preferable to verify that a crystal structure is not noticeably changed before and after irradiation, by observation on a TEM image, for example.

Figure 23A:
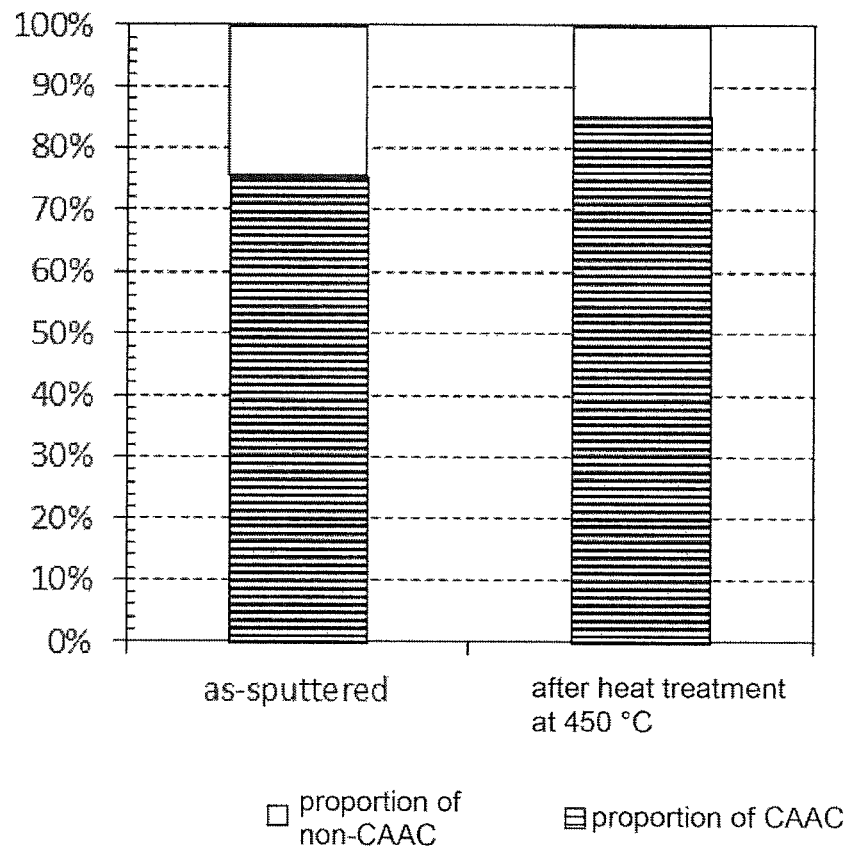
FIG. 23A shows an example of structural analysis by transmission electron diffraction measurement and FIGS. 23B and 23C show plan-view TEM images.

FIG. 23A shows the CAAC proportion of the samples. The CAAC proportion of the CAAC-OS film obtained just after the deposition was 75.7% (the proportion of non-CAAC was 24.3%). The CAAC proportion of the CAAC-OS film subjected to the heat treatment at 450° C. was 85.3% (the proportion of non-CAAC was 14.7%). These results show that the CAAC proportion obtained after the heat treatment at 450° C. is higher than that obtained just after the deposition. That is, heat treatment at a high temperature (e.g., higher than or equal to 400° C.) reduces the proportion of non-CAAC (increases the CAAC proportion). Further, the above results also indicate that even when the temperature of the heat treatment is lower than 500° C., the CAAC-OS film can have a high CAAC proportion.

Here, most of diffraction patterns different from that of a CAAC structure are diffraction patterns similar to that of an nc structure. Further, a diffraction pattern similar to that of an amorphous oxide semiconductor film was not able to be observed in the measurement region. Therefore, the above results suggest that the region having an nc structure is rearranged by the heat treatment owing to the influence of the structure of the adjacent region, whereby the region becomes CAAC.

Figure 23B:
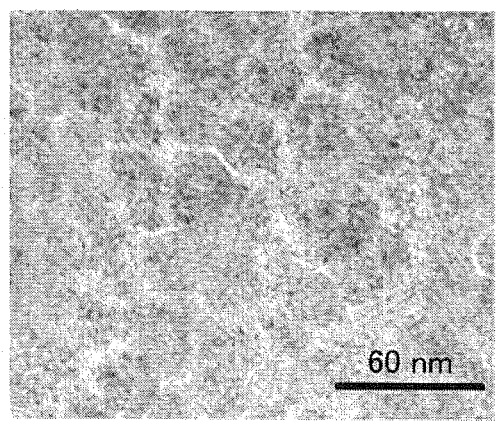
Figure 23C:
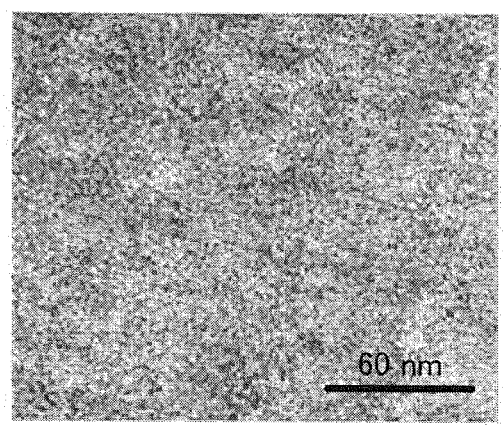

FIGS. 23B and 23C are plan-view TEM images of the CAAC-OS film obtained just after the deposition and the CAAC-OS film subjected to the heat treatment at 450° C., respectively. Comparison between FIGS. 23B and 23C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Figure 59A:
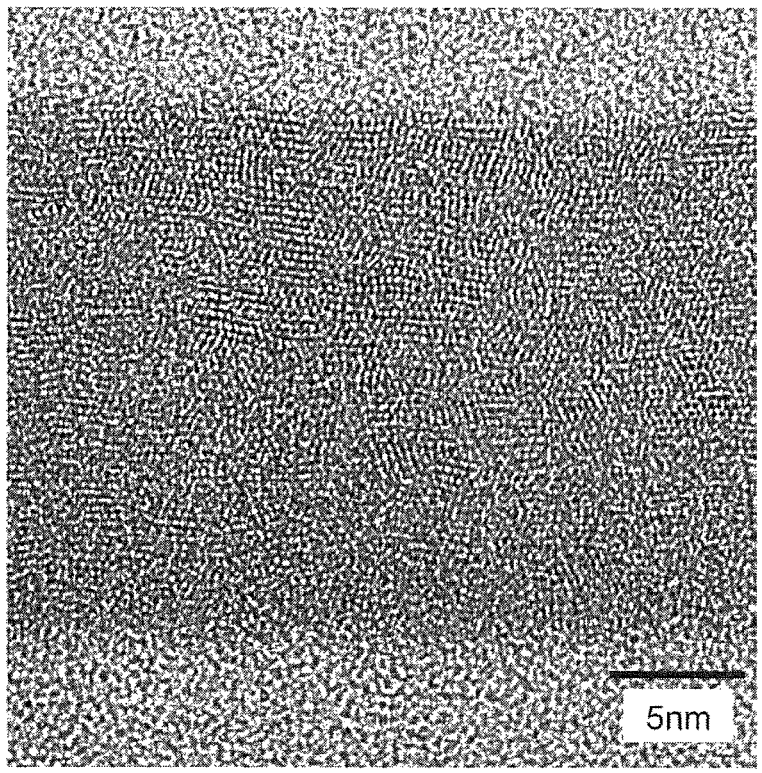
FIGS. 59A and 59B show observations of oxide semiconductor films by cross-sectional TEM.
Figure 59B:
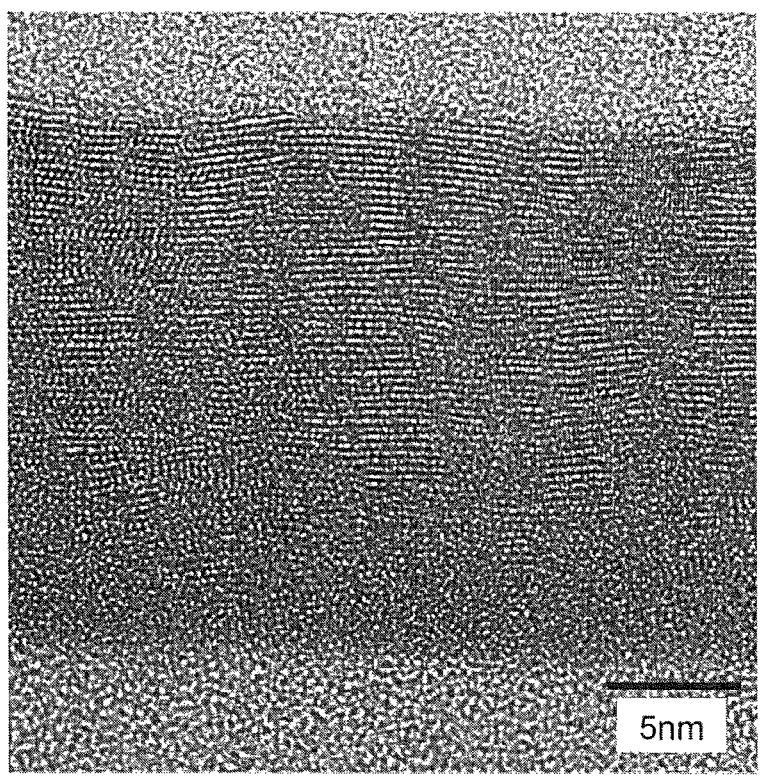

For example, when the CAAC-OS film is observed by cross-sectional TEM, as the CAAC proportion becomes larger, the number of regions where metal atoms are regularly arranged in a layered manner is increased. Although described in detail in an example later, for example, when two kinds of CAAC-OS films having different CAAC proportions are observed by cross-sectional TEM, in some cases, the number of regions where metal atoms are regularly arranged in a layered manner is large in one CAAC-OS film that has a higher CAAC proportion. FIG. 59A shows an observation of a cross section of a CAAC-OS film having a CAAC proportion of approximately 90%, and FIG. 59B shows an observation of a cross section of a CAAC-OS having a CAAC proportion of approximately 98%. Regions denoted by lines in the drawings are regions where metal atoms are regularly arranged in a layered manner. Although there may be a region where arrangement is unclear between regions where metal atoms regularly arranged, the areas of regions with unclear arrangement are reduced in some cases as the CAAC proportion of the CAAC-OS film becomes larger.

Here, the case where the CAAC-OS film has a region having a structure other than the CAAC structure, such as a region where an nc-structure diffraction pattern is observed or a region where a spinel-crystal-structure diffraction pattern is observed by nanobeam electron diffraction, is considered. In such a case, at the boundary between a region with a CAAC-structure diffraction pattern and a region with a diffraction pattern of another structure, for example, carrier scattering might be increased, and thus the carrier mobility might be reduced. Furthermore, the boundary portion tends to serve as a movement path of impurities and capture impurities easily; thus, the impurity concentration of the CAAC-OS film might be increased.

In particular, in the case where the region with another structure is a region with a spinel crystal structure, a clear boundary appears between the region with a spinel structure and a region with a CAAC structure in some cases; therefore, the electron mobility at the boundary portion might be reduced owing to carrier scattering or the like. Furthermore, in the case where a conductive film is formed over the CAAC-OS film, an element contained in the conductive film, such as metal, might diffuse into the boundary between the region with the spinel crystal structure and another region. In addition, the impurity concentration such as a hydrogen concentration of a film having a spinel crystal structure might be increased, and for example, impurities such as hydrogen might be captured in a grain boundary portion. Therefore, it is particularly preferable that a CAAC-OS film have no or a small amount of spinel crystal structures.

[Atomic Ratio]

The case where an oxide semiconductor film contains indium, an element M, and zinc is considered. Here, the element M is preferably aluminum, gallium, yttrium, tin, or the like. Other elements which can be used as the element Mare boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. A favorable range of the atomic ratio of indium to the element M and zinc (x:y:z) of the oxide semiconductor film is described with reference to FIGS. 1A and 1B and FIGS. 2A and 2B.

Figure 3A:
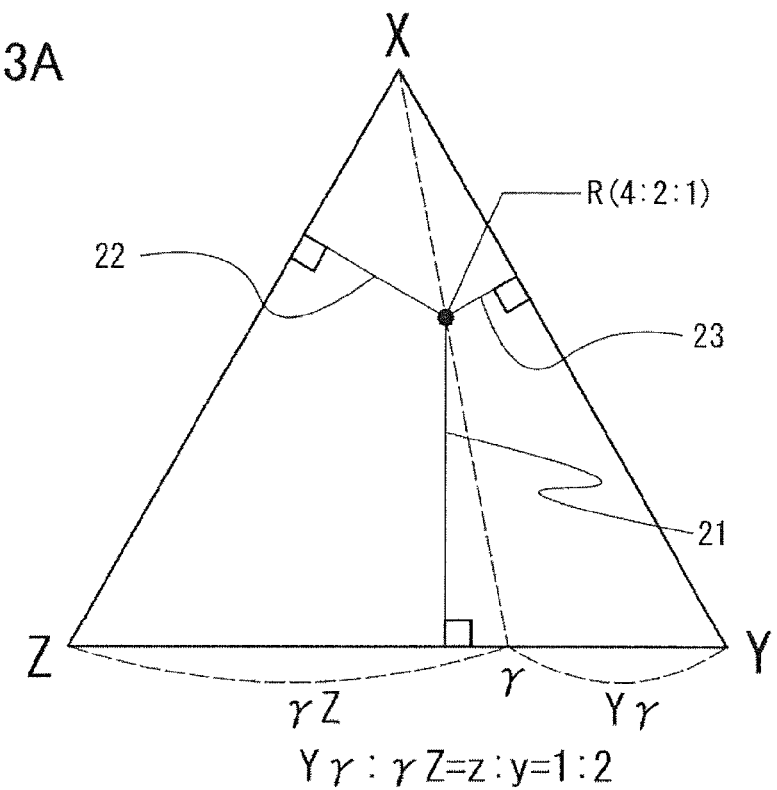
FIGS. 3A and 3B illustrate phase diagrams.
Figure 3B:
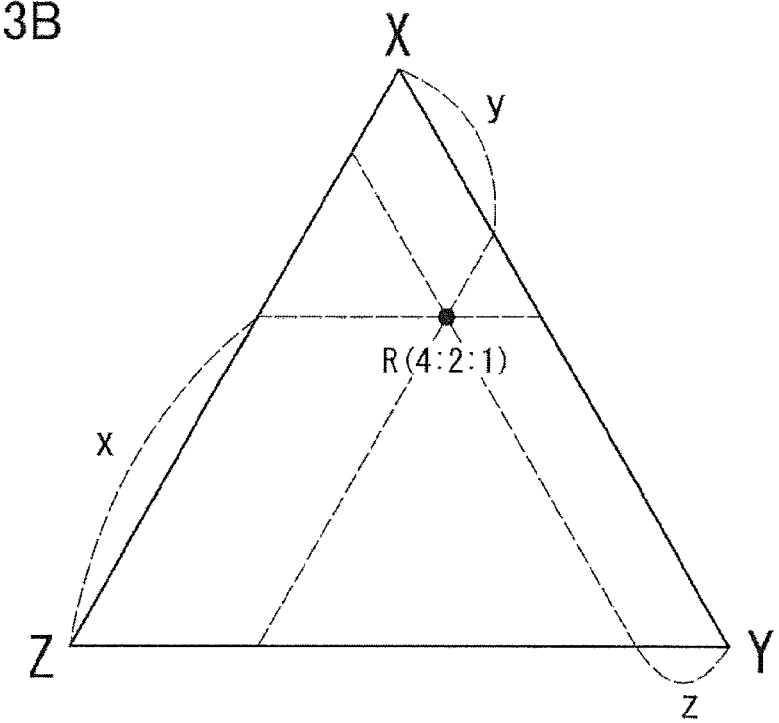

Here, the atomic ratio of the elements is described with reference to FIGS. 3A and 3B. FIGS. 3A and 3B each show a regular triangle with vertices X, Y, and Z, and a coordinate point R (4:2:1) as an example. The vertices denote elements X, Y, and Z. As the distance to each vertex is reduced, the proportion of atoms of the corresponding element is increased, whereas as the distance is increased, the proportion of the atoms is reduced. In addition, as shown in FIG. 3A, the proportion of atoms of each element is represented by the length of a perpendicular line from the coordinate point to the subtense of the corresponding vertex of the triangle. For example, the proportion of atoms of the element X is represented by the length of a perpendicular line 21 from the coordinate point to the subtense of the vertex X, i.e., to a side YZ. Therefore, the coordinate point R in FIGS. 3A and 3B represents that the atomic ratio of the element X to the element Y and the element Z is the ratio of the length of the perpendicular line 21 to the length of a perpendicular line 22 and the length of a perpendicular line 23, that is, x:y:z=4:2:1. Furthermore, an intersection point of the side YZ with a line passing through the vertex X and the coordinate point R is denoted by γ. Assuming that the ratio of the length of a line Yγ to the length of a line γZ is Yγ:γZ, Yγ:γZ corresponds to (the number of atoms of the element Z):(the number of atoms of the element Y).

As shown in FIG. 3B, three lines each of which passes through the coordinate point R and is parallel to any of the three sides of the triangle are drawn. By using intersection points of the three lines and the three sides, x, y, and z can be represented as shown in FIG. 3B.

FIGS. 1A and 1B and FIGS. 2A and 2B show the range of the atomic ratio of indium to the element M and zinc of the oxide semiconductor film. Here, FIGS. 1A and 1B and FIGS. 2A and 2B show an example in which the element M is Ga. Note that the proportion of oxygen atoms is not shown in FIGS. 1A and 1B and FIGS. 2A and 2B.

For example, as disclosed in Non-Patent Document 1, it is known that there is a homologous series represented by $InMO_3(ZnO)_m$ (i is a natural number) as one of oxides containing indium, the element M, and zinc. Here, for example, the case where the element M is Ga is considered. It is known that ranges denoted by thick lines in FIGS. 1A and 1B allow single-phase solid solution range when powders of $In_2O_3$, $Ga_2O_3$, and ZnO are mixed at any ratio within the ranges in FIGS. 1A and 1B and sintered at 1350° C. Coordinates denoted by square symbols correspond to known compositions with which a spinel crystal structure is likely to be mixed.

For example, a compound represented by $ZnM_2O_4$, such as $ZnGa_2O_4$, is known as having a spinel crystal structure, for example. Furthermore, for example, Non-Patent Document 1 discloses that when a composition is in the neighborhood of $ZnGa_2O_4$ as illustrated in FIGS. 1A and 1B, that is, the ratio of x to y and z is close to 0:1:2, a spinel crystal structure is likely to be formed or mixed.

Here, the oxide semiconductor film is preferably a CAAC-OS film. Furthermore, it is preferable that the CAAC-OS have no spinel crystal structure in particular. In addition, to increase carrier mobility, the indium content is preferably increased. In an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

Figure 1B:
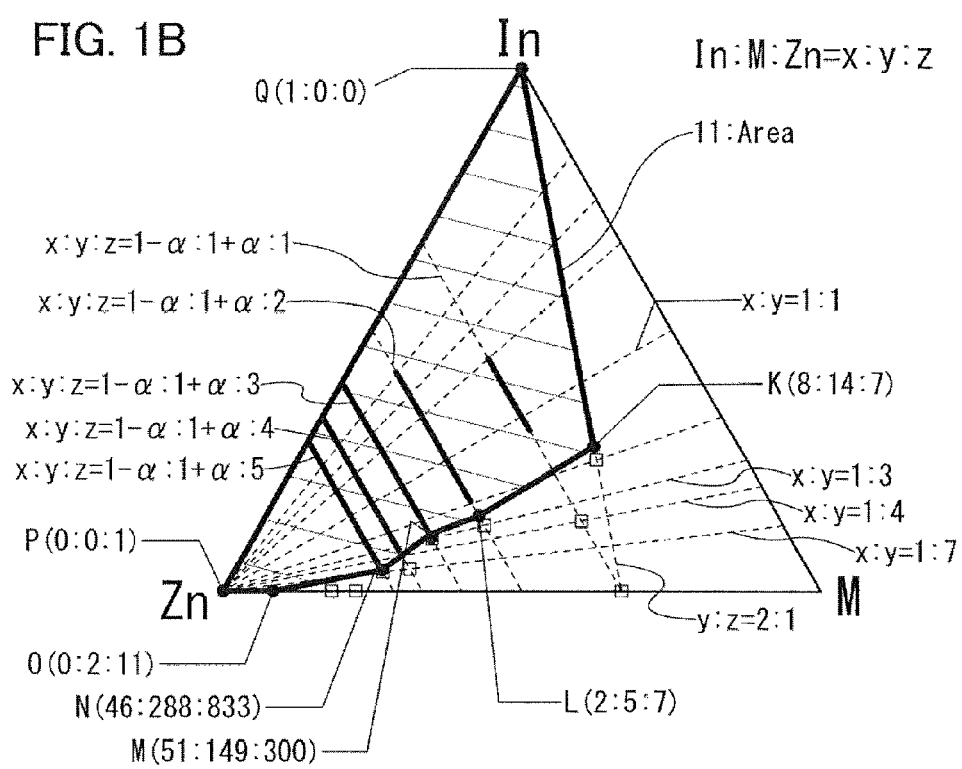

Accordingly, the atomic ratio of indium to the element M and zinc, x:y:z, of the oxide semiconductor film is preferably within the range of an area 11 shown in FIG. 1B, for example. Here, the area 11 includes atomic ratios within the range of an area surrounded by line segments that connect first coordinates K (x:y:z=8:14:7), second coordinates L (x:y:z=2:5:7), third coordinates M (x:y:z=51:149:300), fourth coordinates N (x:y:z=46:288:833), fifth coordinates O (x:y:z=0:2:11), sixth coordinates P (x:y:z=0:0:1), seventh coordinates Q (x:y:z=1:0:0) and the first coordinates K, in this order. Note that the area 11 also includes coordinates positioned on the line segments.

When x:y:z is within the area 11 in FIG. 1B, a spinel crystal structure is not observed or is hardly observed by nanobeam electron diffraction. Thus, an excellent CAAC-OS film can be obtained. Furthermore, carrier scattering or the like at the boundary between a CAAC structure and a spinel crystal structure can be reduced; therefore, when the oxide semiconductor film is used for a transistor, the transistor can have high field-effect mobility. In addition, the transistor can have high reliability.

Here, to further increase the CAAC proportion of the oxide semiconductor film, the proportion of zinc atoms is preferably increased. In FIGS. 1A and 1B and FIGS. 2A and 2B, ranges in which the atomic ratio of indium to the element M and zinc, x:y:z, satisfies Formula (1) are indicated by dotted lines.

[Formula 1]

$$x{:}y{:}z=(1-\alpha){:}(1+\alpha){:}m \quad (-1\leq\alpha\leq1) \qquad (1)$$

Here, FIGS. 1A and 1B and FIGS. 2A and 2B show the cases where m is 1, 2, 3, 4, and 5. The thick lines in FIGS. 1A and 1B, for example, indicate the ranges in which when the element M is gallium, the In—Ga—Zn oxide can have a single-phase solid solution range. For example, when the atomic ratio of an In—Ga—Zn oxide is within the range which allows a solid solution range, the CAAC proportion can be further increased. The range which allows a solid solution range tends to be widened when the ratio of the number of zinc atoms to the total number of indium and gallium atoms is increased. Therefore, when the ratio of the number of zinc atoms to the total number of indium and gallium atoms is increased, the CAAC proportion of the oxide semiconductor film can be increased in some cases.

Here, the ranges indicated by the thick lines in FIGS. 1A and 1B, that is, the ranges which allow a solid solution range are represented by Formulae 2 to 6 where m is 1 to 5.

[Formula 2]

$$x{:}y{:}z=(1-\alpha){:}(1+\alpha){:}1 \quad (-0.33\leq\alpha\leq+0.08) \qquad (2)$$

[Formula 3]

$$x{:}y{:}z=(1-\alpha){:}(1+\alpha){:}2 \quad (-0.68\leq\alpha\leq+0.32) \qquad (3)$$

[Formula 4]

$$x{:}y{:}z=(1-\alpha){:}(1+\alpha){:}3 \quad (-1\leq\alpha\leq+0.46) \qquad (4)$$

[Formula 5]

$$x{:}y{:}z=(1-\alpha){:}(1+\alpha){:}4 \quad (-1\leq\alpha\leq+0.54) \qquad (5)$$

[Formula 6]

$$x{:}y{:}z=(1-\alpha){:}(1+\alpha){:}5 \quad (-1\leq\alpha\leq+0.72) \qquad (6)$$

Therefore, to further increase the CAAC proportion of the oxide semiconductor film, the atomic ratio of indium to the element M and zinc, x:y:z, of the oxide semiconductor film is preferably within the range of an area 12 shown in FIG. 2A, and further preferably within the range of an area 13 shown in FIG. 2B. Here, the area 12 and the area 13 are preferable because they are included in the area 11 and thus a region in which a spinel crystal structure is observed in the oxide semiconductor film can be eliminated or reduced.

Here, the area 12 includes atomic ratios within the range of an area surrounded by line segments that connect first coordinates A (x:y:z=2:2:1), second coordinates B (x:y:z=23:27:25), third coordinates C (x:y:z=8:12:35), fourth coordinates D (x:y:z=4:0:7), fifth coordinates E (x:y:z=2:0:3), sixth coordinates F (x:y:z=7:1:8), seventh coordinates G (x:y:z=15:5:8), and the first coordinates A, in this order. Note that the area 12 also includes coordinates on the line segments.

Furthermore, the area 13 includes atomic ratios within the range of an area surrounded by line segments that connect first coordinates H (x:y:z=35:20:22), second coordinates I (x:y:z=7:4:11), third coordinates J (x:y:z=5:1:6), fourth coordinates U (x:y:z=25:10:14), and the first coordinates H, in this order. Note that the area 13 includes coordinates positioned on the line segments. For example, to increase carrier mobility, it is preferable to increase the proportion of indium atoms. For example, x is preferably greater than or equal to 1.75 times as large as y.

It is further preferable that x, y, and z satisfy the relation represented by Formula 1 or Formulae 2 to 6 within the ranges of the areas 12 and 13, in which case the CAAC proportion may be increased, in particular. Here, the values of x, y, z may deviate from values satisfying Formulae 1 to 6 by approximately 10%, for example. In the case where $x{:}y{:}z=x_1{:}y_1{:}z_1$ satisfies Formula 1, the values of x, y, and z are preferably $0.9\times x_1 \leq x \leq 1.1\times x_1$, $0.9\times y_1 \leq y \leq 1.1\times y_1$, and $0.9\times z_1 \leq z \leq 1.1\times z_1$, for example.

According to one embodiment of the present invention, an oxide semiconductor film having a high CAAC proportion can be obtained. That is, a good-quality CAAC-OS film can be obtained. Furthermore, according to one embodiment of the present invention, a CAAC-OS film having no or a very small region in which a spinel crystal structure is observed can be obtained. Here, the CAAC proportion is preferably higher than or equal to 95%, further preferably higher than or equal to 97% and lower than or equal to 100%.

In the case where the oxide semiconductor film is formed by a sputtering method, a film having an atomic ratio deviated from the atomic ratio of the target is formed in some cases. Especially for zinc, the proportion of zinc atoms of a deposited film is smaller than that of zinc atoms of the target in some cases. Specifically, the proportion of zinc atoms of the film may be approximately 40% to 90% of the proportion of zinc atoms of the target. The target used here is preferably polycrystalline.

Here, results of investigation on the relation between the atomic ratio of a target and the atomic ratio of an oxide semiconductor film obtained by a sputtering method, regarding to indium, gallium, and zinc, are described. The atomic ratios of targets in use and the atomic ratios of oxide semiconductor films obtained by a sputtering method are shown in Table 1.

TABLE 1

| Atomic ratio | Atomic ratio of film | | |
|---|---|---|---|
| In:Ga:Zn of target | In | Ga | Zn |
| 1:1:1 | 1 | 0.99 | 0.66 |
| 1:1:1.2 | 1 | 0.98 | 0.84 |
| 1:1:1.5 | 1 | 0.92 | 1.04 |
| 1:3:2 | 1 | 2.89 | 1.24 |
| 1:3:4 | 1 | 3.02 | 2.56 |
| 1:3:6 | 1 | 3.06 | 4.19 |
| 3:1:2 | 3 | 0.98 | 1.40 |
| 3:1:3 | 3 | 1.01 | 2.30 |

As for the deposition conditions, argon and oxygen were used as deposition gases and the flow rate percentage of oxygen was 33%. Here, the flow rate percentage of oxygen is expressed by (the flow rate of oxygen)÷((the flow rate of oxygen)+(the flow rate of argon))×100 [%]. In addition, the pressure was in the range of 0.4 Pa to 0.7 Pa, the substrate temperature was 200° C. to 300° C., and the power supply (DC) was 0.5 kW.

Figure 31A:
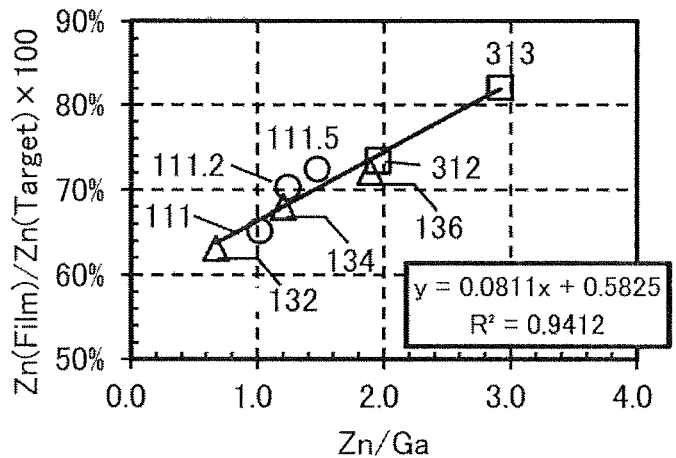
FIGS. 31A to 31C show the relation between the atomic ratio of a target and the atomic ratio of an oxide semiconductor film.
Figure 31B:
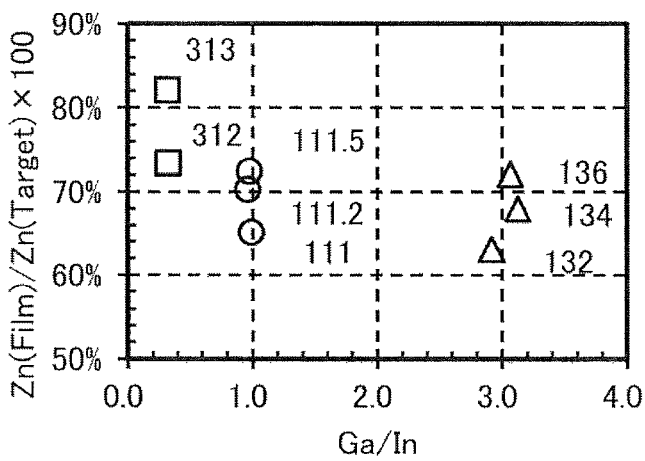
Figure 31C:
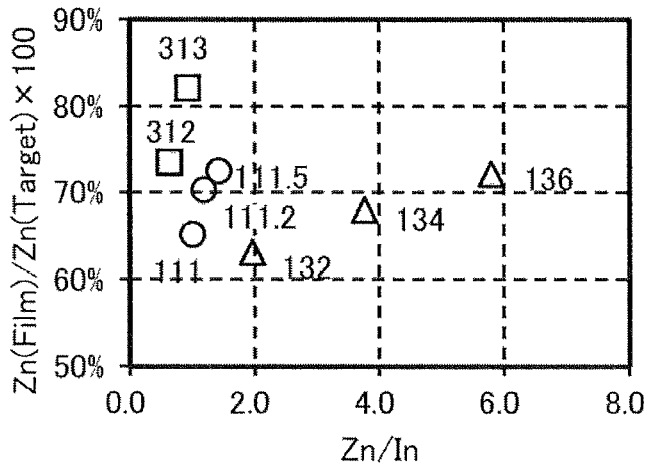

The concentrations of the elements in the oxide semiconductor films obtained by the targets having the atomic ratios were evaluated by inductively coupled plasma mass spectrometry (ICP-MS). FIGS. 31A to 31C each show the relation between the atomic ratio of the target and a percentage of remaining zinc. Numbers in FIGS. 31A to 31C each represent the atomic ratio of indium to gallium and zinc of the target, and the vertical axis represents the percentage of remaining zinc. Here, the percentage of remaining zinc is described. A value obtained by dividing the proportion of zinc atoms of a film obtained by deposition by the total proportion of indium, gallium, and zinc atoms of the film is referred to as Zn(Film). Furthermore, a value obtained by dividing the proportion of zinc atoms of the target by the total proportion of indium, gallium, and zinc atoms of the target is referred to as Zn(Target). Here, the percentage of remaining zinc (A) is defined as follows: A=Zn(Film)÷Zn(Target)×100 [%]. In FIG. 31A, the horizontal axis represents the atomic ratio of zinc to gallium (Zn/Ga) of the target, in FIG. 31B the horizontal axis represents the atomic ratio of gallium to indium (Ga/In) of the target, and in FIG. 31C, the horizontal axis represents the atomic ratio of zinc to indium (Zn/In) of the target. Furthermore, each vertical axis represents the percentage of remaining zinc (A).

Here, according to FIGS. 31A to 31C, the percentages of remaining zinc of the oxide semiconductor films obtained by a sputtering method are within the range of 50% to 90% approximately. In other words, the proportion of zinc atoms in the oxide semiconductor film is largely reduced as compared to that in the target. Furthermore, according to the atomic ratios of indium to gallium in Table 1, there is no large difference in the atomic ratio of indium to gallium between the oxide semiconductor film and the target as compared to zinc. In addition, for example, when the atomic ratio of zinc to gallium (Zn/Ga) is 1, 2, and 3, the percentage of remaining zinc (A) is approximately 66%, 74%, and 83%, respectively.

In addition, FIG. 31A indicates that there is a favorable correlation between the atomic ratio of zinc to gallium (z/y) of the target and the percentage of remaining zinc. That is, as the ratio of zinc to gallium becomes smaller, the remaining percentage is reduced.

Here, in the case where, x, y, and z of the atomic ratio of indium to gallium and zinc of the oxide semiconductor film satisfy Formula 1, the CAAC proportion of the oxide semiconductor film can be further increased in some cases.

Three examples of the atomic ratio satisfying Formula 1, that is, x:y:z=4:2:3, x:y:z=1.1:2.9:6, and x:y:z=1:2:3, are considered.

For example, in the case of x:y:z=4:2:3, the proportion of indium atoms can be twice as high as that of gallium atoms, so that the indium content can be high. Thus, high mobility can be obtained in some cases.

Furthermore, for example, in the case of x:y:z=1.1:2.9:6, Formula 1 is satisfied, the atomic ratio can be within the range indicated by the thick line in FIGS. 1A and 1B which allows a solid solution range, and thus a high CAAC proportion can be obtained in some cases, which is preferable. When the indium content is reduced, electron affinity can be reduced. For example, the oxide semiconductor film having an atomic ratio of x:y:z=1.1:2.9:6 has relatively small electron affinity because it has a lower indium content than an oxide semiconductor film having an atomic ratio in the area 12 or the area 13.

In a similar manner, for example, in the case of x:y:z=1:2:3, Formula 1 is satisfied, the atomic ratio can be within the range which allows a solid solution range, and thus a high CAAC proportion can be obtained in some cases, which is preferable. Furthermore, the oxide semiconductor film having an atomic ratio of x:y:z=1:2:3 has relatively small electron affinity because it has a lower indium content than an oxide semiconductor film having an atomic ratio in the area 12 or the area 13.

The atomic ratio of indium to gallium and zinc of the target are referred to as a:b:c. According to FIGS. 31A to 31C, an approximate formula showing the relation between the percentage of remaining zinc (A) and b and c, which is represented as Formula 7, is satisfied.

[Formula 7]

$$A[\%]=\{0.0811\times(c/b)+0.5825\}\times100 \quad (7)$$

Thus, assuming that the remaining percentage of each of indium and gallium is 100%, when an oxide semiconductor film is formed by a sputtering method using a target with In:Ga:Zn=a:b:c, the atomic ratio of the obtained oxide semiconductor film is x:y:z=a:b:$\{0.0811\times(c/b)+0.5825\}\times c$.

Here, when a target atomic ratio of indium to gallium and zinc of the obtained oxide semiconductor film is x:y:z=4:2:3, the proportion of zinc atoms c of the target may satisfies Formula 3. Note that a=x=4, b=y=2, and z=3.

[Formula 8]

$$3=\{0.0811\times(c/2)+0.5825\}\times c \quad (8)$$

Formula 8 is an quadratic equation of c, and the solutions thereof are 4.0234 and −18.3883. Here, a negative value is not appropriate, and thus, to achieve x:y:z=4:2:3, a:b:c is 4:2:4.

In a similar manner, when a target atomic ratio is x:y:z=1.1:2.9:6, a:b:c is preferably 1.1:2.9:7.7, and when a target atomic ratio is x:y:z=1:2:3, a:b:c is preferably 1:2:4.

In addition, for example, to obtain an oxide semiconductor film in the area 12 in FIG. 2A, the proportion of zinc atoms of the target is preferably larger than any of the proportions of zinc atoms in the area 12 in FIG. 2A. Here, the atomic ratio of indium to the element M and zinc of the target is referred to as a:b:c. In order that the atomic ratio of indium to the element M and zinc of the oxide semiconductor film obtained by a sputtering method is x:y:z, in the case of c/b=1, for example, the value of c/(a+b+c) may be approximately 1.5 times as large as z/(x+y+z) (100÷66=1.51); in the case of c/b=2, for example, the value of c/(a+b+c) may be approximately 1.35 times as large as z/(x+y+z) (100÷74=1.35); and in the case of c/b=3, for example, the value of c/(a+b+c) may be approximately 1.20 times as large as z/(x+y+z) (100÷83=1.20).

It is preferable that the atomic ratio of the oxide semiconductor film be within the range of the area 12 to further increase the CAAC proportion.

Therefore, to obtain an oxide semiconductor film having a higher CAAC proportion, as for the atomic ratio of the target, in the case of c/b≥2, for example, the value of c/(a+b+c) may be approximately 1.4 times as large as z/(x+y+z). Specifically, the atomic ratio of the target is preferably any of the values within the range of an area 14 in FIG. 4. Here, the area 14 includes atomic ratios within the range of an area surrounded by line segments that connect first coordinates A (a:b:c=2:2:1), second coordinates B (a:b:c=23:27:25), third coordinates C (a:b:c=2:4:15), fourth coordinates T (a:b:c=2:0:5), fifth coordinates E (a:b:c=2:0:3), sixth coordinates F (a:b:c=7:1:8), seventh coordinates G (a:b:c=15:5:8), and the first coordinates A, in this order. Note that the area 14 also includes coordinates on the line segments.

Here, the oxide semiconductor film of one embodiment of the present invention may be formed of stacked films. Furthermore, the films may differ in the CAAC proportion. In addition, at least one of the stacked films preferably has a CAAC proportion of higher than 90%, further preferably higher than or equal to 95%, still further preferably higher than or equal to 97% and lower than or equal to 100%.

Here, the film density of an oxide semiconductor film is described below.

[Evaluation Results of Film Density]

A CAAC-OS film has a plurality of crystal parts with c-axis alignment and no clear grain boundaries are observed between the crystal parts, and thus the CAAC-OS film can be dense. Although described in detail in an example later, when the film density of a CAAC-OS film formed by a sputtering method using an In—Ga—Zn oxide target having an atomic ratio of In:Ga:Zn=1:1:1 and the film density of a CAAC-OS film formed by a sputtering method using an In—Ga—Zn oxide target having an atomic ratio of In:Ga:Zn=2:1:3 were evaluated, both films had a film density of approximately 6.3 g/cm³. The following conditions were used: the flow rate percentage of oxygen was 33% and the substrate temperature at deposition was higher than or equal to 200° C. and lower than or equal to 300° C. In addition, the film density was obtained by X-ray reflectivity (XRR).

An oxide semiconductor film may have low density depending on formation conditions. Furthermore, with a reduction in film density, the film might have what is called a void. Here, the void is a region that has an extremely low density, or a space. Such a film has low crystallinity and an impurity is likely to be trapped therein; thus, it is difficult to obtain transistor characteristics with the film.

Here, the film density of a film having a large number of voids is described. For example, when deposition is performed by a sputtering method under the conditions where the oxygen flow rate percentage and the substrate temperature are low, a film having a large number of voids can be formed. Oxide semiconductor films were formed by a sputtering method under conditions shown in Table 2. An In—Ga—Zn oxide target having an atomic ratio of In:Ga:Zn=1:1:1 was used. An RF power source was used as a power source.

TABLE 2

| | | Gas flow rate | | Substrate | |
| | Power | Ar [sccm] | $O_2$ [sccm] | temperature [° C.] | Pressure [Pa] |
|---|---|---|---|---|---|
| Condition C | 100 W | 98 | 2 | Room temperature | 1.0 |
| Condition D | 100 W | 98 | 2 | Room temperature | 0.4 |

A deposition rate of Condition C in Table 2 was 0.48 nm/min, and a deposition rate of Condition D in Table 2 was 1.78 nm/min.

Table 3 shows measurement results of the film densities of the oxide semiconductor films formed under Conditions C and D in Table 2.

TABLE 3

| | Film density [g/cm³] |
|---|---|
| Condition C | 5.57 |
| Condition D | 6.10 |

In each of Conditions C and D, the film density tended to be low. This is probably because the oxygen flow rate percentage is as low as 2% and the deposition temperature is low. Furthermore, the film density was lower in Condition C in which the deposition pressure was higher than that in Condition D.

[Hydrogen Concentration of Film]

Figure 32:
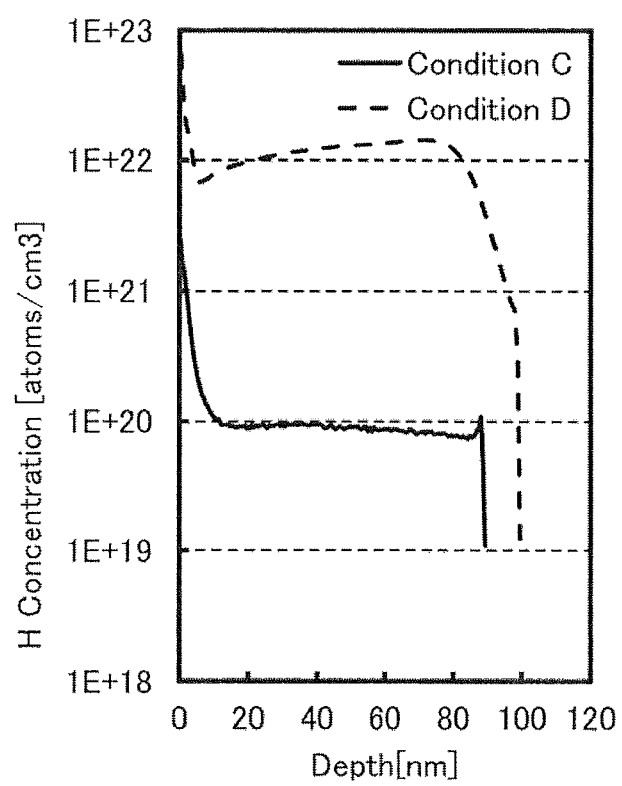
FIG. 32 shows SIMS analysis results of oxide semiconductor films.

Next, the hydrogen concentrations of the oxide semiconductor films formed under Conditions C and D are shown in FIG. 32. The hydrogen concentration is noticeably high in Condition C.

Figure 33A:
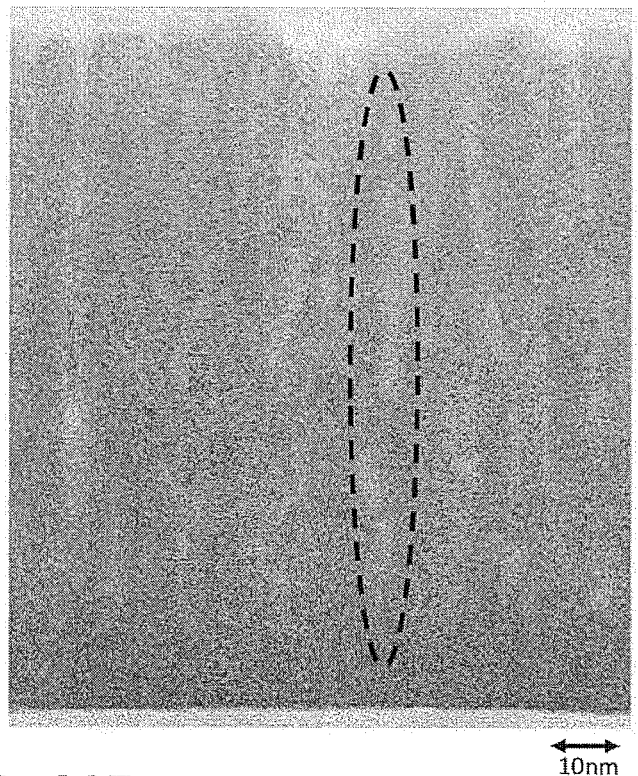
FIGS. 33A and 33B show observations of an oxide semiconductor film by cross-sectional TEM.
Figure 33B:
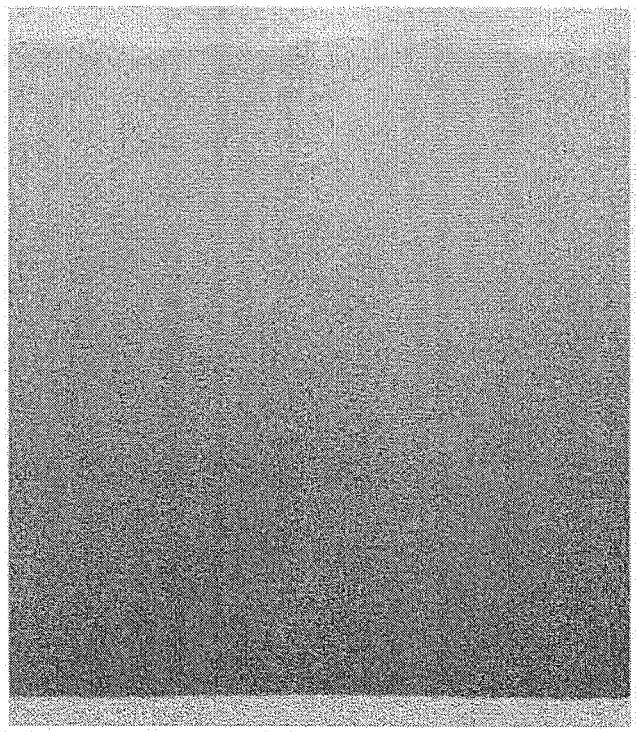

FIGS. 33A and 33B show cross-sectional TEM images of the oxide semiconductor films formed under Conditions C and D, respectively. In Condition C, a sparse area, what is called a void, was observed. An example of a region including the void is surrounded by a dotted line.

Figure 34A:
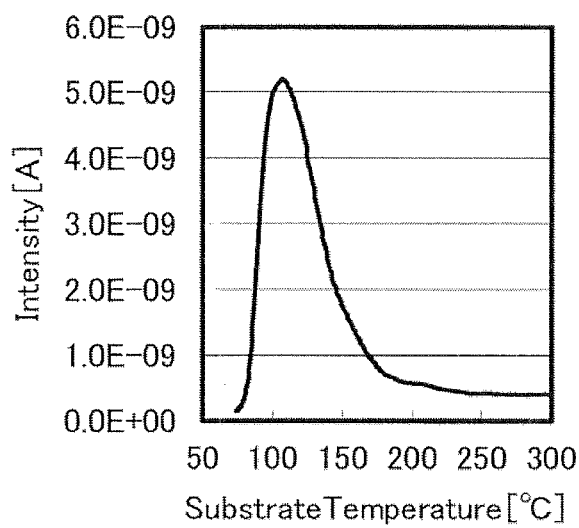
FIGS. 34A and 34B show TDS analysis results of oxide semiconductor films.
Figure 34B:
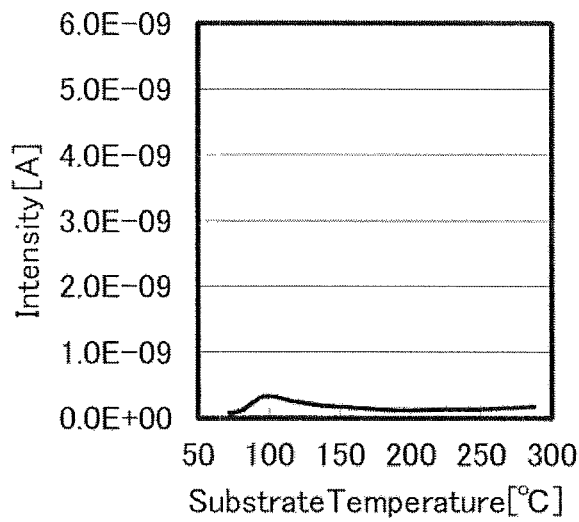

FIGS. 34A and 34B show analysis results of thermal desorption spectroscopy (TDS) of the oxide semiconductor films formed under Conditions C and D. The amount of released molecules having a molecule weight of 18 is shown in FIGS. 34A and 34B. FIGS. 34A and 34B show results of the film formed under Condition C and the film formed under Condition D, respectively. In the oxide semiconductor film having a low film density formed under Condition C, release of molecules having a molecule weight of 18 in TDS analysis is significantly observed, which indicates that the release of molecules corresponds to release of $H_2O$, i.e., moisture. That is, the amount of moisture adsorbed on the film is large.

Figure 35A:
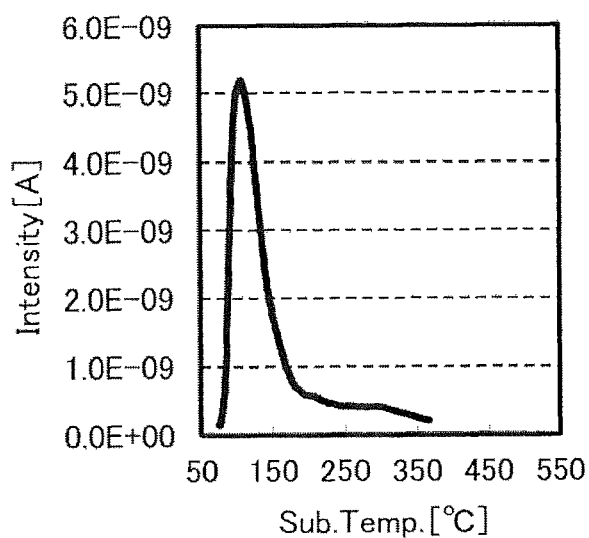
FIGS. 35A and 35B show TDS analysis results of oxide semiconductor films.
Figure 35B:
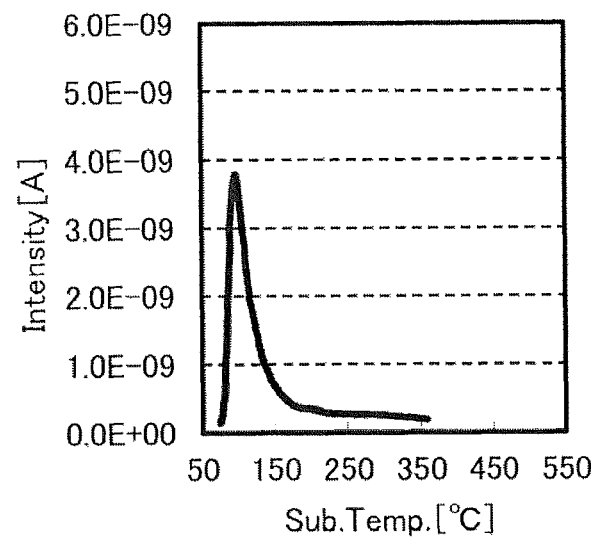
Figure 36B:
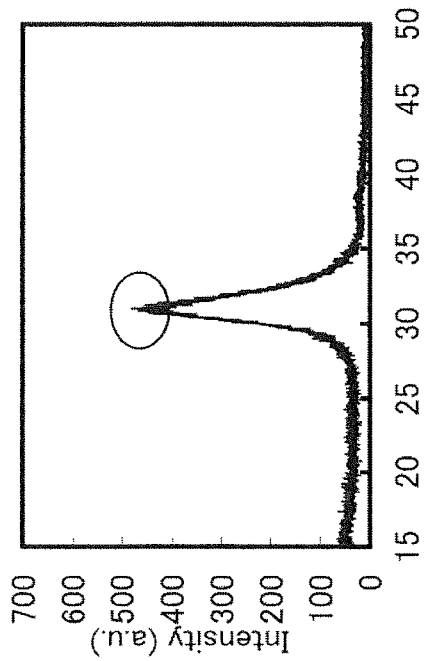
FIGS. 36A to 36D show results of XRD evaluation in oxide semiconductor films of one embodiment of the present invention.
Figure 36D:
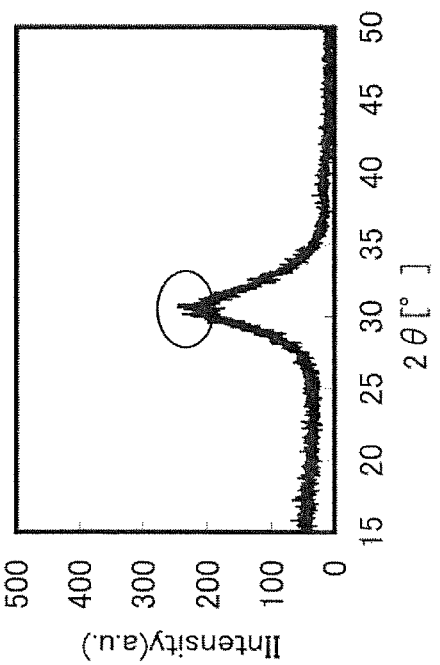
Figure 36A:
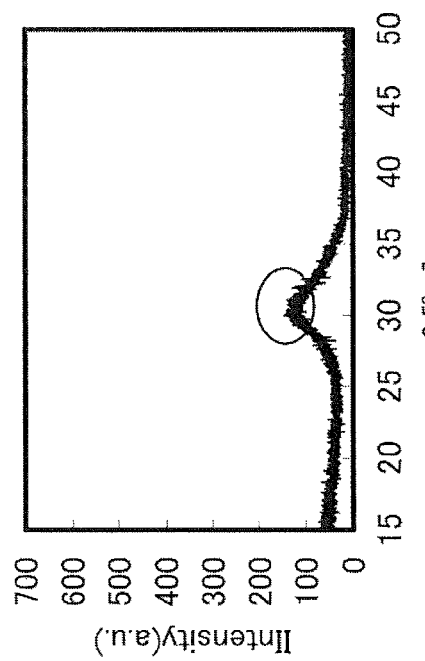
Figure 36C:
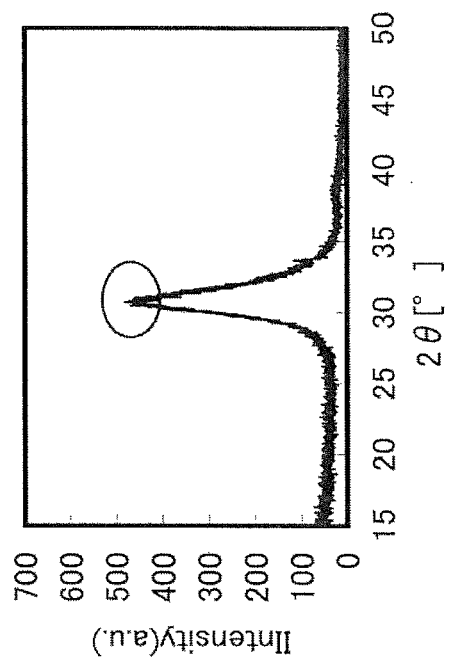

To verify adsorption of moisture more in detail, after the TDS analysis, the oxide semiconductor film formed under Condition C was left in the air for 24 hours under the conditions where the average temperature was 24° C. and the average humidity was 61%, and then TDS analysis was performed again. The results are shown in FIGS. 35A and 35B. FIG. 35A shows results of the first analysis, and FIG. 35B shows results that was obtained after the film had been left in the air, that is, results of the second analysis. In the second analysis, a peak due to a molecule weight 18 was observed again. This result indicates that after moisture is released in the first TDS analysis, moisture is adsorbed again in the air. Accordingly, a low-density film that has voids is likely to adsorb moisture.

(Embodiment 2)

In this embodiment, an example of a transistor including an oxide semiconductor that is one embodiment of the present invention is described.

In a conventional transistor including silicon, germanium, or a compound thereof, in particular, in an element having a short channel length, it is preferable that a gate electric field be strengthened in order to reduce a short-channel effect, and the thickness of a gate insulating film is preferably reduced in order to strengthen the gate electric field.

In contrast, a transistor including an oxide semiconductor film is an accumulation-type transistor in which electrons are majority carriers. Therefore, drain-induced barrier lowering (DIBL) as a short-channel effect is less likely to occur than in an inversion-type transistor having a pn junction. In other words, the transistor including an oxide semiconductor film is resistant to a short-channel effect.

The transistor including an oxide semiconductor film can have a thicker gate insulating film than a conventional transistor including silicon or the like because of its high resistance to a short-channel effect. For example, a minute transistor having channel length and width of 50 nm or less can have a gate insulating film with a thickness as large as approximately 10 nm. Here, when the gate insulating film is thick, parasitic capacitance can be small. Thus, dynamic behavior of a circuit may be improved. Furthermore, when the gate insulating film is thick, leakage current and power consumption may be low.

Furthermore, a drain electric field is strengthened with a reduction in the channel length; thus, a reduction in reliability due to hot-carrier degradation noticeably occurs in a conventional transistor that includes silicon or the like, in particular, a transistor having a short channel width. In contrast, avalanche breakdown or the like is less likely to occur in some cases in the transistor including an oxide semiconductor film than in a conventional transistor including silicon or the like, because, for example, an oxide semiconductor has a wide bandgap (e.g., an oxide semiconductor containing indium, gallium, and zinc has a bandgap of 2.5 eV or more) and thus electrons are less likely to be excited, and the effective mass of a hole is large. Therefore, it may be possible to inhibit hot-carrier degradation due to avalanche breakdown, for example.

When the gate insulating film is thick, the withstand voltage of the gate insulating film can be increased, so that the transistor can be driven at a higher gate voltage. In addition, hot-carrier degradation is inhibited, whereby the transistor can be driven at a high drain voltage without lengthening of the channel length. Thus, the reliability of the transistor in a circuit supplied with high voltage can be increased, and the channel length can be reduced, so that the integration degree of the circuit can be increased.

In a transistor including an intrinsic or substantially intrinsic oxide semiconductor film, when the distance between the source electrode and the drain electrode is sufficiently short, the valence band minimum is low because of the electric fields of the source and the drain, so that the valence band minimum is close to the Fermi level. This phenomenon is called a conduction band lowering (CBL) effect. Owing to the CBL effect, a drain current starts to flow at a low voltage that is close to 0 V in the Vg-Id characteristics, so that the driving voltage of the transistor may be reduced.

Here, a CAAC-OS film is preferably used as the oxide semiconductor film. It is preferable that the CAAC-OS film have a high CAAC proportion. An increase in the CAAC proportion enables, for example, a reduction in influence of carrier scattering in the transistor, resulting in high field-effect mobility. Furthermore, the influence of a grain boundary can be reduced; as a result, variation in on-state characteristics of the transistor can be reduced. Thus, a highly reliable semiconductor device can be obtained. Furthermore, use of the transistor with small variation can reduce driving voltage to reduce power consumption. In addition, for example, a CAAC-OS film having a low density of defects can be obtained. Alternatively, a CAAC-OS film with a small amount of impurities can be obtained. A reduction in the density of defects makes it possible to obtain extremely low off-stat current characteristics, for example.

[Transistor Including Oxide Semiconductor Film]

An example of a transistor including an oxide semiconductor film is described with reference to FIGS. 5A to 5C.

Figure 5A:
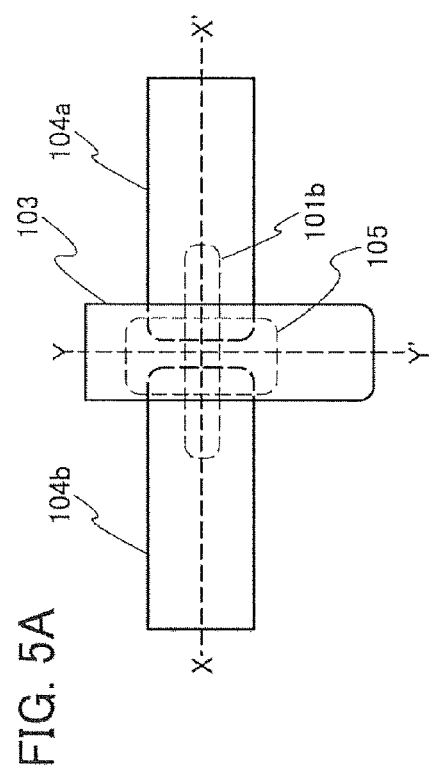
FIGS. 5A to 5C illustrate an example of a transistor of one embodiment of the present invention.

FIG. 5A is a top view of a transistor 100. FIG. 5B shows a cross section taken along dashed dotted line X-X' in FIG. 5A, and FIG. 5C is a cross section taken along dashed dotted line Y-Y' in FIG. 5A. The transistor 100 in FIGS. 5A to 5C includes a semiconductor layer 101, conductive layers 104a and 104b, a gate insulating film 102 over the semiconductor layer 101, and a gate electrode 103 overlapping the semiconductor layer 101 with the gate insulating film 102 positioned therebetween. The transistor 100 is covered with an insulating film 112 and an insulating film 113. Furthermore, the transistor 100 may include a conductive layer 105. Here, it is preferable that the transistor 100 be provided over the substrate 50 as illustrated in FIGS. 5A to 5C. Furthermore, an insulating film 51 in contact with the top surface of the substrate 50 and an insulating film 114 in contact with the top surface of the insulating film 51 may be provided between the substrate and the transistor 100. In FIGS. 5A to 5C, the semiconductor layer 101 is in contact with the top surface of the insulating film 114. The insulating film is not necessarily provided between the substrate 50 and the insulating film 114.

Figure 5B:
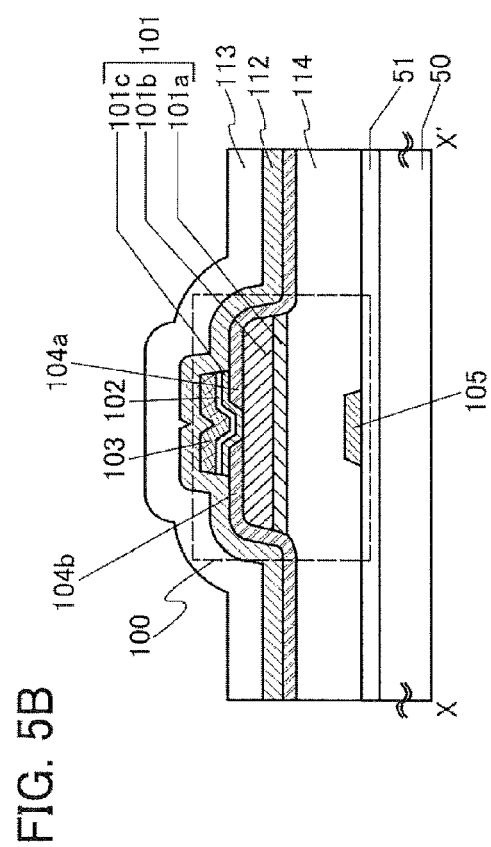
Figure 5C:
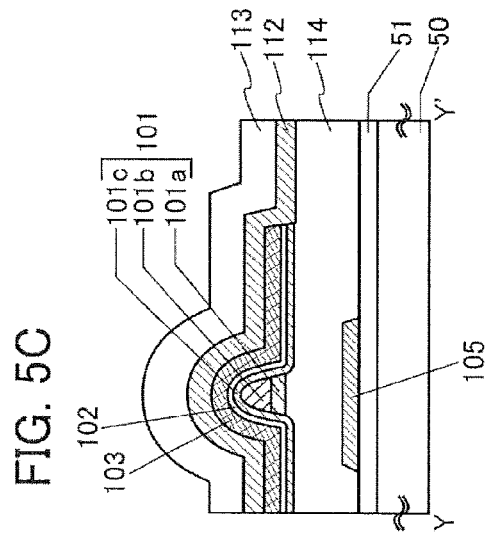

The semiconductor layer 101 may be formed of a single layer but is preferably formed with a stacked-layer structure of a semiconductor layer 101a, a semiconductor layer 101b, and a semiconductor layer 101c, as in the example illustrated in FIGS. 5A to 5C. In such a case, the transistor 100 in FIGS. 5A to 5C includes the semiconductor layer 101a, the semiconductor layer 101b in contact with the top surface of the semiconductor layer 101a, the conductive layers 104a and 104b that are in contact with the top surface of the semiconductor layer 101b and are apart from each other in a region overlapping the semiconductor layer 101b, the semiconductor layer 101c in contact with the top surface of the semiconductor layer 101b, the insulating film 102 over the semiconductor layer 101c, and the gate electrode 103 overlapping the semiconductor layer 101b with the gate insulating film 102 and the semiconductor layer 101c positioned therebetween. The semiconductor layer 101a is provided between the insulating film 114 and the semiconductor layer 101b. The semiconductor layer 101c is provided between the semiconductor layer 101b and the gate insulating film 102. The conductive layer 104a and the conductive layer 104b are in contact with the top surface of the semiconductor layer 101b and the bottom surface of the semiconductor layer 103c.

The conductive layer 104a and the conductive layer 104b function as a source electrode and a drain electrode. A voltage lower or higher than that of the source electrode may be applied to the conductive layer 105 so that the threshold voltage of the transistor may be shifted in the positive or negative direction. For example, by shifting the threshold voltage of the transistor in the positive direction, a normally-off transistor in which the transistor is in a non-conduction state (off state) when the gate voltage is 0 V can be achieved in some cases. Note that the voltage applied to the conductive layer 105 may be variable or fixed. In the case where a variable voltage is applied to the conductive layer 105, a circuit for controlling the voltage may be connected to the conductive layer 105. Furthermore, the conductive layer 105 may be connected to the gate electrode 103.

As for the conductive layers 104a and 104b provided in the transistor, it is possible to use a conductive material which is easily bonded to oxygen, such as tungsten, titanium, aluminum, copper, molybdenum, chromium, or tantalum, or an alloy thereof. As a result, oxygen contained in the semiconductor layer 101 is bonded to the conductive material in the conductive layers 104a and 104b, whereby an oxygen-vacancy region is formed in the semiconductor layer 101. In addition, part of the constituent elements of the conductive material included in the conductive layers 104a and 104b might be mixed in the semiconductor layer 101. As a result, a first low-resistance region and a second low-resistance region are formed in the vicinities of regions of the semiconductor layer 101 in contact with the conductive layers 104a and 104b. Since the first low-resistance region and the second low-resistance region have high conductivity, contact resistance between the semiconductor layer 101 and the conductive layers 104a and 104b can be reduced, so that on-state current of the transistor can be increased.

Note that end portions of the first and second low-resistance regions may be substantially aligned with end portions of the conductive layers 104a and 104b. Alternatively, the end portions of the first and second low-resistance regions may be on the inner side than the end portions of the conductive layers 104a and 104b. In the case where the first and second low-resistance regions are formed in the semiconductor layer 101, the channel length corresponds to the distance between the first low-resistance region and the second low-resistance region at the interface between the semiconductor layer 101 and the gate insulating film 102.

As the semiconductor layer 101b, an oxide which has higher electron affinity than the semiconductor layer 101a and the semiconductor layer 101c is preferably used. For example, for the semiconductor layer 101b, an oxide having an electron affinity higher than that of each of the semiconductor layer 101a and the semiconductor layer 101c by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the conduction band minimum.

An oxide which has higher electron affinity than the semiconductor layers 101a and 101c is used for the semiconductor layer 101b, whereby when an electric field is applied to the gate electrode, a channel is formed in the semiconductor layer 101b that has the highest electron affinity among the semiconductor layers 101a, 101b, and 101c. Here, when the channel is formed in the semiconductor layer 101b, for example, the channel formation region is apart from the interface with the gate insulating film 102; as a result, influence of scattering at the interface with the gate insulating film can be reduced. Thus, the field effect mobility of the transistor can be increased. Here, as described later, the semiconductor layer 101b and the semiconductor layer 101c have the common constituent element and thus interface scattering hardly occurs therebetween.

Furthermore, in the case where a silicon oxide film, a silicon oxynitride film, a silicon nitride oxide film, a silicon nitride film, or the like is used as the gate insulating film, silicon contained in the gate insulating film enters the oxide semiconductor film in some cases. When silicon is included in the oxide semiconductor film, a decrease in crystallinity of the oxide semiconductor film, a decrease in carrier mobility, or the like might occur. Therefore, to reduce the impurity concentration, for example, the silicon concentration, of the semiconductor layer 101b where the channel is formed, it is preferable that the semiconductor layer 101c be provided between the semiconductor layer 101b and the gate insulating film. For a similar reason, to reduce influence of an impurity diffused from the insulating film 114, it is preferable that the semiconductor layer 101a be provided between the semiconductor layer 101b and the insulating film 114.

The oxide semiconductor layer 101b is an oxide semiconductor containing indium, for example. The oxide semiconductor layer 101b has a high carrier mobility (electron mobility) by containing indium, for example. The oxide semiconductor layer 101b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Further, the oxide semiconductor layer 101b preferably contains zinc. When the oxide semiconductor contains zinc, the oxide semiconductor is easily to be crystallized, for example.

For the semiconductor layer 101b, an oxide with a wide energy gap is used. The energy gap of the semiconductor layer 101b is, for example, larger than or equal to 2.5 eV and smaller than or equal to 4.2 eV, preferably larger than or equal to 2.7 eV and smaller than or equal to 3.7 eV, further preferably larger than or equal to 2.8 eV and smaller than or equal to 3.3 eV.

Here, a CAAC-OS film is preferably used as the semiconductor layer 101b. Use of a CAAC-OS film makes it possible to obtain a transistor having small carrier scattering and high field-effect mobility. Furthermore, the CAAC proportion of the semiconductor layer 101b is preferably increased. For example, the CAAC proportion is preferably higher than or equal to 90%, further preferably higher than or equal to 95%, still further preferably higher than or equal to 97% and lower than or equal to 100%.

Next, the semiconductor layer 101a and the semiconductor layer 101c are described. For example, the semiconductor layer 101a and the semiconductor layer 101c are each an oxide semiconductor which includes one or more kinds of elements other than oxygen that are included in the semiconductor layer 101b. Since the semiconductor layer 101a and the semiconductor layer 101c are each formed using one or more kinds of elements other than oxygen that are included in the semiconductor layer 101b, interface states are less likely to be formed at the interface between the semiconductor layer 101a and the semiconductor layer 101b and the interface between the semiconductor layer 101b and the semiconductor layer 101c.

Here, CAAC-OS films are preferably used as the semiconductor layers 101a and 101c.

For example, when a CAAC-OS film having a plurality of crystal parts with c-axis alignment is used as the semiconductor layer 101a, the semiconductor layer 101b formed thereover can have a region with favorable c-axis alignment even in the vicinity of the interface with the semiconductor layer 101a.

In addition, by an increase in the CAAC proportion of the CAAC-OS film, defects can be reduced, for example. Furthermore, for example, an area having a spinel structure can be reduced. Moreover, for example, carrier scattering can be reduced. In addition, the CAAC-OS film can be a film having a high blocking property against impurities. Accordingly, when the CAAC proportion of each of the semiconductor layers 101a and 101c is increased, a favorable interface with the semiconductor layer 101b where the channel is formed can be formed, so that carrier scattering can be low. Furthermore, mixing of impurities to the semiconductor layer 101b can be prevented; as a result, the impurity concentration of the semiconductor layer 101b can be reduced.

Figure 20A:
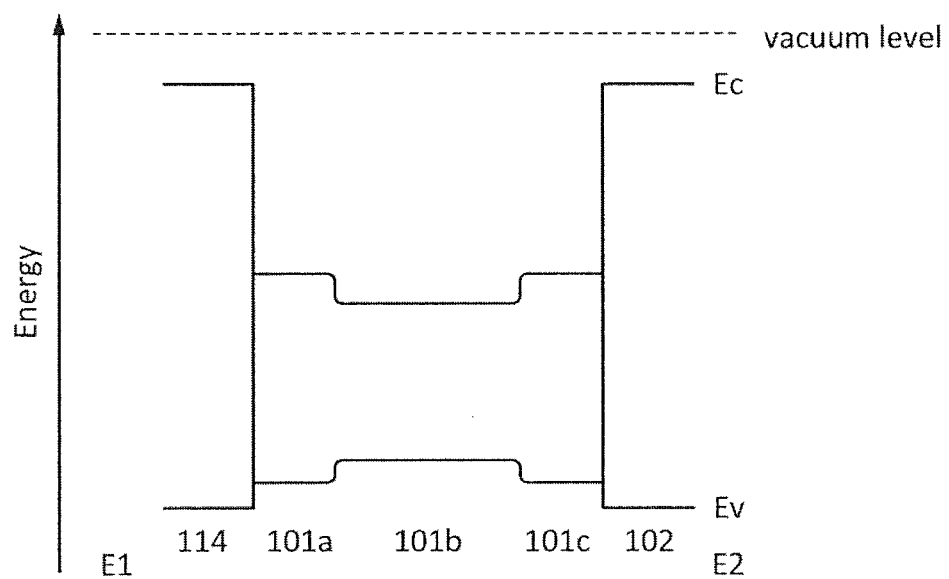

FIG. 20A illustrates a band structure. FIG. 20A shows a vacuum level (denoted by vacuum level), and the conduction band minimum (denoted by Ec) and the valence band maximum (denoted by Ev) of each of the layers.

Here, a mixed region of the semiconductor layer 101a and the semiconductor layer 101b might exist between the semiconductor layer 101a and the semiconductor layer 101b. Furthermore, a mixed region of the semiconductor layer 101b and the semiconductor layer 101c might exist between the semiconductor layer 101b and the semiconductor layer 101c. The mixed region has a low density of interface states. For that reason, the stack including the semiconductor layers 101a, 101b, and 101c has a band structure where energy at each interface and in the vicinity of the interface is changed continuously (continuous junction).

Note that FIG. 20A illustrates the case where the Ec of the semiconductor layer 101a and the Ec of the semiconductor layer 101c are equal to each other; however, they may be different from each other. For example, Ec of the semiconductor layer 101c may be higher than Ec of the semiconductor layer 101a.

Figure 20B:
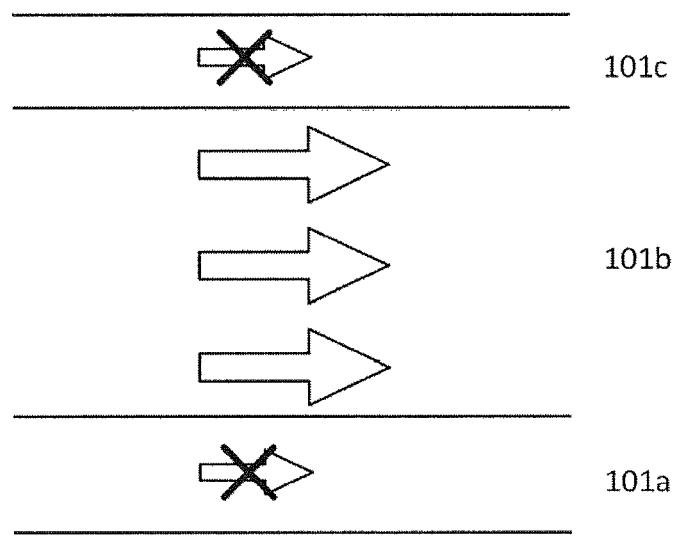

At this time, electrons mainly move not in the semiconductor layer 101a and the semiconductor layer 101c but in the semiconductor layer 101b (see FIG. 20B). As described above, when the interface state density at the interface between the semiconductor layer 101a and the semiconductor layer 101b and the interface state density at the interface between the semiconductor layer 101b and the semiconductor layer 101c are lowered, the on-state current of the transistor can be increased without interruption of the movement of electrons in the semiconductor layer 101b.

As illustrated in FIG. 5B, the side surface of the semiconductor layer 101b is in contact with the conductive layer 104a and the conductive layer 104b. Furthermore, as illustrated in FIG. 5C, the semiconductor layer 101b can be electrically surrounded by an electric field of the gate electrode 103 (a structure in which a semiconductor is electrically surrounded by an electric field of a conductor is referred to as a surrounded channel (s-channel) structure). Therefore, a channel is formed in the entire semiconductor layer 101b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a top surface of a semiconductor is higher than the proportion of a channel region formed in a side surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Here, the example illustrated in FIGS. 5A to 5C in which a stack formed of three layers, i.e., a stack formed of the semiconductor layers 101a, 101b, and 101c, is used as the oxide semiconductor is described; however, the oxide semiconductor that can be used to the transistor 100 may be formed of a single layer. Alternatively, a structure in which one or two of the semiconductor layer 101a, the semiconductor layer 101b, and the semiconductor layer 101c are not provided may be employed.

It is preferable that the semiconductor layer 101a, the semiconductor layer 101b, and the semiconductor layer 101c each preferably contain indium. In the case when the semiconductor layer 101a is an In-M-Zn oxide, when the summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. In the case where the semiconductor layer 101b is an In-M-Zn oxide, when the summation of In and M is assumed to be 100 atomic %, the proportions of In and M are preferably set to be greater than or equal to 25 atomic % and less than 75 atomic %, respectively, further preferably greater than or equal to 34 atomic % and less than 66 atomic %, respectively. In the case where the semiconductor layer 101c is an In-M-Zn oxide, when the summation of In and M is assumed to be 100 atomic %, the proportions of In and M are preferably set to be less than 50 atomic % and greater than or equal to 50 atomic %, respectively, further preferably less than 25 atomic % and greater than or equal to 75 atomic %, respectively. Note that the semiconductor layer 101c may be an oxide that is a type the same as that of the semiconductor layer 101a.

An indium gallium oxide has small electron affinity and a high oxygen-blocking property. Therefore, for example, the semiconductor layer 101c may include indium gallium oxide. The gallium atomic ratio [Ga/(In+Ga)] is, for example, higher than or equal to 70%, preferably higher than or equal to 80%, more preferably higher than or equal to 90%.

Here, for the semiconductor layer 101b, an oxide having an electron affinity higher than that of each of the semiconductor layer 101a and the semiconductor layer 101c by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is preferably used.

To obtain an excellent CAAC-OS film with a high CAAC proportion, for example, in the case where the semiconductor layer 101b includes indium, the element M, and zinc, the atomic ratio of indium to the element M and zinc, x:y:z, is preferably a value within the range of the area 12 in FIG. 2A, further preferably a value within the range of the area 13 in FIG. 2B.

Furthermore, the semiconductor layers 101a, 101b, and 101c preferably have no or a small amount of spinel crystal structures. Furthermore, the semiconductor layers 101a, 101b, and 101c are preferably CAAC-OS films.

Here, as a specific example, the case where the semiconductor layers 101a, 101b, and 101c are each formed of an oxide including indium, the element M, and zinc is considered. The atomic ratio of indium to the element M and zinc of the semiconductor layer 101a is represented as $x_a:y_a:z_a$. In a similar manner, the atomic ratio of indium to the element M and zinc of the semiconductor layer 101b is represented as $x_b:y_b:z_b$, and the atomic ratio of indium to the element M and zinc of the semiconductor layer 101c is represented as $x_c:y_c:z_c$.

Furthermore, the semiconductor layers 101a and 101c preferably have no or a small amount of spinel crystal structures. Therefore, $x_a:y_a:z_a$ and $x_c:y_c:z_c$ are preferably within the range of the area 11 in FIG. 1B, for example. As the semiconductor layer 101b, an oxide which has higher electron affinity than the semiconductor layer 101a and the semiconductor layer 101c is preferably used.

Accordingly, it is preferable that, for example, $x_a:y_a:z_a$ and $x_c:y_c:z_c$ be values within the range of the area 11 so that the semiconductor layers 101a and 101c each have lower electron affinity than the semiconductor layer 101b.

Here, in order that the semiconductor layer 101b has higher electron affinity than the semiconductor layers 101a and 101c, for example, the indium content of the semiconductor layer 101b is preferably higher than those of the semiconductor layers 101a and 101c. For example, $x_b/(x_b+y_b+z_b) > x_a/(x_a+y_a+z_a)$ and $x_b/(x_b+y_b+z_b) > x_c/(x_c+y_c+z_c)$ are preferably satisfied.

Alternatively, it is preferably that the atomic ratio of the semiconductor layer 101a be within the range of the area 11 so that $x_a \leq 2y_a$ is satisfied. Furthermore, it is preferably that the atomic ratio of the semiconductor layer 101c be within the range of the area 11 so that $x_c \leq y_c$ is satisfied.

In a similar manner, it is preferably that the atomic ratio of the semiconductor layer 101c be within the range of the area 11 so that $x_c \leq 2y_c$ is satisfied. Furthermore, it is preferably that the atomic ratio of the semiconductor layer 101c be within the range of the area 11 so that $x_c \leq y_c$ is satisfied.

That is, the semiconductor layer 101a preferably has an atomic ratio with in the range of an area surrounded by line segments that connect the coordinate K (8:14:7), the coordinate L (2:5:7), the coordinate M (51:149:300), the coordinate N (46:288:833), the coordinate O (0:2:11), the coordinate P (0:0:1), the coordinate A (2:2:1), and the coordinates K, in this order.

Furthermore, the semiconductor layer 101c preferably has an atomic ratio with in the range of an area surrounded by line segments that connect the coordinate K (8:14:7), the coordinate L (2:5:7), the coordinate M (51:149:300), the coordinate N (46:288:833), the coordinate O (0:2:11), the coordinate P (0:0:1), the coordinate A (2:2:1), and the coordinates K, in this order.

Furthermore, semiconductor layer 101a and the semiconductor layer 101c preferably have an atomic ratio with in the range of an area surrounded by line segments that connect the coordinate K (8:14:7), the coordinate L (2:5:7), the coordinate M (51:149:300), the coordinate N (46:288:833), the coordinate O (0:2:11), the coordinate C (8:12:25), the coordinate B (23:27:25), the coordinate A (2:2:1), and the coordinates K, in this order.

Note that in the case where the transistor has an s-channel structure, the channel is formed in the entire region of the semiconductor layer 101b. Therefore, as the thickness of the semiconductor layer 101b is increased, the size of the channel region is increased. That is, the thicker the semiconductor layer 101b is, the larger the on-state current of the transistor is. For example, the semiconductor layer 101b may have a region with a thickness of greater than or equal to 20 nm, preferably greater than or equal to 40 nm, further preferably greater than or equal to 60 nm, and still further preferably greater than or equal to 100 nm. Note that there is a possibility that the productivity of the semiconductor device is reduced; therefore, for example, the semiconductor layer 101b includes a region with a thickness of, for example, less than or equal to 300 nm, preferably less than or equal to 200 nm, and further preferably less than or equal to 150 nm.

Moreover, the thickness of the semiconductor layer 101c is preferably as small as possible to increase the on-state current of the transistor. For example, the semiconductor layer 101c may include a region with a thickness of less than 10 nm, preferably less than or equal to 5 nm, and further preferably less than or equal to 3 nm. Meanwhile, the semiconductor layer 101c has a function of blocking elements other than oxygen (such as hydrogen and silicon) included in the adjacent insulator from entering the semiconductor layer 101b where a channel is formed. For this reason, it is preferable that the semiconductor layer 101c have a certain thickness. For example, the semiconductor layer 101c may include a region with a thickness of greater than or equal to 0.3 nm, preferably greater than or equal to 1 nm, and further preferably greater than or equal to 2 nm. The semiconductor layer 101c preferably has an oxygen blocking property to inhibit outward diffusion of oxygen released from the gate insulating film 102 and the like.

To improve reliability, preferably, the thickness of the semiconductor layer 101a is large and the thickness of the semiconductor layer 101c is small. For example, the semiconductor layer 101a may include a region with a thickness of greater than or equal to 10 nm, preferably greater than or equal to 20 nm, further preferably greater than or equal to 40 nm, and still further preferably greater than or equal to 60 nm. When the thickness of the semiconductor layer 101a is made large, a distance from an interface between the adjacent insulator and the semiconductor layer 101a to the semiconductor layer 101b in which a channel is formed can be large. Since the productivity of the semiconductor device might be decreased, the semiconductor layer 101a has a region with a thickness of, for example, less than or equal to 200 nm, preferably less than or equal to 120 nm, further preferably less than or equal to 80 nm.

When a large amount of hydrogen is contained in an oxide semiconductor film, a donor level might be formed owing to the hydrogen. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that treatment be performed so that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/\text{cm}^3$, lower than or equal to $1\times10^{16}/\text{cm}^3$, lower than or equal to $1\times10^{15}/\text{cm}^3$, lower than or equal to $1\times10^{14}/\text{cm}^3$, or lower than or equal to $1\times10^{13}/\text{cm}^3$.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

Here, differences in electrical characteristics depending on the shapes of semiconductors of transistors were calculated by device simulation. FIGS. 65A to 65D illustrate models of a transistor used for the calculation. For the calculation, Sentaurus Device manufactured by Synopsys, Inc. was used.

Figure 65A:
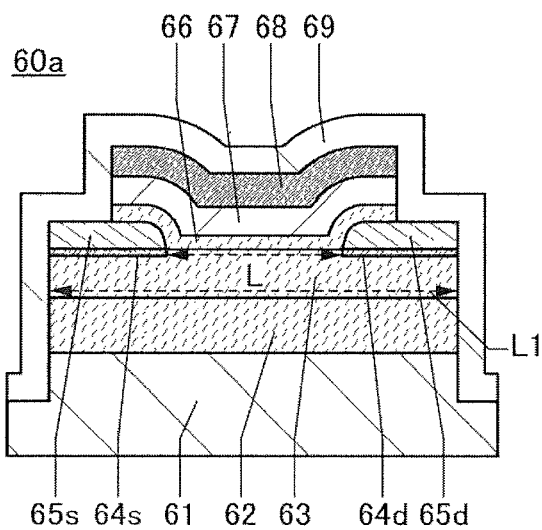
FIGS. 65A and 65B and FIGS. 65C and 65D each illustrate an example of a transistor of one embodiment of the present invention.
Figure 65B:
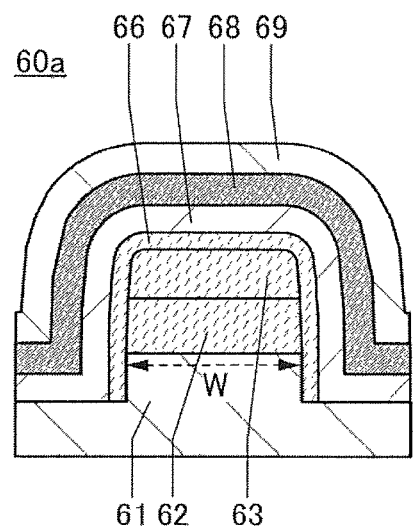

FIGS. 65A and 65B each show a cross-sectional structure of a transistor 60a including a semiconductor layer with a stacked-layer structure. FIG. 65A is a cross-sectional view in the channel length direction and FIG. 65B is a cross-sectional view in the channel width direction.

The transistor 60a includes an insulating film 61 in contact with the top surface of a substrate (not illustrated), a semiconductor layer 62 in contact with the top surface of the insulating film 61, a semiconductor layer 63 in contact with the top surface of the semiconductor layer 62, conductive layers 65s and 65d that are in contact with the top surface of the semiconductor layer 63 and apart from each other in a region overlapping the semiconductor layer 63, a semiconductor layer 66 in contact with the top surface of the semiconductor layer 63, an insulating film 67 over the semiconductor layer 66, and a gate electrode 68 overlapping the semiconductor layer 63 with the insulating film 67 positioned therebetween. Note that regions of the semiconductor layer 63 which are in contact with the conductive layers 65s and 65d include low-resistance layers 64s and 64d. The insulating film 67 functions as a gate insulating film. The conductive layers 65s and 65d function as a source electrode and a drain electrode. An insulating film 69 is provided to cover the transistor 60a.

Figure 65C:
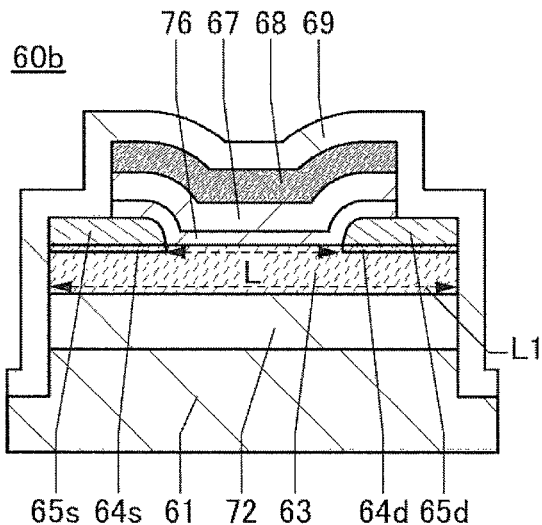
Figure 65D:
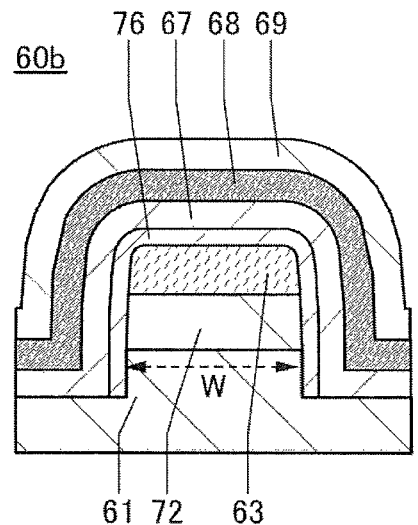

FIGS. 65C and 65D each show a cross-sectional structure of a transistor 60b including a semiconductor layer with a single-layer structure. FIG. 65C is a cross-sectional view in the channel length direction and FIG. 65D is a cross-sectional view in the channel width direction.

The transistor 60b includes the insulating film 61 in contact with the top surface of a substrate (not illustrated), an insulating film 72 in contact with the top surface of the insulating film 61, the semiconductor layer 63 in contact with the top surface of the insulating film 72, the conductive layers 65s and 65d that are in contact with the top surface of the semiconductor layer 63 and apart from each other in a region overlapping the semiconductor layer 63, an insulating film 76 in contact with the top surface of the semiconductor layer 63, the insulating film 67 over the insulating film 76, and the gate electrode 68 overlapping the semiconductor layer 63 with the insulating film 67 positioned therebetween. Note that regions of the semiconductor layer 63 which are in contact with the conductive layers 65s and 65d include the low-resistance layers 64s and 64d. The insulating film 67 and the insulating film 76 function as gate insulating films. The insulating film 69 is provided to cover the transistor 60b.

The conditions of the calculation are given below. In each of the transistors 60a and 60b, the channel length L was 60 nm, the channel width was 60 nm, a length L1 of the semiconductor layer 63 was 140 nm, and lengths of regions where the conductive layers 65s and 65d overlap the gate electrode 68 in the channel length direction were each 20 nm. Furthermore, the relative dielectric constant of the insulating film 61 was 4.1 and the thickness thereof was 400 nm. The work function of each of the conductive layers 65s and 65d was 4.6 eV. The relative dielectric constant of the insulating film 67 was 4.1 and the thickness thereof was 10 nm. The work function of the gate electrode 68 was 5.0 eV.

The conditions of the semiconductor layer 63 in each of the transistors 60a and 60b are listed in Table 4.

TABLE 4

| | |
|---|---|
| Composition | IGZO (In:Ga:Zn = 1:1:1) |
| Electron affinity | 4.6 eV |
| Eg | 3.2 eV |
| Relative dielectric constant | 15 |
| Donor density | 6.60E−09 cm$^{-3}$ |
| Donor density (66s, 66d) | 5.00E+18 cm$^{-3}$ |
| Electron mobility | 10 cm$^2$/Vs |
| Hole mobility | 0.01 cm$^2$/Vs |
| $N_C$ | 5.00E+18 cm$^{-3}$ |
| $N_V$ | 5.00E+18 cm$^{-3}$ |
| Thickness | 15 nm |

In the transistor 60a, an In—Ga—Zn oxide (In:Ga:Zn=1: 3:2) was used for the semiconductor layers 62 and 66, the electron affinity of each of the semiconductor layers 62 and 66 was 4.3 eV, the bandgap was 3.7 eV, the relative dielectric constant was 15, the donor density was 6.6×10$^{-9}$/cm$^3$, the electron mobility was 0.1 cm$^2$/Vs, the hole mobility was 0.01 cm$^2$/Vs, and $N_C$ and $N_V$ were each 5×10$^{18}$/cm$^3$. The thicknesses of the semiconductor layers 62 and 66 were 20 nm and 5 nm, respectively.

In the transistor 60b, the electron affinity of each of the insulating films 72 and 76 was 0.9 eV, the bandgap thereof was 9 eV, and the relative dielectric constant thereof was 15. The thicknesses of the insulating films 72 and 76 were 20 nm and 5 nm, respectively.

Electron traps were set at the interface between the semiconductor layer 66 and the insulating film 67 of the transistor 60a. Furthermore, electron traps were set at the interface between the semiconductor layer 63 and the insulating film 76 of the transistor 60b. A distribution f of the electron traps is normal distribution and thus can be obtained with Formula 9.

[Formula 9]

$$f = N_0 \exp\left(-\frac{(E - E_0)^2}{2E_S^2}\right) \qquad (9)$$

Note that in Formula 9, $N_0$ represents the maximum density of the electron traps, $E_0$ represents the energy of the valence band minimum, E represents states of the electron traps distributed to the valence band from the conduction band minimum, and $E_S$ represents the degree of variation in the electron traps. Here, calculation was performed assuming that $N_0$ was 1.7×10$^{13}$/eVcm$^2$, $E_0$ was 0 eV, and $E_S$ was 0.1 eV.

Figure 76A:
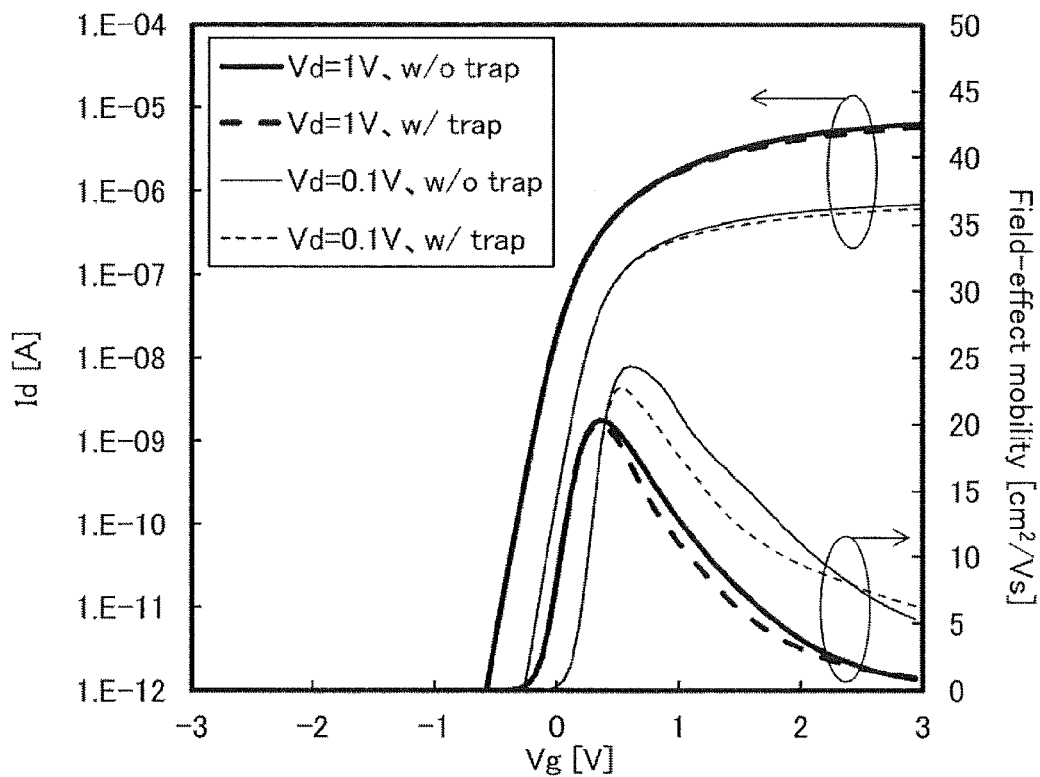
FIGS. 76A and 76B show calculation results of Vg-Id characteristics of transistors.
Figure 76B:
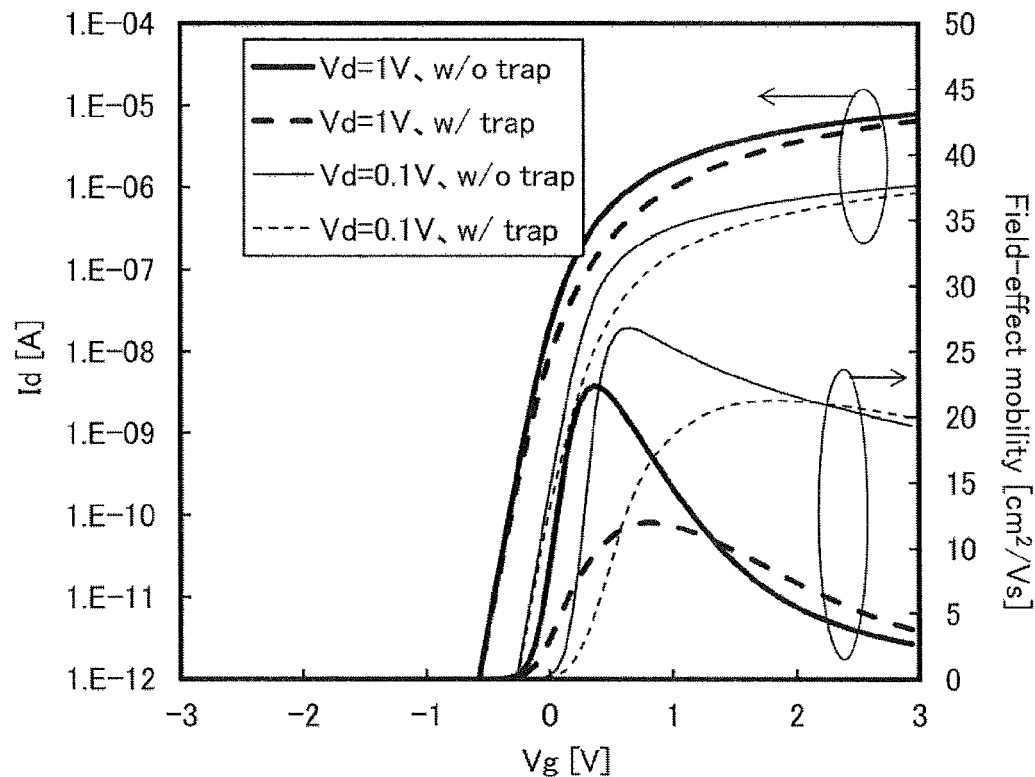

FIG. 76A shows calculation results of Vg-Id characteristics of the transistor 60a, and FIG. 76B shows calculation results of Vg-Id characteristics of the transistor 60b. Note that in FIGS. 76A and 76B, the horizontal axis represents gate voltage Vg, the first vertical axis represents drain current Id, and the second vertical axis represents field-effect mobility. In addition, solid lines denote calculation results of transistors with no electron trap, and dashed lines denote calculation results of transistors with electron traps. Thin lines denote calculation results when the drain voltage Vd is 0.1 V, and thick lines denote calculation results when the drain voltage Vd is 1 V.

As shown in FIG. 76B, when electron traps are set at the interface between the semiconductor layer 63 and the insulating film 76, on-state current tends to decrease. However, as shown in FIG. 76A, even when electron traps are set at the interface between the semiconductor layer 66 and the insulating film 67, on-state current hardly decreases. In the semiconductor layer with a stacked-layer structure, the semiconductor layer 63 is an oxide that has higher electron affinity than the semiconductor layers 62 and 66. When an electric field is applied to the gate electrode, the channel is formed in the semiconductor layer 63 that has the highest electron affinity among the semiconductor layers 62, 63, and 66. Since the channel is apart from the interface between the semiconductor layer 66 and the insulating film 67, influence of the electron traps at the interface between the semiconductor layer 66 and the insulating film 67 upon the channel can be small. Consequently, a decrease in the on-state current of the transistor can be inhibited. Furthermore, change in the threshold voltage of the transistor can be prevented to increase the reliability of the transistor.

In this embodiment, one embodiment of the present invention has been described. Other embodiments of the present invention are described in Embodiment 1 and Embodiments 3 to 10. Note that one embodiment of the present invention is not limited thereto. The example in which the transistor including an oxide semiconductor has been described above as one embodiment of the present invention; however, one embodiment of the present invention is not limited thereto. Depending on circumstances, a transistor that does not include an oxide semiconductor may be employed in one embodiment of the present invention. Alternatively, depending on circumstances, a transistor which includes a semiconductor material that is not an oxide semiconductor may be employed in one embodiment of the present invention. As such a transistor, for example, a transistor including Si (silicon), Ge (germanium), SiGe (silicon germanium), GaAs (gallium arsenic), silicon carbide, a nitride semiconductor, a compound semiconductor, an organic semiconductor, or the like may be used. Furthermore, depending on circumstances, with regard to the crystallinity of the semiconductor, an amorphous semiconductor, a microcrystalline semiconductor, a polycrystalline semiconductor, a single crystal semiconductor, or the like may be used. The example in which the semiconductor contains predetermined atoms at a predetermined atomic ratio has been described in one embodiment of the present invention however, one embodiment of the present invention is not limited thereto. Depending on circumstances, a semiconductor having atoms at a ratio which does not correspond to the predetermined atomic ratio may be used in one embodiment of the present invention.

At least part of this embodiment can be implemented in combination with any of the embodiments described in this specification as appropriate.

(Embodiment 3)

The structure of a transistor including an oxide semiconductor and a semiconductor device of one embodiment of the present invention are described below.

[Modification Example of Transistor]

The structure of the transistor 100 including an oxide semiconductor is not limited to that shown in FIGS. 5A to 5C in Embodiment 2. For example, the transistor 100 may have a structure illustrated in FIGS. 6A and 6B. The structure of FIGS. 6A and 6B is different from that of FIGS. 5A to 5C in the shapes of the conductive layers 104a and 104b. In the cross section in FIG. 5B, the conductive layers 104a and 104b are in contact with the side surface of the semiconductor layer 101a, the side surface of the semiconductor layer 101b, and the top surface of the semiconductor layer 101b. In FIG. 6A, the conductive layers 104a and 104b are in contact with the top surface of the semiconductor layer 101b, and end portions of the conductive layers 104a and 104b are substantially aligned with end portions of the semiconductor layer 101b. Note that FIG. 6B illustrates a cross section taken along dashed dotted line A-B in FIG. 6A, which is perpendicular to the cross section in FIG. 6A.

Figure 66A:
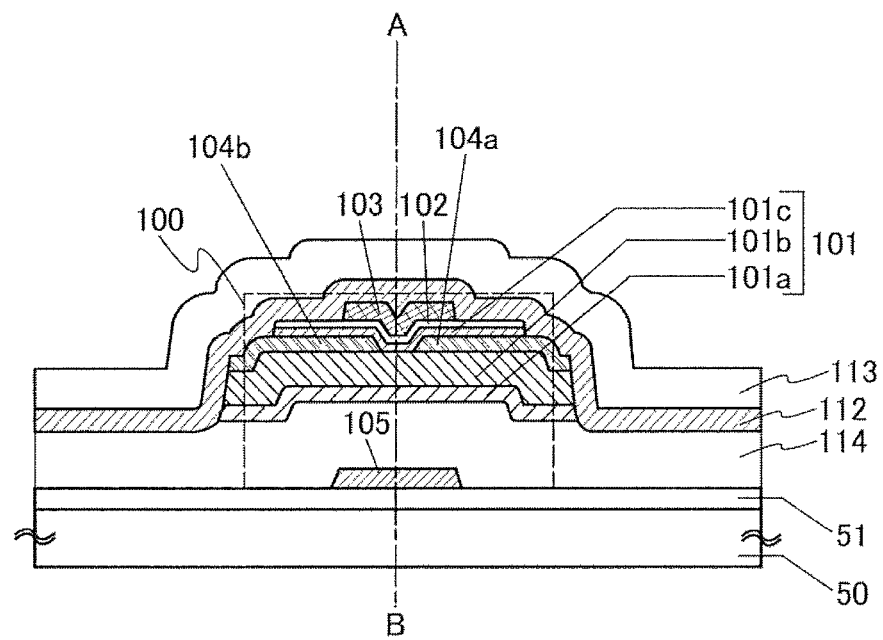
FIGS. 66A and 66B illustrate an example of a transistor of one embodiment of the present invention.
Figure 66B:
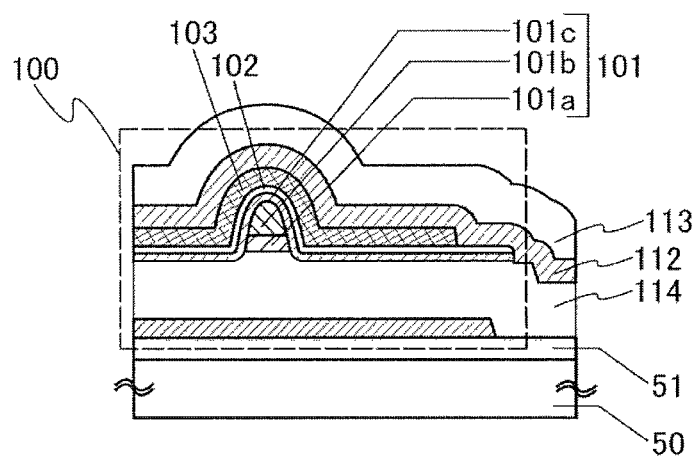

Alternatively, the transistor 100 may have a structure in FIGS. 66A and 66B. The structure of FIGS. 66A and 66B is different from that of FIGS. 6A and 6B mainly in that the surface of the insulating film 114 is not planarized.

Figure 7A:
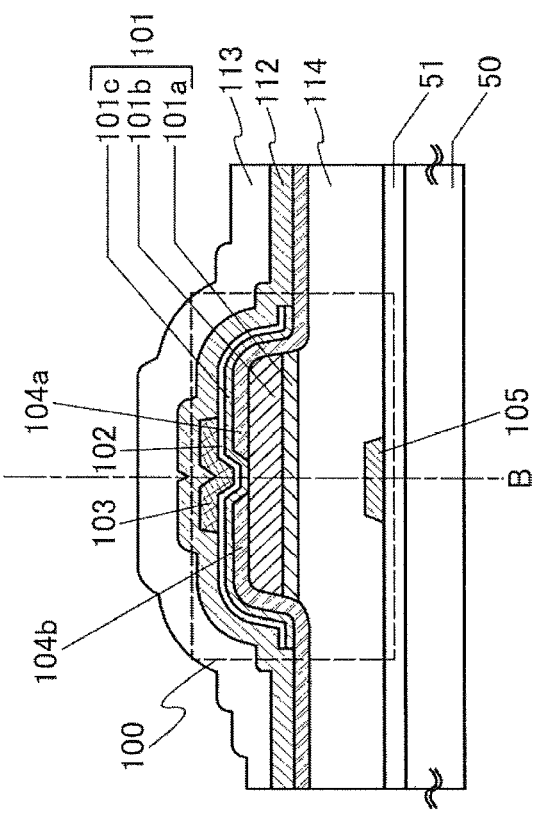
FIGS. 7A and 7B illustrate an example of a transistor of one embodiment of the present invention.
Figure 7B:
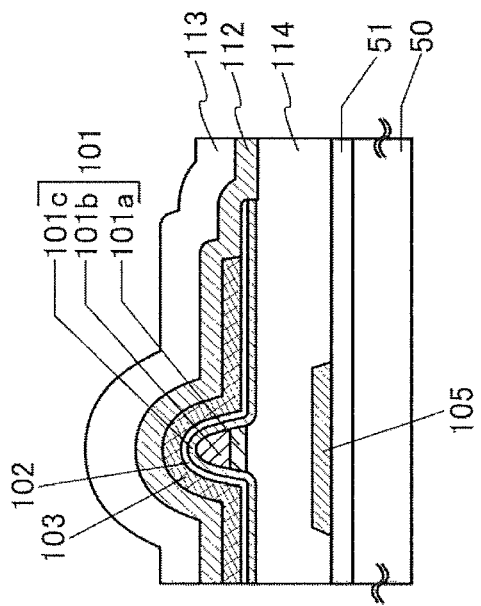

Alternatively, the transistor 100 may have a structure illustrated in FIGS. 7A and 7B. The structure of FIGS. 7A and 7B is different from that of FIGS. 5A to 5C in the shapes of the gate insulating film 102 and the semiconductor layer 101c. In FIGS. 5B and 5C, the end portions of the gate insulating film 102 and the semiconductor layer 101c have regions that are substantially aligned with the end portion of the gate electrode 103. In contrast, in FIGS. 7A and 7B, the end portions of the gate insulating film 102 and the semiconductor layer 101c have regions that are positioned on the outer side than the end portion of the gate electrode 103. Note that FIG. 7B illustrates a cross section taken along dashed dotted line A-B in FIG. 7A, which is perpendicular to the cross section in FIG. 7A.

Figure 8A:
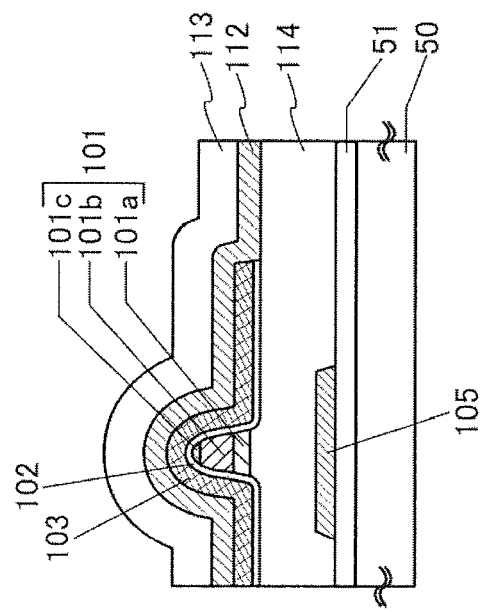
FIGS. 8A and 8B illustrate an example of a transistor of one embodiment of the present invention.
Figure 8B:
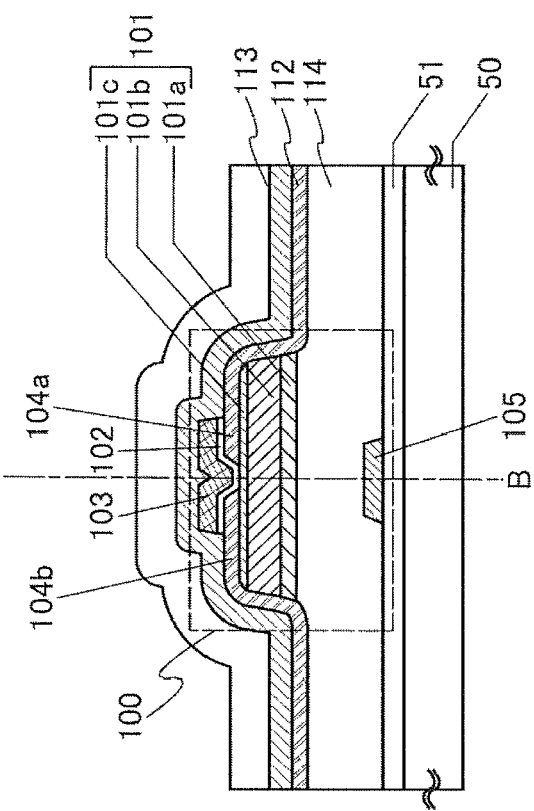

Alternatively, the transistor 100 may have a structure illustrated in FIGS. 8A and 8B. In FIGS. 5A to 5C, the semiconductor layer 101c is in contact with the top surfaces of the conductive layers 104a and 104b, whereas in FIGS. 8A and 8B, the semiconductor layer 101c is in contact with the bottom surfaces of the conductive layers 104a and 104b. Note that FIG. 8B illustrates a cross section taken along dashed dotted line A-B in FIG. 8A, which is perpendicular to the cross section in FIG. 8A. Such a structure enables films used for the semiconductor layer 101a, the semiconductor layer 101b, and the semiconductor layer 101c to be formed successively without contact with the air and therefore can reduce defects at each interface.

Figure 67A:
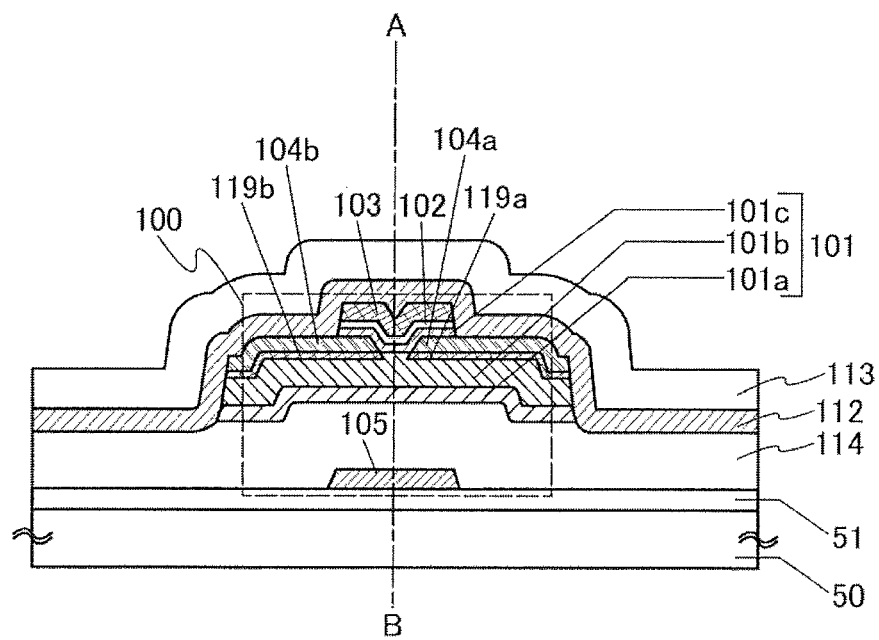
FIGS. 67A and 67B illustrate an example of a transistor of one embodiment of the present invention.
Figure 67B:
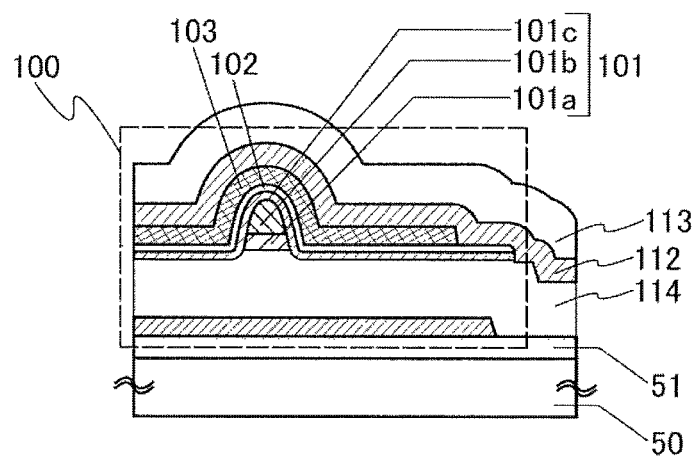

Alternatively, the transistor 100 may include a layer 119a and a layer 119b, as illustrated in FIGS. 67A and 67B.

The layers 119a and 119b may be formed using a transparent conductor, an oxide semiconductor, a nitride semiconductor, or an oxynitride semiconductor, for example. The layers 119a and 119b may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon.

The layers 119a and 119b may have a property of transmitting visible light. Alternatively, the layers 119a and 119b may have a property of not transmitting visible light, ultraviolet light, infrared light, or X-rays by reflecting or absorbing it. In some cases, such a property can suppress a change in electrical characteristics of the transistor due to stray light.

The layers 119a and 119b may preferably be formed using a layer which does not form a Schottky barrier with the semiconductor layer 101b or the like. Accordingly, on-state characteristics of the transistor can be improved.

Note that the layer 119a and the layer 119b preferably have higher resistance than the conductive layers 104a and 104b, depending on circumstances. The layers 119a and 119b may preferably be formed using a layer having a resistance lower than that of the channel of the transistor. For example, the layers 119a and 119b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 119a and 119b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 119a and 119b (e.g., the layer on the drain side) may preferably be provided.

Figure 9A:
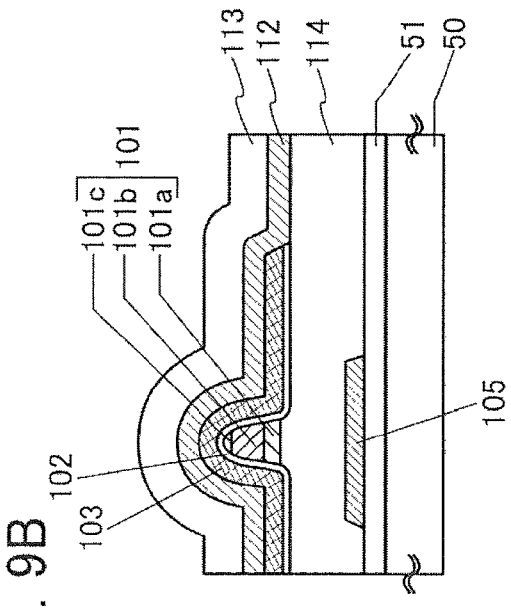
FIGS. 9A to 9D illustrate examples of transistors of one embodiment of the present invention.
Figure 9B:
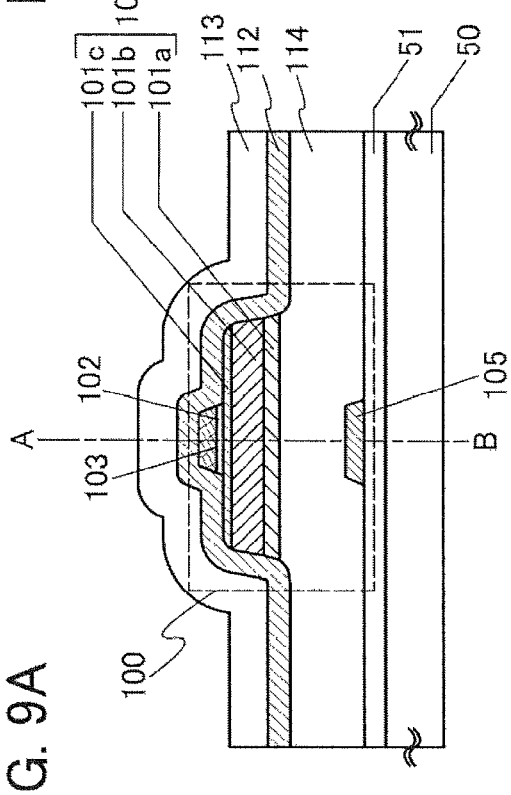
Figure 9D:
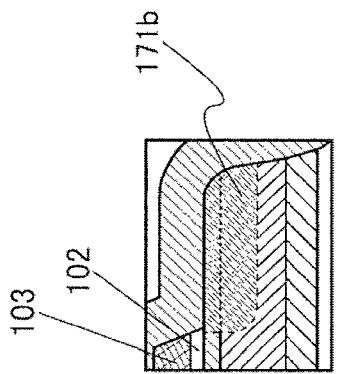
Figure 9C:
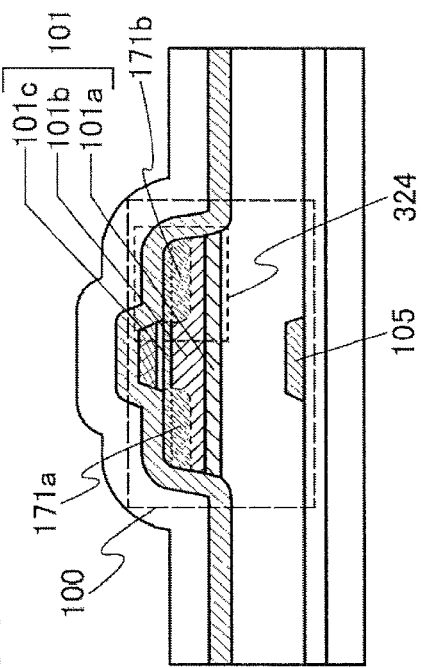

Alternatively, the transistor 100 may have a structure illustrated in FIGS. 9A to 9D. Note that FIG. 9B illustrates a cross section taken along dashed dotted line A-B in FIG. 9A, which is perpendicular to the cross section in FIG. 9A. The structure of FIGS. 9A to 9D is different from that of FIGS. 5A to 5C in that neither the conductive layer 104a nor the conductive layer 104b is provided. Here, as illustrated in FIG. 9C, the transistor 100 may include a low-resistance layer 171a and a low-resistance layer 171b. The low-resistance layer 171a and the low-resistance layer 171b preferably function as a source region and a drain region. Furthermore, an impurity may be added to the low-resistance region 171a and the low-resistance region 171b. Adding the impurity can reduce the resistance of the semiconductor layer 101. As the impurity, for example, one or more kinds of element selected from argon, boron, carbon, magnesium, aluminum, silicon, phosphorus, calcium, scandium, titanium, vanadium, chromium, manganese, iron, cobalt, nickel, gallium, germanium, arsenic, yttrium, zirconium, niobium, molybdenum, indium, tin, lanthanum, cerium, neodymium, hafnium, tantalum, and tungsten are preferably added. The low-resistance layer 171a and the low-resistance layer 171b in the semiconductor layer 101 each include for example, any of the above impurities at a concentration of higher than or equal to $5\times10^{19}$ atoms/cm$^3$, preferably higher than or equal to $1\times10^{20}$ atoms/cm$^3$, further preferably higher than or equal to $2\times10^{20}$ atoms/cm$^3$, still further preferably higher than or equal to $5\times10^{20}$ atoms/cm$^3$. FIG. 9D is an enlarged view of a region 324 in FIG. 9C.

Note that an impurity such as unnecessary hydrogen can be trapped in such a low-resistance region. The trap of unnecessary hydrogen in the low-resistance layer can reduce the hydrogen concentration of the channel region, and as a result, the transistor 100 can have favorable characteristics.

Figure 10A:
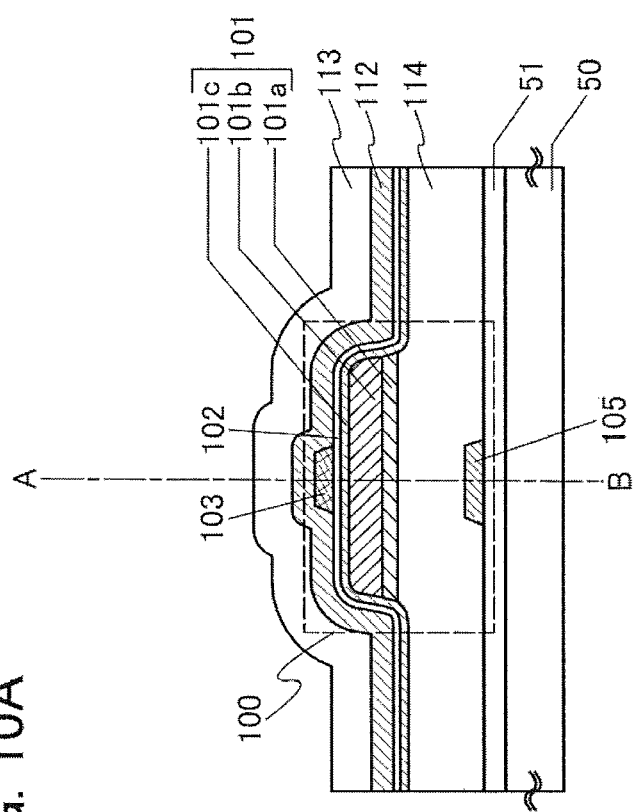
FIGS. 10A and 10B illustrate an example of a transistor of one embodiment of the present invention.
Figure 10B:
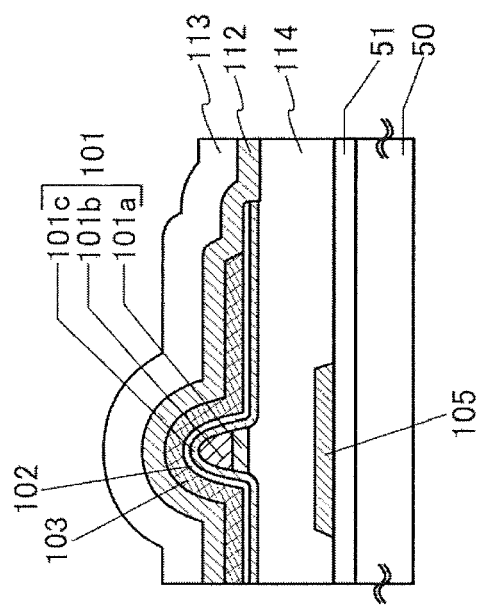

Alternatively, the transistor 100 may have a structure illustrated in FIGS. 10A and 10B. The structure of FIGS. 10A and 10B is different from the structures of FIGS. 9A to 9D in the shapes of semiconductor layer 101c and the gate insulating film 102. In FIGS. 9A and 9B, the end portion of the gate insulating film 102 includes a region that is substantially aligned with the end portion of the gate electrode 103, and the semiconductor layer 101c includes a region that is positioned on the outer side than the end portion of the gate electrode 103. In FIGS. 10A and 10B, the end portions of the semiconductor layer 101c and the gate insulating film 102 are positioned on the outer side than the end portion of the gate electrode 103, and the semiconductor layer 101c includes a region that is in contact with the side surfaces of the semiconductor layers 101a and 101b. Note that FIG. 10B illustrates a cross section taken along dashed dotted line A-B in FIG. 10A, which is perpendicular to the cross section in FIG. 10A.

FIG. 6A to FIG. 10B each illustrate the structure in which the semiconductor layer 101a and the semiconductor layer 101c are in contact with the semiconductor layer 101b; however, a structure without one or both of the semiconductor layer 101a and the semiconductor layer 101c may be employed.

Alternatively, the transistor 100 may have a structure in which the gate electrode 103 is provided below the semiconductor layer 101 with the gate insulating film 102 positioned therebetween as illustrated in FIGS. 11A to 11C. FIGS. 11A and 11B are a top view and a cross-sectional view of the transistor 100. FIG. 11A is a top view of the transistor 100, FIG. 11B is a cross-sectional view taken along dashed dotted line A-B in FIG. 11A, and FIG. 11C is a cross-sectional view taken along dashed dotted line C-D in FIG. 11A. Note that in FIG. 11A, the substrate 50, the gate insulating film 102, the protective film 25, and the like are omitted for simplicity. The transistor 100 in FIGS. 11A to 11C includes the gate electrode 103 provided over the substrate 50, the gate insulating film 102 provided over the substrate 50 and the gate electrode 103, the semiconductor layer 101 overlapping the gate electrode 103 with the gate insulating film 102 positioned therebetween, and the conductive layers 104a and 104b in contact with the semiconductor layer 101. Furthermore, a protective film 25 is formed over the gate insulating film 102, the semiconductor layer 101, the conductive layer 104a, and the conductive layer 104b.

The protective film 25 is in contact with a surface of the semiconductor layer 101 that is an opposite side of a surface in contact with the gate insulating film 102. In other words, the protective film 25 has a function of protecting a region (hereinafter referred to as a back channel region) of the semiconductor layer 101 that is on the opposite side of a region where a channel is formed.

Here, the protective film 25 may be formed of two or more stacked layers, for example. Furthermore, it is preferable that the protective film 25 include a film which contains oxygen in excess of that in the stoichiometric composition and which releases part of oxygen by heating. As the protective film 25, for example, a silicon oxide film, a silicon oxynitride film, a silicon nitride film, or the like may be used.

Figure 62A:
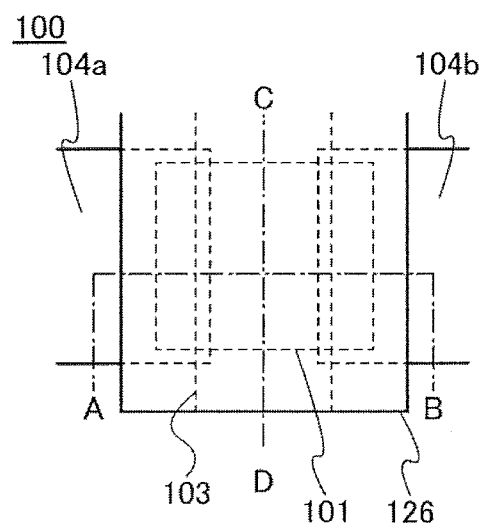
FIGS. 62A to 62C illustrate an example of a transistor of one embodiment of the present invention.
Figure 62C:
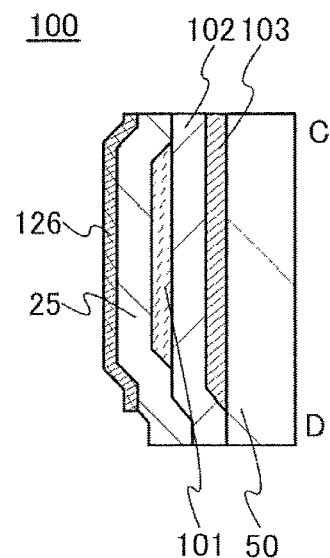
Figure 62B:
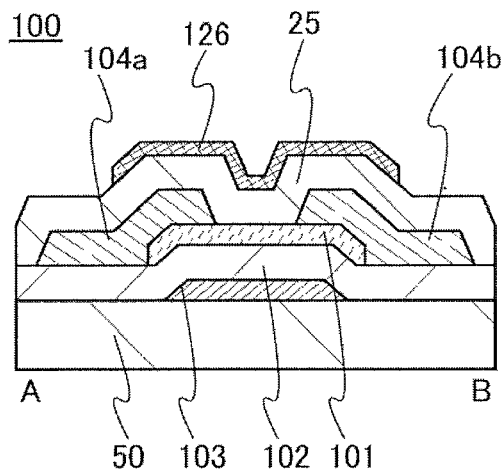

Furthermore, as illustrated in FIGS. 62A to 62C, an electrode 126 may be provided over the protective film 25 in the transistor 100.

Figure 63A:
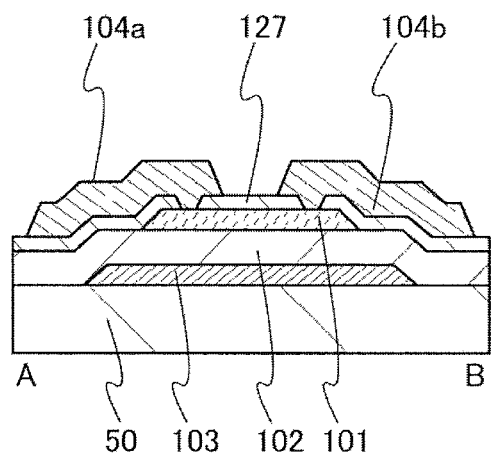
FIGS. 63A and 63B each illustrate an example of a transistor of one embodiment of the present invention.
Figure 63B:
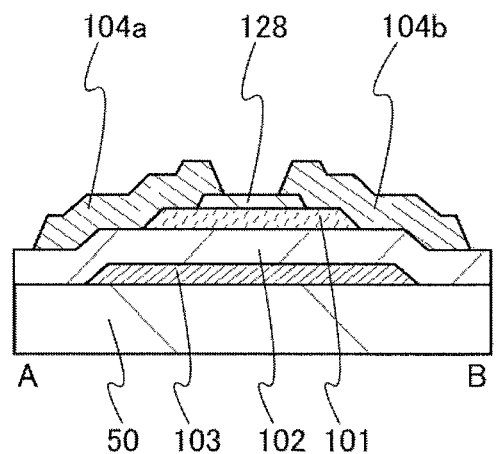

The transistor 100 may have any of structures illustrated in FIGS. 63A and 63B. Here, the transistors 100 illustrated in FIGS. 11A to 11C and FIGS. 62A to 62C are channel-etched transistors; in contrast, the transistors 100 illustrated in FIGS. 63A and 63B are channel-protective transistors.

Here, a manufacturing process of a channel-etched transistor is described. A CAAC-OS film is used as the semiconductor layer 101 of the channel-etched transistor, whereby even when the semiconductor layer 101 is exposed at the time of etching for forming the pair of conductive layers 104a and 104b, the semiconductor layer 101 is less likely to be damaged because the semiconductor layer 101 has high crystallinity; as a result, favorable transistor characteristics can be obtained. Use of the channel-etched transistor enables simplification of the structure. Accordingly, for example, a cost needed for manufacturing a transistor can be reduced.

In addition, since the CAAC-OS film has no grain boundary, it serves as a barrier film against copper. Therefore, when copper is contained in the conductive layers 104a and 104b, the CAAC-OS film inhibits the copper contained in the conductive layers 104a and 104b from diffusing into the channel region of the transistor.

The transistor 100 illustrated in FIG. 63A includes the gate electrode 103 over the substrate 50; the gate insulating film 102 over the substrate 50 and the gate electrode 103; the semiconductor layer 101 overlapping the gate electrode 103 with the gate insulating film 102 positioned therebetween; an insulating film 127 over the gate insulating film 102 and the semiconductor layer 101; and the pair of conductive layer 104a and 104b in contact with the semiconductor layer 101 in openings of the insulating film 127.

Note that as in the transistor 100 in FIG. 63B, an insulating film 128 formed over the semiconductor layer 101, and the pair of conductive layers 104a and 104b which are in contact with the semiconductor layer 101 and whose end portions are formed over the insulating film 128 may be provided.

In the transistors 100 in FIGS. 63A and 63B, the semiconductor layer 101 is covered with the insulating film 127 or 128 at the time of forming the pair of conductive layers 104a and 104b; therefore, the semiconductor layer 101 is not damaged by etching for forming the pair of conductive layers 104a and 104b. In addition, when the insulating film 127 or 128 is an oxide insulating film containing nitrogen and having a small number of defects, a change in electrical characteristics is prevented, whereby the transistor can have improved reliability.

Furthermore, each of the transistors 100 in FIGS. 63A and 63B may include the protective film 25 and the electrode 126 illustrated in FIGS. 62A to 62C.

[Structure Example 1]

Figure 12B:
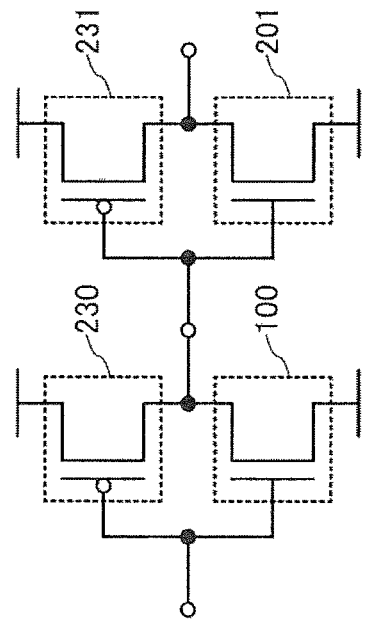
FIGS. 12A and 12B are circuit diagrams of one embodiment of the present invention.
Figure 12A:
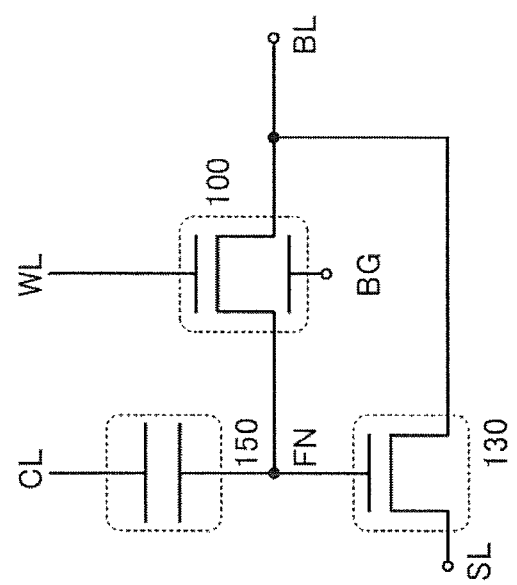

FIG. 12A is an example of a circuit diagram of the semiconductor device of one embodiment of the present invention. The semiconductor device in FIG. 12A includes the transistor 100, the transistor 130, the capacitor 150, a wiring BL, a wiring WL, a wring CL, a wiring SL, and a wiring BG.

One of a source or a drain of the transistor 130 is electrically connected to the wiring BL, the other is electrically connected to the wiring SL, and a gate of the transistor 130 is electrically connected to one of a source and a drain of the transistor 100 and one electrode of the capacitor 150. The other of the source and the drain of the transistor 100 is electrically connected to the wiring BL, and a gate of the transistor 100 is electrically connected to the wiring WL. The other electrode of the capacitor 150 is electrically connected to the wiring CL. The wiring BG is electrically connected to a second gate of the transistor 100. Note that a node connecting the gate of the transistor 130, the one of the source and the drain of the transistor 100, and the one electrode of the capacitor 150 is referred to as a node FN.

The semiconductor device shown in FIG. 12A supplies a potential corresponding to the potential of the wiring BL to the node FN when the transistor 100 is in an on state (i.e., is on). Meanwhile, the semiconductor device has a function of retaining the potential of the node FN when the transistor 100 is in an off state (i.e., is off). In other words, the semiconductor device shown in FIG. 12A functions as a memory cell of a memory device. In the case where a display element such as a liquid crystal element or an organic electroluminescence (EL) element is electrically connected to the node FN, the semiconductor device in FIG. 12A can function as a pixel of a display device.

The on/off state of the transistor 100 can be selected in accordance with the potential supplied to the wiring WL or the wiring BG. The threshold voltage of the transistor 100 can be controlled by a potential supplied to the wiring WL or the wiring BG. A transistor with small off-state current is used as the transistor 100, whereby the potential of the node FN at the time when the transistor 100 is in a non-conduction state can be retained for a long time. Thus, the refresh rate of the semiconductor device can be reduced, resulting in low power consumption of the semiconductor device. An example of the transistor with small off-state current is a transistor including an oxide semiconductor.

Note that a reference potential, a ground potential, or a fixed potential such as an arbitrary fixed potential is supplied to the wiring CL. In that case, the apparent threshold voltage of the transistor 100 varies depending on the potential of the node FN. Conduction and non-conduction states of the transistor 130 change in response to the change in the apparent threshold voltage; thus, data of a potential retained in the node FN can be read as data.

To retain a potential retained in the node FN at 85° C. for 10 years ($3.15 \times 10^8$ seconds), off-state current is preferably lower than 4.3 yA (yoctoamperes, where 1 yA is $10^{-24}$ A) per femtofarad of capacitance and per micrometer of channel width of the transistor. In that case, the allowable potential variation in the node FN is preferably within 0.5 V. Alternatively, the off-state current is preferably lower than 1.5 yA at 95° C. In the semiconductor device of one embodiment of the present invention, the concentration of hydrogen contained in the layers under the barrier film is sufficiently reduced; thus, the transistor including an oxide semiconductor over the barrier film can have such extremely small off-state current.

Furthermore, when the capacitance is increased, the potential can be retained in the node FN for a longer time. In other words, the retention time can be lengthened.

When the semiconductor device illustrated in FIG. 12A is arranged in a matrix, a memory device (memory cell array) can be formed.

Figure 13C:
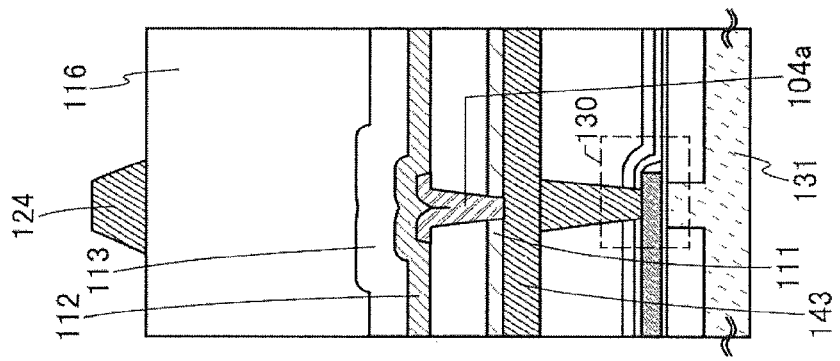
FIGS. 13A to 13C illustrate an example of a semiconductor device of one embodiment of the present invention.
Figure 13B:
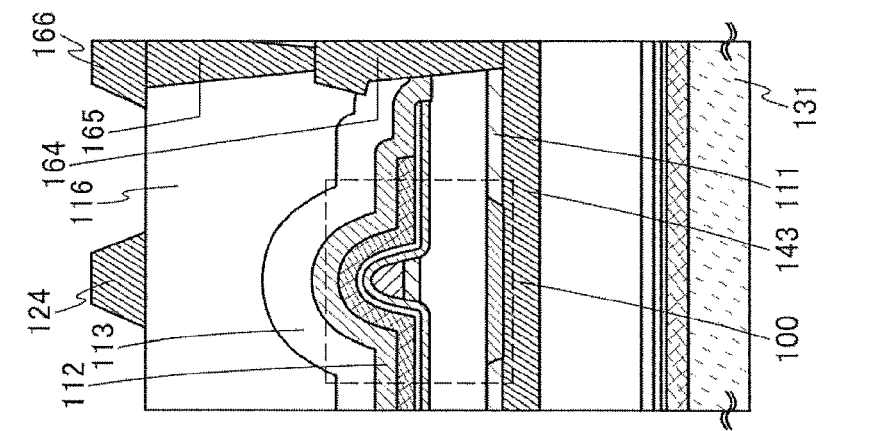
Figure 13A:
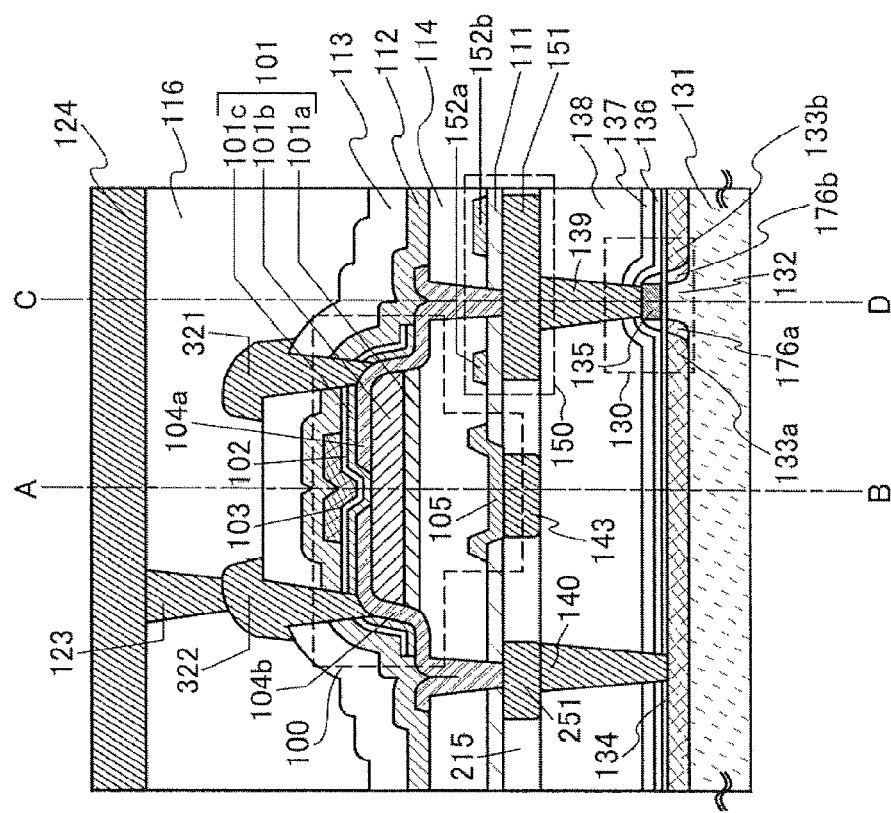

FIGS. 13A to 13C illustrate an example of a cross-sectional structure of a semiconductor device in which the circuit shown in FIG. 12A can be obtained. Note that FIG. 13B illustrates a cross section taken along dashed dotted line A-B in FIG. 13A, which is perpendicular to the cross section in FIG. 13A. Note that FIG. 13C illustrates a cross section taken along dashed dotted line C-D in FIG. 13A, which is perpendicular to the cross section in FIG. 13A.

The semiconductor device includes the transistor 130, the transistor 100, and the capacitor 150. The transistor 100 is provided over the transistor 130, and at least one barrier film is provided between the transistor 130 and the transistor 100. Alternatively, a plurality of barrier films may be provided.

In FIGS. 13A to 13C, the transistor structure illustrated in FIGS. 7A and 7B is used for the transistor 100.

The transistor 130 includes a first semiconductor material. The transistor 100 includes a second semiconductor material. The first semiconductor material and the second semiconductor material may be the same material but they are preferably different semiconductor materials.

Examples of semiconductors that can be used as the first semiconductor material or the second semiconductor material are semiconductor materials such as silicon, germanium, gallium, and arsenic; compound semiconductor materials containing silicon, germanium, gallium, arsenic, or aluminum; organic semiconductor materials; and oxide semiconductor materials.

Here, the case where single crystal silicon is used as the first semiconductor material and an oxide semiconductor is used as the second semiconductor material is described.

[First Transistor]

The transistor 130 is provided on a semiconductor substrate 131 and includes a semiconductor layer 132 which is part of the semiconductor substrate 131, a gate insulating film 134, a gate electrode 135, and low-resistance layers 133*a* and 133*b* functioning as source and drain regions.

The transistor 130 may be either a p-channel transistor or an n-channel transistor, and an appropriate transistor may be used depending on the circuit configuration or the driving method.

It is preferable that a region of the semiconductor layer 132 where a channel is formed, a region in the vicinity thereof, the low-resistance layers 133*a* and 133*b* serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 130 may be a high-electron-mobility transistor (HEMT) with GaAs and GaAlAs or the like.

The transistor 130 may include regions 176*a* and 176*b* serving as lightly doped drain (LDD) regions.

The low-resistance layers 133*a* and 133*b* contain an element that imparts n-type conductivity, such as phosphorus, or an element that imparts p-type conductivity, such as boron, in addition to a semiconductor material used for the semiconductor layer 132.

The gate electrode 135 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Here, a transistor 190 in FIGS. 15C and 15D may be used instead of the transistor 130. FIG. 15D illustrates a cross section taken along dashed dotted line E-F in FIG. 15C, which is perpendicular to the cross section in FIG. 15D. In the transistor 190, the semiconductor layer 132 (part of the semiconductor substrate) in which a channel is formed has a protruding portion, and the gate insulating film 134, and the gate electrode 135 are provided along top and side surfaces of the protruding portion. Furthermore, an element isolation layer 181 is provided between the transistors. The transistor 190 is also referred to as FIN transistors because they each utilize a protruding portion of the semiconductor substrate. Note that an insulating film serving as a mask for forming the protruding portion may be provided in contact with the top of the protruding portion. Although the case where the protruding portion is formed by processing part of the semiconductor substrate is described here, a semiconductor layer having a protruding shape may be formed by processing a silicon-on-insulator (SOI) substrate.

An insulating film 136, an insulating film 137, and an insulating film 138 are stacked in this order to cover the transistor 130.

In a manufacturing process of the semiconductor device, the insulating film 136 functions as a protective film for activation of an element imparting conductivity that is added to the low-resistance layers 133a and 133b. The insulating film 136 is not necessarily provided.

In the case where a silicon-based semiconductor material is used for the semiconductor layer 132, the insulating film 137 preferably contains hydrogen. When the insulating film 137 containing hydrogen is provided over the transistor 130 and heat treatment is performed, dangling bonds in the semiconductor layer 132 are terminated by hydrogen contained in the insulating film 137, whereby the reliability of the transistor 130 can be improved.

The insulating film 138 functions as a planarization film for eliminating a level difference caused by the transistor 130 or the like underlying the insulating film 138. The top surface of the insulating film 138 may be planarized by planarization treatment using a chemical mechanical polishing (CMP) method or the like in order to increase the planarity.

In the insulating films 136, 137, and 138, a plug 140 electrically connected to the low-resistance layer 133a, the low-resistance layer 133b, and the like, and a plug 139 electrically connected to the gate electrode 135 of the transistor 130, and the like may be embedded.

[Capacitor]

The barrier film 111 is provided between the transistor 130 and the transistor 100. The barrier film may be formed of a single layer as illustrated in FIGS. 13A to 13C, or a plurality of layers.

The barrier film 111 has a function of inhibiting water and hydrogen of layers under the barrier film 111 from diffusing upward. The barrier film 111 preferably has low oxygen permeability. Furthermore, the barrier film 111 may have an opening or a plug for electrically connecting an electrode or a wiring provided over the barrier film 111 to an electrode or a wiring provided under the barrier film 111. Here, "a film has a function of inhibiting diffusion of water and hydrogen" means that the film is the one to which water and hydrogen are less likely to diffuse and which has lower water and hydrogen permeability than silicon oxide or the like that is generally used as an insulating film, for example. Furthermore, "a film has low oxygen permeability" means that the film has lower oxygen permeability than silicon oxide or the like that is generally used as an insulating film.

For the insulating film 112, as in the case of the barrier film 111, a material to which water and hydrogen do not easily diffuse is preferably used. In particular, for the insulating film 112, a material relatively impermeable to oxygen is preferably used. Note that the insulating film 112 may have a stacked-layer structure of two or more layers. In this case, for example, the insulating film 112 may be formed to have a two-layer structure in which the bottom layer is formed using, for example, silicon oxide, silicon oxynitride, silicon nitride oxide, silicon nitride, aluminum oxide, aluminum oxynitride, aluminum nitride oxide, aluminum nitride, or the like. Furthermore, the top layer is preferably formed using a material to which water and hydrogen do not easily diffuse, as in the case of the barrier film 111. The bottom insulating layer may be an insulating film from which oxygen is released by heating in a manner similar to that of an insulating film 114 described later, so that oxygen may be supplied also from above the semiconductor layer 101 through the gate insulating film 102.

By covering the semiconductor layer 101 with the insulating film 112 including a material relatively impermeable to oxygen, oxygen can be prevented from being released from the semiconductor layer 101 to a portion over the insulating film 112. Furthermore, oxygen released from the insulating film 114 can be confined below the insulating film 112, resulting in an increase in the amount of oxygen to be supplied to the semiconductor layer 101.

The insulating film 112 that is relatively impermeable to water or hydrogen can inhibit entry of water or hydrogen, which is an impurity for an oxide semiconductor, so that changes in electrical characteristics of the transistor 100 can be suppressed and the transistor 100 can have high reliability.

Note that an insulating film from which oxygen is released by heating like the insulating film 114 may be provided under the insulating film 112 to supply oxygen also from a portion over the semiconductor layer 101 through the gate insulating film 102.

Here, it is preferable that hydrogen, water, and the like in the layers under the barrier film 111 be reduced as much as possible. Alternatively, degasification is preferably reduced. Hydrogen or water might become a factor that causes changes in the electrical characteristics of an oxide semiconductor. Hydrogen or water diffusing from the layers under the barrier film 111 to the layers over the barrier film 111 can be suppressed by the barrier film 111; however, the hydrogen or water might diffuse to the layers over the barrier film 111 through an opening, a plug, or the like provided in the barrier film 111.

To reduce hydrogen and water contained in the layers under the barrier film 111 or to reduce degasification, heat treatment for removing the hydrogen and the water or for reducing degasification is preferably performed before the formation of the barrier film 111 or immediately after the formation of an opening for forming a plug in the barrier film 111. The heat treatment is preferably performed at as high a temperature as possible within the range that does not adversely affect the heat resistance of the conductive films and the like in the semiconductor device and the electrical characteristics of the transistor. Specifically, the temperature may be, for example, 450° C. or higher, preferably 490° C. or higher, further preferably 530° C. or higher, or may be 650° C. or higher. It is preferable that the heat treatment be performed under an inert gas atmosphere or a reduced pressure atmosphere for 1 hour or longer, preferably 5 hours or longer, further preferably 10 hours or longer. The temperature of the heat treatment is determined in consideration of the heat resistance of the materials of wirings or electrodes positioned under the barrier film 111; for example, in the case where the heat resistance of the materials is low, the temperature of the heat treatment is preferably lower than or equal to 550° C., lower than or equal to 600° C., lower than or equal to 650° C., or lower than or equal to 800° C. Such heat treatment may be performed at least once but is preferably performed more than once.

It is preferable that the amount of released hydrogen of the insulating film provided under the barrier film 111, which is measured by thermal desorption spectrometry (TDS) analysis, at a substrate surface temperature of 400° C. be lower than or equal to 130%, preferably lower than or equal to 110% of that at a substrate surface temperature of 300° C. Alternatively, it is preferable that the amount of released hydrogen molecules measured by TDS analysis at a substrate surface temperature of 450° C. be lower than or equal to 130%, preferably lower than or equal to 110% of that at a substrate surface temperature of 350° C.

Water and hydrogen contained in the barrier film 111 itself are also preferably reduced. Alternatively, degasification is preferably reduced. For example, the barrier film 111 is preferably formed using a material where the amount of released hydrogen molecules (M/z=2) at a substrate surface temperature of 20° C. to 600° C., which is measured by TDS, is less than $2\times10^{15}/cm^2$, preferably less than $1\times10^{15}/cm^2$, and further preferably less than $5\times10^{14}/cm^2$. Alternatively, the barrier film 111 is preferably formed using a material where the amount of released water molecules (M/z=18) at a substrate surface temperature of 20° C. to 600° C., which is measured by TDS, is less than $1\times10^{16}/cm^2$, preferably less than $5\times10^{15}/cm^2$, and further preferably less than $2\times10^{12}/cm^2$.

In the case where single crystal silicon is used for a semiconductor layer in the transistor 130, the heat treatment can also serve as treatment for terminating dangling bonds of silicon with hydrogen (the treatment is also referred to as hydrogenation treatment). By the hydrogenation treatment, part of hydrogen contained in the gate insulating film of the transistor 130 or another insulating film that is formed under the barrier film 111 diffuses to the semiconductor layer in the first transistor to terminate dangling bonds of silicon, so that the reliability of the second transistor can be improved.

As the barrier film 111, an insulating film containing a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST) can be used. The barrier film 111 may be a single layer or a stacked layer. Alternatively, aluminum oxide, bismuth oxide, germanium oxide, niobium oxide, silicon oxide, titanium oxide, tungsten oxide, yttrium oxide, zirconium oxide, or gallium oxide may be added to the insulating film, for example. Alternatively, the insulating film may be subjected to nitriding treatment to be an oxynitride film. A layer of silicon oxide, silicon oxynitride, or silicon nitride may be stacked over the insulating film. Aluminum oxide is particularly preferable because of its excellent barrier property against water or hydrogen.

The barrier film 111 may be a stack of a layer of a material relatively impermeable to water or hydrogen and a layer containing an insulating material. The barrier layer 111 may be, for example, a stack of a layer containing silicon oxide or silicon oxynitride, a layer containing a metal oxide, and the like.

For the barrier film 111, a material relatively impermeable to oxygen is preferably used. The materials given above have excellent barrier properties against oxygen as well as hydrogen and water. The use of any of the materials can inhibit diffusion of oxygen released when the insulating film 114 is heated to the layers under the barrier film 111. Consequently, the amount of oxygen that is released from the insulating film 114 and is likely to be supplied to the semiconductor layer of the transistor 100 can be increased.

In this manner, the concentration of hydrogen or water contained in each layer provided under the barrier film 111 is reduced, or degasification is prevented so that diffusion of hydrogen or water into the transistor 100 is prevented by the barrier film 111. Thus, the amount of hydrogen or water contained in the insulating film 114 or each layer in the transistor 100 can be extremely low. The concentration of hydrogen contained in the insulating film 114 and the semiconductor layer 101 or the gate insulating film 102 in the transistor 100 can be reduced to, for example, lower than $5\times10^{18}$ $cm^{-3}$, preferably lower than $1\times10^{18}$ $cm^{-3}$, further preferably lower than $3\times10^{17}$ $cm^{-3}$.

The above structure makes it possible to obtain high reliability in both of the first and second transistors, and as a result, an extremely highly reliable semiconductor device can be obtained.

A conductive layer 151, a conductive layer 152a, and a conductive layer 152b are provided so that the barrier film 111 is positioned therebetween to form the capacitor 150. The plug 140 and a conductive layer 251 are electrically connected to the conductive layer 104b of the transistor 100. The conductive layer 151 is electrically connected to the conductive layer 104a of the transistor 100. The conductive layer 151, a conductive layer 143, and the conductive layer 251 are formed to fill openings formed in an insulating film 115.

The insulating film 114 is provided to cover the barrier film 111, the conductive layer 152a, the conductive layer 152b, the conductive layer 105, and the like.

It is preferable that the top surface of the insulating film 114 be planarized by a CMP method or the like.

The insulating film 114 preferably includes oxide. In particular, the insulating film 114 preferably includes an oxide material from which part of oxygen is released by heating. The insulating film 114 preferably includes an oxide containing oxygen in excess of that in the stoichiometric composition. In the case where an oxide semiconductor is used as the second semiconductor material, oxygen released from the insulating film 114 is supplied to the oxide semiconductor, so that oxygen vacancy in the oxide semiconductor can be reduced. Consequently, changes in the electrical characteristics of the second transistor can be reduced and the reliability of the second transistor can be improved.

An oxide material from which oxygen is partly released by heating is preferably used for the insulating film 114. As an oxide material from which oxygen is released by heating, an oxide containing oxygen in excess of that in the stoichiometric composition is preferably used. Part of oxygen is released by heating from the oxide film containing oxygen in excess of that in the stoichiometric composition. Note that the oxide film containing oxygen in excess of that in the stoichiometric composition is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. As the metal oxide, aluminum oxide, aluminum oxynitride, gallium oxide, gallium oxynitride, yttrium oxide, yttrium oxynitride, hafnium oxide, or hafnium oxynitride can be used. Note that in this specification, "silicon oxynitride" refers to a material that contains oxygen at a higher proportion than nitrogen, and "silicon nitride oxide" refers to a material that contains nitrogen at a higher proportion than oxygen.

In order that the insulating film 114 includes excess oxygen, a region containing excess oxygen may be formed in the insulating film 114 by introduction of oxygen into the insulating film 114. For example, oxygen (at least including any of oxygen radicals, oxygen atoms, and oxygen ions) is introduced into the insulating film 114 which has been deposited, whereby a region containing excess oxygen is formed. Oxygen can be introduced by an ion implantation method, an ion doping method, a plasma immersion ion implantation method, plasma treatment, or the like.

[Second Transistor]

The semiconductor layer 101 of the transistor 100 is provided over the insulating film 114. The transistor 100 includes the semiconductor layer 101 in contact with the top surface of the insulating film 114, the conductive layers 104a and 104b, and the gate insulating film 102 over the semiconductor layer 101, the gate electrode 103 overlapping the semiconductor layer 101 with the gate insulating film 102 positioned therebetween. Furthermore, the insulating film 112, the insulating film 113, and an insulating film 116 are provided to cover the transistor 100. In addition, the transistor 100 may include the conductive layer 105 functioning as a second gate electrode.

Note that the semiconductor layer 101 may be formed of a single layer but is preferably formed with a stacked-layer structure of the semiconductor layer 101a, the semiconductor layer 101b, and the semiconductor layer 101c, as in the example illustrated in FIGS. 13A to 13C. The transistor 100 in FIGS. 13A to 13C includes the semiconductor layer 101a, the semiconductor layer 101b in contact with the top surface of the semiconductor layer 101a, the conductive layers 104a and 104b that are in contact with the top surface of the semiconductor layer 101b and are apart from each other in a region overlapping the semiconductor layer 101b, the semiconductor layer 101c in contact with the top surface of the semiconductor layer 101b, the insulating film 102 over the semiconductor layer 101c, and the gate electrode 103 overlapping the semiconductor layer 101b with the gate insulating film 102 and the semiconductor layer 101c positioned therebetween. The transistor 100 in FIGS. 13A to 13C includes the conductive layer 105 functioning as a second gate electrode. The conductive layer 105 may be formed at the same time as the conductive layers 152a and 152b that are part of the capacitor 150. The semiconductor layer 101a is provided between the insulating film 114 and the semiconductor layer 101b. The semiconductor layer 101c is provided between the semiconductor layer 101b and the gate insulating film 102. The conductive layer 104a and the conductive layer 104b are in contact with the top surface of the semiconductor layer 101b and the bottom surface of the semiconductor layer 103c.

The transistor 100 is covered with the insulating film 112, the insulating film 113, and the insulating film 116.

Here, it is preferable to use an oxide semiconductor for the semiconductor layer 101b. Oxygen released from the insulating film 114 by heating can be supplied to the semiconductor layer 101b to reduce oxygen vacancy in the semiconductor layer 101b. Consequently, for example, changes in the electrical characteristics of the transistor 100 can be reduced and the reliability of the transistor 100 can be improved.

A relationship between crystallinity and oxygen permeability in the case where the semiconductor layer 101b is an In—Ga—Zn oxide is described below.

An energy barrier due to movement of excess oxygen (oxygen) in a crystal of an In—Ga—Zn oxide is obtained by calculation. In the calculation, plane-wave basis first-principles calculation software Vienna ab-initio simulation package (VASP) based on density functional theory is used. GGA-PBE is used as a functional. Cut-off energy of a plane wave is 400 eV. The effect of an inner shell electron is included by a projector augmented wave (PAW) method.

Figure 61:
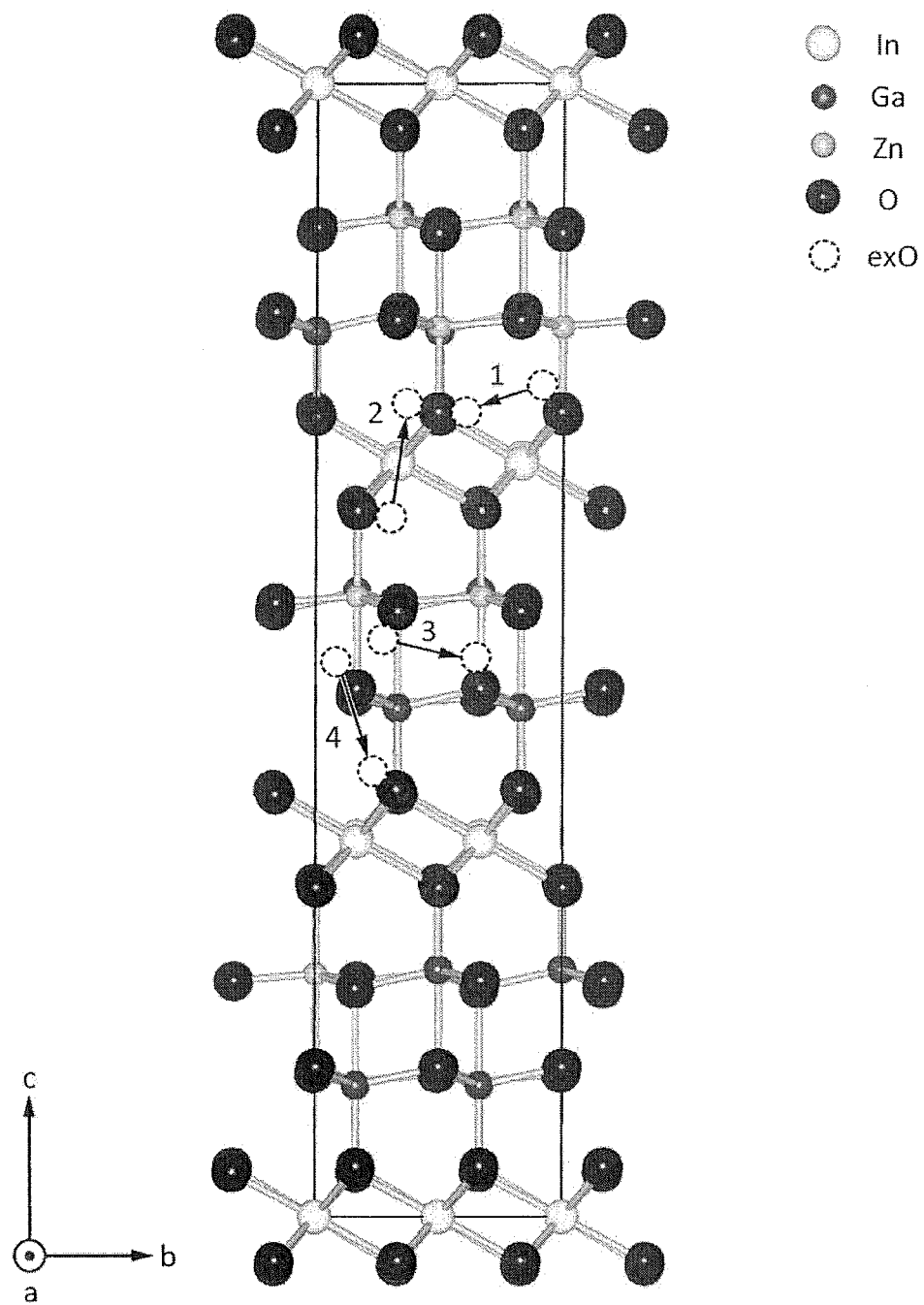
FIG. 61 shows a movement path of oxygen in an In—Ga—Zn oxide.

Here, the ease of movement of excess oxygen (oxygen) through movement paths 1 to 4 in a crystal of an In—Ga—Zn oxide illustrated in FIG. 61 is calculated.

The movement path 1 is a path through which excess oxygen (oxygen) bonded to oxygen bonded to three indium atoms and one zinc atom is bonded to adjacent oxygen bonded to three indium atoms and one zinc atom. The movement path 2 is a path through which excess oxygen (oxygen) bonded to oxygen bonded to three indium atoms and one gallium atom crosses a layer containing indium and oxygen and is bonded to adjacent oxygen bonded to three indium atoms and one zinc atom. The movement path 3 is a path through which excess oxygen (oxygen) bonded to oxygen bonded to two gallium atoms and one zinc atom is bonded to adjacent oxygen bonded to two zinc atoms and one gallium atom. The movement path 4 is a path through which excess oxygen (oxygen) bonded to oxygen bonded to two gallium atoms and one zinc atom crosses a layer containing gallium, zinc, and oxygen and is bonded to adjacent oxygen bonded to three indium atoms and one gallium atom.

When the frequency of going over an energy barrier $E_a$ per unit time is referred to as a diffusion frequency R, R can be expressed as the following formula.

$$R = \nu \cdot \exp[-E_a/(k_B T)]$$

Note that $\nu$ represents the number of heat vibrations of diffusion atoms, $k_B$ represents Boltzmann constant, and T represents the absolute temperature. The diffusion frequency R at 350° C. and 450° C. when $10^{13}$ [1/sec] is applied to $\nu$ as Debye frequency is shown in Table 5.

TABLE 5

| | Energy barrier [eV] | Diffusion frequency R [1/sec] | |
| --- | --- | --- | --- |
| | | 350° C. | 450° C. |
| Movement path 1 | 0.50 | $9.0 \times 10^8$ | $3.3 \times 10^9$ |
| Movement path 2 | 1.97 | $1.2 \times 10^{-3}$ | $1.9 \times 10^{-1}$ |
| Movement path 3 | 0.53 | $5.2 \times 10^8$ | $2.0 \times 10^9$ |
| Movement path 4 | 0.56 | $3.0 \times 10^8$ | $1.3 \times 10^9$ |

As shown in Table 5, the movement path 2 across the layer containing indium and oxygen has a higher energy barrier than the other movement paths. This indicates that movement of excess oxygen (oxygen) in the c-axis direction is less likely to occur in a crystal of an In—Ga—Zn oxide. In other words, in the case where crystals have c-axis alignment and the c-axes are aligned in a direction substantially perpendicular to a formation surface or a top surface, like CAAC-OS, movement of excess oxygen (oxygen) is less likely to occur in the direction substantially perpendicular to the formation surface or the top surface.

Therefore, when excess oxygen is supplied to the semiconductor layer 101b, oxygen may be supplied from a direction which is slightly deviated from the direction perpendicular to the formation surface or the top surface. For example, after the semiconductor layer 101b is formed, oxygen may be supplied through the side surface thereof.

For example, when the semiconductor layer 101b is stacked over the semiconductor layer 101a, movement of excess oxygen is less likely to occur at the top surface of the semiconductor layer 101a, i.e., the interface with the semiconductor layer 101b. Therefore, release of oxygen which has been supplied from the semiconductor layer 101b can be prevented. In a similar manner, when the semiconductor layer 101c is stacked over the semiconductor layer 101b, movement of excess oxygen is less likely to occur at the interface between the semiconductor layer 101b and the semiconductor layer 101c; as a result, release of oxygen from the semiconductor layer 101b can be prevented. In contrast, there is a possibility that oxygen is likely to be released from the side surface of the semiconductor layer 101b; therefore, the side surface of the semiconductor layer 101b is preferably covered with the semiconductor layer 101c, for example, as illustrated in FIGS. 5A to 5C. Alternatively, the side surface of the semiconductor layer 101b is preferably covered with the insulating film 112 and covered with the gate electrode 103 or the like with the gate insulating film 102 positioned therebetween, for example, as illustrated in FIGS. 6A and 6B.

Note that at least part (or all) of the conductive layer 104a (and/or the conductive layer 104b) is provided on at least part (or all) of a surface, a side surface, a top surface, and/or a bottom surface of a semiconductor layer such as the semiconductor layer 101b (and/or the semiconductor layer 101a).

Alternatively, at least part (or all) of the conductive layer 104a (and/or the conductive layer 104b) is in contact with at least part (or all) of a surface, a side surface, a top surface, and/or a bottom surface of a semiconductor layer such as the semiconductor layer 101b (and/or the semiconductor layer 101a). Alternatively, at least part (or all) of the conductive layer 104a (and/or the conductive layer 104b) is in contact with at least part (or all) of a semiconductor layer such as the semiconductor layer 101b (and/or the semiconductor layer 101a).

Alternatively, at least part (or all) of the conductive layer 104a (and/or the conductive layer 104b) is electrically connected to at least part (or all) of a surface, a side surface, a top surface, and/or a bottom surface of a semiconductor layer such as the semiconductor layer 101b (and/or the semiconductor layer 101a). Alternatively, at least part (or all) of the conductive layer 104a (and/or the conductive layer 104b) is electrically connected to part (or all) of a semiconductor layer such as the semiconductor layer 101b (and/or the semiconductor layer 101a).

Alternatively, at least part (or all) of the conductive layer 104a (and/or the conductive layer 104b) is provided near at least part (or all) of a surface, a side surface, a top surface, and/or a bottom surface of a semiconductor layer such as the semiconductor layer 101b (and/or the semiconductor layer 101a). Alternatively, at least part (or all) of the conductive layer 104a (and/or the conductive layer 104b) is provided near part (or all) of a semiconductor layer such as the semiconductor layer 101b (and/or the semiconductor layer 101a).

Alternatively, at least part (or all) of the conductive layer 104a (and/or the conductive layer 104b) is placed on a side of at least part (or all) of a surface, a side surface, a top surface, and/or a bottom surface of a semiconductor layer such as the semiconductor layer 101b (and/or the semiconductor layer 101a). Alternatively, at least part (or all) of the conductive layer 104a (and/or the conductive layer 104b) is placed on a side of part (or all) of a semiconductor layer such as the semiconductor layer 101b (and/or the semiconductor layer 101a).

Alternatively, at least part (or all) of the conductive layer 104a (and/or the conductive layer 104b) is provided obliquely above at least part (or all) of a surface, a side surface, a top surface, and/or a bottom surface of a semiconductor layer such as the semiconductor layer 101b (and/or the semiconductor layer 101a). Alternatively, at least part (or all) of the conductive layer 104a (and/or the conductive layer 104b) is provided obliquely above part (or all) of a semiconductor layer such as the semiconductor layer 101b (and/or the semiconductor layer 101a).

Alternatively, at least part (or all) of the conductive layer 104a (and/or the conductive layer 104b) is provided above at least part (or all) of a surface, a side surface, a top surface, and/or a bottom surface of a semiconductor layer such as the semiconductor layer 101b (and/or the semiconductor layer 101a). Alternatively, at least part (or all) of the conductive layer 104a (and/or the conductive layer 104b) is provided above part (or all) of a semiconductor layer such as the semiconductor layer 101b (and/or the semiconductor layer 101a).

The semiconductor layer 101 may contain a semiconductor such as a silicon-based semiconductor in a region where a channel is formed. It is particularly preferable that the semiconductor layer 101 contains a semiconductor having a wider band gap than silicon. The semiconductor layer 101 is preferably formed using an oxide semiconductor. A semiconductor material having a wider band gap and a lower carrier density than silicon is preferably used because off-state leakage current of the transistor can be reduced.

The use of such materials for the semiconductor layer makes it possible to provide a highly reliable transistor in which a change in the electrical characteristics is suppressed.

As for a preferable mode of an oxide semiconductor which can be used for the semiconductor layer, the oxide semiconductor described in Embodiment 1 can be referred to, for example.

Note that in this specification and the like, in the case of the substantially purified oxide semiconductor layer, the carrier density thereof is lower than $1\times10^{17}/cm^3$, lower than $1\times10^{15}/cm^3$, or lower than $1\times10^{13}/cm^3$. With a highly purified intrinsic oxide semiconductor layer, the transistor can have stable electric characteristics.

One of the conductive layer 104a and the conductive layer 104b serves as a source electrode and the other serves as a drain electrode.

The conductive layer 104a and the conductor layer 104b are each formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 102 may be formed with a single layer or a stack using, for example, one or more of silicon oxide, silicon oxynitride, silicon nitride oxide, aluminum oxide, hafnium oxide, gallium oxide, Ga—Zn-based metal oxide, silicon nitride, and the like.

The gate insulating film 102 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide.

The gate insulating film 102 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

As the gate insulating film 102, like the insulating film 114, an oxide insulating film that contains oxygen in excess of that in the stoichiometric composition is preferably used.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

In the transistor in which electrons are trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In either case, it is preferable that the semiconductor device be not exposed to temperatures of 125° C. or higher for 1 hour or more after the process for trapping electrons.

The gate electrode 103 can be formed using, for example, a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used for the gate electrode 103. Further, the gate electrode 103 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film, or a nitride film containing aluminum and one or more metals selected from titanium, tantalum, tungsten, molybdenum, chromium, neodymium, and scandium may be used.

The gate electrode 103 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 103 and the gate insulating film 102. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 101, specifically an In—Ga—Zn-based oxynitride semiconductor film having a nitrogen concentration higher than or equal to 7 atomic %, is used.

For the insulating film 112, as in the case of the barrier film 111, a material to which water or hydrogen does not easily diffuse is preferably used. In particular, for the insulating film 112, a material relatively impermeable to oxygen is preferably used.

By covering the semiconductor layer 101 with the insulating film 112 including a material relatively impermeable to oxygen, oxygen can be prevented from being released from the semiconductor layer 101 to a portion over the insulating film 112. Furthermore, oxygen released from the insulating film 114 can be confined below the insulating film 112, resulting in an increase in the amount of oxygen to be supplied to the semiconductor layer 101.

The insulating film 112 relatively impermeable to water or hydrogen can inhibit water or hydrogen, which is an impurity for an oxide semiconductor, from entering the oxide semiconductor layer 101 from the outside; therefore, a change in the electrical characteristics of the transistor 100 can be suppressed and the transistor can have high reliability.

Note that an insulating film from which oxygen is released by heating like the insulating film 114 may be provided under insulating film 112 to supply oxygen also from a portion over the semiconductor layer 101 through the gate insulating film 102.

As illustrated in FIG. 13B, the gate electrode 103 is provided so as to face top and side surfaces of the semiconductor layer 101b in the cross section of the transistor in the channel width direction. Thus, a channel is formed not only in the vicinity of the top surface but also in the vicinity of the side surface of the semiconductor layer 101b, and the effective channel width is increased, which results in increased current in an on state of the transistor (i.e., on-state current). In particular, in the case where the width of the semiconductor layer 101b is extremely small (for example, less than or equal to 50 nm, preferably less than or equal to 30 nm, more preferably less than or equal to 20 nm), a region where the channel is formed spreads inside the semiconductor layer 101b, so that the on-state current is increased as the transistor is miniaturized.

The above is the description of the transistor 100.

The insulating film 116 covering the transistor 100 functions as a planarization layer which covers an uneven surface shape of an underlying layer. The insulating film 113 may function as a protective layer when the insulating film 116 is formed. The insulating film 113 is not necessarily provided.

A plug 321, a plug 322, and a plug 123 that are electrically connected to the conductive layer 104b or the conductive layer 104a are embedded in the insulating film 112, the insulating film 113, and the insulating film 116.

A wiring 124 and the like that are electrically connected to the plug 322 are provided over the insulating film 116.

Here, the wiring 124 in FIG. 13A corresponds to the wiring BL in FIG. 12A. In a similar manner, a wiring 166 in FIG. 13B corresponds to the wiring BG, and although not illustrated, a wiring connected to the gate electrode 103 in FIGS. 13A to 13C corresponds to the wiring WL. The wiring connected to the conductive layer 152a and the conductive layer 152b corresponds to the wiring CL. Furthermore, a wiring connected to the low-resistance layer 133b of the transistor 130 corresponds to the wiring SL. A node including the gate electrode 135 of the transistor 130, the conductive layer 151 functioning as a first electrode of the capacitor 150, and the conductive layer 104a of the transistor 100 corresponds to the node FN illustrated in FIG. 12A.

As illustrated in FIGS. 13A to 13C, the insulating film 137 which contains the same material as the barrier film 111 may be provided over the insulating film 136 containing hydrogen. This structure can effectively prevents water or hydrogen remaining in the insulating film 136 containing hydrogen from diffusing upward. In that case, heat treatment for removing water or hydrogen may performed twice or more in total: before formation of the insulating film 137, and after formation of the insulating film 137 and before formation of the barrier film 111.

Here, wirings such as the wiring 124 and the wiring 166 can be formed using a conductive material such as a metal material, an alloy material, or a metal oxide material. It is particularly preferable to use a high-melting-point material that has both heat resistance and conductivity, such as tungsten or molybdenum, and it is particularly preferable to use tungsten.

Conductive layers such as the conductive layer 151, the conductive layer 152a, the conductive layer 152b, the conductive layer 251, and the conductive layer 143; and plugs such as the plugs 123, the plug 139, the plug 140, a plug 164, and a plug 165 can be formed using any of conductive materials such as metal materials, alloy materials, and metal oxide materials. It is particularly preferable to use a high-melting-point material that has both heat resistance and conductivity, such as tungsten or molybdenum, and it is particularly preferable to use tungsten. A stack including a material such as titanium nitride or titanium and another material may be used. For example, use of titanium nitride or titanium can improve adhesion with an opening. Furthermore, the conductive layers such as the as the conductive layer 151, the conductive layer 152a, the conductive layer 152b, the conductive layer 251, and the conductive layer 143; the plugs such as the plugs 123, the plug 139, the plug 140, the plug 164, and the plug 165; and the like are provided in insulating films, and the top surfaces thereof are preferably planarized.

The semiconductor device of one embodiment of the present invention includes the transistor 130 and the transistor 100 over the transistor 130. Since these transistors are stacked, the area occupied by the elements can be reduced. Furthermore, the barrier film 111 provided between the transistor 130 and the transistor 100 can prevents diffusion of impurities such as water and hydrogen from an underlying layer to the transistor 100 side. Furthermore, the conductive layer 151 part of which functions as the first electrode and the conductive layers 152a and 152b part of which functions as a second electrode are provided with the barrier film 111 therebetween to form the capacitor 150; thus, the capacitor 150 can be easily formed without additional steps for forming the capacitor 150.

[Structure Example 2]

Next, a circuit diagram in FIG. 12B shows a configuration in which two CMOS circuits are connected. In each of the CMOS circuits, a p-channel transistor and an n-channel transistor are connected in series and gates of them are connected to each other. Here, for example, the transistor 100 and a transistor 201 which include the second semiconductor material may be used as the n-channel transistors, and the transistor 130 and a transistor 230 which include the first semiconductor material may be used as the p-channel transistors.

FIGS. 14A to 14C illustrate an example of a cross-sectional structure of a semiconductor device in which the circuit shown in FIG. 12B can be obtained. Note that FIG. 14B illustrates a cross section taken along dashed dotted line A-B in FIG. 14A, which is perpendicular to the cross section in FIG. 14A. As illustrated in FIGS. 14A and 14B, a p-channel transistor and an n-channel transistor are stacked, whereby the circuit area can be reduced in some cases.

The semiconductor device in FIGS. 14A to 14C includes the transistor 230, a transistor 231, and the transistor 100. As illustrated in FIG. 14A, the transistor 100 is provided over the transistor 230, and at least one barrier film is provided between the transistor 230 and the transistor 100. Furthermore, as illustrated in FIG. 14B, the transistor 100 is provided over the transistor 231, and at least one barrier film is provided between the transistor 231 and the transistor 100. Note that the transistor 201 is not illustrated in FIGS. 14A to 14C The transistor 230 and the transistor 231 include a first semiconductor material. The transistor 100 and the transistor 201 include a second semiconductor material. The first semiconductor material and the second semiconductor material may be the same material but they are preferably different semiconductor materials.

Examples of semiconductors that can be used as the first semiconductor material or the second semiconductor material are semiconductor materials such as silicon, germanium, gallium, and arsenic; compound semiconductor materials containing silicon, germanium, gallium, arsenic, or aluminum; organic semiconductor materials; and oxide semiconductor materials.

Here, the case where single crystal silicon is used as the first semiconductor material and an oxide semiconductor is used as the second semiconductor material is described.

The transistors 230 and 231 and the transistor 100 are stacked. Here, the transistor 230 is a p-channel transistors, and the transistor 100 is an n-channel transistor.

The transistor 230 is provided on the semiconductor substrate 131 and includes the semiconductor layer 132 which is part of the semiconductor substrate 131, the gate insulating film 134, the gate electrode 135, and low-resistance layers 233a and 233b functioning as source and drain regions. The transistor 231 is provided on the semiconductor substrate 131 and includes a semiconductor layer 132b which is part of the semiconductor substrate 131, a gate insulating film 134b, a gate electrode 135b, and low-resistance layers 233c and 233d functioning as source and drain regions. FIG. 14C shows a cross section taken along dashed dotted line C-D in FIG. 14B.

It is preferable that a region of the semiconductor layer 132 where a channel is formed, a region in the vicinity thereof, the low low-resistance layers 233a, 233b, 233c, and 233d serving as source and drain regions, and the like include a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 230 may be a high-electron-mobility transistor (HEMT) with GaAs and GaAlAs or the like.

The transistor 230 may include regions 276a, 276b, 276c, and 276d that serve as LDD regions.

The low-resistance layers 233a, 233b, 233c, and 233d include an element that imparts n-type conductivity, such as phosphorus, or an element that imparts p-type conductivity, such as boron, in addition to a semiconductor material used for the semiconductor layer 132. Here, for example, the case where an element imparts p-type conductivity, such as boron, is included is considered.

The gate electrode 135 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

As illustrated in FIG. 14A, the low-resistance layer 233a of the transistor 230 is electrically connected to the conductive layer 104b of the transistor 100 through the plug 140 and the conductive layer 251. Here, the conductive layer 104b is preferably formed to fill an opening of the insulating film 114 and a barrier film 211. Here, by forming the conductive layer 104b to fill the opening of the insulating film 114 and the barrier film 211, another plug for electrically connecting the conductive layer 104b and the conductive layer 251 need not be formed, so that the process can be simplified and the design does not require the accuracy of the positions of the conductive layer 104b and the plug; thus, higher integration is possible.

Furthermore, as illustrated in FIG. 14B, the gate electrode 135 of the transistor 230, the low-resistance layer 233c and the gate electrode 103 of the transistor 231 are electrically connected to each other through the plug 139, a plug 323, the conductive layer 151, and a conductive layer 104c. Here, the conductive layer 104c is preferably formed at the same time as the conductive layer 104a and the conductive layer 104b. When the conductive layers 104a, 104b, and 104c are formed at the same time, another plug need not be formed in an opening of the barrier film 211 and the insulating film 114; therefore, the process can be simplified.

Note that what is called a FIN-type transistor similar to that illustrated in FIGS. 15C and 15D may be used as each of the transistors 230 and 231.

The description of the transistor 100 in FIGS. 13A to 13C may be referred to for the transistor 100 in FIGS. 14A to 14C.

Next, a modification example of the semiconductor device in FIGS. 14A to 14C is illustrated in FIG. 15A. Note that FIG. 15B illustrates a cross section taken along dashed dotted line A-B in FIG. 15A, which is perpendicular to the cross section in FIG. 15A. The transistor structure illustrated in FIG. 9A is applied to the transistor 100 in FIGS. 15A to 15D.

The structure of FIGS. 15A to 15D is different from that in FIGS. 14A to 14C in that, for example, the conductive layers 104a, 104b, and 104c are not provided, a plug 121 and a plug 122 are provided, and the plug 322 has a different shape.

Here, the CMOS circuit described in this embodiment can be used as a basic element of a logic circuit such as a NAND circuit, a NOR circuit, an encoder, a decoder, a multiple amplifier (MUX), or a demultiplexer (DEMUX).

The above is the description of a structural example.

[Example of Manufacturing Method]

An example of a method for manufacturing the semiconductor device illustrated in FIGS. 13A to 13C of the semiconductor devices described in the above structure examples is described below with reference to FIGS. 16A to 16E, FIGS. 17A to 17D, FIGS. 18A to 18C, and FIGS. 19A and 19B.

First, the semiconductor substrate 131 is prepared. As the semiconductor substrate 131, for example, a single crystal silicon substrate (including a p-type semiconductor substrate or an n-type semiconductor substrate), a compound semiconductor substrate containing silicon carbide or gallium nitride, or the like can be used. An SOI substrate may be used as the semiconductor substrate 131. The case where single crystal silicon is used for the semiconductor substrate 131 is described below.

Next, an element isolation layer (not illustrated) is formed in the semiconductor substrate 131. The element isolation layer may be formed by a local oxidation of silicon (LOCOS) method, a shallow trench isolation (STI) method, mesa isolation, or the like.

In the case where a p-channel transistor and an n-channel transistor are formed on the same substrate, an n-well or a p-well may be formed in part of the semiconductor substrate 131. For example, a p-well may be formed by adding an impurity element imparting p-type conductivity, such as boron, to an n-type semiconductor substrate 131, and an n-channel transistor and a p-channel transistor may be formed on the same substrate.

Next, an insulating film to be the gate insulating film 134 is formed over the semiconductor substrate 131. For example, a surface of the semiconductor substrate 131 is oxidized, whereby a silicon oxide film is formed. Alternatively, the insulating film may be formed as a stack of a silicon oxide film and a silicon oxynitride film formed in such a manner that the silicon oxide film is formed by thermal oxidation, and then a surface of the silicon oxide film is nitrided by nitridation treatment. Further alternatively, the insulating film may be formed using silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like.

The insulating film may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Next, a conductive film to be the gate electrode 135 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used. As a metal nitride, tungsten nitride, molybdenum nitride, or titanium nitride can be used. When the metal nitride film is provided, adhesiveness of the metal film can be increased; thus, separation can be prevented.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Next, a resist mask is formed over the conductive film by a lithography process or the like and an unnecessary portion of the conductive film is removed. Then, the resist mask is removed. In this manner, the gate electrode 135 can be formed.

Here, a method for processing a film is described. In the case of finely processing a film, a variety of fine processing techniques can be used. For example, a method may be used in which a resist mask formed by a photolithography process or the like is subjected to slimming treatment. Alternatively, a method may be used in which a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

An organic resin film having a function of improving adhesion between the film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In a particularly minute process, the organic resin film is preferably formed using a material functioning as an anti-reflection film against light for exposure. Examples of such an organic resin film serving as an anti-reflection film include bottom anti-reflection coating (BARC) film. The organic resin film may be removed at the same time as the removal of the resist mask or after the resist mask is removed.

After the gate electrode 135 is formed, a sidewall covering the side surface of the gate electrode 135 may be formed. The sidewall can be formed in such a manner that an insulating film thicker than the gate electrode 135 is formed and subjected to anisotropic etching so that only a portion of the insulating film on the side surface of the gate electrode 135 remains.

FIGS. 16A to 16E illustrate an example in which etching of the gate insulating film is not performed at the time of formation of the sidewall. However, the insulating film to be the gate insulating film 134 may be performed at the same time as formation of the sidewall. In this case, the gate insulating film 134 is provided below the gate electrode 135 and the sidewall.

Figure 16A:
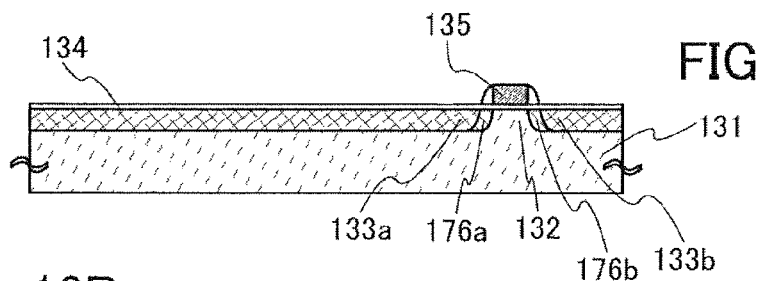
FIGS. 16A to 16E illustrate a method for manufacturing a semiconductor device of one embodiment of the present invention.

Next, an element imparting n-type conductivity, such as phosphorus, or an element imparting p-type conductivity, such as boron, is added to a region of the semiconductor substrate 131 where the gate electrode 135 (and the sidewall) is not provided. FIG. 16A illustrates a schematic cross-sectional view at this stage.

Next, the insulating film 136 is formed, and then, first heat treatment is performed to activate the aforementioned element which imparts conductivity.

The insulating film 136 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 136 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The first heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 130 is formed. Furthermore, a third transistor 160 may be formed in a manner similar to that for forming the transistor 130.

Next, the insulating film 137 and the insulating film 138 are formed.

The insulating film 137 can be formed using any of the materials that can be used for the insulating film 136, and is preferably formed using silicon nitride containing oxygen and hydrogen (SiNOH) because the amount of hydrogen released by heating can be increased. Alternatively, the insulating film 138 can be formed using any of the materials that can be used for the insulating film 136, and is preferably formed using silicon oxide with high step coverage that is formed by reacting tetraethyl orthosilicate (TEOS), silane, or the like with oxygen, nitrous oxide, or the like.

The insulating films 137 and 138 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, the top surface of the insulating film 138 is planarized by a CMP method or the like. As the insulating film 138, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of boron phosphorus silicate glass (BPSG). Furthermore, an example of a film which can be formed by a coating method is a film of hydrogen silsesquioxane (HSQ).

After that, second heat treatment is performed so that dangling bonds in the semiconductor layer 132 are terminated by hydrogen released from the insulating film 137. By the second heat treatment, water and hydrogen are released from each layer; thus, the water content and the hydrogen content can be reduced.

The second heat treatment can be performed under the conditions given as an example in the above description of the stacked-layer structure. For example, the conditions described for the first heat treatment or the like can be used.

Figure 16B:
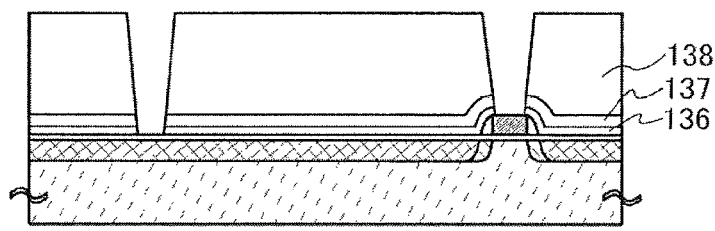
Figure 16C:
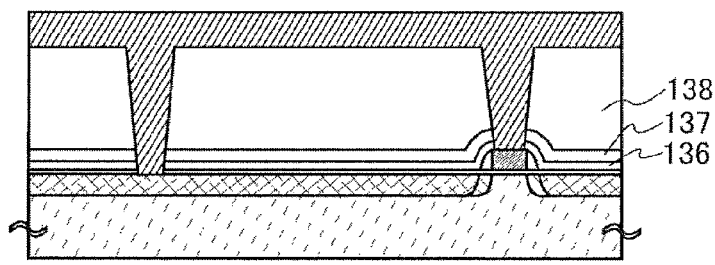
Figure 16D:
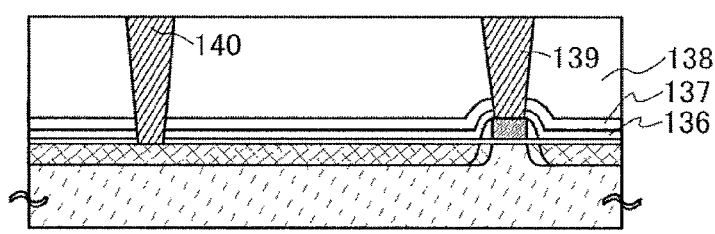
Figure 16E:
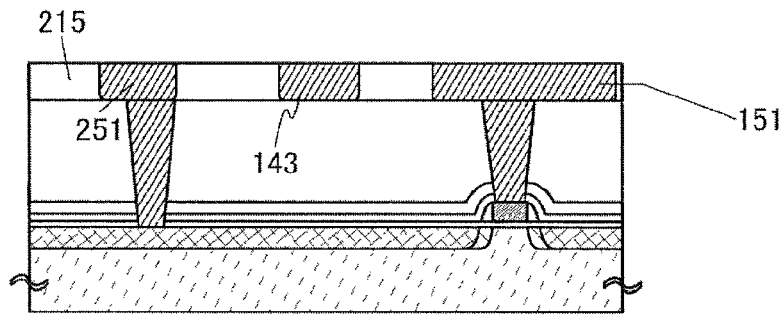

Next, openings reaching the low-resistance layers 133a and 133b, the gate electrode 135, and the like are formed in the insulating film 136, the insulating film 137, and the insulating film 138 (see FIG. 16B). After that, a conductive film is formed to fill the openings (see FIG. 16C). Then, planarization treatment is performed on the conductive film so that the top surface of the insulating film 138 is exposed, whereby the plug 139, the plug 140, and the like are formed (see FIG. 16D). The conductive film can be formed by a sputtering method, a CVD method (including a thermal CVD method, an MOCVD method, a PECVD method, and the like), an MBE method, an ALD method, a PLD method, or the like.

Next, an insulating film 215 is deposited over the insulating film 138. The insulating film 215 can be formed using a material and a method similar to those of the insulating film 136 and the like.

After the insulating film 215 is formed, third heat treatment is preferably performed. By the third heat treatment, water and hydrogen are released from each layer; thus, the contents of water and hydrogen can be reduced. In the case where the third heat treatment is performed shortly before formation of the barrier film 111 to thoroughly remove hydrogen and water from layers under the barrier film 111 and then the barrier film 111 is formed, it is possible to inhibit diffusion and release of water and hydrogen to the side under the barrier film 111 in a later step.

The third heat treatment can be performed under the conditions given as an example in the above description of the stacked-layer structure. For example, the conditions described for the first heat treatment or the like can be used.

Then, openings are formed in the insulating film 215. After that, a conductive film is formed to fill the openings and subjected to planarization treatment so that the top surface of the insulating film 215 is exposed, whereby the conductive layer 251, the conductive layer 143, the conductive layer 151, and the like are formed (see FIG. 16E).

Then, the barrier film 111 is deposited, and an opening is formed (see FIG. 17A). The barrier film 111 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, a conductive film to be the conductive layers 105, 152a, and 152b is deposited. After that, the conductive layers 105, 152a, and 152b are formed by etching or the like (see FIG. 17B).

Next, the insulating film 114 is deposited. The insulating film 114 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

To make the insulating film 114 contain excess oxygen, the insulating film 114 may be deposited in an oxygen atmosphere, for example. Alternatively, a region containing excess oxygen may be formed by introduction of oxygen into the insulating film 114 that has been deposited. Both the methods may be combined.

For example, oxygen (at least including any of oxygen radicals, oxygen atoms, and oxygen ions) is introduced into the insulating film 114 which has been deposited, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

After the insulating film 114 is formed, the insulating film 114 may be subjected to planarization treatment using a CMP method or the like to improve the planarity the top surface thereof.

Next, a semiconductor film to be the semiconductor layer 101a and a semiconductor film to be the semiconductor layer 101b are deposited in this order (see FIG. 17C). The semiconductor films are preferably formed successively without contact with the air. The semiconductor film to be the semiconductor layer 101a and the semiconductor film to be the semiconductor layer 101b can be formed by a sputtering method, a CVD method, an MBE method, a PLD method, an ALD method, or the like.

Note that in the case where In—Ga—Zn oxide layers formed by an MOCVD method are used as the semiconductor to be the semiconductor layer 101a and the semiconductor to be the semiconductor layer 101b, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

Here, after the semiconductor layer 101a is formed, oxygen may be introduced into the semiconductor layer 101a. For example, oxygen (at least including any of oxygen radicals, oxygen atoms, and oxygen ions) is introduced into the semiconductor layer 101a that has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

After the semiconductor layers 101a and 101b are formed, fourth heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. Note that the heat treatment may be performed directly after the formation of the semiconductor films or may be performed after the semiconductor films are processed into the island-shaped semiconductor layers 101a and 101b. Through the heat treatment, oxygen can be supplied to the semiconductor films from the insulating film 114 and the oxide film; thus, oxygen vacancy in the semiconductor films can be reduced.

Then, a resist mask is formed by a method similar to that described above, and an unnecessary portion is removed by etching. Then, the resist mask is removed. In this manner, a stacked-layer structure including the island-shaped semiconductor layers 101a and 101b can be formed (see FIG. 17D). Note that, in some cases, part of the insulating film 114 is etched in the etching of the semiconductor films to reduce the thickness of a portion of the insulating film 114 which is not covered with the semiconductor layer 101a and the semiconductor layer 101b. For this reason, the insulating film 114 is preferably formed to have a large thickness so as not to be removed by the etching.

Figure 18A:
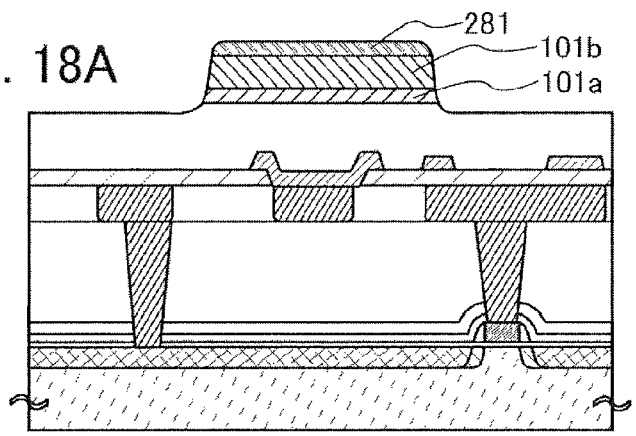
FIGS. 18A to 18C illustrate a method for manufacturing a semiconductor device of one embodiment of the present invention.

Note that there is a possibility that the resist is totally removed depending on the etching conditions of the semiconductor films; therefore, what is called a hard mask formed of a material with high resistance to etching, such as an inorganic film or a metal film, may be used. Here, for example, a conductive film is used as a hard mask 281. FIG. 18A illustrates an example in which the semiconductor layer 101a and the semiconductor layer 101b are formed in such a manner that the semiconductor films are processed using the hard mask 281. Here, when the material which can be used as the conductive layers 104a and 104b is used for the hard mask 281, the conductive layers 104a and 104b can be formed by processing the hard mask 281. With use of such a method, the transistor 100 illustrated in FIGS. 6A and 6B can be manufactured, for example.

Figure 18B:
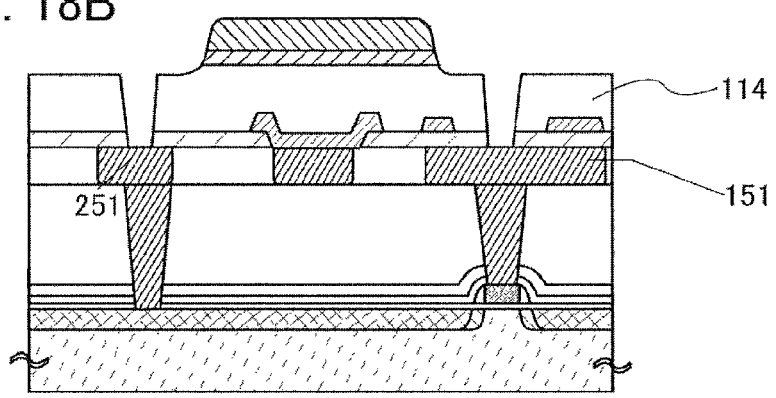
Figure 18C:
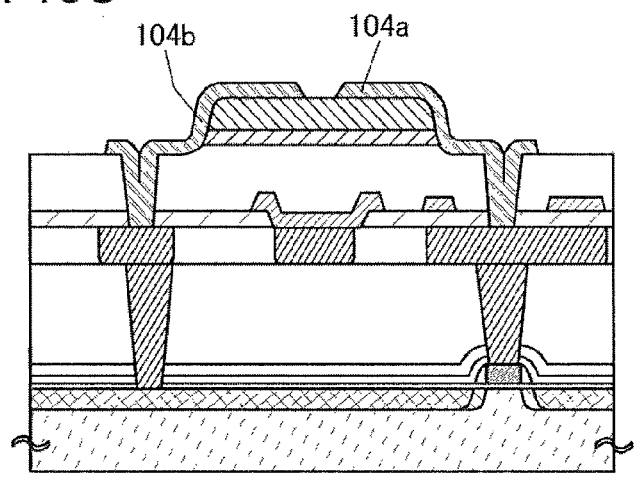
Figure 19A:
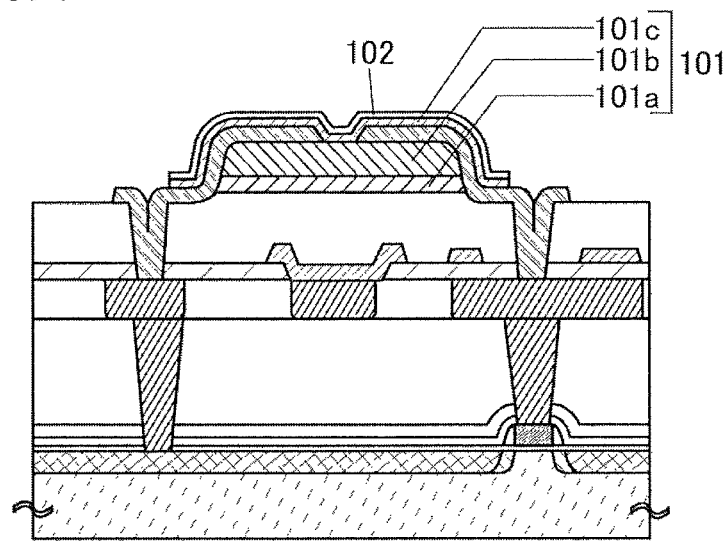
FIGS. 19A and 19B illustrate a method for manufacturing a semiconductor device of one embodiment of the present invention.
Figure 19B:
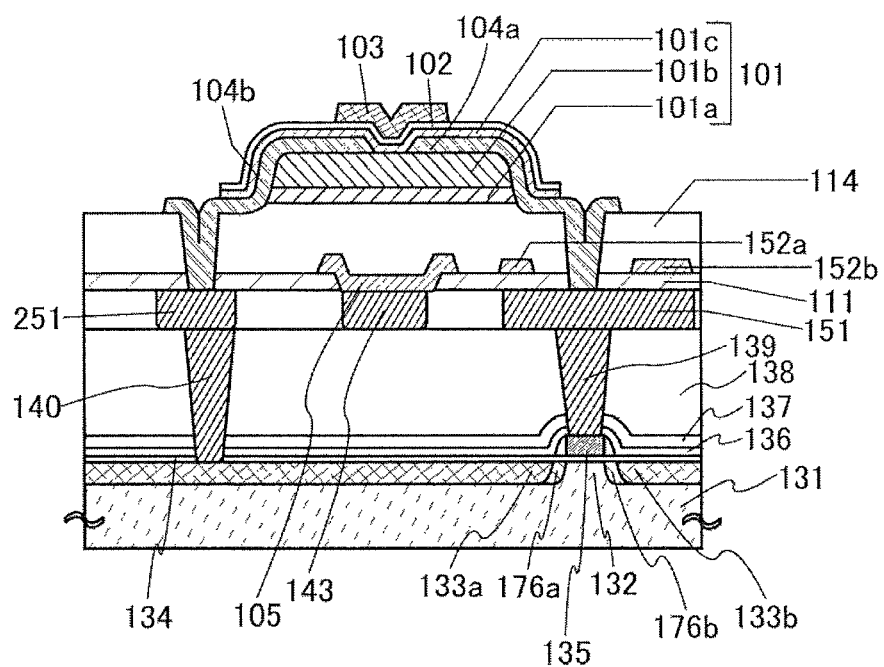

After a structure in FIG. 17D is formed, openings reaching the conductive layer 151, the conductive layer 251, and the like are formed in the insulating film 114 (see FIG. 18B). After that, a conductive film to be the conductive layer 104a, the conductive layer 104b, and the like is formed to fill the openings provided in the insulating film 114. The conductive film to be the conductive layer 104a, the conductive layer 104b, and the like can be formed by, for example, a sputtering method, a CVD method (including a thermal CVD method, an MOCVD method, a PECVD method, and the like), an MBE method, an ALD method, or a PLD method. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

Next, a resist mask is formed, and an unnecessary portion of the conductive film to be the conductive layer 104a, the conductive layer 104b, and the like is removed by etching. After that, the resist mask is removed, so that the conductive layer 104a, the conductive layer 104b, and the like are formed (see FIG. 18C). Here, in some cases, parts of the upper portions of the semiconductor layer 101b and the insulating film 114 are etched in the etching of the conductive film to reduce the thickness of a portion where the conductive layer 104a and the conductive layer 104b do not overlap the semiconductor layer 101b. For this reason, the semiconductor film to be the semiconductor layer 101b, and the like are preferably formed to have a large thickness in advance in consideration of the etching depth.

Next, the semiconductor layer 101c and the gate insulating film 102 are formed. Then, a resist mask is formed, and etching process is performed, and then the resist mask is removed (see FIG. 19A). Next, a conductive film to be the gate electrode 103 is deposited, a resist mask is formed, the conductive film is processed by etching, and the resist mask is removed, whereby the gate electrode 103 is formed (see FIG. 19B). A semiconductor film to be the semiconductor layer 101c can be formed by a sputtering method, a CVD method, an MBE method, a PLD method, an ALD method, or the like.

Alternatively, etching for the semiconductor layer 101c and the gate insulating film 102 may be performed after the gate electrode is formed. The etching may be performed with a resist mask, for example. Alternatively, the gate insulating film 102 and the semiconductor layer 101c may be etched using the formed gate electrode 103 as a mask. With the use of the gate electrode 103 as a mask, as illustrated in FIGS. 5A to 5C and FIGS. 6A and 6B, a shape in which side surfaces of the gate electrode 103, the gate insulating film 102, and the semiconductor layer 101c are substantially continuous can be formed.

Note that in the case where an In—Ga—Zn oxide layer formed by an MOCVD method is used as the semiconductor to be the semiconductor layer 101c, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

After the semiconductor layer 101c is formed, oxygen may be introduced into the semiconductor layer 101c. For example, oxygen (at least including any of oxygen radicals, oxygen atoms, and oxygen ions) is introduced into the semiconductor layer 101c that has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

At this stage, the transistor 100 is formed.

Next, the insulating film 112 is formed. The insulating film 112 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

After the insulating film 112 is formed, fifth heat treatment is preferably performed. Through the heat treatment, oxygen can be supplied from the insulating film 114 and the like to the semiconductor layer 101 to reduce oxygen vacancy in the semiconductor layer 101. At this time, oxygen released from the insulating film 114 is blocked by the barrier film 111 and the insulating film 112 and does not diffuse into layers under the barrier film 111 and layers over the insulating film 114; therefore, oxygen can be effectively confined. Thus, the amount of oxygen supplied to the semiconductor layer 101 can be increased, so that oxygen vacancy in the semiconductor layer 101 can be effectively reduced.

Furthermore, the insulating film 112 may have a stacked-layer structure of two or more layers. In this case, for example, the insulating film 112 may be formed to have a two-layer structure in which the bottom layer is formed using, for example, silicon oxide, silicon oxynitride, silicon nitride oxide, silicon nitride, aluminum oxide, aluminum oxynitride, aluminum nitride oxide, aluminum nitride, or the like. Furthermore, the top layer is preferably formed using a material to which water and hydrogen do not easily diffuse, as in the case of the barrier film 111. The bottom insulating layer may be an insulating film from which oxygen is released by heating in a manner similar to that of an insulating film 114, so that oxygen may be supplied also from above the semiconductor layer 101 through the gate insulating film 102.

Next, the insulating film 113 is formed. The insulating film 113 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 113 can be formed by a sputtering method, a CVD method (including a thermal CVD method, an MOCVD method, a PECVD method, and the like), an MBE method, an ALD method, a PLD method, or the like, for example. In particular, it is preferable that the insulating film 113 be formed by a CVD method, more preferably a plasma CVD method because coverage can be favorable. It is preferable to use a thermal CVD method, an MOCVD method, or an ALD method in order to reduce plasma damage.

Next, openings reaching the conductive layer 104a and the like are provided in the insulating film 113, the insulating film 112, the gate insulating film 102, and the semiconductor layer 101c. Next, a conductive film is formed to fill the openings, an unnecessary portion is removed using a resist mask, and the resist mask is removed, whereby the plug 321 and the plug 322 are formed.

Next, the insulating film 116 is formed. The insulating film 116 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulating film 116 can be formed by a sputtering method, a CVD method (including a thermal CVD method, an MOCVD method, a PECVD method, and the like), an MBE method, an ALD method, a PLD method, or the like, for example. In the case where the insulating film 116 is formed using an organic insulating material such as an organic resin, a coating method such as a spin coating method may be used. After the insulating film 116 is formed, the top surface thereof is preferably subjected to planarization treatment. The material and formation method for the insulating film 138 may be used for the insulating film 116.

Subsequently, the plug 123 reaching the plug 322, and the like are formed in the insulating film 116 by a method similar to that described above.

A conductive film is formed over the insulating film 116. Then, a resist mask is formed by a method similar to that described above, and an unnecessary portion of the conductive film is removed by etching. After that, the resist mask is removed. In this manner, the wiring 124 and the like can be formed.

Through the above steps, the semiconductor device if one embodiment of the present invention can be manufactured.
(Embodiment 4)

In this embodiment, an example of a circuit including the transistor of one embodiment of the present invention is described with reference to drawings.

[Circuit Configuration Example]

When a connection between transistors, wirings, or electrodes is changed from that described in Embodiment 1, a variety of circuits can be formed. Examples of circuit configurations that can be achieved by using a semiconductor device of one embodiment of the present invention are shown below.

[CMOS Circuit]

Figure 24A:
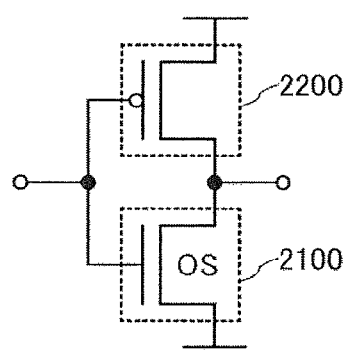
FIGS. 24A to 24D are circuit diagrams of an embodiment.

A circuit diagram in FIG. 24A shows a configuration of a so-called CMOS circuit in which a p-channel transistor 2200 and an n-channel transistor 2100 are connected to each other in series and in which gates of them are connected to each other. Note that transistors including a second semiconductor material are denoted by "OS" in drawings.

[Analog Switch]

Figure 24B:
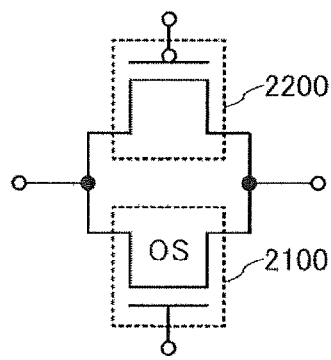

A circuit diagram in FIG. 24B shows a configuration in which sources of the transistors 2100 and 2200 are connected to each other and drains of the transistors 2100 and 2200 are connected to each other. With such a configuration, the transistors can function as a so-called analog switch.

[Example of Memory Device]

Figure 24C:
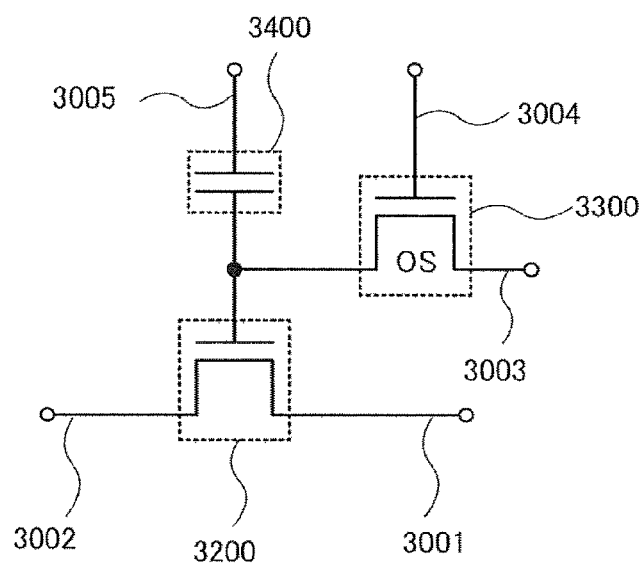

An example of a semiconductor device (memory device) that includes the transistor of one embodiment of the present invention, can retain stored data even when not powered, and has an unlimited number of write cycles is shown in FIG. 24C.

The semiconductor device illustrated in FIG. 24C includes a transistor 3200 using a first semiconductor material, a transistor 3300 including the second semiconductor material, and a capacitor 3400. Note that the transistor described in the above embodiment can be used as the transistor 3300.

In this embodiment, for example, the transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 24C, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to the gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 24C has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is retained (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, only data of desired memory cells need to be read. The fifth wiring 3005 in the case where data is not read may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

Figure 24D:
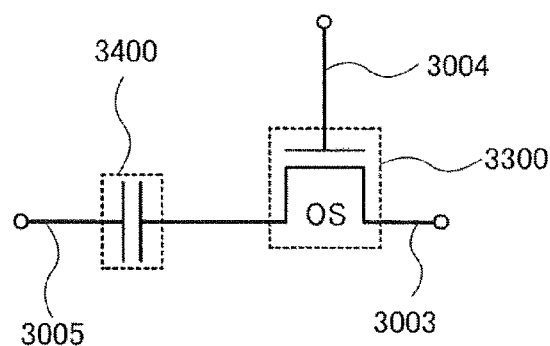

The semiconductor device illustrated in FIG. 24D is mainly different from the semiconductor device illustrated in FIG. 24C in that the transistor 3200 is not provided. Also in this case, writing and retaining operation of data can be performed in a manner similar to that of the semiconductor device illustrated in FIG. 24C.

Next, reading of data is described. When the transistor 3300 is turned on, the third wiring 3003 in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400.

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ (=$(C_B \times V_{B0} + C \times V_1)/(C_B + C)$) is higher than the potential of the third wiring 3003 in the case of retaining the potential $V_0$ (=$(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor having a channel formation region formed including an oxide semiconductor and having an extremely small off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

At least part of this embodiment can be implemented in combination with any of the other embodiments described in this specification as appropriate.

(Embodiment 5)

Figure 60:
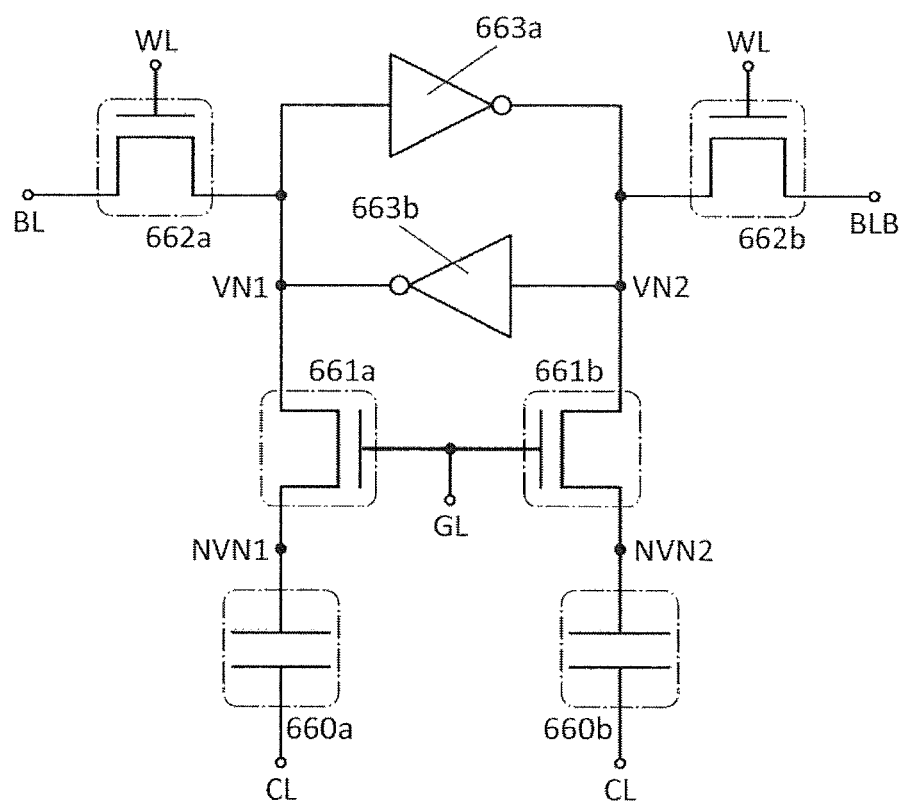
FIG. 60 is a circuit diagram of a semiconductor device of an embodiment.

In this embodiment, an example of a semiconductor device including a transistor of one embodiment of the present invention is described with reference to drawings. FIG. 60 is an example of a circuit diagram of a semiconductor device of one embodiment of the present invention.

The semiconductor device in FIG. 60 includes a capacitor 660a, a capacitor 660b, a transistor 661a, a transistor 661b, a transistor 662a, a transistor 662b, an inverter 663a, an inverter 663b, a wiring BL, a wiring BLB, a wiring WL, a wiring CL, and a wiring GL.

The semiconductor device in FIG. 60 is a memory cell in which the inverter 663a and the inverter 663b are connected in a ring to form a flip-flop. A node to which an output signal of the inverter 663b is output is a node VN1, and a node to which an output signal of the inverter 663a is output is a node VN2. The memory cells are provided in a matrix, whereby a memory device (memory cell array) can be formed.

One of a source and a drain of the transistor 662a is electrically connected to the wiring BL, the other of the source and the drain thereof is electrically connected to the node VN1, and a gate thereof is electrically connected to the wiring WL. One of a source and a drain of the transistor 662b is electrically connected to the node VN2, the other of the source and the drain thereof is electrically connected to the wiring BLB, and a gate thereof is electrically connected to the wiring WL.

One of a source and a drain of the transistor 661a is electrically connected to the node VN1, the other of the source and the drain thereof is electrically connected to one of electrodes of the capacitor 660a, and a gate thereof is electrically connected to the wiring GL. A node between the other of the source and the drain of the transistor 661a and the one of electrodes of the capacitor 660a is a node NVN1. One of a source and a drain of the transistor 661b is electrically connected to the node VN2, the other of the source and the drain thereof is electrically connected to one of electrodes of the capacitor 660b, and a gate thereof is electrically connected to the wiring GL. A node between the other of the source and the drain of the transistor 661b and the one of electrodes of the capacitor 660b is a node NVN2.

The other of electrodes of the capacitor 660a is electrically connected to the wiring CL. The other of electrodes of the capacitor 660b is electrically connected to the wiring CL.

Conduction and non-conduction states of the transistor 662a and the transistor 662b can be controlled by a potential supplied to the wiring WL. Conduction and non-conduction states of the transistor 661a and the transistor 661b can be controlled by a potential supplied to the wiring GL.

Writing, retaining, and reading operations of the memory cell illustrated in FIG. 60 are described below.

In the case where data is written, first, potentials corresponding to data 0 or data 1 are applied to the wiring BL and the wiring BLB.

For example, in the case where data 1 is to be written, a high-level power supply potential (VDD) is applied to the wiring BL and a ground potential is applied to the wiring BLB. Then, a potential (VH) higher than or equal to the sum of VDD and the threshold voltage of the transistors 662a and 662b is applied to the wiring WL.

Next, the potential of the wiring WL is set to be lower than the threshold voltage of the transistors 662a and 662b, whereby the data 1 written to the flip-flop is retained.

In the case where the data is read, first, the wiring BL and the wiring BLB are set to VDD in advance. Then, VH is applied to the wiring WL. Accordingly, the potential of the wiring BL remains VDD, but the potential of the wiring BLB is discharged through the transistor 662a and the inverter 663a to be a ground potential. The potential difference between the wiring BL and the wiring BLB is amplified by a sense amplifier (not illustrated), so that the retained data 1 can be read.

In the case where data 0 is to be written, the wiring BL is set to a ground potential and the wiring BLB is set to VDD; then, VH is applied to the wiring WL. Next, the potential of the wiring WL is set to be lower than the threshold voltage of the transistors 662a and 662b, whereby the data 0 written to the flip-flop is retained. In the case of data reading, the wiring BL and the wiring BLB are set to VDD in advance and VH is applied to the wiring WL, whereby the potential of the wiring BLB remains VDD but the potential of the wiring BL is discharged through the transistor 662b and the inverter 663b to be a ground potential. The potential difference between the wiring BL and the wiring BLB is amplified by the sense amplifier, so that the retained data 0 can be read.

Accordingly, the semiconductor device in FIG. 60 serves as a so-called static random access memory (SRAM). An SRAM does not require refresh operation because the SRAM retains data using a flip-flop. Therefore, power consumption in retaining data can be reduced. In addition, an SRAM does not require a capacitor in a flip-flop and is therefore suitable for applications where high speed operation is required.

In the semiconductor device in FIG. 60, data of the node VN1 can be written to the node NVN1 through the transistor 661a. Similarly, data of the node VN2 can be written to the node NVN2 through the transistor 661b. The written data is retained by turning off the transistor 661a or the transistor 661b. For example, even in the case where supply of a power supply potential is stopped, data of the node VN1 and the node VN2 can be retained in some cases.

Unlike a conventional SRAM in which data is lost immediately after supply of a power supply potential is stopped, the semiconductor device in FIG. 60 can retain data even after supply of a power supply potential is stopped. Therefore, power consumption of the semiconductor device can be reduced by appropriately supplying or stopping a power supply potential. For example, the semiconductor device in FIG. 60 is used in a memory region of a CPU, whereby power consumption of the CPU can be reduced.

Note that the length of a period during which data is retained in the node NVN1 and the node NVN2 depends on the off-state current of the transistor 661a and the transistor 661b. Therefore, a transistor with small off-state current is preferably used as each of the transistor 661a and the transistor 661b in order to retain data for a long time. Alternatively, the capacitance of the capacitor 660a and the capacitor 660b is preferably increased.

For example, the transistor 100 and the capacitor 150 described in Embodiment 1 are used as the transistor 661a and the capacitor 660a, whereby data can be retained in the node NVN1 for a long time. Similarly, the transistor 100 and the capacitor 150 are used as the transistor 661b and the capacitor 660b, whereby data can be retained in the node NVN2 for a long time. Accordingly, the description of the transistor 100 is referred to for the transistor 661a and the transistor 661b. Furthermore, the description of the capacitor 150 is referred to for the capacitor 660a and the capacitor 660b.

As described in the above embodiment, the transistor 100 and the capacitor 150 can be formed to at least partly overlap with the transistor 130. The transistor 662a, the transistor 662b, the transistor included in the inverter 663a, and the transistor included in the inverter 663a in FIG. 60 can be formed to at least partly overlap the transistor 661a, the transistor 661b, the capacitor 660a, and the capacitor 660b in FIG. 60. Accordingly, the semiconductor device in FIG. 60 can be formed without a significant increase in an occupation area in some cases as compared to a conventional SRAM. The description of the transistor 130 is referred to for the transistor 662a, the transistor 662b, the transistor included in the inverter 663a, and the transistor included in the inverter 663b.

As described above, the semiconductor device of one embodiment of the present invention has high performance for an occupation area. Furthermore, the semiconductor device can be manufactured with high productivity.

This embodiment can be combined as appropriate with any of the other embodiments in this specification.

(Embodiment 6)

In this embodiment, an RF tag that includes the transistor described in the above embodiment or the memory device described in the above embodiment is described with reference to FIG. 25.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF device is required to have extremely high reliability in order to be used for this purpose.

A configuration of the RF tag is described with reference to FIG. 25. FIG. 25 is a block diagram illustrating a configuration example of an RF tag.

Figure 25:
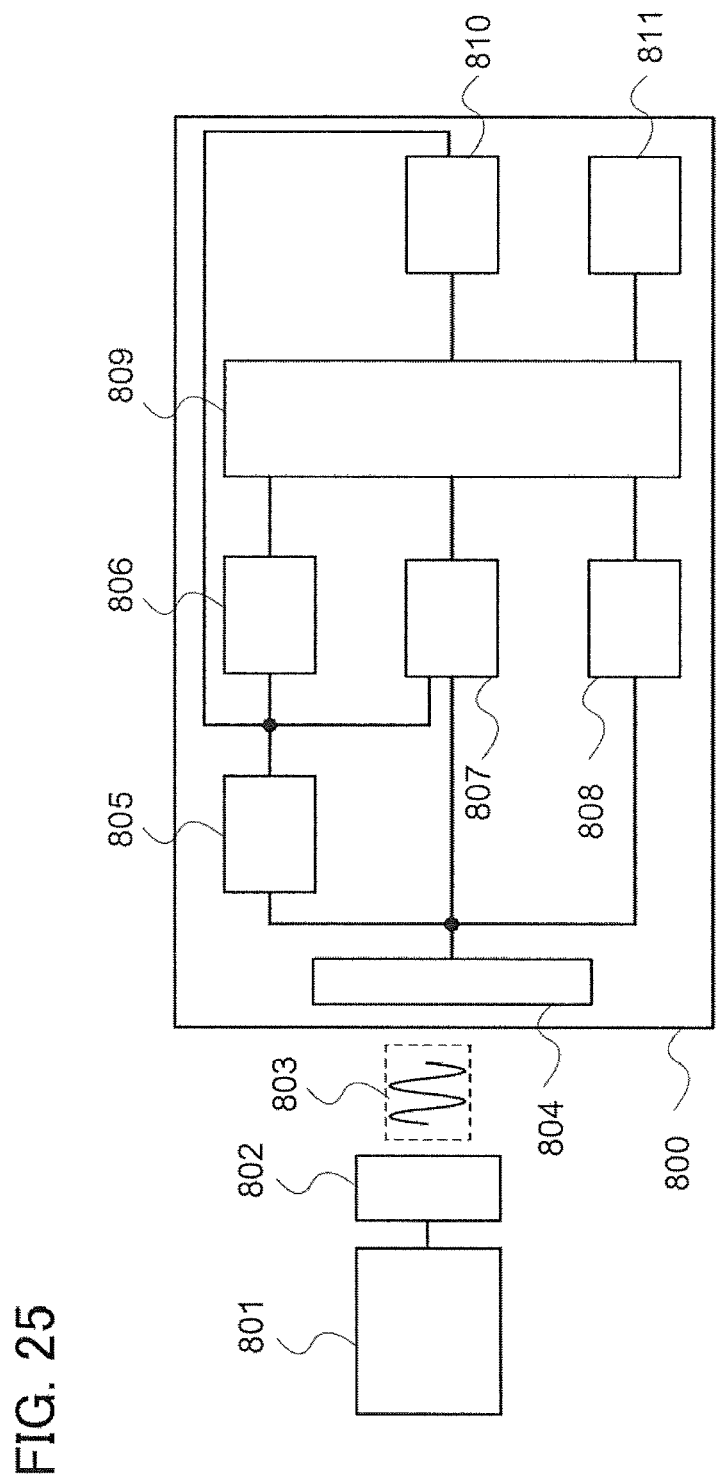
FIG. 25 illustrates a structure example of an RF tag of an embodiment.

As shown in FIG. 25, an RF tag 800 includes an antenna 804 that receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material that enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, a configuration of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. The ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. In addition, the memory circuit of one embodiment of the present invention needs power (voltage) needed for data writing significantly lower than that needed in a conventional nonvolatile memory; thus, it is possible to prevent a difference between the maximum communication range in data reading and that in data writing. Furthermore, it is possible to suppress malfunction or incorrect writing that is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers only to good products to be shipped. Thus, the identification numbers of the shipped products are in series and customer management corresponding to the shipped products is easily performed.

At least part of this embodiment can be implemented in combination with any of the other embodiments described in this specification as appropriate.

(Embodiment 7)

In this embodiment, a CPU in which at least the transistor described in any of the above embodiments can be used and the memory device described in the above embodiment is included is described.

Figure 26:
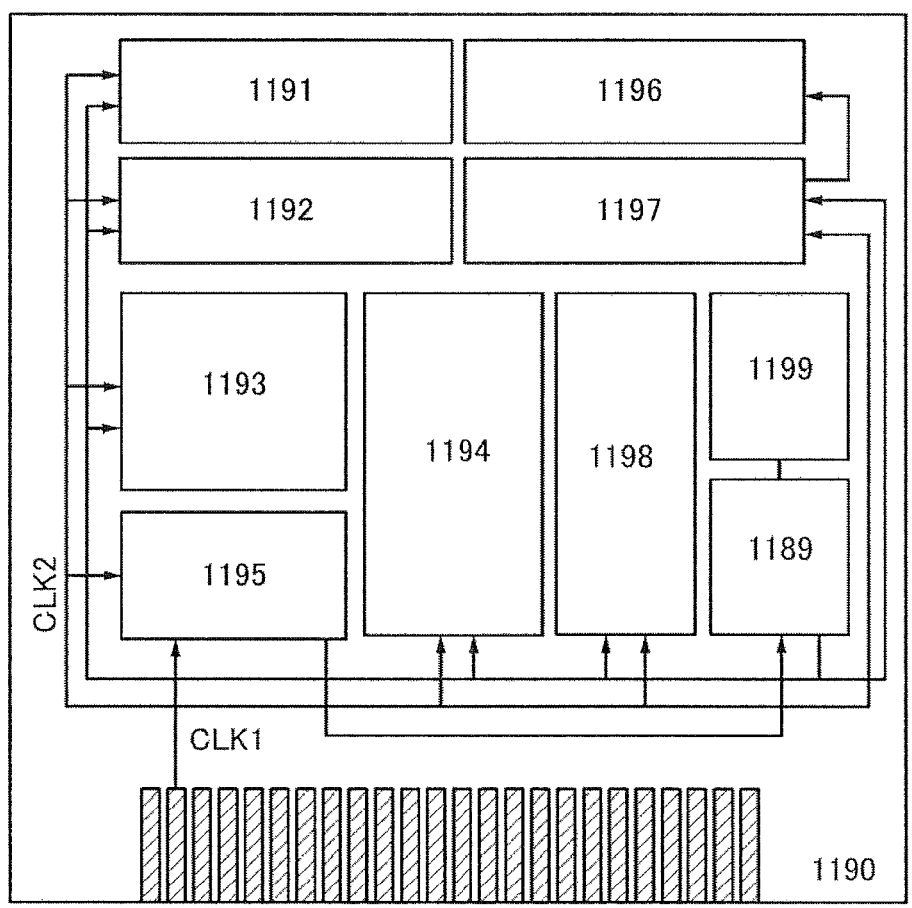
FIG. 26 illustrates a structure example of a CPU of one embodiment.

FIG. 26 is a block diagram illustrating a configuration example of a CPU at least partly including any of the transistors described in the above embodiments as a component.

The CPU illustrated in FIG. 26 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 26 is just an example in which the configuration is simplified, and an actual CPU may have a variety of configurations depending on the application. For example, the CPU may have the following configuration: a structure including the CPU illustrated in FIG. 26 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 26, a memory cell is provided in the register 1196. For the memory cell of the register 1196, any of the transistors described in the above embodiments can be used.

In the CPU illustrated in FIG. 26, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 27:
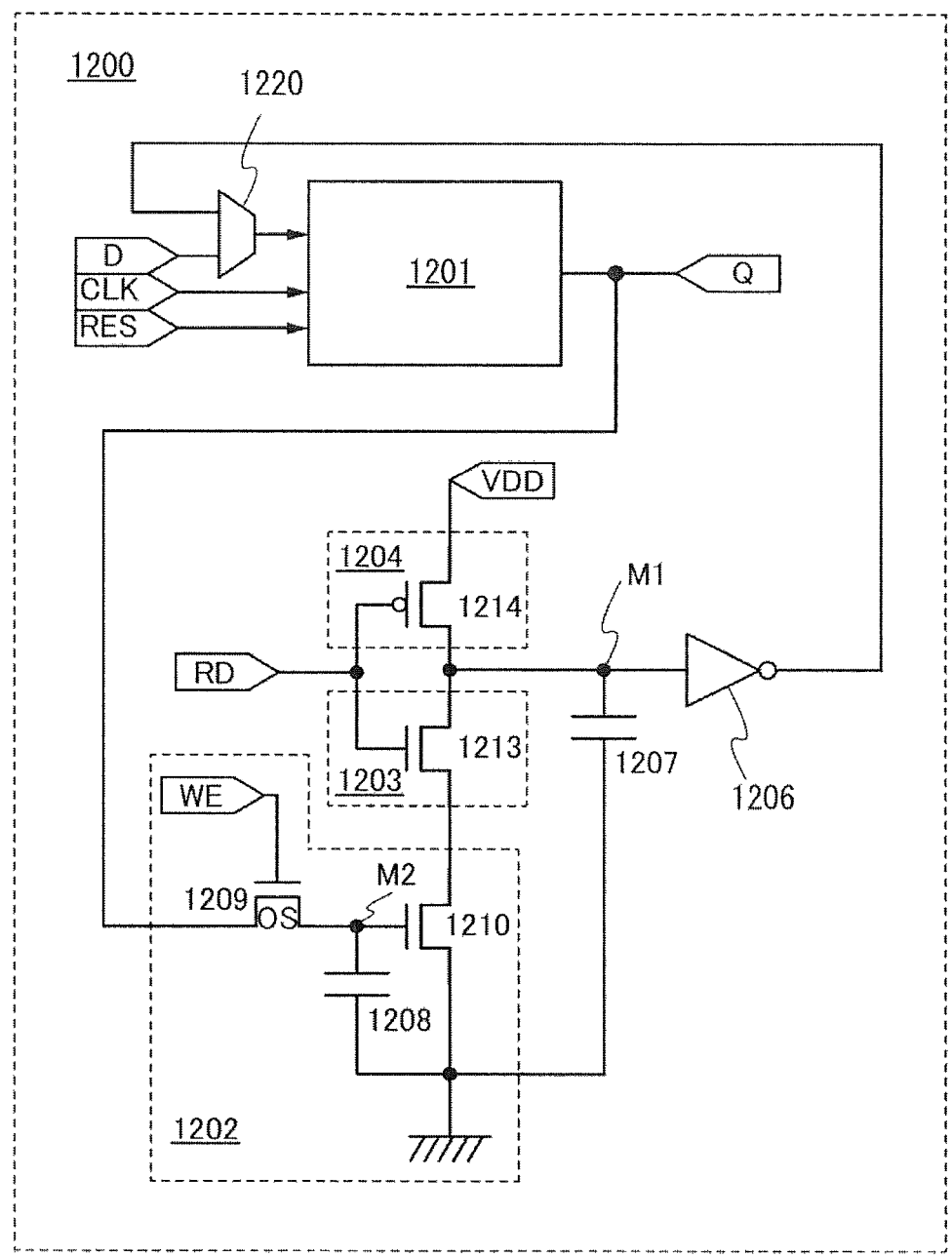
FIG. 27 is a circuit diagram of a memory element of an embodiment.

FIG. 27 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed. The transistor 1209 is preferably a transistor in which a channel is formed in an oxide semiconductor layer.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 27 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 27, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 27, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory element 1200. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 27, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal retained in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

(Embodiment 8)

In this embodiment, a structure example of a display panel of one embodiment of the present invention is described.

[Structure Example]

Figure 28A:
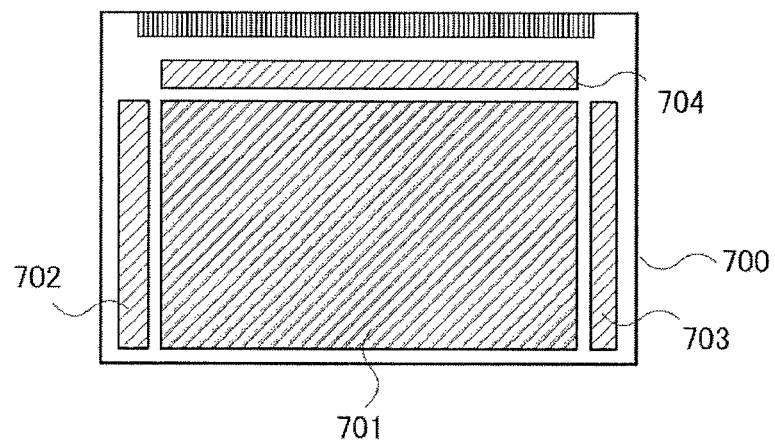
FIGS. 28A to 28C are a top view and circuit diagrams of a display device of an embodiment.
Figure 28B:
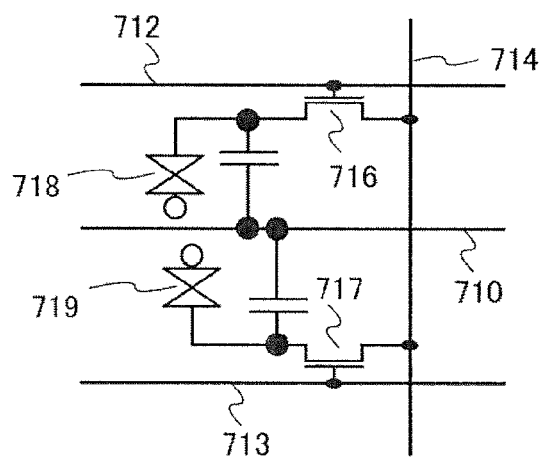
Figure 28C:
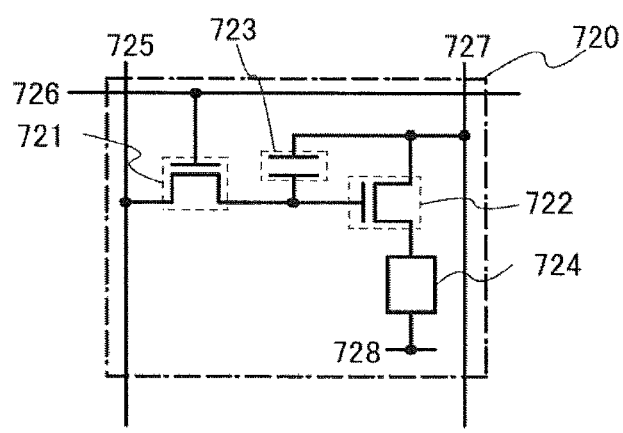

FIG. 28A is a top view of the display panel of one embodiment of the present invention. FIG. 28B is a circuit diagram illustrating a pixel circuit that can be used in the case where a liquid crystal element is used in a pixel in the display panel of one embodiment of the present invention. FIG. 28C is a circuit diagram illustrating a pixel circuit that can be used in the case where an organic EL element is used in a pixel in the display panel of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 28A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 28A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 28B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor 100 described the above embodiment can be used as appropriate as each of the transistors 716 and 717. Thus, a highly reliable liquid crystal display panel can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 28B. For example, a switch, a resistor, a capacitor, a transistor, a sensor, a logic circuit, or the like may be added to the pixel shown in FIG. 28B.

[Organic EL Panel]

FIG. 28C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 28C shows an example of a pixel circuit that can be used. In this example, one pixel includes two n-channel transistors. Note that a metal oxide film of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor 100 described in the above embodiment can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, voltage greater than or equal to voltage that is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 28C. For example, a switch, a resistor, a capacitor, a sensor, a transistor, a logic circuit, or the like may be added to the pixel circuit shown in FIG. 28C.

In the case where the transistor described in the above embodiments is used for the circuit shown in FIGS. 28A to 28C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electronluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included. Examples of a display device having an EL element include an EL display. Display devices having electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples further include a display device including electronic ink, Electronic Liquid Powder(registered trademark), or an electrophoretic element, such as electronic paper. In the case of a transflective liquid crystal display or a reflective liquid crystal display, some of or all of pixel electrodes function as reflective electrodes. For example, some or all of pixel electrodes are formed to contain aluminum, silver, or the like. For example, some or all of pixel electrodes are formed to contain aluminum, silver, or the like. In such a case, a memory circuit such as an SRAM can be provided under the reflective electrodes, leading to lower power consumption.

Note that in this specification and the like, a transistor can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, a soda lime glass substrate, or the like can be given. Examples of a glass substrate include a barium borosilicate glass substrate, an aluminoborosilicate glass substrate, and soda lime glass substrate. Examples of the glass substrate are a barium borosilicate glass substrate, an aluminoborosilicate glass substrate, and a soda lime glass substrate. Another example is a synthetic resin such as acrylic. Furthermore, polypropylene, polyester, polyvinyl fluoride, and polyvinyl chloride can be given as examples. Furthermore, polyamide, polyimide, aramid, epoxy, an inorganic vapor a deposition film, and paper can be given as examples. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

At least part of this embodiment can be implemented in combination with any of the embodiments described in this specification as appropriate.

(Embodiment 9)

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images. Other examples of electronic appliances that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 29A to 29F illustrate specific examples of these electronic appliances.

Figure 29A:
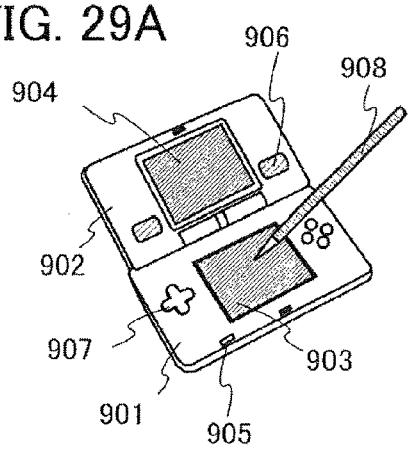
FIGS. 29A to 29F each illustrate an electronic appliance of an embodiment.

FIG. 29A illustrates a portable game machine, which includes a housing 901, a housing 902, a display portion 903, a display portion 904, a microphone 905, a speaker 906, an operation key 907, a stylus 908, and the like. Although the portable game machine in FIG. 29A has the two display portions 903 and 904, the number of display portions included in a portable game machine is not limited to this.

Figure 29B:
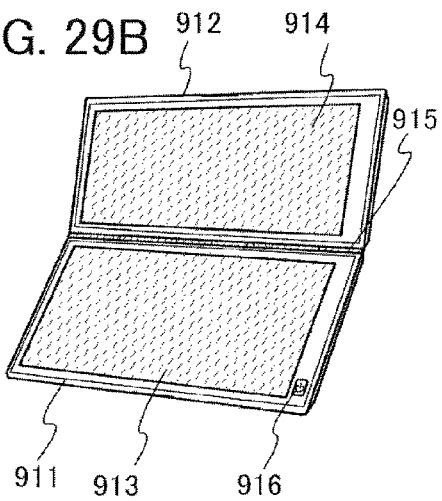

FIG. 29B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. Images displayed on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 29C:
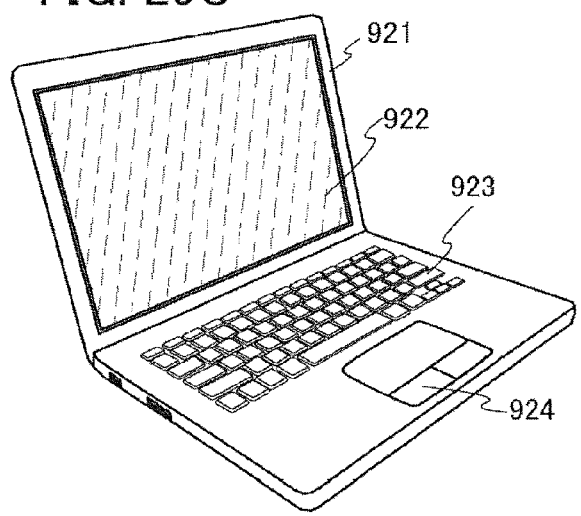

FIG. 29C illustrates a laptop personal computer, which includes a housing 921, a display portion 922, a keyboard 923, a pointing device 924, and the like.

Figure 29D:
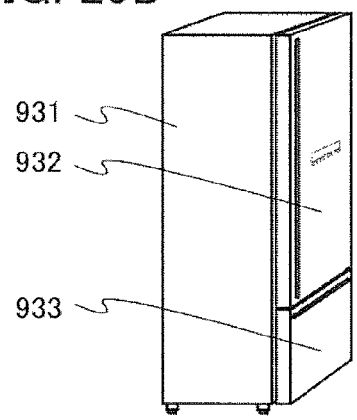

FIG. 29D illustrates an electric refrigerator-freezer, which includes a housing 931, a refrigerator door 932, a freezer door 933, and the like.

Figure 29E:
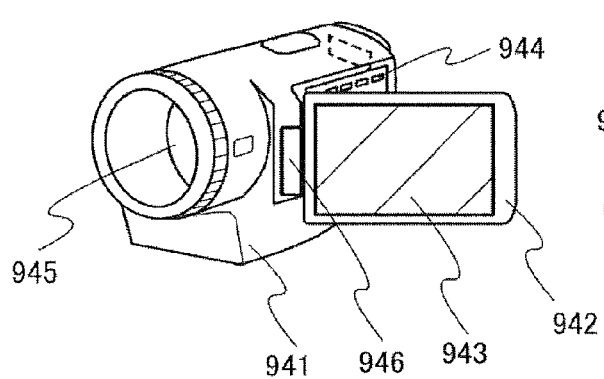

FIG. 29E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 29F:
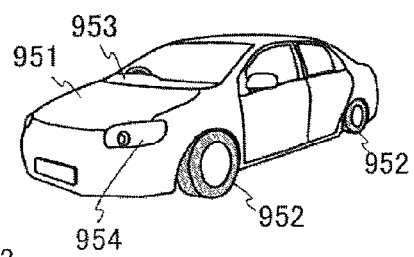
Figure 30A:
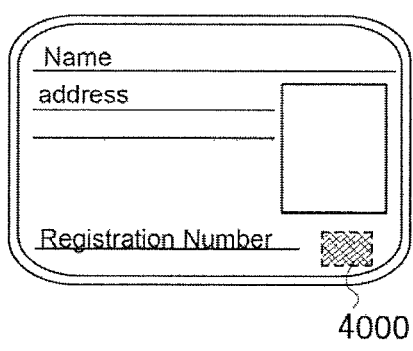
FIGS. 30A to 30F each illustrate an application example of an RF tag of an embodiment.
Figure 30B:
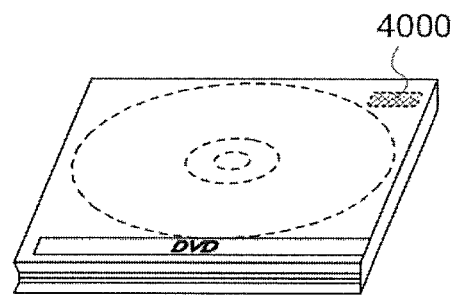
Figure 30C:
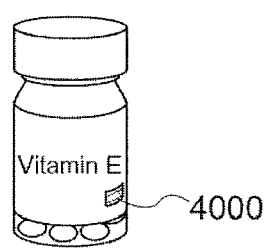
Figure 30D:
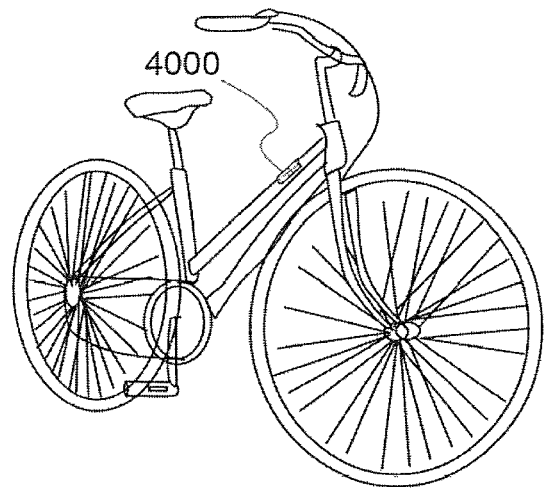
Figure 30E:
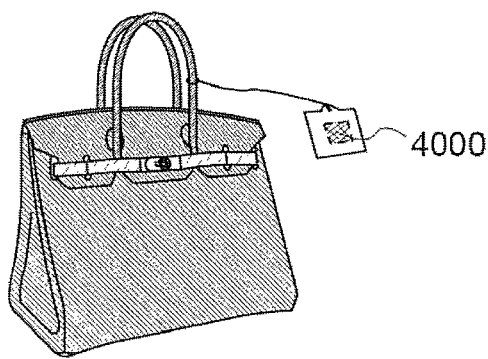
Figure 30F:
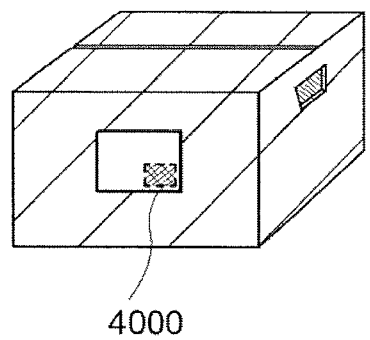

FIG. 29F illustrates a passenger car, which includes a car body 951, wheels 952, a dashboard 953, lights 954, and the like.

At least part of this embodiment can be implemented in combination with any of the other embodiments described in this specification as appropriate.

(Embodiment 10)

In this embodiment, application examples of an RF tag of one embodiment of the present invention are described with reference to FIGS. 30A to 30F. The RF tag is widely used and can be provided for, for example, products such as bills, coins, securities, bearer bonds, documents (e.g., driver's licenses or residence cards, see FIG. 30A), packaging containers (e.g., wrapping paper or bottles, see FIG. 30C), recording media (e.g., DVDs or video tapes, see FIG. 30B), vehicles (e.g., bicycles, see FIG. 30D), personal belongings (e.g., bags or glasses), foods, plants, animals, human bodies, clothing, household goods, medical supplies such as medicine and chemicals, and electronic appliances (e.g., liquid crystal display devices, EL display devices, television sets, or cellular phones), or tags on products (see FIGS. 30E and 30F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic appliances, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

At least part of this embodiment can be implemented in combination with any of the other embodiments described in this specification as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

Example 1

In this example, evaluation results of oxide semiconductor films of one embodiment of the present invention are described.

[Formation Method]

A silicon wafer was used as a substrate, and an oxide semiconductor film was formed over the silicon wafer. As the oxide semiconductor film, an In—Ga—Zn oxide film was formed by a sputtering method using an In—Ga—Zn oxide target. Main deposition conditions are listed in Table 6.

TABLE 6

| | Apparatus | Power [kW] | Gas flow rate | | Substrate temperature | Pressure [Pa] | Target | Taget-substrate distance |
| | | | Ar [sccm] | $O_2$ [sccm] | | | | |
| --- | --- | --- | --- | --- | --- | --- | --- | --- |
| Condition A1 | Apparatus A | 0.5 (DC) | 30 | 15 | 300° C. | 0.7 | In:Ga:Zn = 1:1:1 | 60 mm |
| Condition A2 | | 0.5 (DC) | 30 | 15 | 300° C. | 0.4 | In:Ga:Zn = 1:1:1 | 60 mm |
| Condition A3 | Apparatus B | 0.5 (DC) | 30 | 15 | 300° C. | 0.4 | In:Ga:Zn = 1:1:1 | 60 mm |
| Condition B1 | Apparatus A | 0.5 (DC) | 30 | 15 | 200° C. | 0.7 | In:Ga:Zn = 2:1:3 | 60 mm |

TABLE 6-continued

| | Apparatus | Power [kW] | Gas flow rate Ar [sccm] | Gas flow rate $O_2$ [sccm] | Substrate temperature | Pressure [Pa] | Target | Taget-substrate distance |
|---|---|---|---|---|---|---|---|---|
| Condition B2 | | 0.5 (DC) | 30 | 15 | 300° C. | 0.7 | In:Ga:Zn = 2:1:3 | 60 mm |
| Condition E1 | Apparatus C | 0.5 (DC) | 20 | 10 | 200° C. | 0.4 | In:Ga:Zn = 4:2:4.1 | 130 mm |

Here, the pressure in Condition A3 in Table 6 was measured using B-A gauge BRG-1B manufactured by CANON ANELVA CORPORATION, and the pressures in other five conditions were measured by Miniature Gauge MG-2 manufactured by CANON ANELVA CORPORATION. As shown in Table 6, an In—Ga—Zn oxide target having an atomic ratio of In:Ga:Zn=1:1:1 was used in Condition A1 and Condition A2, an In—Ga—Zn oxide target having an atomic ratio of In:Ga:Zn=2:1:3 was used in Condition B1 and Condition B2, and an In—Ga—Zn oxide target having an atomic ratio of In:Ga:Zn=4:2:4.1 was used in Condition E1. A DC power source was used as a power source.

[XRD Evaluation]

Oxide semiconductor films formed under Condition A1, Condition B1, Condition B2, and Condition E1 were evaluated using an XRD apparatus. The results are described below. First, samples for evaluation were formed. A 100-nm-thick oxide semiconductor film was formed over a silicon wafer. Samples with the oxide semiconductor films formed under Condition A1, Condition B1, Condition B2, and Condition E1 in Table 6 are respectively referred to as Sample A1-1, Sample B1-1, Sample B2-1, and Sample E1-1.

Before evaluation with an XRD apparatus, each sample was subjected to heat treatment. The heat treatment was performed at 450° C. for 1 hour in a nitrogen atmosphere and heat treatment was subsequently performed at 450° C. for 1 hour in an oxygen atmosphere in the same treatment chamber. Then, each sample was evaluated with a multi-function thin film material evaluation X-ray diffractometer, D8 DISCOVER Hybrid manufactured by Bruker AXS. FIGS. 36A to 36D show results of analysis by an out-of-plane method. FIGS. 36A, 36B, 36C, and 36D show the results of Sample A1-1, Sample B1-1, Sample B2-1, and Sample E1-1, respectively. A peak was observed at around 2θ=31° in all the samples. This peak is derived from the (009) plane of an $InGaZnO_4$ crystal, which indicates that crystals in the oxide semiconductor film in every sample have c-axis alignment, and that the c-axes are aligned in a direction substantially perpendicular to a formation surface or the top surface of the oxide semiconductor film. When the peaks at around 2θ=31° are compared with each other, the peaks in the samples other than Sample A1-1 are narrower and sharper than the peak in Sample A1-1. This indicates that the samples other than Sample A1-1 each have a high CAAC proportion. Here, the half-width of the peak at around 2θ=31° of each sample is shown in Table 7. Each half-width was obtained in such a manner that a background was subtracted and then the peak was fitted to the Lorentz function. For the background, the sum of the linear function and the Lorentz function was used. According to Table 7, Sample A1-1 formed using a target having an atomic ratio of In:Ga:Zn=1:1:1 has a half-width of 4.68°, whereas Sample B1-1 and Sample B2-1 each formed using a target having an atomic ratio of In:Ga:Zn=2:1:3 have a half-width of 2.10° and a half-width of 2.19°, respectively, and Sample E1-1 has a half-width of 3.47°; thus, Samples B1-1, B2-1, and E1-1 each have a small half-width and a sharp peak.

TABLE 7

| | 2θ [°] | Half-width [°] |
|---|---|---|
| Sample A1-1 | 30.6 | 4.68 |
| Sample B1-1 | 31.1 | 2.10 |
| Sample B2-1 | 30.8 | 2.19 |
| Sample E1-1 | 30.7 | 3.47 |

[Evaluation of Film Density]

Next, the film densities of Samples A1-1, B1-1, and B2-1 were measured. Before evaluation of the film density, each sample was subjected to heat treatment. Next, heat treatment was performed at 450° C. for 1 hour in a nitrogen atmosphere and heat treatment was subsequently performed at 450° C. for 1 hour in an oxygen atmosphere in the same treatment chamber. The obtained film densities are shown in Table 8. A dense and favorable film was able to be obtained in all the conditions. These results indicate that an oxide semiconductor film having a plurality of crystal parts with c-axis alignment, i.e., a CAAC-OS film is a dense film.

TABLE 8

| | Film density [g/cm$^3$] |
|---|---|
| Sample A1-1 | 6.27 |
| Sample B1-1 | 6.33 |
| Sample B2-1 | 6.29 |

[Evaluation Results with ICP-MS]

The indium content, gallium content, and zinc content of Samples A1-1, B1-1, and B2-1 were evaluated by inductively coupled plasma mass spectrometry (ICP-MS). Table 9 shows the atomic ratios of the elements calculated from the obtained results.

TABLE 9

| | Atomic ratio | | |
|---|---|---|---|
| | In | Ga | Zn |
| Sample A1-1 | 1 | 0.99 | 0.66 |
| Sample B1-1 | 2 | 0.98 | 2.3 |
| Sample B2-1 | 2 | 0.99 | 2.2 |

According to Table 9, as compared to the proportion of zinc atoms in the target, the proportion of zinc atoms in Sample A1-1 was reduced by approximately 44%, that in Sample B1-1 was reduced by approximately 23%, and that in Sample B2-1 was reduced by approximately 26%. In contrast, the difference in the proportions of indium atoms and gallium atoms between the target and each sample was only approximately 1% to 2%, and the proportions of indium atoms and gallium atoms were not reduced.

[Cross-Sectional TEM Observation 1]

Next, observations of cross-sectional TEM images are described. Samples for the observations were each fabricated as follows. First, an insulating film was formed on a silicon wafer. As the insulating film, a 100-nm-thick silicon oxide film was formed by thermal oxidation. After that, a 300-nm-thick silicon oxide film was deposited by a sputtering method. The silicon oxide film was formed under the conditions where a silicon oxide target was used, the flow rate of oxygen was 50 sccm, the pressure was 0.4 Pa, a power of 1.5 kW with an RF power source was used, and the substrate temperature was 100° C. The distance between the target and the substrate was 60 mm. After the deposition, polishing was performed by CMP to planarize the surface.

After the insulating film was formed over the silicon wafer in the above manner, a 20-nm-thick oxide semiconductor film was formed. Samples including oxide semiconductor films formed under Condition A1, B1, and B2 in Table 6 are respectively referred to as Sample A1-2, Sample B1-2, and Sample B2-2.

In this manner, Sample A1-2, Sample B1-2, and Sample B2-2 were formed. Next, the obtained samples were subjected to heat treatment. With regard to the heat treatment conditions, heat treatment was performed at 450° C. for 1 hour in a nitrogen atmosphere, and heat treatment was subsequently performed at 450° C. for 1 hour in an oxygen atmosphere. Then, each sample was thinned.

Next, TEM images of cross sections of the oxide semiconductor films of Sample A1-2, Sample B1-2, and Sample B2-2 obtained with a spherical aberration corrector function were observed. Note that a combined analysis image of a bright-field image which is obtained by TEM analysis and a diffraction pattern is referred to as a high-resolution plan-view TEM image. Furthermore, a high-resolution TEM image obtained with a spherical aberration corrector function is particularly referred to as a Cs-corrected high-resolution TEM image. The Cs-corrected high-resolution TEM images was obtained using an atomic resolution analytical electron microscope JEM-ARM200F manufactured by JEOL Ltd. The accelerating voltage was 200 kV.

FIGS. 37A and 37B, FIGS. 38A and 38B, and FIGS. 39A and 39B are cross-sectional TEM images of Sample A1-2, Sample B1-2, and Sample B2-2, respectively. In the oxide semiconductor films of Samples B1-2 and B2-2 formed using an In—Ga—Zn oxide target having an atomic ratio of In:Ga:Zn=2:1:3, layered atomic arrangement was significantly observed, as compared with the oxide semiconductor film of Sample A1-2. This result indicates that metal atoms are arranged in a layered manner and c-axis aligned more strongly in Samples B1-2 and B2-2.

Figure 37A:
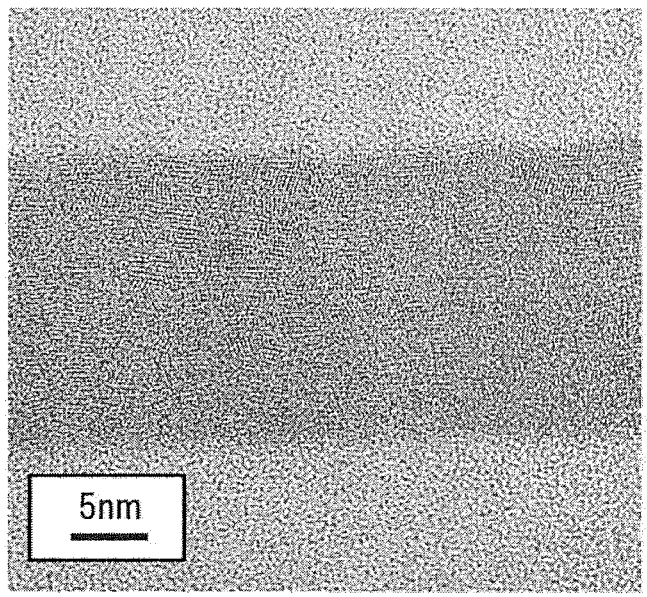
FIGS. 37A and 37B show observations of an oxide semiconductor film by cross-sectional TEM.
Figure 37B:
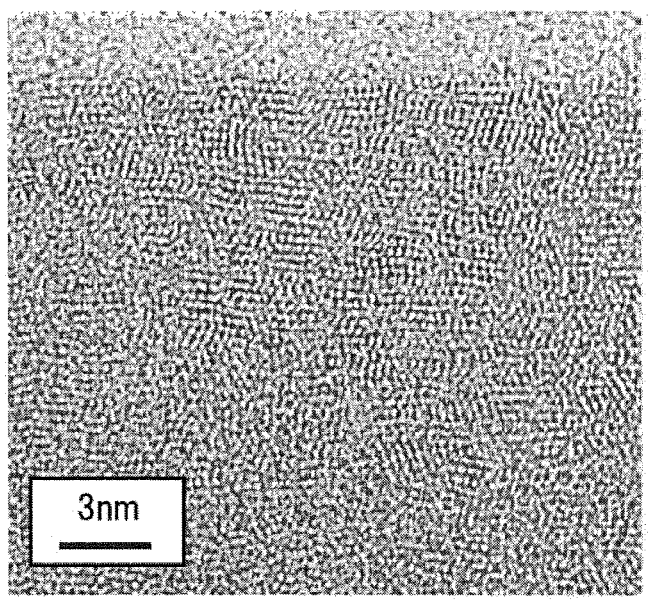
Figure 38A:
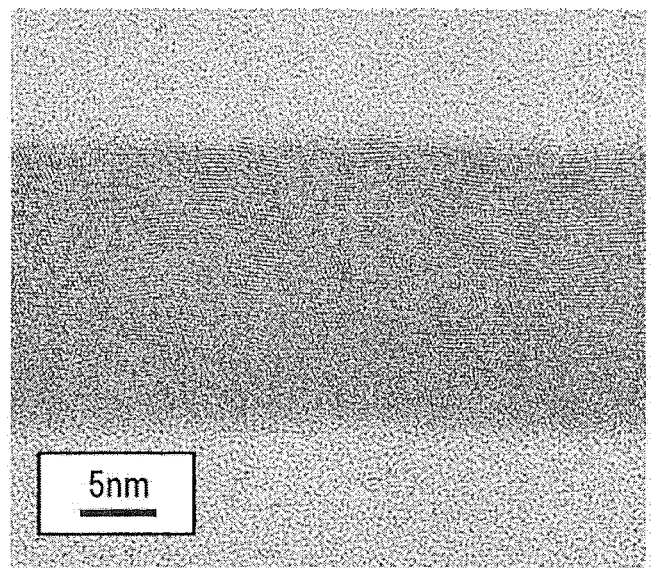
FIGS. 38A and 38B show observations of an oxide semiconductor film by cross-sectional TEM.
Figure 38B:
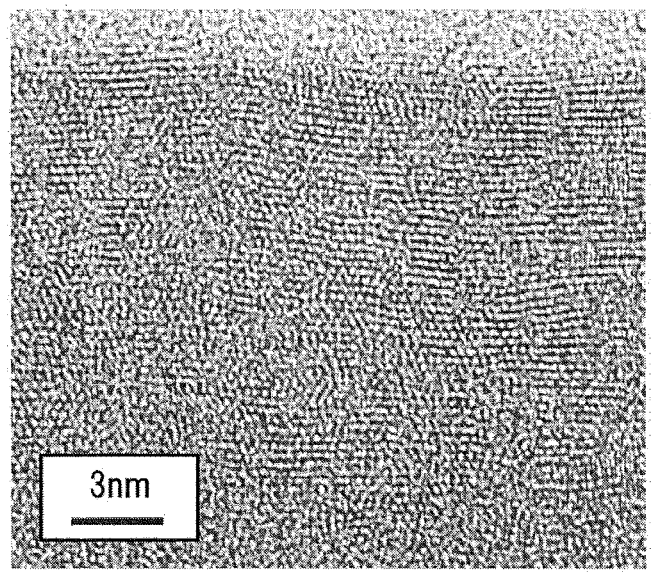
Figure 39A:
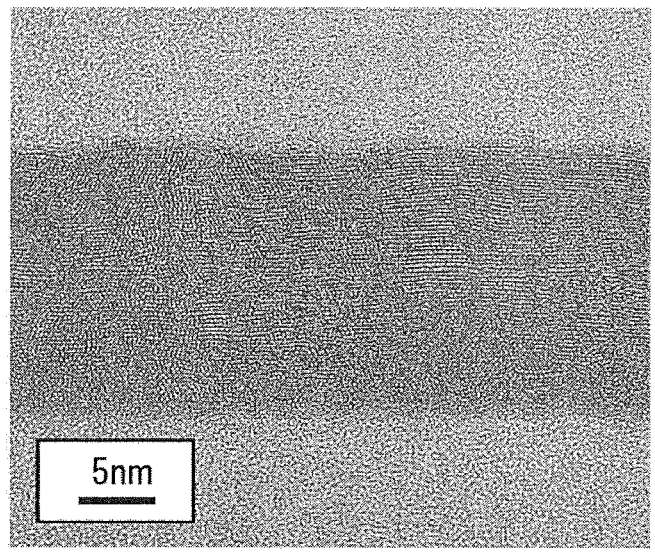
FIGS. 39A and 39B show observations of an oxide semiconductor film by cross-sectional TEM.
Figure 39B:
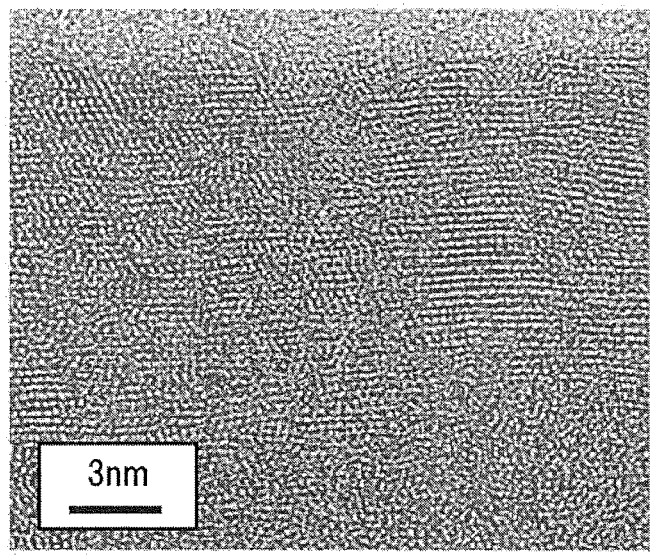
Figure 40A:
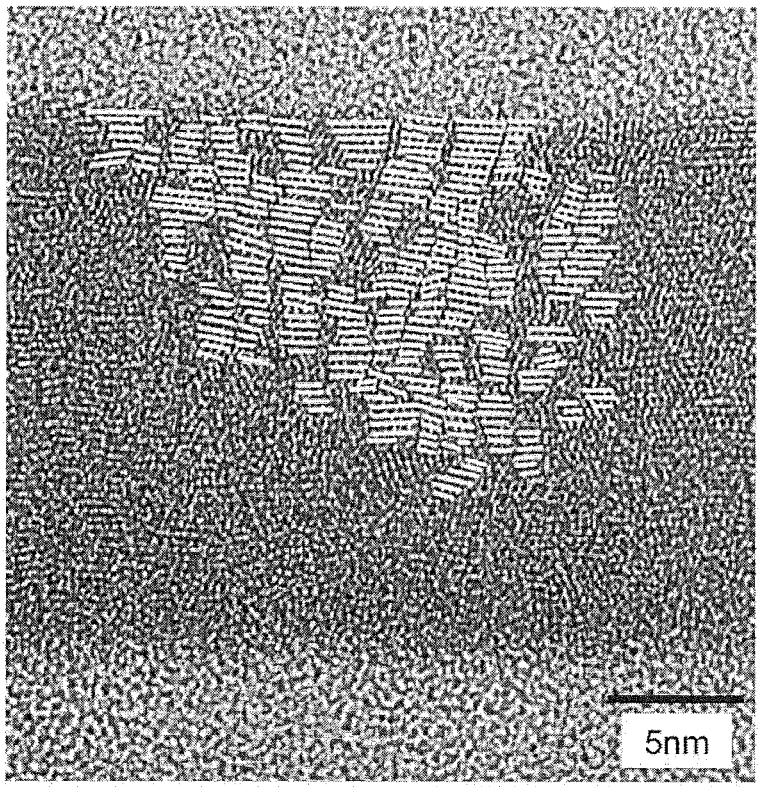
FIGS. 40A and 40B show observations of an oxide semiconductor film by cross-sectional TEM.
Figure 40B:
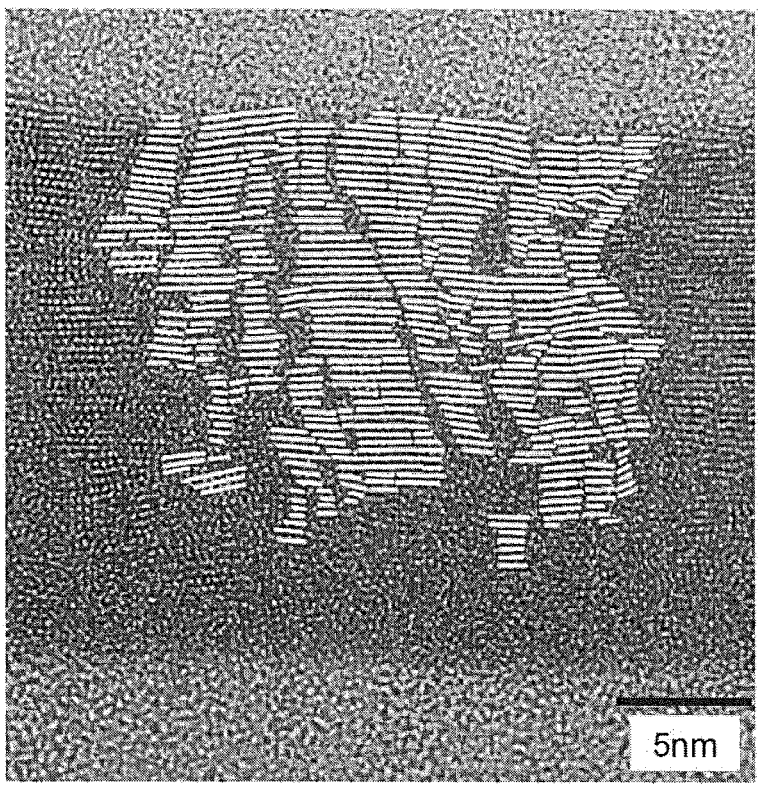
Figure 41A:
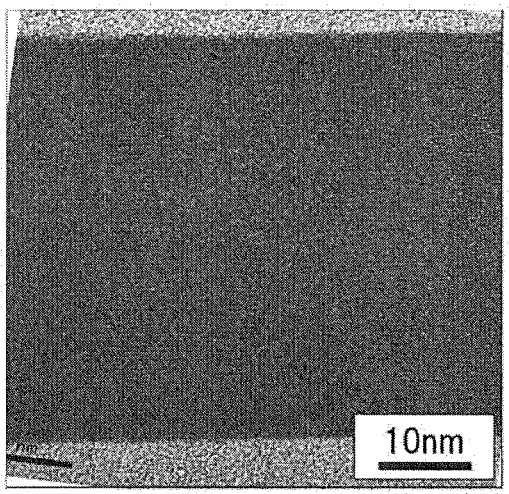
FIGS. 41A to 41D show observations of an oxide semiconductor film by cross-sectional TEM.
Figure 41B:
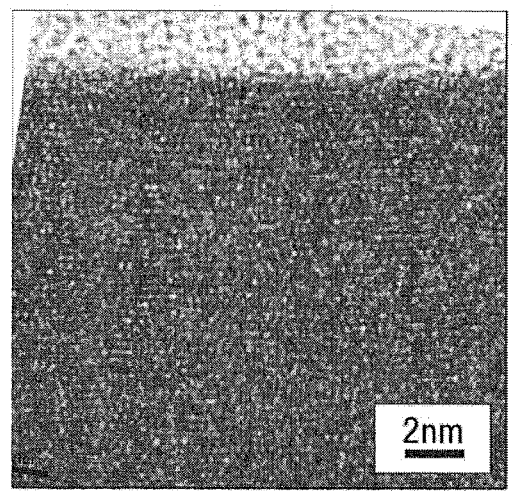
Figure 41C:
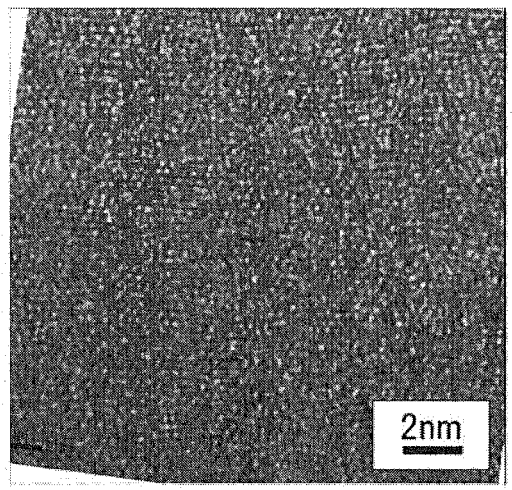
Figure 41D:
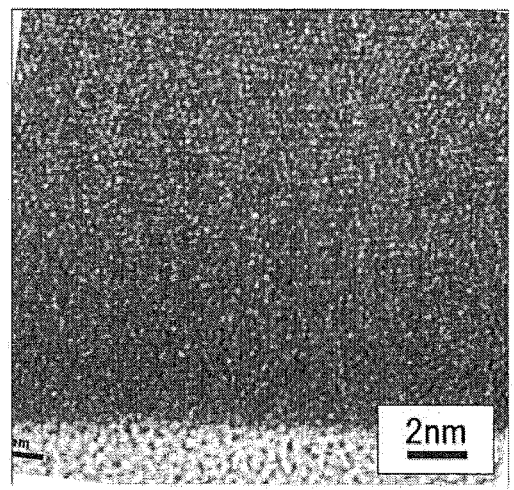
Figure 42A:
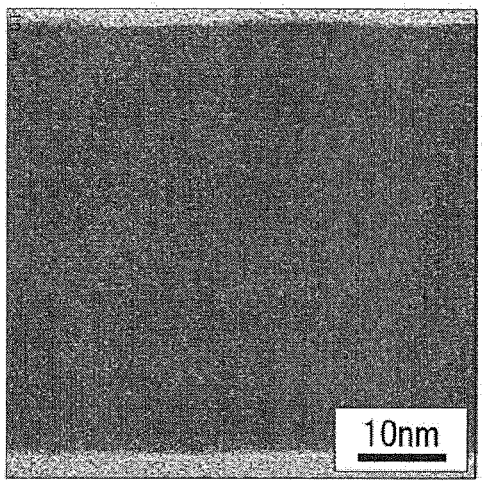
FIGS. 42A to 42D show observations of an oxide semiconductor film by cross-sectional TEM.
Figure 42B:
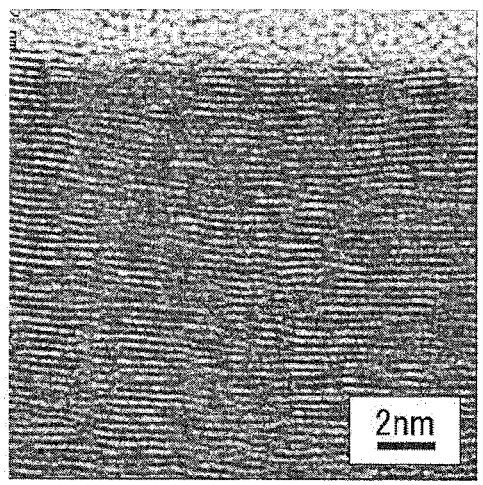
Figure 42C:
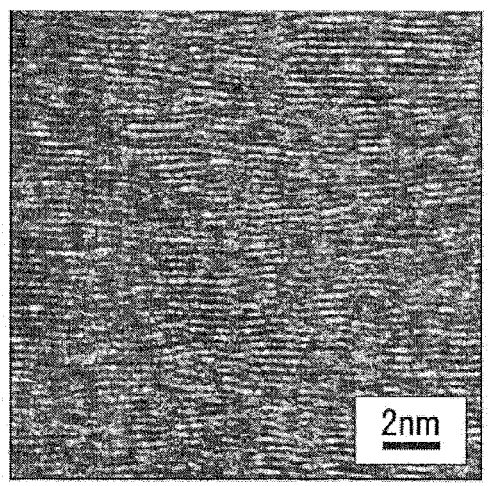
Figure 42D:
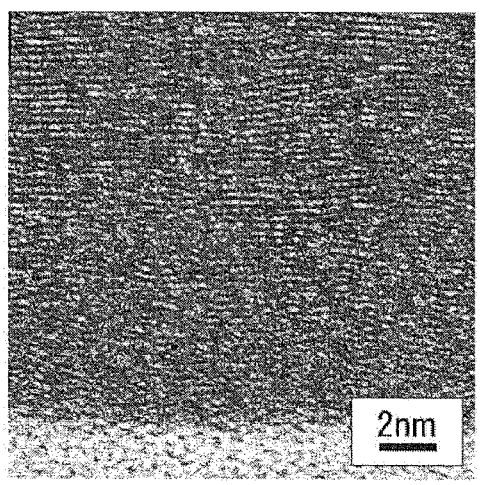

FIG. 59A is a cross-sectional TEM image of a portion of Sample A1-2 different from the region shown in FIGS. 37A and 37B. FIG. 59B is a cross-sectional TEM image of a portion of Sample B1-2 different from the region shown in FIGS. 38A and 38B. In FIGS. 40A and 40B, regions in the portions in FIGS. 59A and 59B, in which metal atoms are arranged in a layered manner regularly, are indicated by lines. A region with regularly arranged metal atoms like a single crystal, and a region in which regularity is unclear are observed in the oxide semiconductor film of Sample A1-2. The area of the region with regular arranged atoms is large and the area of the region in which regularity is unclear is small in the oxide semiconductor film of Sample B1-2, as compared to those in Sample A1-2.

[Cross-Sectional TEM Observation 2]

Next, thicker oxide semiconductor films were prepared and cross-sectional TEM images thereof were observed. The TEM images were obtained with H-9500 manufactured by Hitachi High-Technologies Corporation. The accelerating voltage was 300 kV.

To form samples for observation, 50-nm-thick oxide semiconductor films were formed over silicon wafers under Condition A2 and Condition B1. Next, the samples were thinned and observed by cross-sectional TEM. The samples including the oxide semiconductor films formed under Condition A2 and Condition B1 are referred to as Sample A2-3 and Sample B1-3, respectively. FIGS. 41A to 41D show observations of Sample A2-3, and FIGS. 42A to 42D show observations of Sample B1-3. FIGS. 41A, 41B, 41C, and 41D show an overall structure, an upper part of the film, a center part of the film, and the vicinity of the interface with the silicon wafer, respectively. In a similar manner, FIGS. 42A, 42B, 42C, and 42D show an overall structure, an upper part of the film, a center part of the film, and the vicinity of the interface with the silicon wafer, respectively. As compared to the oxide semiconductor film of Sample A2-3, atoms arranged in a layered manner were significantly observed in the oxide semiconductor film of Sample B1-3 formed using an In—Ga—Zn oxide target having an atomic ratio of In:Ga:Zn=2:1:3, which suggests that the atoms are c-axis aligned more strongly, in a manner similar to those in FIG. 38A to FIG. 39B.

[Plan-View TEM Observation]

Next, observations of plan-view TEM images are described. The TEM images were obtained with H-9000NAR manufactured by Hitachi High-Technologies Corporation. The accelerating voltage was 300 kV. Samples A1-2 and B1-2, which are described above, were subjected to heat treatment, and plan-view TEM images thereof were observed. As for the heat treatment conditions, heat treatment was performed at 450° C. for 1 hour in a nitrogen atmosphere, and heat treatment was subsequently performed at 450° C. for 1 hour in an oxygen atmosphere.

Figure 43A:
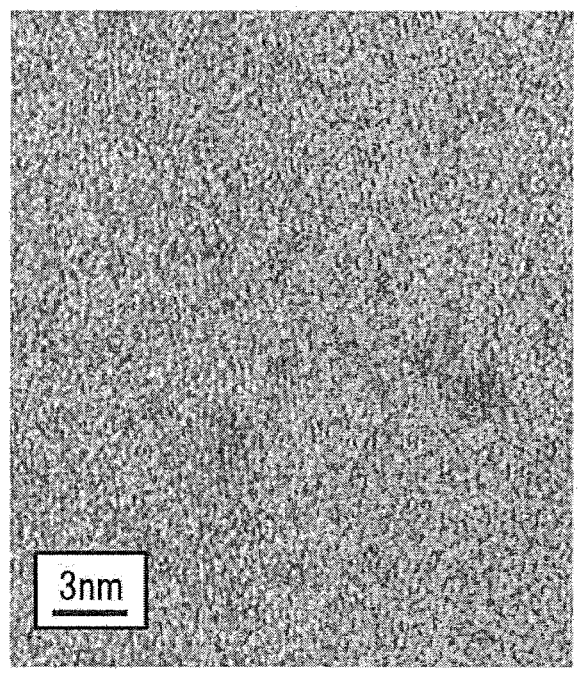
FIGS. 43A and 43B show observations of an oxide semiconductor film by plan-view TEM.
Figure 43B:
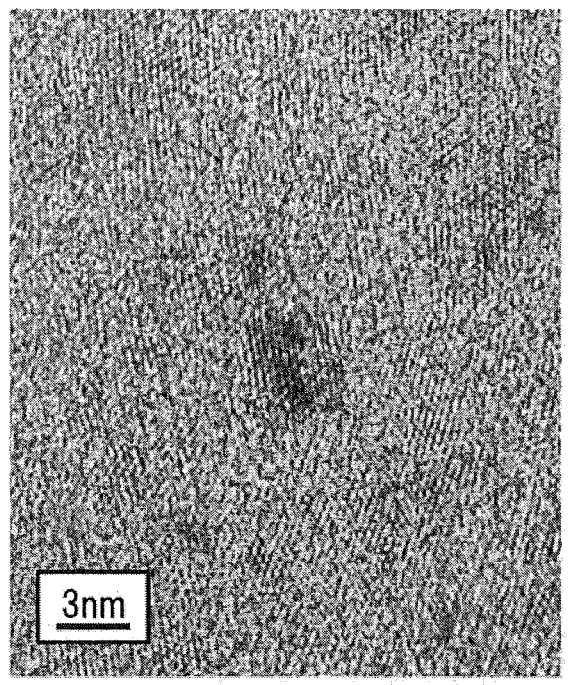

FIGS. 43A and 43B show observations of Sample A1-2 and Sample B1-2, respectively. Although the arrangement of metal atoms between different crystal parts is different from that of a single crystal, the metal atoms are more regularly arranged in Sample B1-2 than in Sample A1-2. Furthermore, as compared to Sample A1-2, Sample B1-2 has a clear lattice image, which indicates that atoms are arranged regularly.

[Evaluation of the CAAC Proportion]

Next, the CAAC proportion in each of Samples A1-2 and B1-2 was obtained by nanobeam electron diffraction. The electron diffraction was performed with HF-2000 manufactured by Hitachi High-Technologies Corporation. The accelerating voltage was 200 kV.

Scan was performed on the top surface of each sample including an oxide semiconductor film while a sample stage was gradually moved; thus, transmission electron diffraction patterns were obtained. As an electron beam, a nanobeam with a probe diameter of 1 nm was used. Three areas of each sample were measured in the above manner. That is, scan was performed three times (Scan 1 to Scan 3).

Diffraction patterns were obtained with scan at a rate of 5 nm/sec to obtain a moving image. Next, the moving image of the diffraction pattern was changed into still images for every 0.5 seconds. The obtained still images were analyzed and classified into four kinds of patterns, i.e., patterns of a CAAC-OS film, patterns that were not identifiable as the pattern of a CAAC-OS film or a pattern of an nc-OS film, the patterns of an nc-OS film, and patterns of a spinel crystal structure. The results are shown in Table 10. Note that in the CAAC proportions in Table 10, the patterns not identifiable as the pattern of a CAAC-OS film or the pattern of an nc-OS film are regarded as not CAAC.

TABLE 10

| | | The number of analyses | I CAAC | II CAAC or nc? | III nc | IV Spinel structure | CAAC proportion (assuming that II is not CAAC) |
|---|---|---|---|---|---|---|---|
| Sample A1-2 | Scan 1 | 130 | 87 | 27 | 16 | 0 | 66.9% |
| | Scan 2 | 132 | 118 | 4 | 10 | 0 | 89.4% |
| | Scan 3 | 189 | 163 | 5 | 21 | 0 | 86.2% |
| Sample B1-2 | Scan 1 | 140 | 136 | 2 | 2 | 0 | 97.1% |
| | Scan 2 | 145 | 137 | 5 | 3 | 0 | 94.5% |
| | Scan 3 | 216 | 200 | 11 | 5 | 0 | 92.6% |

Next, patterns before and after each of the patterns that were not identifiable as the pattern of a CAAC-OS film or the pattern of an nc-OS film were observed in the moving image, and classified into patterns in which the pattern of a CAAC-OS film was observed, and patterns in which the pattern of an nc-OS film was observed. Then, the CAAC proportions were calculated. The results are shown in Table 11. In Table 11, the number of images of diffraction patterns used for calculating the CAAC proportion, the number of images of each observed pattern, and the CAAC proportion obtained by calculation are listed for each scan.

TABLE 11

| | | The number of analyses | CAAC | nc | Spinel structure | CAAC proportion |
|---|---|---|---|---|---|---|
| Sample A1-2 | Scan 1 | 130 | 114 | 16 | 0 | 87.7% |
| | Scan 2 | 132 | 122 | 10 | 0 | 92.4% |
| | Scan 3 | 189 | 168 | 21 | 0 | 88.9% |
| Sample B1-2 | Scan 1 | 140 | 138 | 2 | 0 | 98.6% |
| | Scan 2 | 145 | 142 | 3 | 0 | 97.9% |
| | Scan 3 | 216 | 211 | 5 | 0 | 97.7% |

Figure 44A:
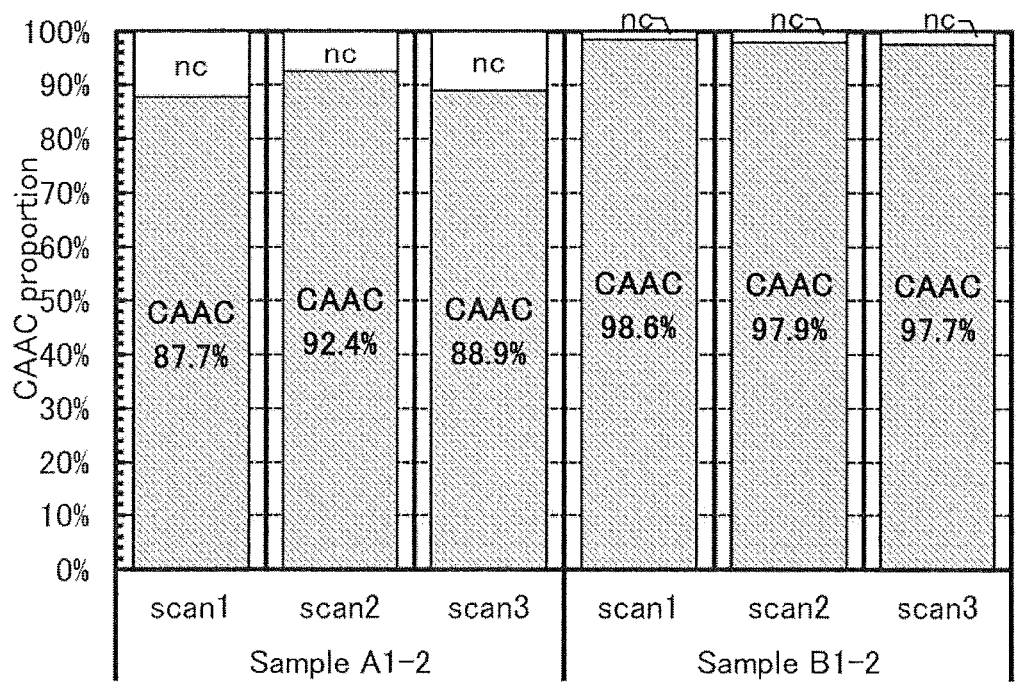
FIGS. 44A and 44B each show the proportions of CAAC in oxide semiconductor films.

FIG. 44A is a graph of the proportions of CAAC in Table 11. As shown in FIG. 44A, the patterns of an nc-OS film were observed as diffraction patterns other than those of a CAAC-OS film, and no spinel-crystal-structure diffraction pattern was observed.

As shown in Table 11, the CAAC proportion of Sample B1-2 obtained using a target having an atomic ratio of In:Ga:Zn=2:1:3 was extremely high.

Figure 55:
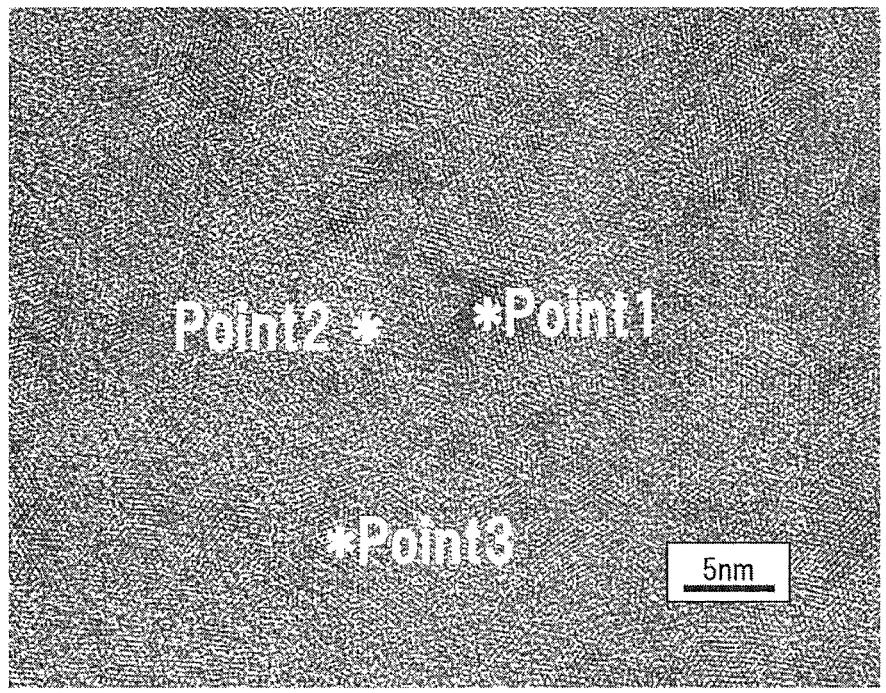
FIG. 55 shows an observation of an oxide semiconductor film by plan-view TEM.

Next, FIG. 55 shows plan-view TEM observations of a portion in Sample B1-2 which is different from a portion shown in FIG. 43B. The structures of three points (Points 1 to 3) in FIG. 55 were analyzed by nanobeam electron diffraction. A nanobeam with a probe diameter of 1 nm was used as an electron beam. Here, an error of ±20% is allowed for the probe diameter. FIGS. 56A, 56B, and 56C respectively show diffraction spots observed in Points 1, 2, and 3 and results of identifications of crystal structures obtained from the diffraction spots. As a result of the analysis, the obtained diffraction spots were identified as a structure of InGaO$_3$(ZnO)$_2$ described in JCPDS card.

Next, the CAAC proportion in a 100-nm-thick oxide semiconductor film was evaluated in the same manner. The deposition conditions of the oxide semiconductor film were Condition A3 and Condition B1 in Table 6.

A 100-nm-thick silicon oxide film was formed on a silicon wafer by thermal oxidation. After that a 100-nm-thick oxide semiconductor film was formed under Condition A3 in Table 6 to obtain Sample A3-1. As a sample for Condition B1, Sample B1-1 was used.

Next, heat treatment was performed on Sample A3-1 and Sample B1-1. As for the heat treatment conditions, heat treatment was performed at 450° C. for 1 hour in a nitrogen atmosphere and heat treatment was subsequently performed at 450° C. for 1 hour in an oxygen atmosphere in the same treatment chamber.

Next, scan was performed on the top surface of each sample; thus, transmission electron diffraction patterns were obtained. As an electron beam, a nanobeam with a probe diameter of 1 nm was used. Three areas of each sample were measured in the above manner. That is, scan was performed three times (Scan 1 to Scan 3).

Diffraction patterns were obtained with scan at a rate of 5 nm/sec to obtain a moving image. Next, the moving image of the diffraction pattern was changed into still images for every 0.5 seconds. Still images obtained by converting a moving image of the diffraction pattern of Scan 2 of Sample A3-1 are shown in FIG. 45, FIG. 46, FIG. 47, FIG. 48, and FIG. 49. Furthermore, still images obtained by converting a moving image of the diffraction pattern of Scan 2 of Sample B1-1 are shown in FIG. 50, FIG. 51, FIG. 52, FIG. 53, and FIG. 54. As shown in FIG. 45 to FIG. 54, a diffraction pattern indicating a CAAC structure was observed in each of the samples, and the angle of the diffraction pattern was gradually shifted as the scan proceeded.

The obtained still images were analyzed and classified into four kinds of patterns, i.e., patterns of a CAAC-OS film, patterns that were not identifiable as the pattern of a CAAC-OS film or a pattern of an nc-OS film, the patterns of an nc-OS film, and patterns of a spinel crystal structure. The results are shown in Table 12. Note that in the CAAC proportions in Table 12, the patterns not identifiable as the pattern of a CAAC-OS film or the pattern of an nc-OS film are regarded as not CAAC.

TABLE 12

| | | The number of analyses | I CAAC | II CAAC or nc? | III nc | IV Spinel structure | The CAAC proportion (assuming that II is not CAAC) |
|---|---|---|---|---|---|---|---|
| Sample A3-1 | Scan 1 | 126 | 118 | 0 | 8 | 0 | 93.7% |
| | Scan 2 | 132 | 119 | 0 | 13 | 0 | 90.2% |
| | Scan 3 | 190 | 168 | 2 | 20 | 0 | 88.4% |
| Sample B1-1 | Scan 1 | 144 | 141 | 2 | 1 | 0 | 97.9% |
| | Scan 2 | 141 | 141 | 0 | 0 | 0 | 100.0% |
| | Scan 3 | 246 | 242 | 3 | 1 | 0 | 98.4% |

Next, patterns before and after each of the patterns that were not identifiable as the pattern of a CAAC-OS film or the pattern of an nc-OS film were observed in the moving image, and classified into patterns before and/or after which the pattern of a CAAC-OS film was observed, and patterns before and/or after which the pattern of an nc-OS film was observed. Then, the CAAC proportions were calculated. The results are shown in Table 13.

TABLE 13

| | | The number of analyses | CAAC | nc | Spinel structure | The CAAC proportion |
|---|---|---|---|---|---|---|
| Sample A3-1 | Scan 1 | 126 | 118 | 8 | 0 | 93.7% |
| | Scan 2 | 132 | 119 | 13 | 0 | 90.2% |
| | Scan 3 | 190 | 170 | 20 | 0 | 89.5% |
| Sample B1-1 | Scan 1 | 144 | 143 | 1 | 0 | 99.3% |
| | Scan 2 | 141 | 141 | 0 | 0 | 100.0% |
| | Scan 3 | 246 | 245 | 1 | 0 | 99.6% |

Figure 44B:
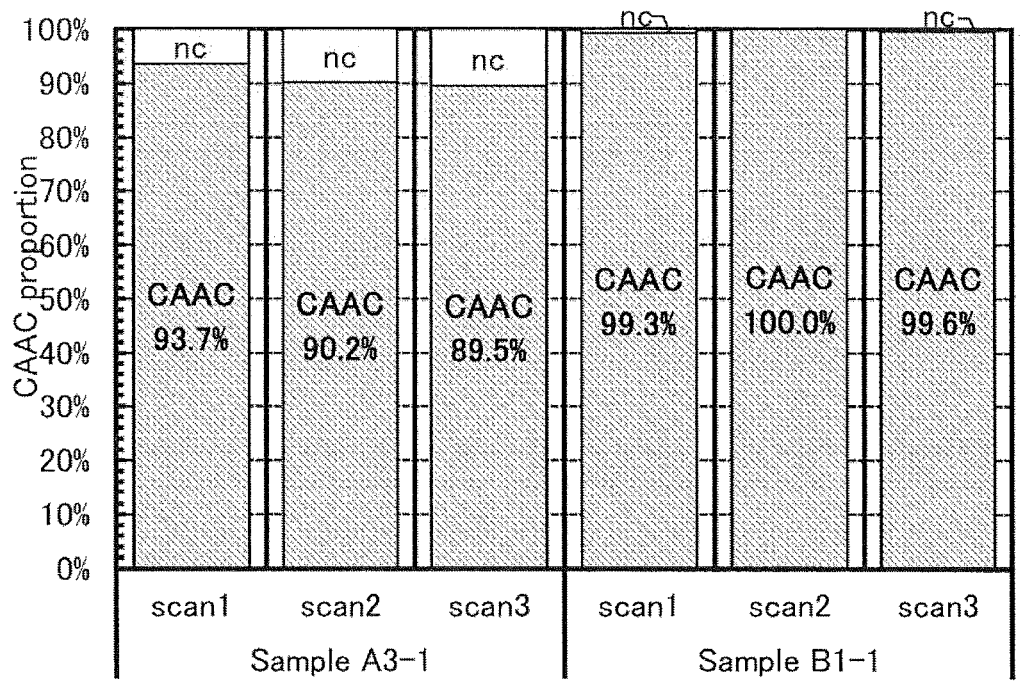
Figure 45:
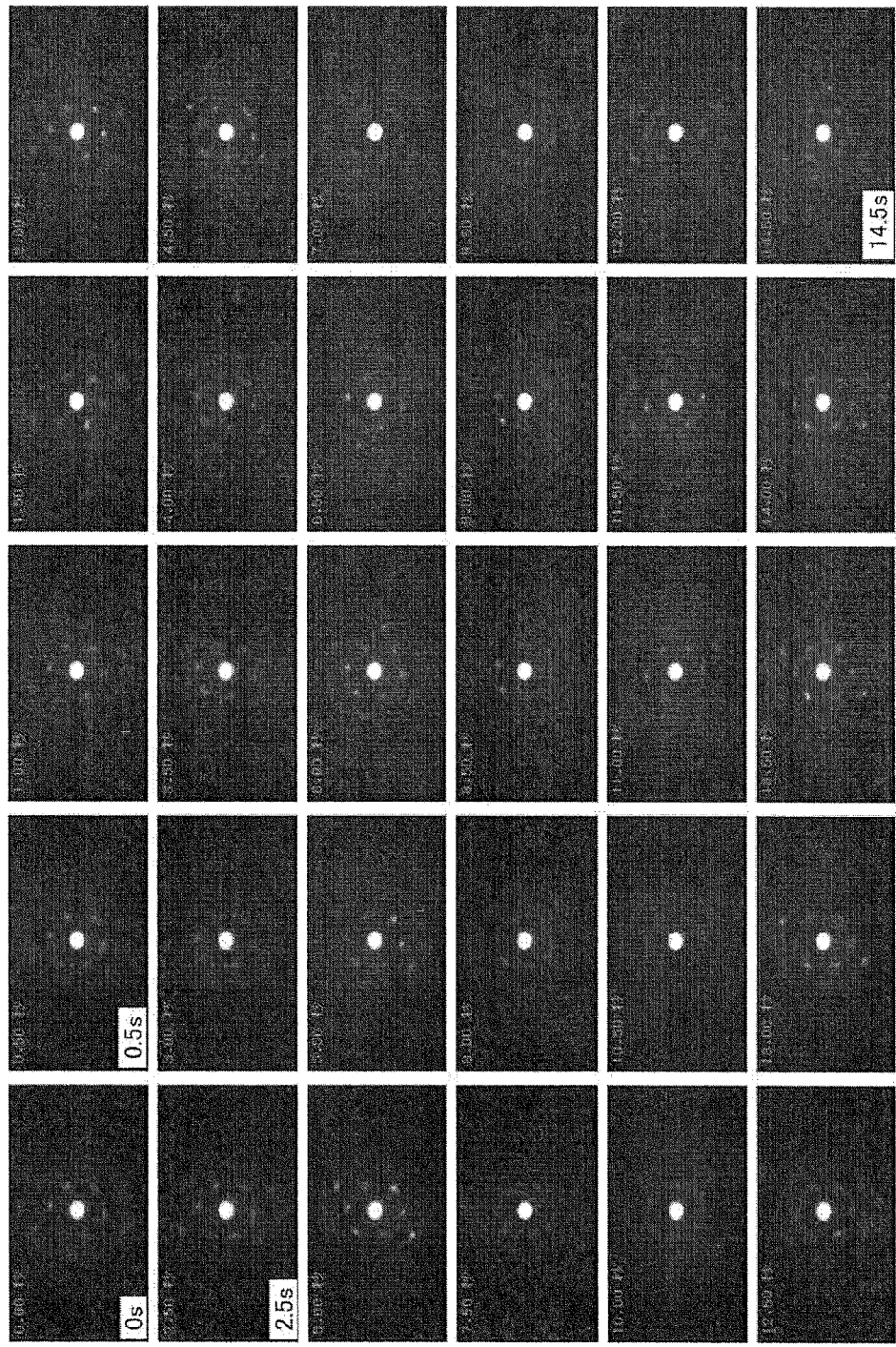
FIG. 45 shows electron diffraction patterns of an oxide semiconductor film.
Figure 46:
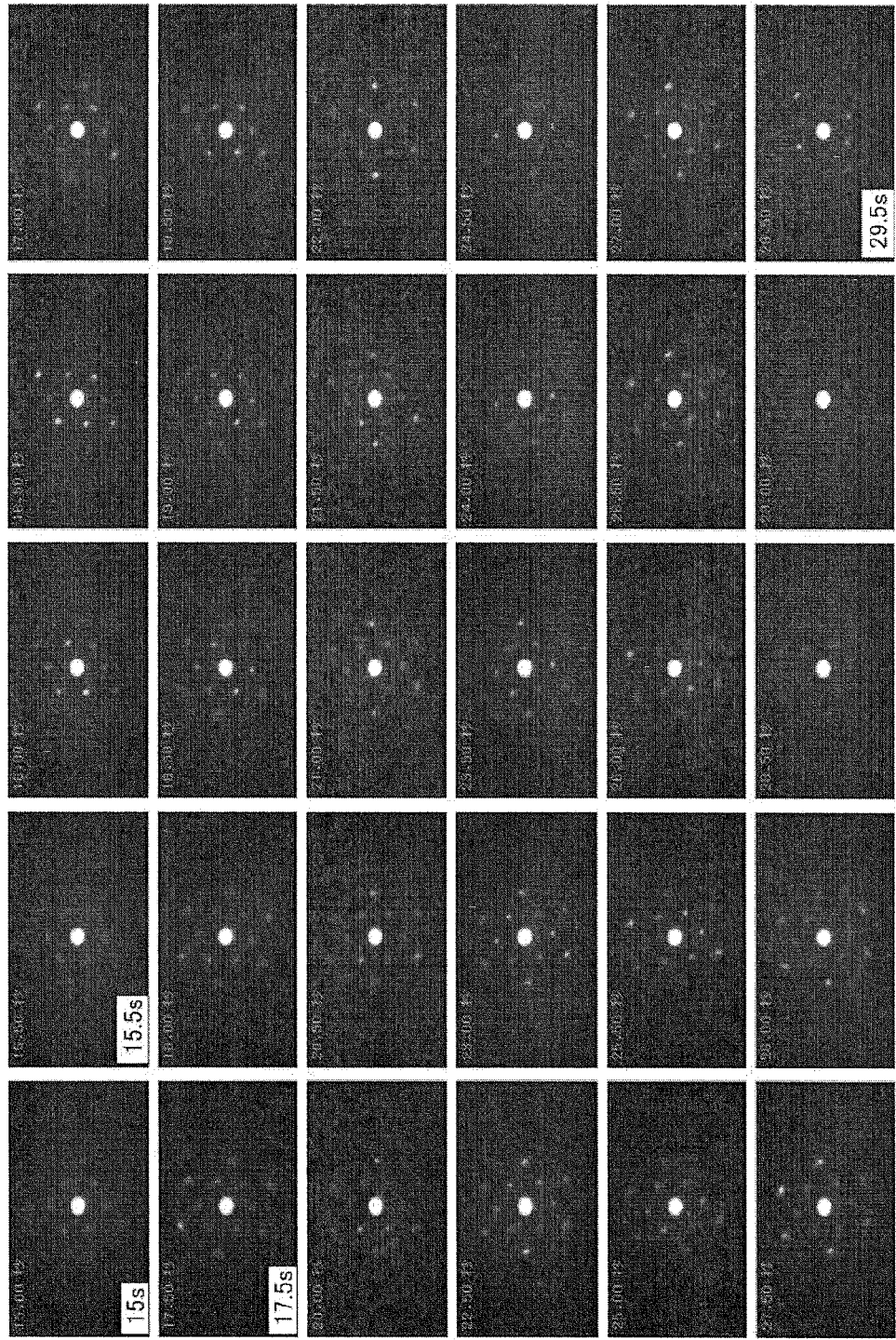
FIG. 46 shows electron diffraction patterns of an oxide semiconductor film.
Figure 47:
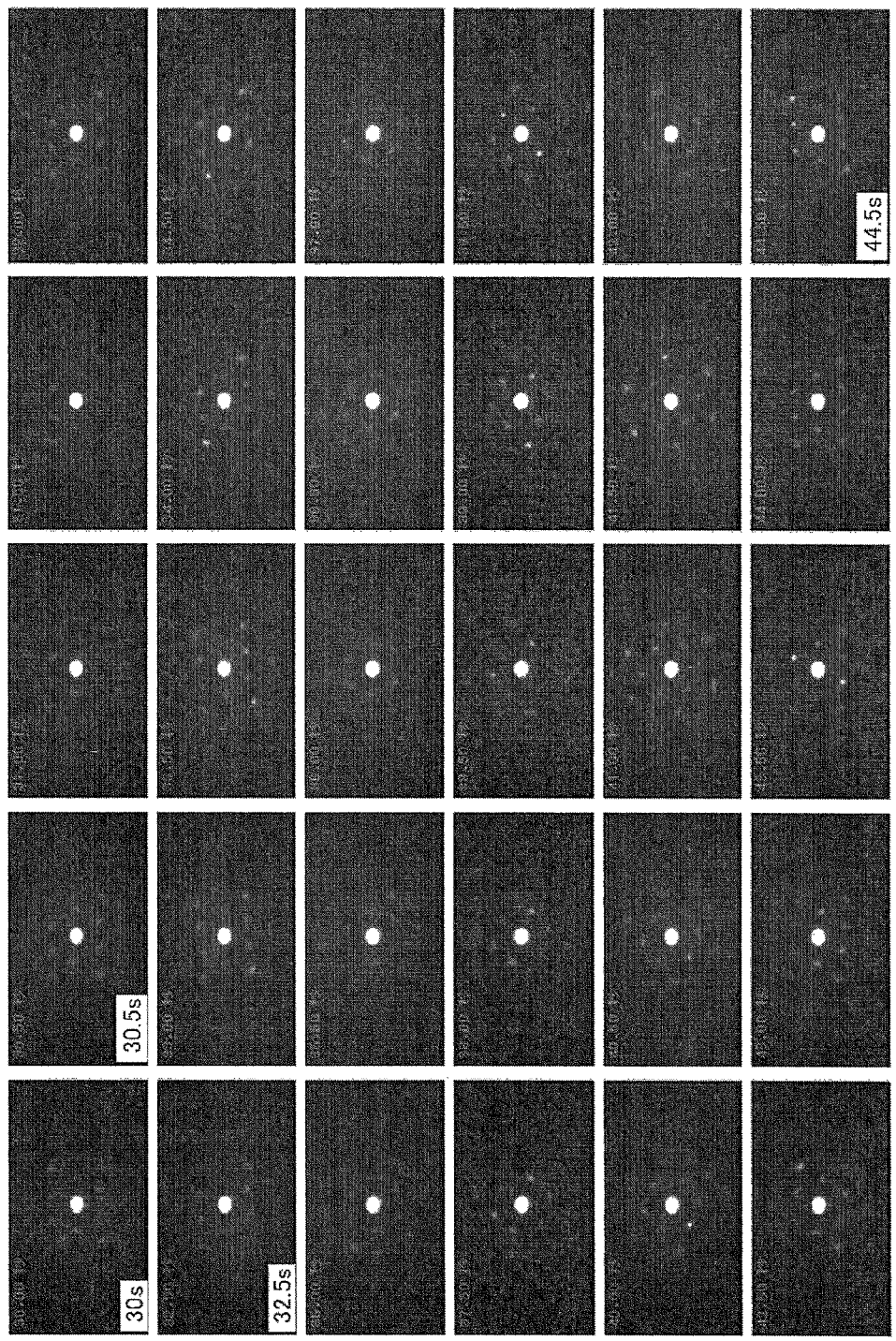
FIG. 47 shows electron diffraction patterns of an oxide semiconductor film.
Figure 48:
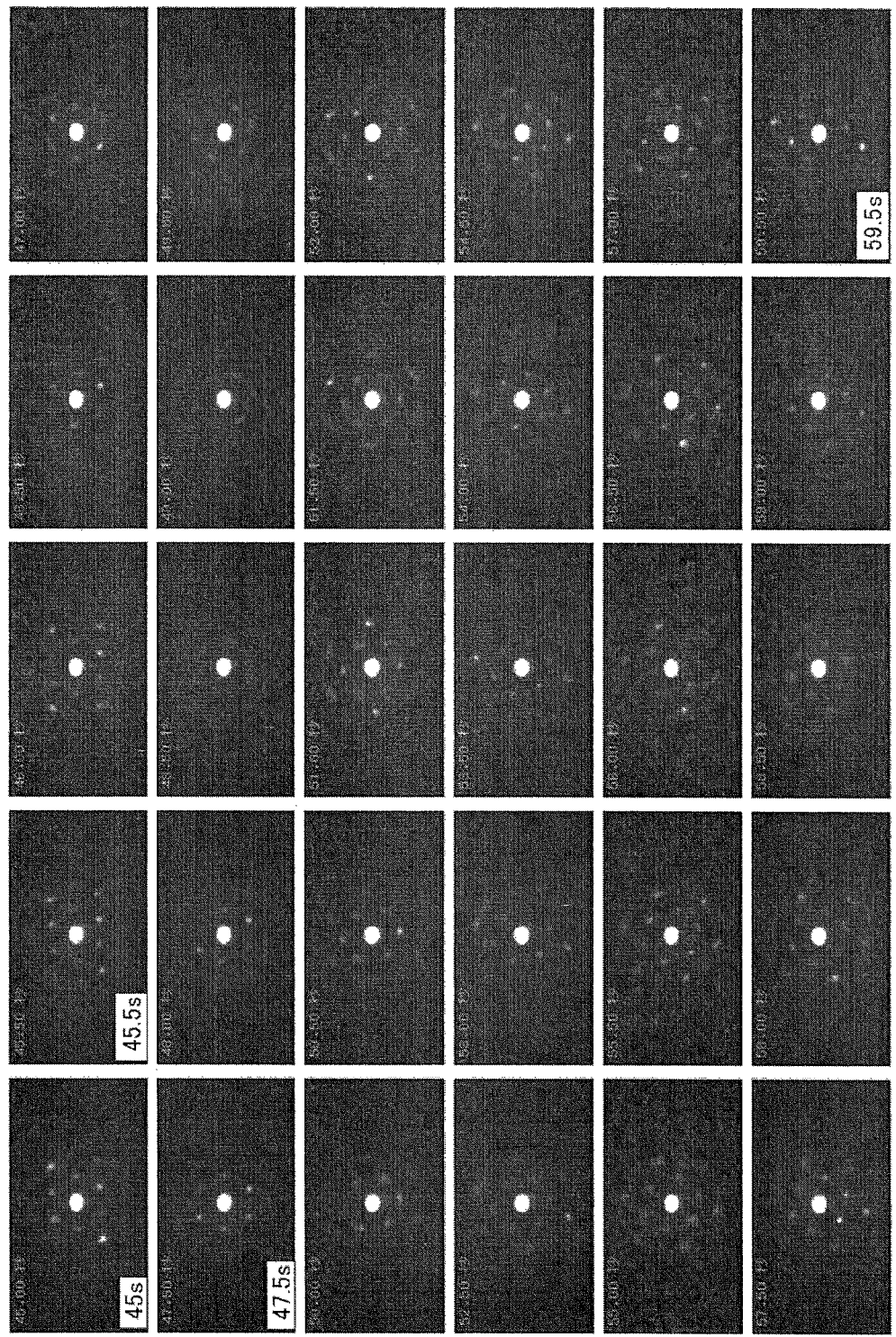
FIG. 48 shows electron diffraction patterns of an oxide semiconductor film.
Figure 49:
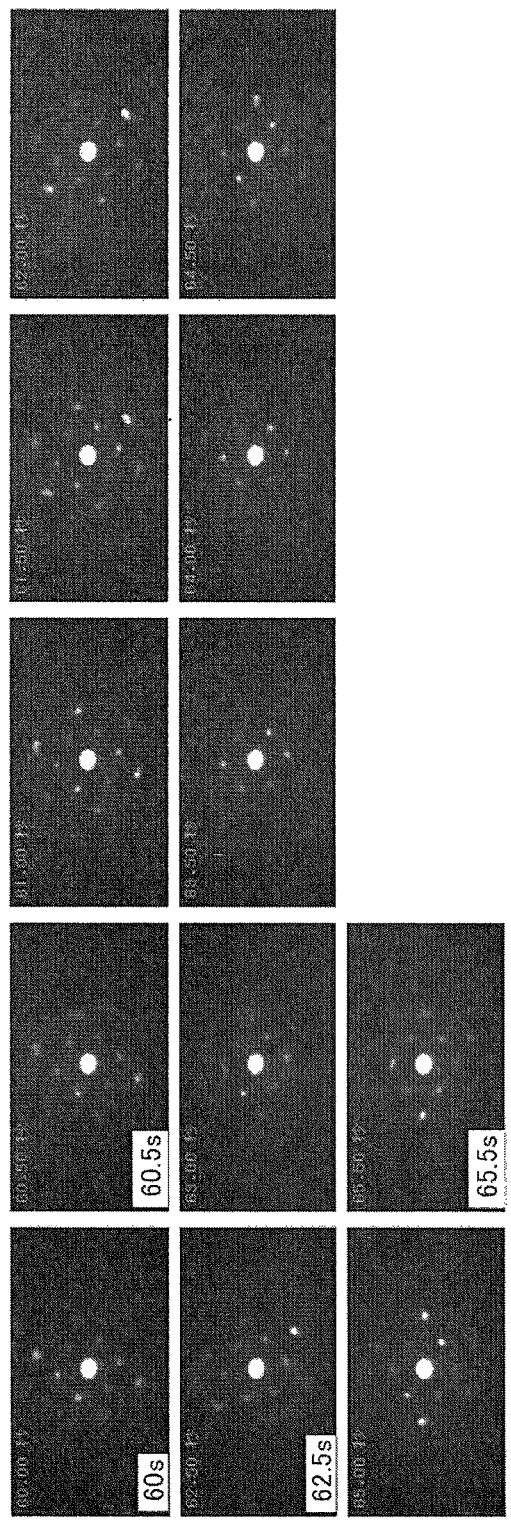
FIG. 49 shows electron diffraction patterns of an oxide semiconductor film.
Figure 50:
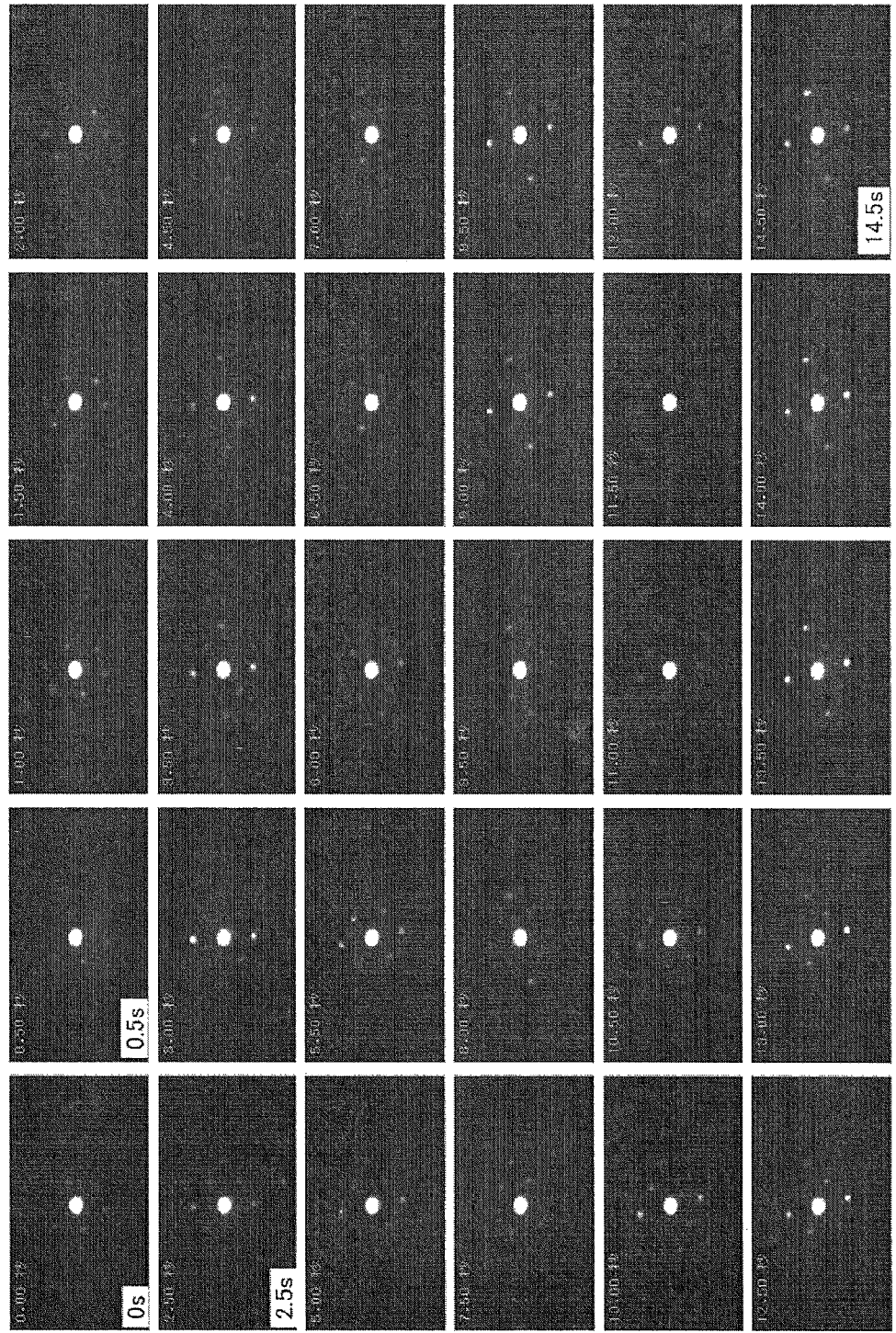
FIG. 50 shows electron diffraction patterns of an oxide semiconductor film.
Figure 51:
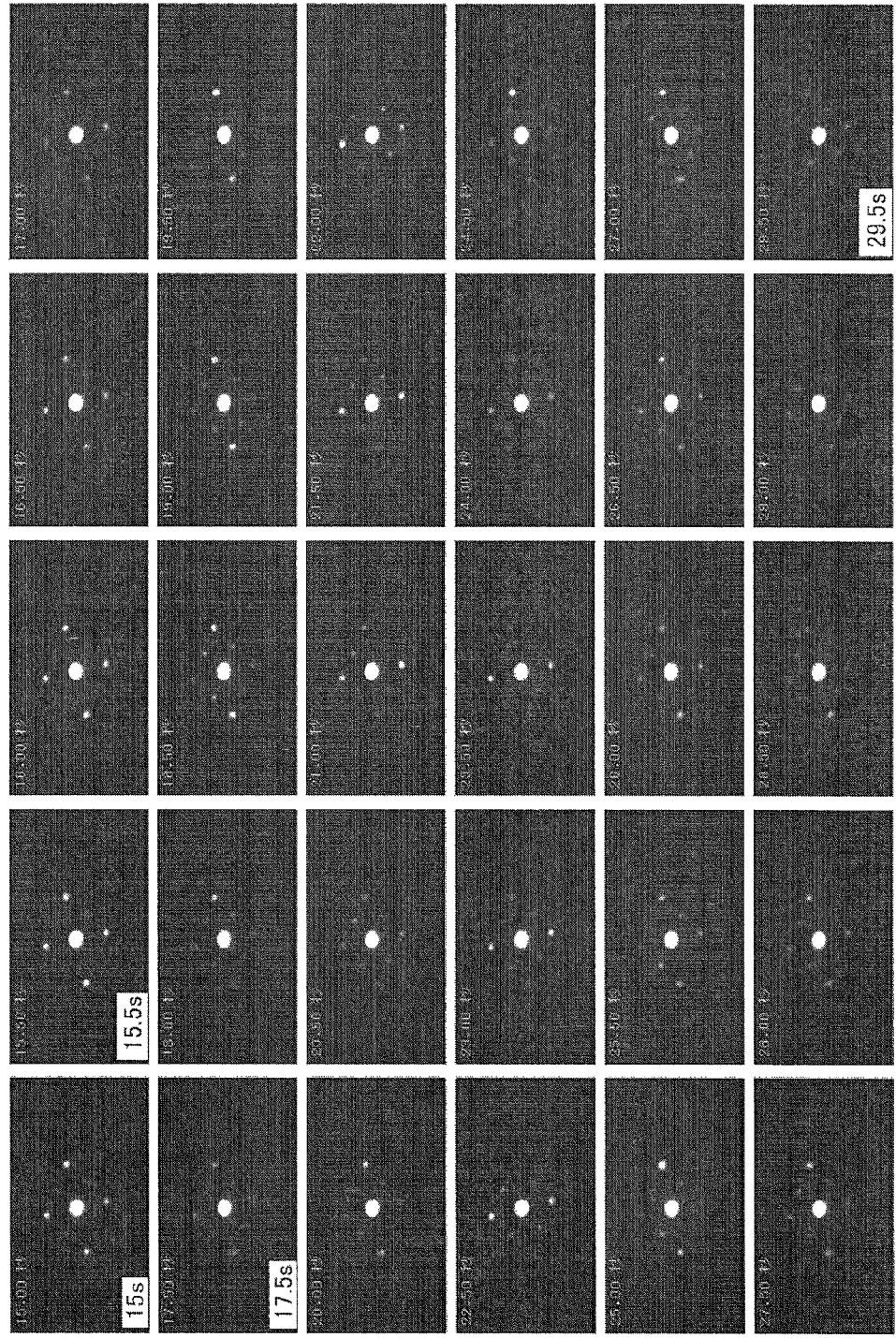
FIG. 51 shows electron diffraction patterns of an oxide semiconductor film.
Figure 52:
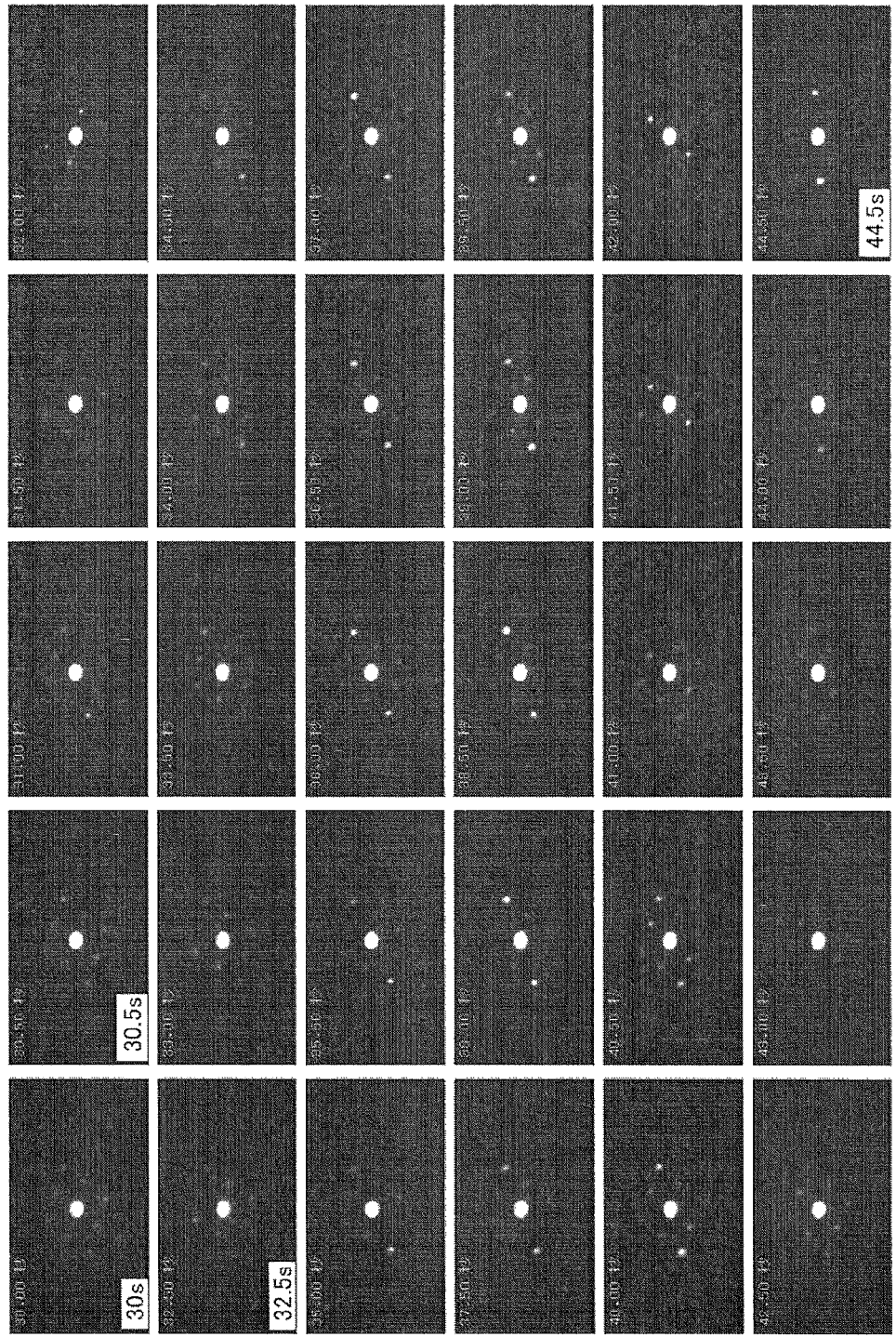
FIG. 52 shows electron diffraction patterns of an oxide semiconductor film.
Figure 53:
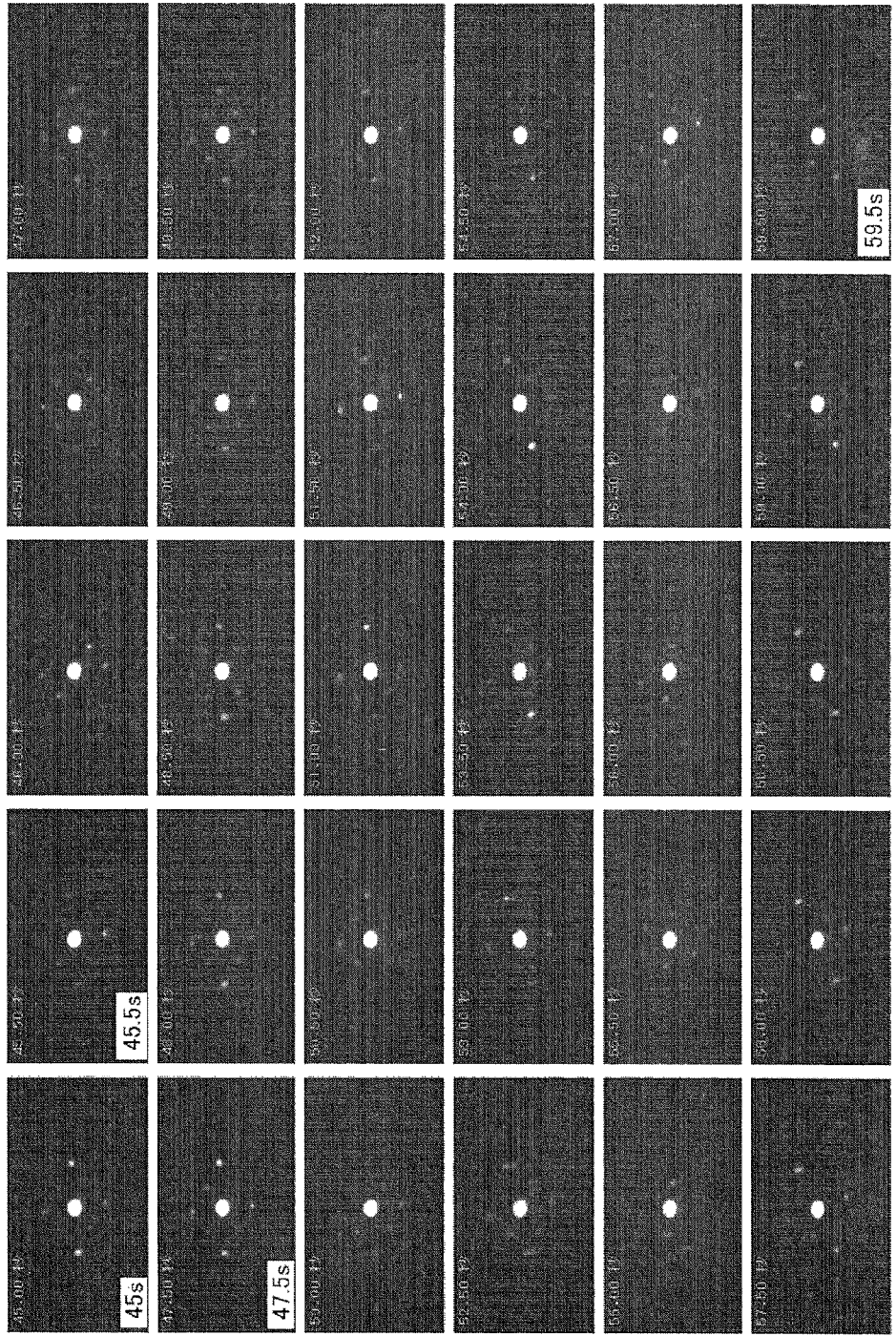
FIG. 53 shows electron diffraction patterns of an oxide semiconductor film.
Figure 54:
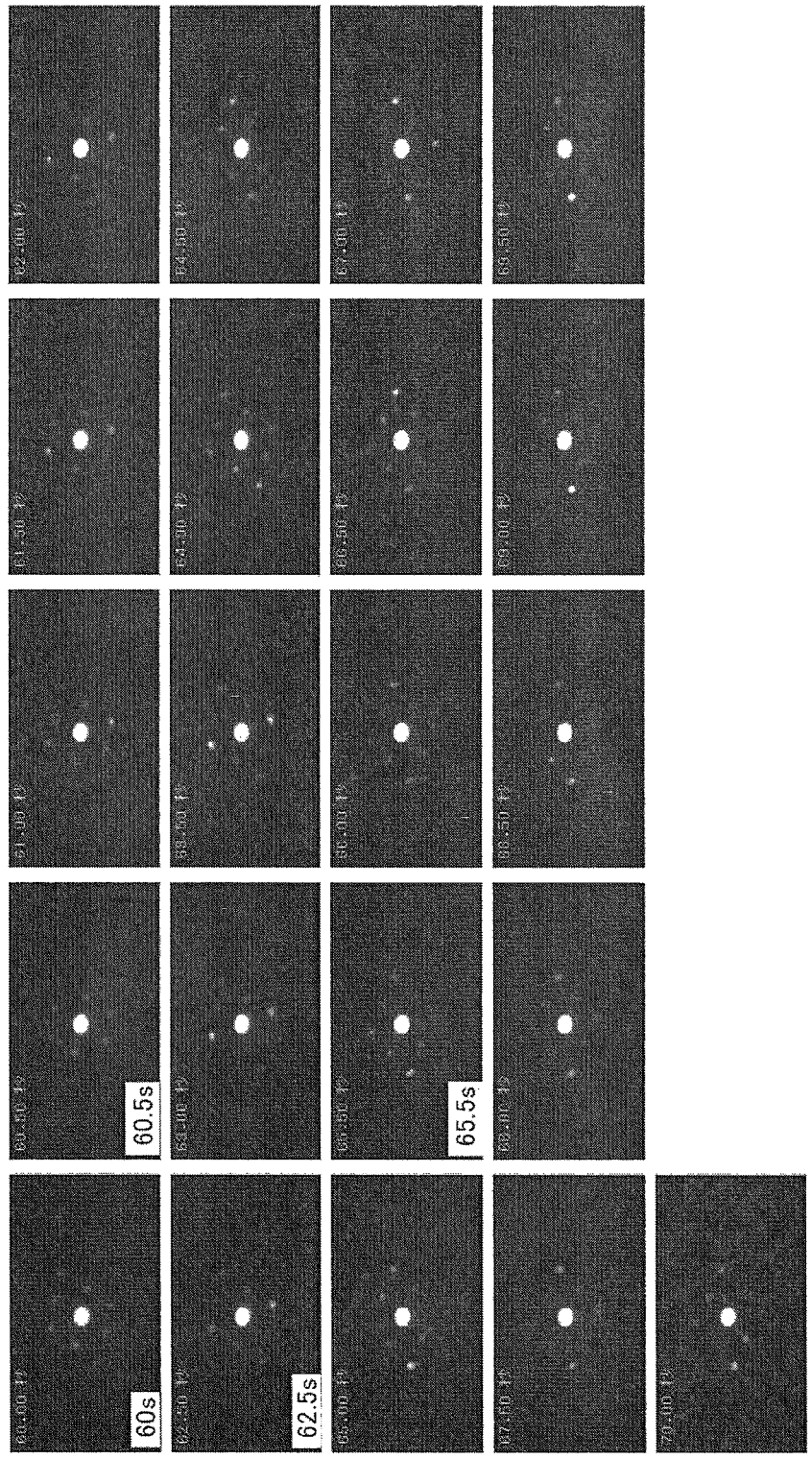
FIG. 54 shows electron diffraction patterns of an oxide semiconductor film.

FIG. 44B is a graph of the proportions of CAAC in Table 13. Like in the results with a thickness of 20 nm, the CAAC proportion of Sample B1-1 formed using a target having an atomic ratio of In:Ga:Zn=2:1:3 was extremely high.

Next, Sample B1-2 was observed by plan-view TEM, and three points thereof were evaluated by energy dispersive X-ray spectroscopy (EDX). Table 14 shows the atomic proportions of indium, gallium, and zinc obtained from the results.

TABLE 14

| | Atomic ratio | | |
|---|---|---|---|
| | In | Ga | Zn |
| Point 1 | 2 | 0.80 | 1.57 |
| Point 2 | 2 | 0.85 | 1.64 |
| Point 3 | 2 | 0.70 | 1.36 |

The atomic ratio of gallium to indium (Ga/In) was approximately greater than or equal to 70% and less than or equal to 83% of the value obtained by ICP-MS, and the atomic ratio of zinc to indium was greater than or equal to 58% and less than or equal to 76% of the value obtained by ICP-MS.

Example 2

[Formation of Transistor]

In this example, Sample A1-4 in which transistors including oxide semiconductor films formed under Condition A1 in Table 6 in Example 1 were formed over a substrate, and Sample B1-4 in which transistors including oxide semiconductor films formed under Condition B1 was formed over a substrate were prepared, and the characteristics thereof were evaluated. Note that in this example, only different points in conditions between Sample A1-4 and Sample B1-4 are described. Thus, in the absence of description of a different point in conditions, Sample A1-4 and Sample B1-4 were subjected to treatment under the same conditions.

To evaluate transistor characteristics, a transistor having a cross-sectional structure illustrated in FIGS. 5B and 5C was used. Note that the transistor did not include the conductive layer 105. A specific fabrication method of the transistor is described below.

As the substrate 50, a p-type CZ crystal silicon wafer with a plane orientation (100) was prepared. After the substrate 50 was cleaned, the insulating film 51 was formed. The insulating film 51 had a stacked-layer structure of a silicon oxide film and a silicon oxynitride film. The silicon oxide film was formed in such a manner that thermal oxidation was performed at 950° C. so that the thickness of the silicon oxide film was 100 nm. After that, the silicon oxynitride film was deposited with a PECVD apparatus to have a thickness of 300 nm. The silicon oxynitride film was deposited under the conditions where the substrate temperature was 400° C., the gas flow rates of silane and nitrous oxide were 2 sccm and 800 sccm, respectively, the pressure was 40 Pa, the deposition power (RF, 27 MHz) was 50 W, and the distance between electrodes was 15 mm. After the deposition of the insulating film 51, planarization was performed by a CMP method. After that, heat treatment was performed at 450° C. for 1 hour in a reduced-pressure atmosphere.

Next, oxygen ions ($^{16}O^+$) were implanted by an ion implantation method. The ion implantation conditions were as follows: acceleration voltage was 60 kV; dosage was $2.0 \times 10^{16}$ ions/cm$^2$; tilt angle was 7°; and twist angle was 72°.

Next, a first semiconductor film to be the semiconductor layer 101a was formed over the insulating film 51. As the first semiconductor film, a 20-nm-thick In—Ga—Zn oxide film was formed by a sputtering method using an In—Ga—Zn oxide target having an atomic ratio of In:Ga:Zn=1:3:4. The first semiconductor film was deposited under the conditions where the flow rates of argon and oxygen were 40 sccm and 5 sccm, respectively, the pressure was 0.7 Pa, the power supply (DC) was 0.5 kW, the substrate temperature was 200° C., and the distance between the substrate and the target was 60 mm. Here, Miniature Gauge manufactured by CANON ANELVA CORPORATION was used as a pressure gauge.

Subsequently, a second semiconductor film to be the semiconductor layer 101b was formed. The first and second semiconductor films were deposited in different chambers, and transfer between the chambers was performed in a vacuum atmosphere without exposure to the air atmosphere. As the second semiconductor film, a 15-nm-thick In—Ga—Zn oxide film was formed. As for the deposition conditions of the second semiconductor film, an In—Ga—Zn oxide target having an atomic ratio of In:Ga:Zn=1:1:1 was used for Sample A1-4, and an In—Ga—Zn oxide target having an atomic ratio of In:Ga:Zn=2:1:3 was used for Sample B1-4. The distance between the substrate and the target was 60 mm. A DC power source was used as a power source. The other main conditions are listed in Table 15. Here, Miniature Gauge manufactured by CANON ANELVA CORPORATION was used as a pressure gauge.

TABLE 15

| | | Gas flow rate | | Substrate | Pres- | |
| | Power [kW] | Ar [sccm] | O$_2$ [sccm] | temperature [° C.] | sure [Pa] | Target |
| --- | --- | --- | --- | --- | --- | --- |
| Sample A1-4 | 0.5 | 30 | 15 | 300° C. | 0.7 | In:Ga:Zn = 1:1:1 |
| Sample B1-4 | 0.5 | 30 | 15 | 200° C. | 0.7 | In:Ga:Zn = 2:1:3 |

Next, heat treatment was performed at 450° C. in a nitrogen atmosphere for 1 hour and heat treatment was subsequently performed at 450° C. in an oxygen atmosphere for 1 hour in the same treatment chamber.

Next, a 15-nm-thick tungsten film was formed by a sputtering method. The tungsten film was deposited under the conditions where a tungsten target was used, the flow rate of argon was 80 sccm, the pressure was 0.8 Pa, the power supply (DC) was 1 kW, and the distance between the substrate and the target was 60 mm. The substrate temperature was approximately 130° C. In addition, argon at a flow rate of 10 sccm was supplied to the rear surface of the substrate.

Next, a mask was formed over the tungsten film through a photolithography process, and part of the tungsten film was etched using the mask by an ICP etching method under the conditions where a mixed atmosphere of a carbon tetrafluoride (CF$_4$) gas at a flow rate of 60 sccm and an oxygen (O$_2$) gas at a flow rate of 40 sccm was used, the power supply was 1000 W, the bias power was 25 W, and the pressure was 2.0 Pa. Then a hard mask was formed.

After that, using the tungsten layer as a mask, the shapes of the first and second semiconductor films were processed by etching, whereby the island-shaped first semiconductor layer 101a and the island-shaped second semiconductor layer 101b were formed. Note that an ICP etching method was used for the etching. For the etching conditions, first etching was performed for three seconds under the conditions where the substrate temperature was 70° C., a mixed gas of methane (CH$_4$) and argon (Ar) (CH$_4$=16 sccm and Ar=32 sccm) was used as an etching gas, the power supply was 600 W, the bias power was 50 W, and the pressure was 3.0 Pa. Then, second etching was performed under the conditions where the substrate temperature was 70° C., a mixed gas of methane and argon (CH$_4$=16 sccm and Ar=32 sccm) was used as an etching gas, the power supply was 600 W, the bias power was 50 W, and the pressure was 1.0 Pa.

Next, the tungsten layer was etched. The etching was performed by an ICP etching method under the conditions where a mixed atmosphere of a chlorine (Cl$_2$) gas at a flow rate of 45 sccm, a carbon tetrafluoride (CF$_4$) gas at a flow rate of 55 sccm, and an oxygen (O$_2$) gas at a flow rate of 55 sccm was used, the power supply was 1000 W, the bias power was 25 W, and the pressure was 2.0 Pa.

Next, a 100-nm thick tungsten film was formed as a conductive film to be the conductive layers 104a and 104b. The tungsten film was deposited under the conditions where a tungsten target was used, the flow rate of argon was 80 sccm, the pressure was 0.8 Pa, and the power supply (DC) was 1 kW. In addition, argon at a flow rate of 10 sccm was supplied to the rear surface of the substrate. The substrate temperature was approximately 130° C.

Next, the shape of the conductive film to be the conductive layers 104a and 104b was processed by etching to form the conductive layers 104a and 104b. Specifically, the etching of the conductive film was performed as follows. First etching was performed under the conditions where the substrate temperature was 40° C., etching gas was a mixed gas of chlorine, carbon tetrafluoride, and oxygen (Cl$_2$=45 sccm, CF$_4$=55 sccm, and O$_2$=55 sccm), the power supply was 3000 W, the bias power was 110 W, the pressure was 0.67 Pa, and the process time was 13 seconds. Then, second etching was performed under the conditions where the substrate temperature was 40° C., the etching gas was chlorine (Cl$_2$=100 sccm), the power supply was 2000 W, the bias power was 0 W, the pressure was 3.00 Pa, and the process time was 15 seconds. Subsequently, third etching was performed under the conditions where the substrate temperature was 40° C., the etching gas was a mixed gas of chlorine, carbon tetrafluoride, and oxygen (Cl$_2$=45 sccm, CF$_4$=55 sccm, and O$_2$=55 sccm), the power supply was 3000 W, the bias power was 110 W, and the pressure was 0.67 Pa.

Next, a third semiconductor film to be the semiconductor layer 101c was formed over the conductive layers 104a and 104b. As the third semiconductor film, a 5-nm-thick In—Ga—Zn oxide film was formed by a sputtering method using an In—Ga—Zn oxide target having an atomic ratio of In:Ga:Zn=1:3:2. The third semiconductor film was deposited under the conditions where the flow rates of argon and oxygen were 30 sccm and 15 sccm, respectively, the pressure was 0.4 Pa, the power supply (DC) was 0.5 kW, the substrate temperature was 200° C., and the distance between the substrate and the target was 60 mm. Here, B-A gauge was used as a pressure gauge.

Next, a 20-nm-thick silicon oxynitride film was formed as the gate insulating film 102 by a PECVD method. The silicon oxynitride film was formed under the conditions where the substrate temperature was 450° C., the gas flow rates of silane and nitrous oxide were 1 sccm and 800 sccm, respectively, the pressure was 200 Pa, the deposition power (RF, 60 MHz) was 150 W, and the distance between electrodes was 28 mm. Subsequently, as a conductive film to be the gate electrode 103, a 30-nm-thick tantalum nitride film was formed and then a 135-nm-thick tungsten film was formed. The tantalum nitride film was deposition under the conditions where the atmosphere was argon and nitrogen (argon:nitrogen=50 sccm:10 sccm), the pressure was 0.6 Pa, the power supply (DC) was 1.0 kW, the substrate temperature was room temperature, and the distance between the substrate and the target was 60 mm. The tungsten film was deposited under the conditions where the atmosphere was argon (argon=100 sccm), the pressure was 2.0 Pa, the power supply (DC) was 4.0 kW, the substrate temperature was approximately 130° C., and the distance between the substrate and the target was 60 mm. Furthermore, argon at a flow rate of 10 sccm is supplied to the rear surface of the substrate.

Next, the shape of the conductive film to be the gate electrode 103 was processed by etching to form the gate electrode 103. Specifically, the etching of the conductive film was performed as follows. First etching was performed under the conditions where the substrate temperature was 40° C., etching gas was a mixed gas of chlorine, carbon tetrafluoride, and oxygen ($Cl_2$=45 sccm, $CF_4$=55 sccm, and $O_2$=55 sccm), the power supply was 3000 W, the bias power was 110 W, and the pressure was 0.67 Pa. Then, second etching was performed under the conditions where the substrate temperature was 40° C., the etching gas was chlorine ($Cl_2$=100 sccm), the power supply was 2000 W, the bias power was 50 W, and the pressure was 0.67 Pa.

Next, the gate insulating film 102 and the third semiconductor film were processed by etching using the gate electrode 103 as a mask, whereby the gate insulating film 102 having a processed shape and the semiconductor layer 101$c$ were formed. An ICP etching method was used for the etching. Etching conditions were set as follows: the substrate temperature was 70° C., the etching gas was boron trichloride ($BCl_3$=80 sccm), the power supply was 450 W, the bias power was 100 W, the pressure was 1.0 Pa, and the process time was 36 seconds.

Next, a 70-nm-thick aluminum oxide film was formed as the insulating film 112 to cover the transistor. The aluminum oxide film was formed by a sputtering method. The aluminum oxide film was formed under the conditions where an aluminum oxide target was used, the atmosphere was argon and oxygen (argon:oxygen=25 sccm: 25 sccm), the pressure was 0.4 Pa, the power supply (RF) was 2.5 kW, the substrate temperature was 250° C., and the distance between the substrate and the target was 60 mm.

Next, a 300-nm-thick silicon oxynitride film was formed as the insulating film 113. The silicon oxynitride film was formed by a PECVD method. The silicon oxynitride film was deposited under the conditions where the substrate temperature was 325° C.; the gas flow rates of silane and nitrous oxide were 5 sccm and 1000 sccm, respectively; the pressure was 133.30 Pa; the deposition power (RF) was 35 W (13.56 MHz); and the distance between electrodes was 20 mm.

Then, openings reaching the conductive layer 104*a* and the conductive layer 104*b* were formed by etching. An ICP etching method was used for the etching.

Specifically, etching of the silicon oxynitride film used for the insulating film 113 was performed as follows. First etching was performed under conditions where the substrate temperature was 70° C.; the etching gas was a mixed gas of trifluoromethane and helium ($CHF_3$=50 sccm and He=100 sccm), the power supply was 475 W, the bias power was 300 W, the pressure was 5.5 Pa, and the process time was 3 seconds. Then, second etching was performed under conditions where the substrate temperature was 70° C.; the etching gas was a mixed gas of trifluoromethane and helium ($CHF_3$=7.5 sccm and He=142.5 sccm), the power supply was 475 W, the bias power was 300 W, the pressure was 5.5 Pa, and the process time was 61 seconds. Then, third etching was performed under conditions where the substrate temperature was 70° C., the etching gas was a mixed gas of trifluoromethane and helium ($CHF_3$=50 sccm and He=100 sccm), the power supply was 475 W, the bias power was 150 W, the pressure was 5.5 Pa, and the process time was 3 seconds. Then, fourth etching was performed under conditions where the substrate temperature was 70° C., the etching gas was a mixed gas of trifluoromethane and helium ($CHF_3$=7.5 sccm and He=142.5 sccm), the power of power source was 475 W, the bias power was 150 W, the pressure was 5.5 Pa, and the process time was 36 seconds.

Specifically, the etching conditions for the aluminum oxide film used as the insulating film 112 were as follows: the substrate temperature was 70° C., the etching gas was boron trichloride ($BCl_3$=80 sccm), the power supply was 450 W, the bias power was 100 W, the pressure was 1.9 Pa, and the process time was 185 seconds.

Next, in the openings and over the insulating film 113, a conductive film in which a 50-nm-thick titanium film, a 200-nm-thick aluminum film, and a 50-nm-thick titanium film were stacked in this order was formed by a sputtering method. Deposition conditions of the uppermost titanium film and the lowermost titanium film were set as follows: the atmosphere was argon (flow rate: 20 sccm), the pressure was 0.1 Pa, the power supply (DC) was 12 kW, the substrate temperature was room temperature, and the distance between the substrate and the target was 400 mm. Further, the deposition conditions of the aluminum film were set as follows: the atmosphere was argon (flow rate: 50 sccm), the pressure was 0.4 Pa, the power supply (DC) was 1 kW, the substrate temperature was room temperature, and the distance between the substrate and the target was 60 mm.

Next, the shapes of the conductive film in the openings and over the insulating film 113 was processed by etching to form wirings. An ICP etching method was used for the etching. Specifically, first etching was performed under conditions where the substrate temperature was 70° C., the etching gas was a mixed gas of boron trichloride and chlorine ($BCl_3$=60 sccm and $Cl_2$=20 sccm), the power supply was 450 W, the bias power was 100 W, and the pressure was 1.9 Pa. Then, second etching was performed under conditions where the substrate temperature was 70° C., the etching gas was a mixed gas of carbon tetrafluoride ($CF_4$=80 sccm), the power supply was 500 W, the bias power was 50 W, the pressure was 2.0 Pa, and the process time was approximately 15 seconds.

Then, a 1.6-μm-thick polyimide film was formed by a coating method, and heat treatment was performed at 300° C. for approximately 1 hour in an air atmosphere.

Through the above process, Sample A1-4 and Sample B1-4 were formed.

[Evaluation of Transistor Characteristics]

Figure 57A:
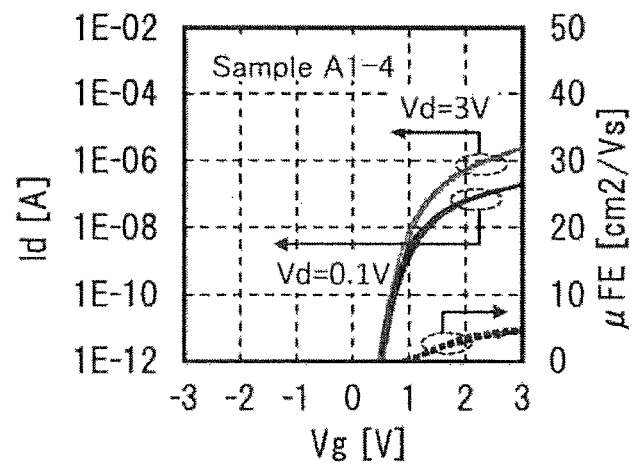
FIGS. 57A and 57B show Vg-Id characteristics of transistors.
Figure 57B:
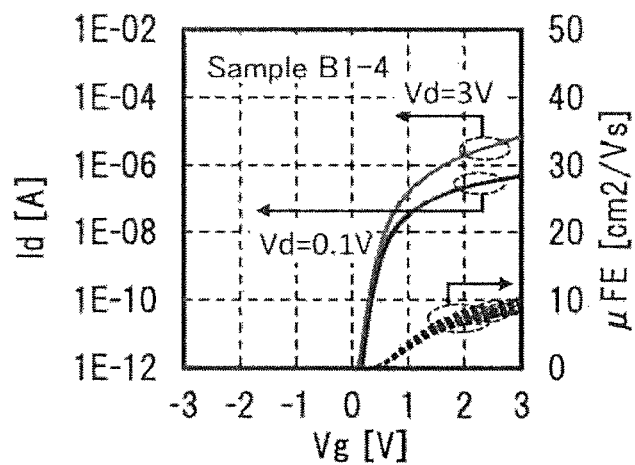

FIGS. 57A and 57B show transistor characteristics. In each of Sample A1-4 and Sample B1-4, out of n-channel transistors that were provided over the plane and each had a channel length L of 0.46 μm and a channel width W of 0.8 μm, 25 transistors were evaluated. FIGS. 57A and 57B show Vg-Id characteristics of Sample A1-4 and Sample B1-4, respectively. Here, Vg corresponds to voltage between the source and the gate, and Id corresponds to current between the source and the drain. Furthermore, the horizontal axis represents gate voltage Vg, the vertical axis on the left side represents drain voltage Id, and the vertical axis on the right side represents field-effect mobility $\mu_{FE}$. Two conditions where the drain voltage Vd was 0.1 V and 3 V were employed in the measurement. Here, field-effect mobility calculated when Vd=0.1 V is shown.

The results of FIGS. 57A and 57B indicate that favorable transistors were able to be obtained in each of the samples. The transistors of Sample B1-4 had lower threshold voltage, higher field-effect mobility, and more favorable characteristics than the transistors of Sample A1-4.

Comparative Example

In this comparative example, the relation between transistor characteristics and density of an oxide semiconductor film is described.

As described in Example 1, a CAAC-OS film having a plurality of crystal parts with c-axis alignment is a dense film. However, as described in Embodiment 3, an oxide semiconductor film may have low density depending on formation conditions. Furthermore, with a reduction in film density, the film might have what is called a void.

To verify how use of an oxide semiconductor film having low density and many voids affects transistor characteristics, oxide semiconductor films which differed in film density were formed under two conditions, and transistors were formed using the oxide semiconductor films.

The oxide semiconductor films were each formed by a sputtering method. An In—Ga—Zn oxide target having an atomic ratio of In:Ga:Zn=1:1:1 was used. Furthermore, the distance between the substrate and the target was 130 mm. Main conditions are listed in Table 16. An RF power source was used as a power source.

TABLE 16

| | Power source | Gas flow rate Ar [sccm] | O$_2$ [sccm] | Substrate temperature [° C.] | Pressure [Pa] |
|---|---|---|---|---|---|
| Condition C | 100 W | 98 | 2 | Room temperature | 1.0 |
| Condition D | 100 W | 98 | 2 | Room temperature | 0.4 |

[Formation of Transistors]

Next, Sample C-2 in which transistors including oxide semiconductor films deposited under Condition C in Table 16 were formed over a substrate, and Sample D-2 in which transistors including oxide semiconductor films deposited under Condition D in Table 16 were formed over a substrate were formed. Note that in this example, only different points in conditions between Sample C-2 and Sample D-2 are described. Thus, in the absence of description of a different point in conditions, Sample C-2 and Sample D-2 were subjected to treatment under the same conditions. As the transistor structure, the structure in FIGS. 62A to 62C was used.

First, a glass substrate was prepared as the substrate 50, and a gate electrode was formed over the glass substrate.

A 100-nm-thick tungsten film was formed by sputtering, a mask was formed over the tungsten film through a photolithography process, and part of the tungsten film was etched using the mask, so that the gate electrode 103 was formed.

Next, the gate insulating film 102 was formed over the gate electrode 103.

As the g gate insulating film 102, a stack including a 400-nm-thick silicon nitride film and a 50-nm-thick silicon oxynitride film was used.

Next, the semiconductor layer 101 overlapping the gate electrode 103 with the gate insulating film 102 positioned therebetween was formed. An oxide semiconductor layer was used as the semiconductor layer 101. Here, the semiconductor layer 101 was formed in such a manner that a 35-nm-thick oxide semiconductor film was formed over the gate insulating film by a sputtering method, and part of the oxide semiconductor film was etched using a mask.

Furthermore, an In—Ga—Zn oxide film was used as the oxide semiconductor film. The deposition conditions of the oxide semiconductor film in Sample C-2 were different from those of the oxide semiconductor film in Sample D-2. Sample C-2 and Sample D-2 were formed using Condition C and Condition D that are described above.

Next, heat treatment was performed. Here, heat treatment was performed at 450° C. for 1 hour in a nitrogen atmosphere, and then heat treatment was performed for 1 hour at 450° C. in a mixed gas of nitrogen and oxygen Next, the conductive layer 104a and the conductive layer 104b that are a pair of conductive layers in contact with the oxide semiconductor film were formed.

First, a conductive film was formed over the gate insulating film 102 and the semiconductor layer 101. As the conductive film, a 400-nm-thick aluminum film was formed over a 50-nm-thick tungsten film, and a 100-nm-thick titanium film was formed over the aluminum film. Then, a mask was formed over the conductive film through a photolithography process, and the conductive film was partly etched using the mask, whereby the conductive layer 104a and the conductive layer 104b were formed.

Next, the protective film 25 was formed over the semiconductor layer 101, the conductive layer 104a, and the conductive layer 104b. As the protective film, a 450-nm-thick silicon oxynitride film was formed and then a 100-nm-thick silicon nitride film was formed.

Next, an opening reaching one of the conductive layers 104a and 104b was formed in part of the protective film 25. The opening portion was formed in such a manner that a mask was formed over the protective film 25, and the protective film 25 was partly etched using the mask.

Next, the electrode 126 serving as a pixel electrode was formed over the protective film 25. The electrode 126 was electrically connected to one of the conductive layers 104a and 104b that were a pair of conductive layers, through the opening formed in part of the protective film 25.

Here, as the electrode 126, a conductive film of an indium oxide-tin oxide compound (ITO-SiO$_2$) containing silicon oxide was formed by a sputtering method. Note that the composition of a target used for forming the conductive film was In$_2$O$_3$:SnO$_2$:SiO$_2$=85:10:5 [wt %]. After that, heat treatment was performed at 300° C. for 1 hour in a nitrogen atmosphere.

Through the above process, Sample C-2 and Sample D-2 were obtained.

[Evaluation of Transistor Characteristics]

Here, Vg-Id characteristics were measured as initial characteristics of transistors. In each of Sample C-2 and Sample D-2, out of n-channel transistors that were provided over the plane and each had a channel length L of 3 μm and a channel width W of 50 μm, four transistors were evaluated. Here, changes in current flowing between a source and a drain (hereinafter referred to as drain current: Id), that is, Vg-Id characteristics were measured under the following conditions: the substrate temperature was 25° C., the potential difference between the source and the drain (hereinafter referred to as drain voltage: Vd) was 1 V or 10 V, and the potential difference between the source and the gate electrodes (hereinafter referred to as gate voltage: Vg) was changed from −20 V to 20 V.

Figure 58A:
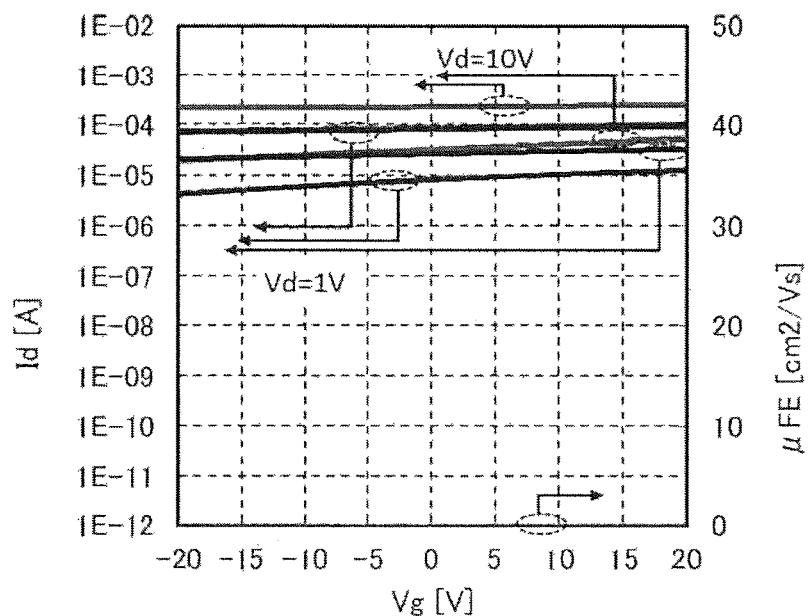
FIGS. 58A and 58B show Vg-Id characteristics of transistors.
Figure 58B:
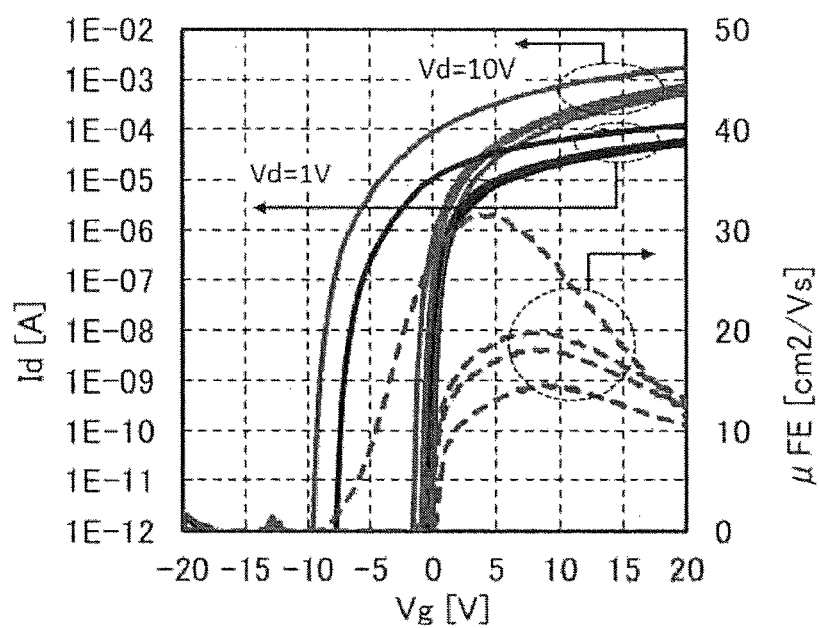

FIGS. 58A and 58B show evaluation results of the transistors of Sample C-2 and sample D-2, respectively. In FIGS. 58A and 58B, the horizontal axis represents gate voltage Vg, and the vertical axis represents drain current Id. The four transistors over the plane were measured.

Favorable on-off characteristics were not able to be obtained in the transistors of Sample C-2 with low film density. Although the on-off ratio was able to be obtained, there was large variation in the transistors of Sample D-2 with relatively high film density. The film density of the oxide semiconductor film correlates with the transistor characteristics, and to obtain favorable characteristics, the dense film shown in Example 2 is preferably used.

Example 3

In this example, evaluation results of oxide semiconductor films of one embodiment of the present invention are described. The oxide semiconductor films were deposited by a sputtering method under conditions shown in Table 17. Conditions A1, A2, A3, B1, B2, and E1, which are shown in Table 6, are listed again in Table 17. The pressure in Apparatus B in Table 17 was measured with B-A gauge BRG-1B manufactured by CANON ANELVA CORPORATION, and the pressures in Apparatus A and Apparatus C were measured with Miniature Gauge MG-2 manufactured by CANON ANELVA CORPORATION. A polycrystalline hIn-Ga—Zn oxide target having an atomic ratio of In:Ga:Zn=1:1:1 was used in Conditions A1, A2, and A3, a polycrystalline In—Ga—Zn oxide target having an atomic ratio of In:Ga:Zn=2:1:3 was used in Conditions B1 and B2, a polycrystalline In—Ga—Zn oxide target having an atomic ratio of In:Ga:Zn=4:2:4.1 was used in Conditions E1 to E3, a polycrystalline In—Ga—Zn oxide target having an atomic ratio of In:Ga:Zn=1:3:4 was used in Conditions F1 to F3, and a polycrystalline In—Ga—Zn oxide target having an atomic ratio of In:Ga:Zn=1:3:2 was used in Condition F4. A DC power source was used as a power source.

was subjected to heat treatment. As for the heat treatment conditions, heat treatment was performed at 450° C. for 1 hour in a nitrogen atmosphere and heat treatment was subsequently performed at 450° C. for 1 hour in an oxygen atmosphere in the same treatment chamber. The samples formed under Condition E2, Condition E3, and Condition E4 are referred to as Sample E2-1, Sample E3-1, and Sample E4-1, respectively. Note that the deposition conditions for Sample E2-1 were obtained by changing the deposition temperature of the deposition conditions for Sample E1-1 described in Example 1 from 200° C. to 300° C.

Figure 68B:
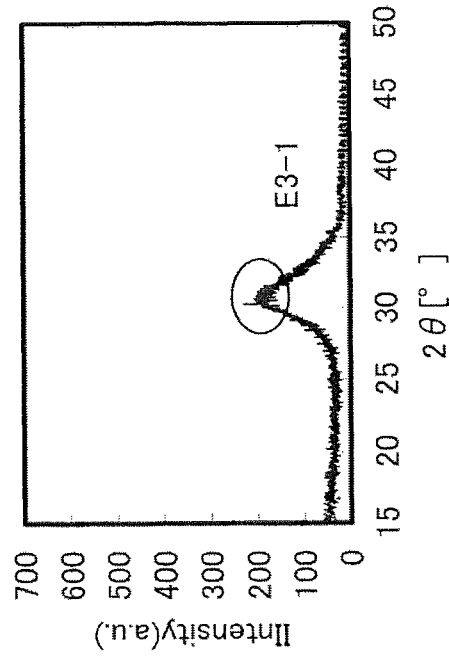
FIGS. 68A to 68C show XRD evaluation results of oxide semiconductor films of one embodiment of the present invention.
Figure 68C:
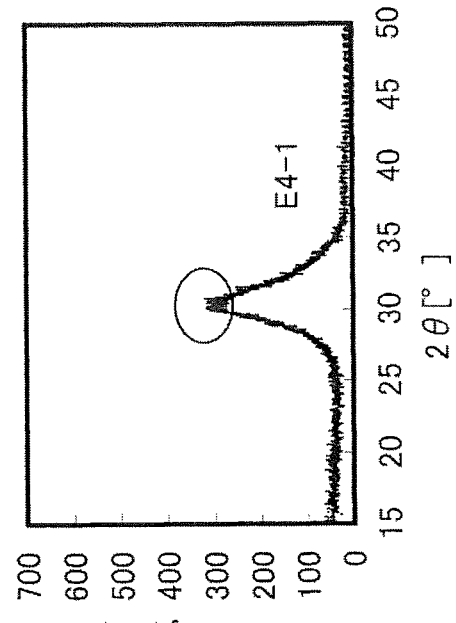
Figure 68A:
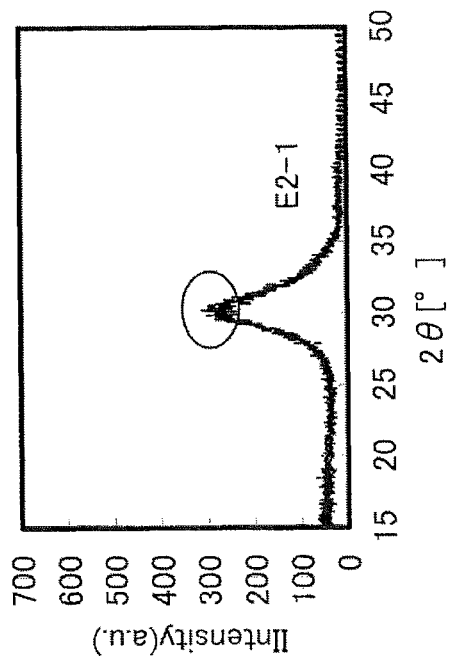

The evaluation results obtained with an XRD apparatus are described. The apparatus used in measurement is the same as that described in Example 1. FIGS. 68A, 68B, and 68C show analysis results of Sample E2-1, Sample E3-1, and Sample E4-1 by an out-of-plane method, respectively. A peak at around 2θ=31° was observed in all the samples. This peak is derived from the (009) plane of the InGaZnO$_4$ crystal, which indicates that crystals in the oxide semiconductor film in each sample had c-axis alignment, and that the c-axes were aligned in a direction substantially perpendicular to the formation surface or the top surface of the oxide semiconductor film. Here, the maximum angle of the peak at around 2θ=31° and a full width at half maximum in each sample are shown in Table 18. The maximum angle of the peak and the full width at half maximum were calculated in such a manner that a background was subtracted and then fitting with the Lorentz function was performed. For the

TABLE 17

| | Apparatus | Power [kW] | Gas flow rate Ar [sccm] | O$_2$ [sccm] | Substrate temperature | Pressure [Pa] | Target | Taget-substrate distance |
|---|---|---|---|---|---|---|---|---|
| Condition A1 | Apparatus A | 0.5 (DC) | 30 | 15 | 300° C. | 0.7 | In:Ga:Zn = 1:1:1 | 60 mm |
| Condition A2 | | 0.5 (DC) | 30 | 15 | 300° C. | 0.4 | In:Ga:Zn = 1:1:1 | 60 mm |
| Condition A3 | Apparatus B | 0.5 (DC) | 30 | 15 | 300° C. | 0.4 | In:Ga:Zn = 1:1:1 | 60 mm |
| Condition B1 | Apparatus A | 0.5 (DC) | 30 | 15 | 200° C. | 0.7 | In:Ga:Zn = 2:1:3 | 60 mm |
| Condition B2 | | 0.5 (DC) | 30 | 15 | 300° C. | 0.7 | In:Ga:Zn = 2:1:3 | 60 mm |
| Condition E1 | Apparatus C | 0.2 (DC) | 20 | 10 | 200° C. | 0.4 | In:Ga:Zn = 4:2:4.1 | 130 mm |
| Condition E2 | | 0.2 (DC) | 20 | 10 | 300° C. | 0.4 | In:Ga:Zn = 4:2:4.1 | 130 mm |
| Condition E3 | Apparatus A | 0.5 (DC) | 30 | 15 | 200° C. | 0.7 | In:Ga:Zn = 4:2:4.1 | 60 mm |
| Condition E4 | | 0.5 (DC) | 30 | 15 | 300° C. | 0.7 | In:Ga:Zn = 4:2:4.1 | 60 mm |
| Condition F1 | Apparatus A | 0.5 (DC) | 40 | 5 | 200° C. | 0.7 | In:Ga:Zn = 1:3:4 | 60 mm |
| Condition F2 | Apparatus B | 0.5 (DC) | 40 | 5 | 200° C. | 0.4 | In:Ga:Zn = 1:3:4 | 60 mm |
| Condition F3 | Apparatus C | 0.2 (DC) | 27 | 3 | 200° C. | 0.4 | In:Ga:Zn = 1:3:4 | 130 mm |
| Condition F4 | Apparatus B | 0.5 (DC) | 30 | 15 | 200° C. | 0.4 | In:Ga:Zn = 1:3:2 | 60 mm |

[XRD Evaluation 2]

Oxide semiconductor films were formed under Conditions E2 to E4 in Table 17 and evaluated with an XRD apparatus. The results are described.

First, samples for evaluation were formed. Oxide semiconductor films were deposited over silicon wafers by a sputtering method. Conditions E2 to E4 in Table 17 were used as deposition conditions. After deposition, each sample background, the sum of the linear function and the Lorentz function was used. The full width at half maximum of Sample E4-1 was 3.21°, whereas that of Sample E3-1 was 3.67°. Furthermore, the full width at half maximum of Sample E2-1 was 3.10°, whereas that of Sample E1-1 described in Example 1 was 3.47°. The results show that when the deposition temperature is high, a sharp peak is obtained and the full width at half maximum is small.

TABLE 18

|  | 2θ [°] | full width at half maximum [°] |
|---|---|---|
| Sample E2-1 | 30.3 | 3.10 |
| Sample E3-1 | 30.9 | 3.67 |
| Sample E4-1 | 30.5 | 3.21 |

[Evaluation Results (2) with ICP-MS]

The indium content, gallium content, and zinc content of Samples E2-1, E3-1, and E4-1 and sample E1-1 in Example 1 were evaluated by ICP-MS. Table 19 shows the atomic ratios of the elements calculated from the obtained results.

TABLE 19

|  | Atomic ratio | | |
|---|---|---|---|
|  | In | Ga | Zn |
| Sample E1-1 | 4.00 | 1.93 | 2.74 |
| Sample E2-1 | 4.00 | 1.92 | 2.60 |
| Sample E3-1 | 4.00 | 1.93 | 2.94 |
| Sample E4-1 | 4.00 | 1.97 | 2.90 |

According to Table 19, the percentage of remaining zinc (A) (=Zn(Film)÷Zn(Target)×100 [%]) of Sample E1-1 is 78%, the percentage of remaining zinc of Sample E2-1 was 75%, the percentage of remaining zinc of Sample E3-1 was approximately 82%, and the percentage of remaining zinc (A) of Sample E4-1 was approximately 81%.

[Evaluation (2) of CAAC Proportion]

Next, evaluation of a CAAC proportion was performed using Conditions E1, E3, and E4 in Table 17.

First, samples for the observations were each fabricated as follows. As an insulating film, a 100-nm-thick silicon oxide film was formed over a silicon wafer by thermal oxidation. After that, a 300-nm-thick silicon oxide film was deposited by a sputtering method. The silicon oxide film was formed under the conditions where a silicon oxide target was used, the flow rate of oxygen was 50 sccm, the pressure was 0.4 Pa, a power of 1.5 kW with an RF power source was used, and the substrate temperature was 100° C. The distance between the target and the substrate was 60 mm. After the deposition, polishing was performed by CMP to planarize the surface.

Next, a 20-nm-thick oxide semiconductor film was formed. Then, heat treatment was performed. As for the heat treatment conditions, heat treatment was performed at 450° C. for 1 hour in a nitrogen atmosphere, and then heat treatment was performed at 450° C. for 1 hour in an oxygen atmosphere. Samples including oxide semiconductor films formed under Condition E1, E3, and E4 in Table 17 are respectively referred to as Sample E1-2, Sample E3-2, and Sample E4-2.

Next, the obtained samples were thinned and the CAAC proportion of each sample was evaluated. Since the apparatus and the method used for evaluating the CAAC proportion described in Example 1 were used in this evaluation, details thereof are omitted here.

The moving image of the diffraction pattern was changed into still images for every 0.5 seconds. Diffraction patterns obtained from the still images were analyzed and classified into four kinds of patterns, i.e., patterns of a CAAC-OS film, patterns that were not identifiable as the pattern of a CAAC-OS film or a pattern of an nc-OS film, the patterns of an nc-OS film, and patterns of a spinel crystal structure. The results are shown in Table 20. Note that in the CAAC proportions in Table 20, the patterns not identifiable as the pattern of a CAAC-OS film or the pattern of an nc-OS film are regarded as not CAAC.

TABLE 20

|  |  | The number of images | | | | | The CAAC proportion (assuming that II is not CAAC) |
|---|---|---|---|---|---|---|---|
|  |  | The number of analyses | I CAAC | II CAAC or nc? | III nc | IV Spinel structure |  |
| Sample E1-2 | Scan 1 | 135 | 120 | 9 | 6 | 0 | 88.9% |
|  | Scan 2 | 133 | 122 | 3 | 8 | 0 | 91.7% |
|  | Scan 3 | 224 | 200 | 13 | 11 | 0 | 89.3% |
| Sample E3-2 | Scan 1 | 133 | 120 | 7 | 6 | 0 | 90.2% |
|  | Scan2 | 133 | 106 | 19 | 8 | 0 | 79.7% |
|  | Scan 3 | 236 | 187 | 27 | 22 | 0 | 79.2% |
| Sample E4-2 | Scan 1 | 133 | 127 | 4 | 2 | 0 | 95.5% |
|  | Scan 2 | 129 | 121 | 2 | 6 | 0 | 93.8% |
|  | Scan 3 | 223 | 207 | 5 | 11 | 0 | 92.8% |

Next, patterns before and after each of the patterns that were not identifiable as the pattern of a CAAC-OS film or the pattern of an nc-OS film were observed in the moving image, and classified into patterns before and/or after which the pattern of a CAAC-OS film was observed, and patterns before and/or after which the pattern of an nc-OS film was observed. Then, the CAAC proportions were calculated. The results are shown in Table 21. In Tables 20 and 21, the number of images of diffraction patterns used for calculating the CAAC proportion, the number of images of each observed pattern, and the CAAC proportion obtained by calculation are listed for each scan.

TABLE 21

|  |  | The number of images | | | | The CAAC proportion |
|---|---|---|---|---|---|---|
|  |  | The number of analyses | CAAC | nc | Spinel structure |  |
| Sample E1-2 | Scan 1 | 135 | 129 | 6 | 0 | 95.6% |
|  | Scan 2 | 133 | 125 | 8 | 0 | 94.0% |
|  | Scan 3 | 224 | 213 | 11 | 0 | 95.1% |
| Sample E3-2 | Scan 1 | 133 | 127 | 6 | 0 | 95.5% |
|  | Scan 2 | 133 | 125 | 8 | 0 | 94.0% |
|  | Scan 3 | 236 | 214 | 22 | 0 | 90.7% |

TABLE 21-continued

| | | The number of images | | | | |
|---|---|---|---|---|---|---|
| | | The number of analyses | CAAC | nc | Spinel structure | The CAAC proportion |
| Sample E4-2 | Scan 1 | 133 | 131 | 2 | 0 | 98.5% |
| | Scan 2 | 129 | 123 | 6 | 0 | 95.3% |
| | Scan 3 | 223 | 212 | 11 | 0 | 95.1% |

In Sample E3-2 formed at a deposition temperature of 200° C., the CAAC proportion was higher than or equal to 90%, and the average CAAC proportion of Scan 1 to Scan 3 was 93.4%. The CAAC proportion was higher than or equal to 95% in Sample E4-2 formed at a deposition temperature of 300° C., and the average CAAC proportion of Scan 1 to Scan 3 was 96.3%. The diffraction pattern in each of the samples was either the pattern of a CAAC-OS film or the patterns of an nc-OS film, and no spinel-crystal-structure diffraction pattern was observed.

Example 4

[CPM Evaluation]

Next, oxide semiconductor films were evaluated by a constant photocurrent method (CPM).

First, samples were formed. Quartz substrates were used as substrates, and a 100-nm-thick In—Ga—Zn oxide film was formed as an oxide semiconductor film over each quartz substrate. The In—Ga—Zn oxide film was formed by a sputtering method using a polycrystalline In—Ga—Zn oxide target. Conditions A1 and E3 in Table 17 were used as deposition conditions. Here, a polycrystalline In—Ga—Zn oxide having an atomic ratio of In:Ga:Zn=1:1:1 was used in Condition A1, and a polycrystalline In—Ga—Zn oxide having an atomic ratio of In:Ga:Zn=4:2:4.1 was used in Condition E3. After the deposition heat treatment was performed. As for the heat treatment conditions, heat treatment was performed at 450° C. for 1 hour in a nitrogen atmosphere and heat treatment was subsequently performed at 450° C. for 1 hour in an oxygen atmosphere in the same treatment chamber. The samples formed under Condition A1 and Condition E3 are referred to as Sample A1-3 and Sample E3-3, respectively.

In the CPM measurement, the amount of light with which a surface of the sample between terminals is irradiated is adjusted so that a photocurrent value is kept constant in the state where voltage is applied between a first electrode and a second electrode provided in contact with the oxide semiconductor film, and then an absorption coefficient is derived from the amount of the irradiation light at each wavelength. In the CPM measurement, the absorption coefficient of energy which corresponds to the density of state (DOS) (calculated from a wavelength) is increased. The increase in the absorption coefficient is multiplied by a constant, whereby the DOS of the sample can be obtained.

Moreover, the light absorption (urbach tail) due to the band tail is removed from the curve of the light absorption spectrum, whereby an absorption coefficient α due to the defect level can be calculated from the following formula.

[Formula 10]

$$\alpha = \int \frac{\alpha(E) - \alpha_u}{E} dE \quad (10)$$

Here, α(E) represents the absorption coefficient at each energy level and $\alpha_u$ represents the absorption coefficient due to the urbach tail.

Note that the slope of the urbach tail is called urbach energy. As the urbach energy gets smaller, such a semiconductor layer is a well-ordered semiconductor layer which has fewer defects and whose tail slope of a level at a band edge in the valence band becomes steeper.

Figure 71A:
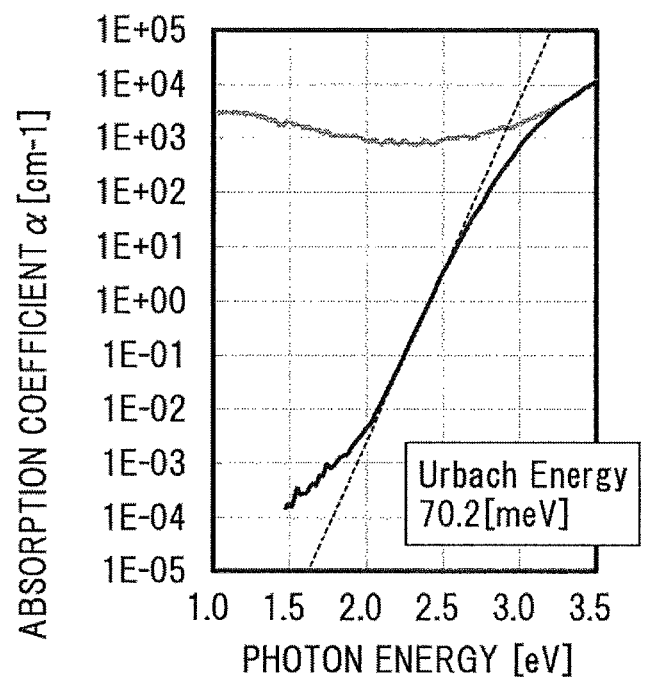
FIGS. 71A and 71B show CPM evaluation results of oxide semiconductor films.
Figure 71B:
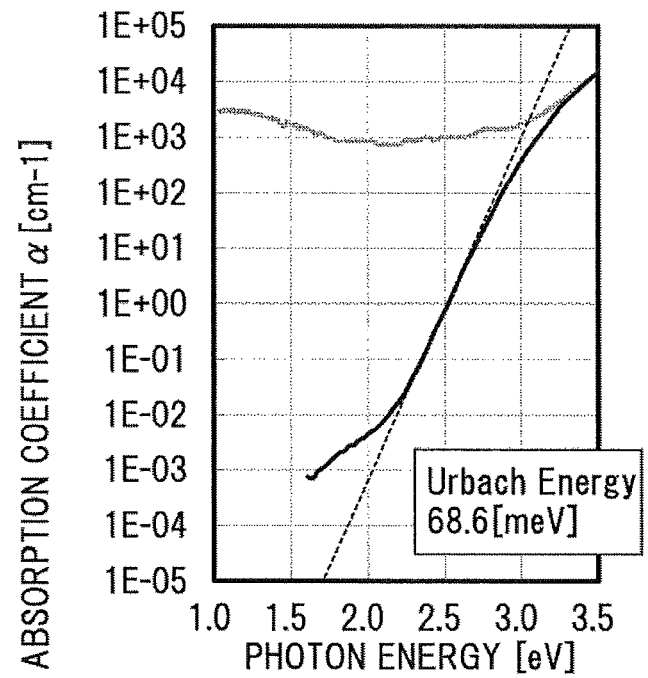

FIGS. 71A and 71B each show results of fitting the absorption coefficient (dotted line) measured using a spectrophotometer and the absorption coefficient (solid line) measured by CPM in the range of energy higher than or equal to the energy gap of the oxide semiconductor film. FIGS. 71A and 71B correspond to the results of Sample A1-3 and the results of Sample E3-3, respectively. An urbach energy obtained by the absorption coefficient measured by CPM was 70.2 meV in Sample A1-3, and 68.6 meV in Sample E3-3.

A background (thin dotted line) was subtracted from the absorption coefficient measured by CPM in FIGS. 71A and 71B, and the integral value of the absorption coefficient was calculated. As a result, the absorption coefficient due to DOS was found to be $1.1 \times 10^{-3}$ cm$^{-1}$ in Sample A2-3 and $1.6 \times 10^{-3}$ cm$^{-1}$ in Sample E3-3. This shows that the absorption coefficient due to the defect level was small in each of the samples The obtained absorption coefficients indicate that each sample was a film having a small amount of defects. In addition, the results for urbach energy suggest that the oxide semiconductor film formed using a polycrystalline In—Ga—Zn oxide having an atomic ratio of In:Ga:Zn=4:2:4.1 had a smaller amount of defects.

Example 5

In this example, evaluation results of transistor characteristics are described.

[Formation of Transistors (2)]

To evaluate transistor characteristics, the transistor in the example illustrated FIG. 6A, in which the side surfaces of the semiconductor layers 101a and 101b are not covered with the conductive layers 104a and 104b, was used. Note that the conductive layer 105 was not provided in the transistor. Samples T1, T2, and T3 each of which was a substrate including the transistor, were formed. The semiconductor layers 101a, 101b, and 101c were deposited by a sputtering method. In Sample T1, the semiconductor layer 101a, the semiconductor layer 101b, and the semiconductor layer 101c were deposited under Condition F2, Condition A3, and Condition F2, respectively. In Sample T2, the semiconductor layer 101a, the semiconductor layer 101b, and the semiconductor layer 101c were deposited under Condition F1, Condition B1, and Condition F2, respectively. In Sample T3, the semiconductor layer 101a, the semiconductor layer 101b, and the semiconductor layer 101c were deposited under Condition F1, Condition E3, and Condition F2, respectively.

A specific method for forming the transistors are described. Note that in this example, only different points in conditions between Samples T1 to T3 are described. Thus, in the absence of description of a different point in conditions, Samples T1 to T3 were subjected to treatment under the same conditions.

As the substrate 50, a p-type CZ crystal silicon wafer with a plane orientation (100) was prepared. After the substrate 50 was cleaned, the insulating film 51 was formed. The insulating film 51 had a stacked-layer structure of a silicon oxide film and a silicon oxynitride film. The silicon oxide film was formed in such a manner that thermal oxidation was performed at 950° C. so that the thickness of the silicon oxide film was 100 nm. After that, the silicon oxynitride film was deposited with a PECVD apparatus to have a thickness of 300 nm. The silicon oxynitride film was deposited under the conditions where the substrate temperature was 400° C., the gas flow rates of silane and nitrous oxide were 2 sccm and 800 sccm, respectively, the pressure was 40 Pa, the deposition power (RF) was 50 W (27 MHz), and the distance between electrodes was 15 mm. After the deposition of the insulating film 51, planarization was performed by a CMP method. After that, heat treatment was performed at 450° C. for 1 hour in a reduced-pressure atmosphere.

Next, oxygen ions ($^{16}O^+$) were implanted by an ion implantation method. The ion implantation conditions were as follows: acceleration voltage was 60 kV, dosage was $2.0 \times 10^{16}$ ions/cm$^2$, tilt angle was 7°, and twist angle was 72°.

Next, a first semiconductor film to be the semiconductor layer 101a was formed over the insulating film 51. As the first semiconductor film, a 20-nm-thick In—Ga—Zn oxide film was formed by a sputtering method using a polycrystalline In—Ga—Zn oxide target having an atomic ratio of In:Ga:Zn=1:3:4. The detail of the deposition conditions of the first semiconductor film in Sample T1 corresponds to Condition F2 in Table 17. The detail of the deposition conditions of the first semiconductor film in each of Samples T2 and T3 corresponds to Condition F1 in Table 17.

Subsequently, a second semiconductor film to be the semiconductor layer 101b was formed. As the second semiconductor film, a 20-nm-thick In—Ga—Zn oxide film was formed. The first and second semiconductor films were deposited in different chambers, and transfer between the chambers was performed in a vacuum atmosphere without exposure to the air atmosphere. Sample T1 was formed using a polycrystalline In—Ga—Zn oxide target having an atomic ratio of In:Ga:Zn=1:1:1, and the detail of the deposition conditions thereof corresponds to Condition A3 in Table 17. Sample T2 was formed using a polycrystalline In—Ga—Zn oxide target having an atomic ratio of In:Ga:Zn=2:1:3, and the detail of the deposition conditions thereof corresponds to Condition B1 in Table 17. Sample T3 was formed using a polycrystalline In—Ga—Zn oxide target having an atomic ratio of In:Ga:Zn=4:2:4.1, and the detail of the deposition conditions thereof corresponds to Condition E3 in Table 17.

Next, heat treatment was performed at 450° C. for 1 hour in a nitrogen atmosphere and heat treatment was subsequently performed at 450° C. for 1 hour in an oxygen atmosphere in the same treatment chamber.

Next, a 150-nm-thick tungsten film was formed by a sputtering method. The tungsten film was deposited under the conditions where a tungsten target was used, the flow rate of argon was 80 sccm, the pressure was 0.8 Pa, the power supply (DC) was 1 kW, and the distance between the substrate and the target was 60 mm. The substrate temperature was approximately 130° C. In addition, argon at a flow rate of 10 sccm was supplied to the rear surface of the substrate.

Next, a resist mask was formed over the tungsten film, and the tungsten film was partly etched by an ICP etching method, so that the conductive layers 104a and 104b were formed. Specifically, the etching of the tungsten film was performed as follows. First etching was performed under the conditions where the substrate temperature was 40° C., etching gas was a mixed gas of chlorine, carbon tetrafluoride, and oxygen ($Cl_2$=45 sccm, $CF_4$=55 sccm, and $O_2$=55 sccm), the power supply was 3000 W, the bias power was 110 W, the pressure was 0.67 Pa, and the process time was 13 seconds. Then, second etching was performed under the conditions where the substrate temperature was 40° C., the etching gas was chlorine ($Cl_2$=100 sccm), the power supply was 2000 W, the bias power was 0 W, the pressure was 3.00 Pa, and the process time was 15 seconds. Subsequently, third etching was performed under the conditions where the substrate temperature was 40° C., the etching gas was a mixed gas of chlorine, carbon tetrafluoride, and oxygen ($Cl_2$=45 sccm, $CF_4$=55 sccm, and $O_2$=55 sccm), the power supply was 3000 W, the bias power was 110 W, and the pressure was 0.67 Pa.

After that, the shapes of the first and second semiconductor films were processed by etching, whereby the island-shaped first semiconductor layer 101a and the island-shaped semiconductor layer 101b were formed. Note that an ICP etching method was used for the etching. The etching was performed under the conditions where the substrate temperature was 70° C., the etching gas was boron trichloride ($BCl_3$=80 sccm), the power supply was 450 W, the bias power was 100 W, and the pressure was 1.0 Pa.

Next, a third semiconductor film to be the semiconductor layer 101c was formed over the conductive layer 104a and the conductive layer 104b. As the third semiconductor film, a 5-nm-thick In—Ga—Zn oxide film was formed by a sputtering method using a polycrystalline In—Ga—Zn oxide target having an atomic ratio of In:Ga:Zn=1:3:4. The detail of the deposition conditions corresponds to Condition F2 in Table 17.

Next, a 20-nm-thick silicon oxynitride film was formed as the gate insulating film 102 by a PECVD method. The deposition conditions of the gate insulating film 102 were the same as those of the gate insulating film 102 described in Example 2. Subsequently, a conductive film to be the gate electrode 103 was formed. The deposition conditions of the conductive film to be the gate electrode 103 were the same as those of the conductive film to be the gate electrode 103 described in Example 3.

Then, the conductive film to be the gate electrode 103 was processed by etching, so that the gate electrode 103 was formed. The processing of the gate electrode 103 was performed under conditions the same as those of the gate electrode in Example 2.

Next, the shapes of the gate insulating film 102 and the third semiconductor film were processed by etching using a resist mask. The etching was performed under conditions that are the same as the process conditions described in Example 2.

Then, a 140-nm-thick aluminum oxide film was formed as the insulating film 112 to cover the transistor. The aluminum oxide film was formed by a sputtering method. The aluminum oxide film was formed under the conditions that are the same as those for the insulating film 112 in Example 2.

After that, a 150-nm-thick silicon oxynitride film was formed as the insulating film 113. The silicon oxynitride film was formed by a PECVD method. The silicon oxynitride film was deposited under the conditions that are the same as those for the insulating film 113 in Example 2.

Then, openings reaching the conductive layer 104a and the conductive layer 104b were formed by etching. An ICP etching method was used for the etching. Etching conditions were set as follows: the substrate temperature was 70° C., the etching gas was boron trichloride $BCl_3$=80 sccm, the power supply was 450 W, the bias power was 100 W; and the pressure was 1.9 Pa.

Next, in the openings and over the insulating film 113, a conductive film in which a 50-nm-thick titanium film, a 300-nm-thick aluminum film, and a 50-nm-thick titanium film were stacked in this order was formed by a sputtering method. Next, the shape of the conductive film in the openings and over the insulating film 113 was processed by etching to form wirings. An ICP etching method was used for the etching.

Then, a 1.6-μm-thick polyimide film was formed by a coating method, and heat treatment was performed at 300° C. for approximately 1 hour in an air atmosphere.

Through the above process, transistors over Samples T1 to T3 were formed.

[Evaluation of Transistor Characteristics (2)]

Figure 69A:
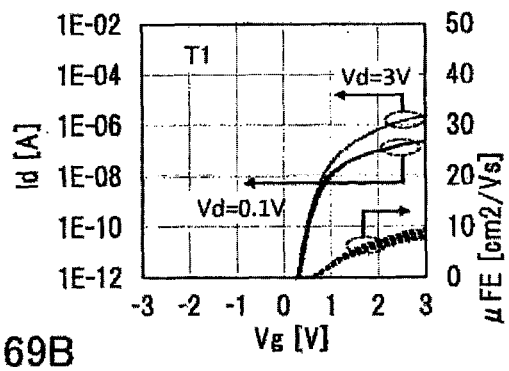
FIGS. 69A to 69C show Vg-Id characteristics of transistors.
Figure 69B:
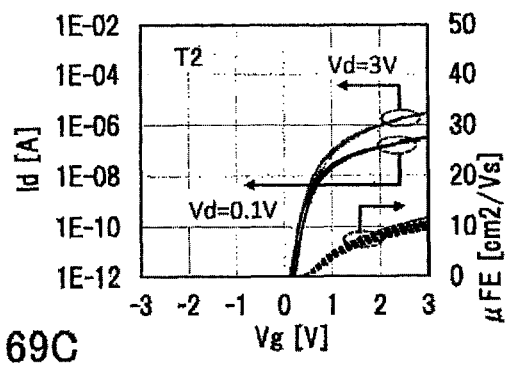
Figure 69C:
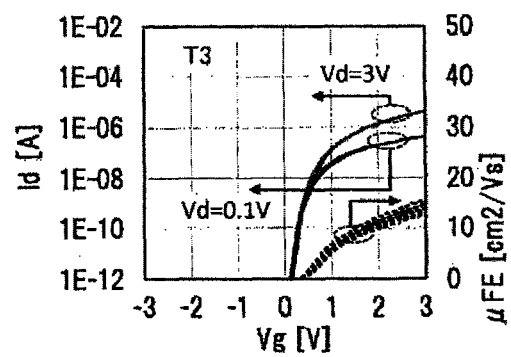

Vg-Id characteristics were measured as initial characteristics of transistors. FIGS. 69A to 69C show transistor characteristics. In each of Samples T1 to T3, out of n-channel transistors that were provided over the plane and each had a channel length L of 0.84 μm and a channel width W of 0.8 μm, 13 transistors were evaluated. FIGS. 69A, 69B, and 69C show Vg-Id characteristics of Sample T1, Sample T2, and Sample T3, respectively. Here, Vg corresponds to voltage between the source and the gate, and Id corresponds to current between the source and the drain. Furthermore, the horizontal axis represents gate voltage Vg, the vertical axis on the left side represents drain voltage Id, and the vertical axis on the right side represents field-effect mobility $\mu_{FE}$. Two conditions where the drain voltage Vd was 0.1 V and 3 V were employed in the measurement. Here, field-effect mobility calculated when Vd=0.1 V is shown.

The results of FIGS. 69A to 69C indicate that favorable transistors were obtained in all the samples. Furthermore, as compared to the transistors of Sample T1, the transistors of Sample T2 had favorable characteristics such as small threshold voltage and high field-effect mobility, and the transistors of Sample T3 had more favorable characteristics such as a smaller S-value and higher field-effect mobility.

Example 6

In this example, evaluation results of characteristics of transistors each having a channel length of approximately 60 nm are described.

[Formation of Transistors (3)]

Figure 64A:
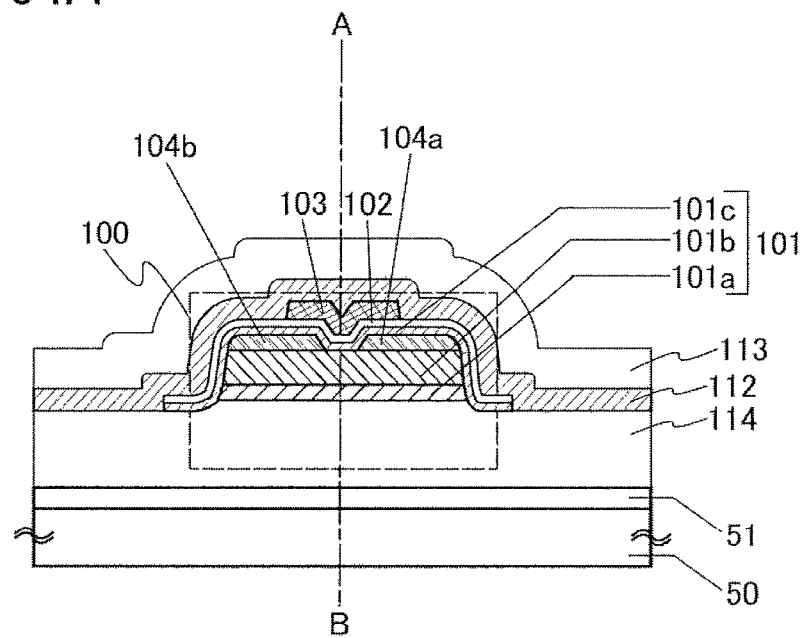
FIGS. 64A and 64B illustrate an example of a transistor of one embodiment of the present invention.
Figure 64B:
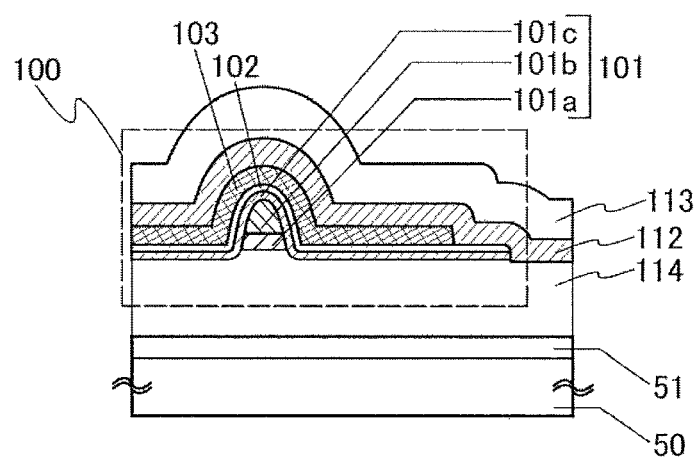

To evaluate transistor characteristics, the transistor illustrated FIGS. 64A and 64B was used. Note that the conductive layer 105 was not provided in the transistor. Samples T4 which was a substrate including the transistor was formed. The semiconductor layers 101a, 101b, and 101c were deposited by a sputtering method. The semiconductor layer 101a, the semiconductor layer 101b, and the semiconductor layer 101c were deposited under Condition F3, Condition E1, and Condition F4, respectively.

First, a silicon wafer was prepared as the substrate 50. After the substrate 50 was cleaned, the insulating film 51 was formed. The insulating film 51 had a stacked-layer structure of a silicon oxide film and a silicon oxynitride film. The formation condition of the insulating film 51 was the same as that for the insulating film 51 in Example 5. After the deposition of the insulating film 51, planarization was performed by a CMP method. After that, heat treatment was performed at 450° C. for 1 hour in a reduced-pressure atmosphere.

Next, oxygen ions ($^{16}O^+$) were implanted by an ion implantation method. The ion implantation conditions were as follows: acceleration voltage was 60 kV; dosage was $2.0 \times 10^{16}$ ions/cm$^2$; tilt angle was 7°; and twist angle was 72°.

Next, a first semiconductor film to be the semiconductor layer 101a was formed over the insulating film 51. As the first semiconductor film, a 20-nm-thick In—Ga—Zn oxide film was formed by a sputtering method using an In—Ga—Zn oxide target having an atomic ratio of In:Ga:Zn=1:3:4. The detail of the deposition conditions corresponds to Condition F3 in Table 17.

Subsequently, a second semiconductor film to be the semiconductor layer 101b was formed. The first and second semiconductor films were deposited in different chambers, and transfer between the chambers was performed in a vacuum atmosphere without exposure to the air atmosphere. As the second semiconductor film, a 15-nm-thick In—Ga—Zn oxide film was formed. As for the deposition conditions of the second semiconductor film, an In—Ga—Zn oxide target having an atomic ratio of In:Ga:Zn=4:2:4.1 was used. The detail of the deposition conditions corresponds to Condition E1 in Table 17.

Next, heat treatment was performed at 450° C. for 1 hour in a nitrogen atmosphere and heat treatment was subsequently performed at 450° C. for 1 hour in an oxygen atmosphere in the same treatment chamber.

Next, a 20-nm-thick tungsten film was deposited as a hard mask over the semiconductor layer 101b. The tungsten film was formed by a sputtering method. The tungsten film was deposited under the conditions where a tungsten target was used, the flow rate of argon was 80 sccm, the pressure was 0.8 Pa, the power supply (DC) was 1 kW, and the distance between the substrate and the target was 60 mm. The substrate temperature was approximately 130° C. In addition, argon at a flow rate of 10 sccm was supplied to the rear surface of the substrate.

Next, a process for applying, as an organic coating film, SWK-T7 (manufactured by TOKYO OHKA KOGYO CO., LTD) to the tungsten film serving as the hard mask is described below. First, heating was performed at 200° C. for 120 seconds to remove moisture. Then, the substrate was set on a hot plate in a chamber. The temperature of the hot plate was 110° C. Next, a nitrogen gas containing 1,1,1,3,3,3-hexamethyldisilazane (HMDS) was introduced into the chamber for 60 seconds, and then treatment was performed. Next, an organic coating film was applied to have a thickness of 20 nm. Then, a solvent and moisture were removed by heating at 200° C. for 200 seconds.

Next, a process for forming a resist over the organic coating film is described. First, heating was performed at 200° C. for 120 seconds to remove moisture. Then, the substrate was set on a hot plate in a chamber. The temperature of the hot plate was 110° C. Next, a nitrogen gas containing 1,1,1,3,3,3-hexamethyldisilazane (HMDS) was introduced into the chamber for 60 seconds, and then treatment was performed. Then, as the resist, a negative resist OEBR-CAN034A2 (manufactured by TOKYO OHKA KOGYO CO., LTD) was deposited to have a thickness of 100 nm. Then, a solvent and moisture were removed by heating at 100° C. for 85 seconds.

Next, a resist mask was formed through light exposure and development. Multiple light exposure was performed by an electron beam exposure apparatus and the amount of light exposure was 80 μC/cm² to 160 μC/cm² (preferably 130 μC/cm² to 155 μC/cm²). After the light exposure, post exposure bake (PEB) was performed at 100° C. for 100 seconds. The development was performed for 60 seconds using NMD-3 (2.38% of tetramethylammonium hydroxide (TMAH) (manufactured by TOKYO OHKA KOGYO CO., LTD) as developer, whereby a resist mask was formed.

Next, the organic coating film and the hard mask were etched using the resist mask as a mask. The etching conditions were set as follows. The substrate temperature was −10° C., CF₄ with a flow rate of 100 sccm was used as the etching gas, the bias power was 50 W, the power of the ICP power source was 2000 W, and the pressure was 0.67 Pa; then, a mixed gas of CF₄ and O₂ at a flow rate ratio of CF₄:O₂=60 sccm:40 sccm was used as the etching gas, the bias power was 25 W, the power of the ICP power source was 1000 W, and the pressure was 2.0 Pa.

Then, the resist mask and the organic coating film were removed by ashing using oxygen plasma. The ashing conditions were as follows: the flow rate of oxygen was 100 sccm, the power supply was 200 W, the pressure was 500 mTorr, and the ashing time was 120 seconds.

Next, the semiconductor layer 101b and the semiconductor layer 101a were etched using the hard mask as a mask. The etching was performed under the conditions where a mixed gas of CH₄ and Ar at a flow rate ratio of CH₄:Ar=16 sccm:32 sccm was used as the etching gas, the bias power was 50 W, the power of ICP power source was 600 W, and the pressure was 3.0 Pa; and then a mixed gas of CH₄ and Ar at a flow rate ratio of CH₄:Ar=16 sccm:32 sccm was used as the etching gas, the bias power was 50 W, the power of ICP power source was 600 W, and the pressure was 1.0 Pa.

Next, the tungsten film serving as the hard mask was processed to form the conductive layer 104a and the conductive layer 104b. First, an organic coating film and a resist film were formed in a manner similar to that described above. Next, light exposure was performed with an electron beam exposure apparatus and development was performed, whereby a resist mask was formed. After that, the organic coating film and the tungsten film were etched using the resist mask. Then, the resist mask and the organic coating film were removed by ashing using oxygen plasma, whereby the conductive layer 104a and the conductive layer 104b were formed.

Next, a third semiconductor film to be the semiconductor layer 101c was formed over the conductive layer 104a and the conductive layer 104b. As the third semiconductor film, a 5-nm-thick In—Ga—Zn oxide film was formed by a sputtering method using a polycrystalline In—Ga—Zn oxide target having an atomic ratio of In:Ga:Zn=1:3:2. The detail of the deposition conditions corresponds to Condition F4 in Table 17.

Next, a 10-nm-thick silicon oxynitride film was deposited as the gate insulating film 102 by a PECVD method. The deposition conditions of the gate insulating film 102 were the same as those of the gate insulating film 102 described in Example 5. Next, as a conductive film to be the gate electrode 103, a 10-nm-thick titanium nitride film and a 30-nm-thick tungsten film were formed in this order. The titanium nitride film was deposited under the conditions where the flow rate of nitrogen was 50 sccm, the pressure was 0.2 Pa, the power supply (DC) was 12 kW, the substrate temperature was room temperature, and the distance between the substrate and the target was 400 mm. The tungsten film was deposited under the conditions where the flow rate of argon was 100 sccm, the pressure was 2.0 Pa, the power supply (DC) was 1.0 kW, the substrate temperature was approximately 130° C., and the distance between the substrate and the target was 60 mm. In addition, argon at a flow rate of 10 sccm was supplied to the rear surface of the substrate.

Next, an organic coating film and a resist film were deposited and a resist mask was formed with an electron beam exposure apparatus, and then the organic coating film and the conductive film to be the gate electrode 103 were processed by etching. After that, the resist mask and the organic coating film were removed by ashing using oxygen plasma to form the gate electrode 103.

Next, a resist mask was formed by photolithography, and the gate insulating film 102 and the semiconductor layer 101c were processed by etching. The etching conditions were as follows. First etching was performed under the conditions where CH₃ at a flow rate of 56 sccm and He at a flow rate of 144 sccm were used as the etching gas, the bias power was 425 W, the power of ICP power source was 25 W, and the pressure was 7.5 Pa. Then, second etching was performed under the conditions where CH₄ at a flow rate of 16 sccm and Ar at a flow rate of 32 sccm were used as the etching gas, the bias power was 50 W, and the power of ICP power source was 600 W. Subsequently, third etching was performed under the conditions where CH₄ at a flow rate of 16 sccm and Ar at a flow rate of 32 sccm were used as the etching gas, the bias power was 50 W, the power of ICP power source was 600 W, and the pressure was 3.0 Pa.

Then, a 40-nm-thick aluminum oxide film was formed as the insulating film 112. The aluminum oxide film was formed by a sputtering method. The aluminum oxide film was formed under the conditions that are the same as those for the insulating film 112 in Example 2.

As the insulating film 113, a 150-nm-thick silicon oxynitride film was formed. The silicon oxynitride film was formed by a PECVD method. The deposition conditions of the silicon oxynitride film were the same as those of the insulating film 113 in Example 2.

Next, a resist mask was formed with an i-line stepper, and the insulating film 112 and the insulating film 113 were processed by etching to form openings reaching the conductive layer 104a and the conductive layer 104b. An ICP etching method was used for the etching.

The etching conditions were as follows. First etching was performed under conditions where the etching gas was a mixed gas of trifluoromethane and helium (CHF₃=50 sccm and He=100 sccm), the power supply was 475 W, the bias power was 300 W, and the pressure was 5.5 Pa. Then, second etching was performed under the conditions where the substrate temperature was 70° C.; the etching gas was a mixed gas of trifluoromethane and helium (CHF₃=7.5 sccm and He=142.5 sccm), the power supply was 475 W, the bias power was 300 W, and the pressure, 5.5 Pa.

Next, in the openings and over the insulating film 113, a conductive film in which a 50-nm-thick titanium film, a 200-nm-thick aluminum film, and a 50-nm-thick titanium film were stacked in this order was formed by a sputtering method. Next, the shape of the conductive film in the openings and over the insulating film 113 was processed by etching to form wirings. An ICP etching method was used for the etching.

Then, a 1.6-μm-thick polyimide film was formed by a coating method, and heat treatment was performed at 300° C. for approximately 1 hour in an air atmosphere.

Through the above process, Sample T4 was formed.

[Evaluation of Transistor Characteristics (3)]

Figure 70:
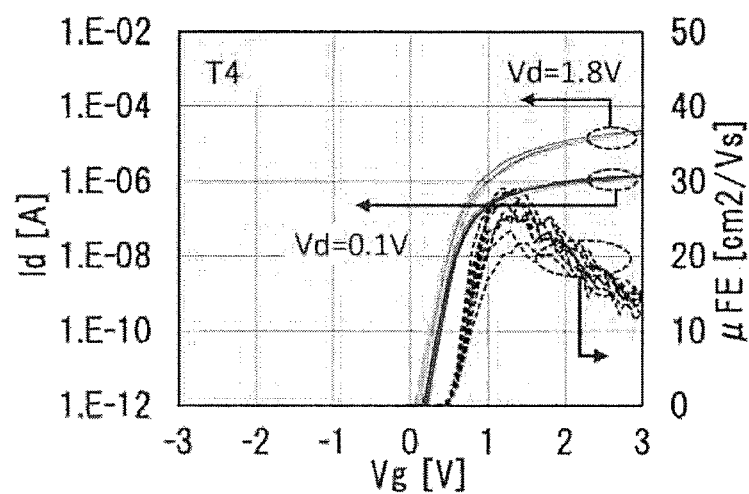
FIG. 70 shows Vg-Id characteristics of a transistor.

FIG. 70 shows measurement results of Vg-Id characteristics of transistors. Out of n-channel transistors each of which had a channel length L of 66 nm and a channel width W of 55 nm, 9 transistors were evaluated. Here, Vg corresponds to voltage between the source and the gate, and Id corresponds to current between the source and the drain. Furthermore, the horizontal axis represents gate voltage Vg, the vertical axis on the left side represents drain voltage Id, and the vertical axis on the right side represents field-effect mobility $\mu_{FE}$. Two conditions where the drain voltage Vd was 0.1 V and 1.8 V were employed in the measurement. Here, field-effect mobility calculated when Vd=0.1 V is shown.

FIG. 70 shows that favorable transistors having a small threshold voltage and high field-effect mobility can be obtained.

Example 7

In this example, the characteristics of a transistor formed under the same conditions as the transistor formed in Example 6 are described.

A transistor having a structure illustrated in FIGS. 64A and 64B was formed. Note that the transistor did not include the conductive layer 105. The transistor was formed through the same process as that described in Example 6.

[Evaluation of Transistor Characteristics (4)]

Figure 72:
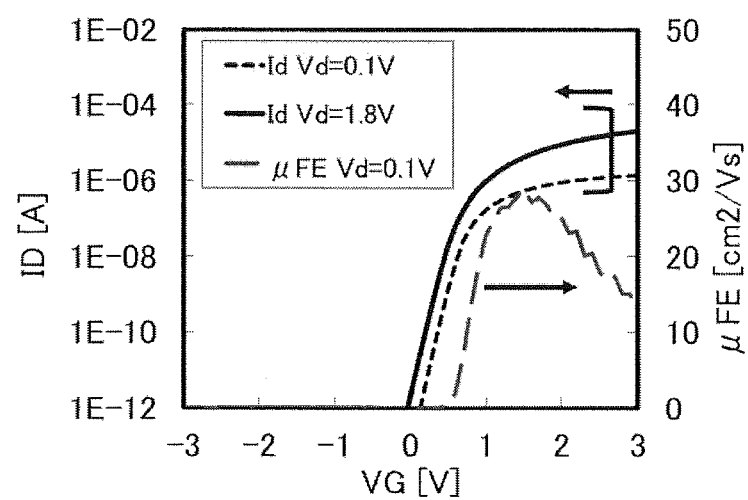
FIG. 72 shows Vg-Id characteristics of a transistor.

The characteristics of the formed transistor were evaluated. First, Vg-Id characteristics were measured as initial characteristics of transistors. FIG. 72 shows Vg-Id characteristics of an n-channel transistor having a channel length L of 72 nm and a channel width W of 53 nm. Here, Vg corresponds to voltage between the source and the gate, and Id corresponds to current between the source and the drain. Furthermore, the horizontal axis represents Vg, the vertical axis on the left side represents Id, and the vertical axis on the right side represents $\mu_{FE}$. The Vg-Id characteristics were measured under two conditions where Vd was 0.1 V and 1.8 V. Here, Vd represents voltage between the source and the drain. Here, field-effect mobility calculated when Vd=0.1 V is shown.

Next, a change in threshold voltage due to stress application in each of Samples T2 and T4 was examined. The threshold voltage was calculated from a Vg-Id curve at Vd=1.8 V.

Verification was performed under the following three stress conditions: a Vg of +1.8 V and a Vd of 0 V were applied; a Vg of −1.8 V and a Vd of 0 V were applied; and a Vg of 0 V and a Vd of +1.8 V were applied. The test temperature was 150° C., and time for stress application was 1 hour.

Figure 73:
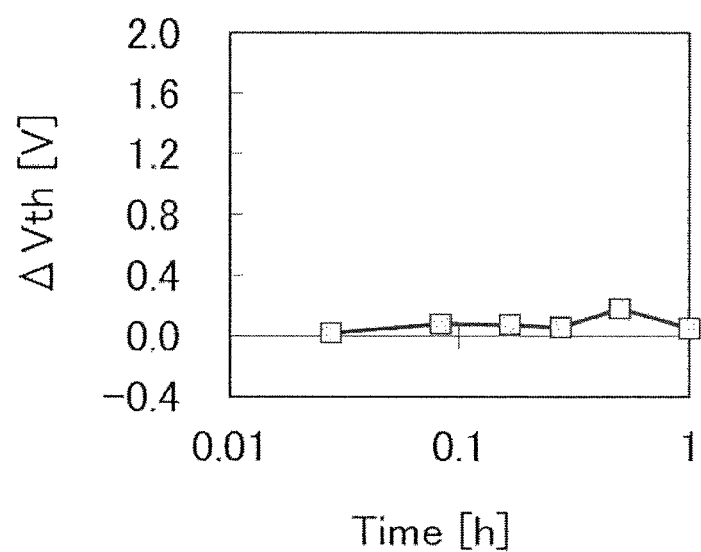
FIG. 73 shows a change in the threshold voltage of a transistor.

The amount of change in the threshold voltage ΔVth when a Vg of +1.8 V and a Vd of 0 V were applied at 150° C. for 1 hour is shown in FIG. 73. The horizontal axis represent time for voltage application, and the vertical axis represents the amount of change in threshold voltage ΔVth. A ΔVth after 1 hour was +0.06 V.

Figure 74:
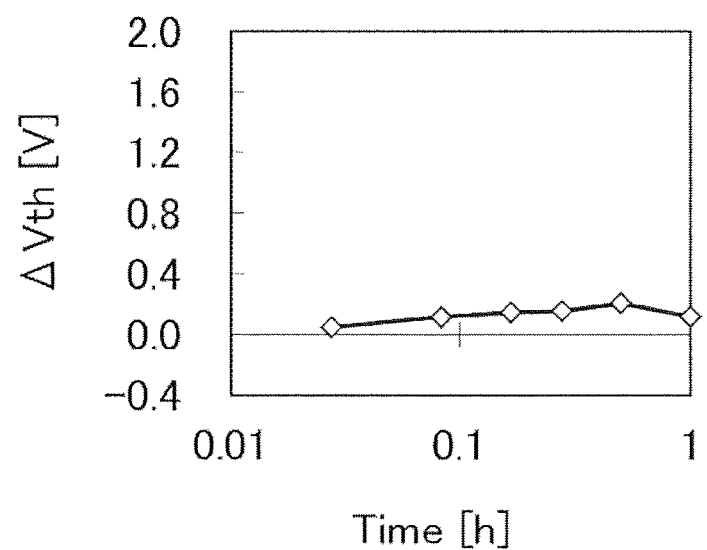
FIG. 74 shows a change in the threshold voltage of a transistor.

The amount of change in the threshold voltage ΔVth when a Vg of −1.8 V and a Vd of 0 V were applied at 150° C. for 1 hour is shown in FIG. 74. A ΔVth after 1 hour was +0.12 V.

Figure 75:
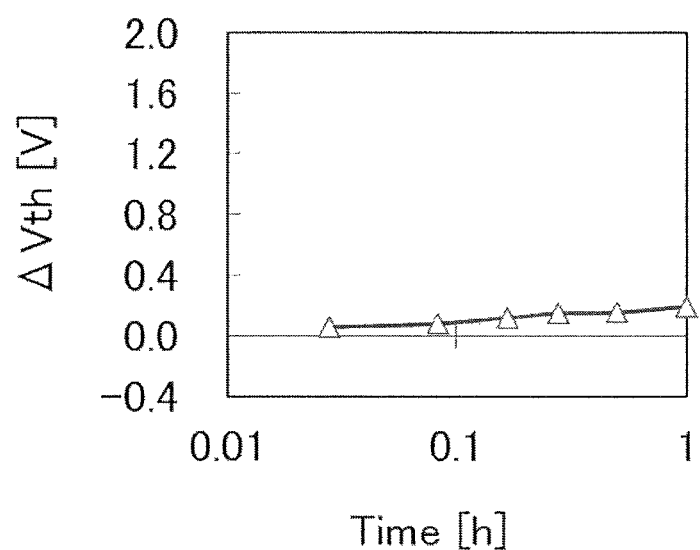
FIG. 75 shows a change in the threshold voltage of a transistor.

The amount of change in the threshold voltage ΔVth when a Vg of 0 V and a Vd of +1.8 V were applied at 150° C. for 1 hour is shown in FIG. 75. A ΔVth after 1 hour was +0.19 V.

FIG. 73 to FIG. 75 indicate that the amount of change in the threshold voltage was small and favorable characteristics were able to be obtained under any of the stress conditions.

Example 8

In this example, a transistor having a channel length L of 26 nm and a channel width W of 31 nm was formed, and transistor characteristics thereof were evaluated.

[Formation of Transistor (4)]

A method for forming Sample T5 including a transistor is described below. The transistor formed in this example has a structure similar to that of FIGS. 64A and 64B, and thus the reference numerals used in FIGS. 64A and 64B are used in the following description. In this example, the semiconductor layer 101a, the semiconductor layer 101b, and the semiconductor layer 101c were formed under Condition F1, Condition E3, and Condition F4, respectively. Detailed conditions are described below. A silicon wafer was prepared as the substrate 50. After the substrate 50 was cleaned, the insulating film 51 was formed. The insulating film 51 had a stacked-layer structure of a silicon oxide film and a silicon oxynitride film. The formation condition of the insulating film 51 was the same as that for the insulating film 51 in Example 5. After the deposition of the insulating film 51, planarization was performed by a CMP method. After that, heat treatment was performed at 450° C. for 1 hour in a reduced-pressure atmosphere.

Next, oxygen ions ($^{16}O^+$) were implanted by an ion implantation method. The ion implantation conditions were as follows: acceleration voltage was 60 kV, dosage was $2.0 \times 10^{16}$ ions/cm$^2$, tilt angle was 7°, and twist angle was 72°.

Next, a first semiconductor film to be the semiconductor layer 101a was formed over the insulating film 51. As the first semiconductor film, a 20-nm-thick In—Ga—Zn oxide film was formed by a sputtering method using an In—Ga—Zn oxide target having an atomic ratio of In:Ga:Zn=1:3:4. The detail of the deposition conditions corresponds to Condition F1 in Table 16.

Subsequently, a second semiconductor film to be the semiconductor layer 101b was formed. The first and second semiconductor films were deposited in different chambers, and transfer between the chambers was performed in a vacuum atmosphere without exposure to the air atmosphere. As the second semiconductor film, a 15-nm-thick In—Ga—Zn oxide film was formed. As for the deposition conditions of the second semiconductor film, an In—Ga—Zn oxide target having an atomic ratio of In:Ga:Zn=4:2:4.1 was used. The detail of the deposition conditions corresponds to Condition E3 in Table 16.

Next, heat treatment was performed at 450° C. for 1 hour in a nitrogen atmosphere and heat treatment was subsequently performed at 450° C. for 1 hour in an oxygen atmosphere in the same treatment chamber.

Next, a hard mask was formed over the semiconductor layer 101b using tungsten. Example 6 is referred to for a method for forming the hard mask.

Next, the semiconductor layer 101b and the semiconductor layer 101a were etched using the hard mask as a mask. Example 6 is referred to for the etching of the semiconductor layer 101b and the semiconductor layer 101a.

Next, the tungsten film serving as a hard mask was processed to form the conductive layer 104a and the conductive layer 104b. Example 6 is referred to for the formation of the conductive layer 104a and the conductive layer 104b.

Next, a third semiconductor film to be the semiconductor layer 101c was formed over the conductive layer 104a and the conductive layer 104b. As the third semiconductor film, a 5-nm-thick In—Ga—Zn oxide film was formed by a sputtering method using a polycrystalline In—Ga—Zn oxide target having an atomic ratio of In:Ga:Zn=1:3:2. The detail of the deposition conditions corresponds to Condition F4 in Table 16.

Next, a 10-nm-thick silicon oxynitride film was deposited as the gate insulating film 102 by a PECVD method. The deposition conditions of the gate insulating film 102 were the same as those of the gate insulating film 102 described in Example 5. Next, a 10-nm-thick titanium nitride film and a 30-nm-thick tungsten film were formed in this order and processed to form the gate electrode 103. For the formation of the gate electrode 103, Example 6 may be referred to.

Next, a 30-nm-thick aluminum oxide film was formed as the insulating film 112. Next, heat treatment was performed at 350° C. for 1 hour in an oxygen atmosphere. Next, a 460-nm-thick silicon oxynitride film was formed as the insulating film 113. After that, CMP treatment was performed.

Then, a tungsten film and a silicon nitride film were formed as a hard mask, and openings reaching the gate electrode 103 and the conductive layers 104a and 104b were provided by dry etching using the hard mask.

Next, a conductive film formed of a stack including a 10-nm-thick titanium nitride film and a 150-nm-thick tungsten film was formed in the openings and over the insulating film 113 by a sputtering method. Next, the conductive film in the openings and over the insulating film 113 was subjected to CMP treatment to form plugs.

Next, a tungsten electrode was provided over the plugs, and then a silicon oxynitride film was formed as an insulating film.

Next, an opening reaching the tungsten electrode and the like was provided in the silicon oxynitride film. A wiring was formed in the opening and over the silicon oxynitride film.

Next, a 1.6-μm-thick polyimide film was provided.

Through the above process, Sample T5 including a transistor of one embodiment of the present invention was formed.

Next, the transistor included in Sample T5 was observed by cross-sectional TEM. To thin the sample for observation, a focused ion beam system (FIB) was used.

Figure 77A:
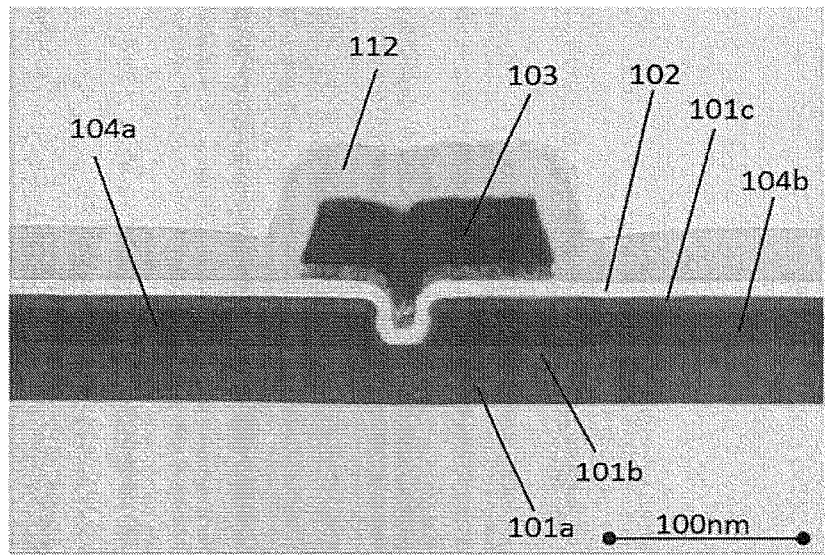
FIGS. 77A and 77B are cross-sectional photographs showing transistors of one embodiment of the present invention.
Figure 77B:
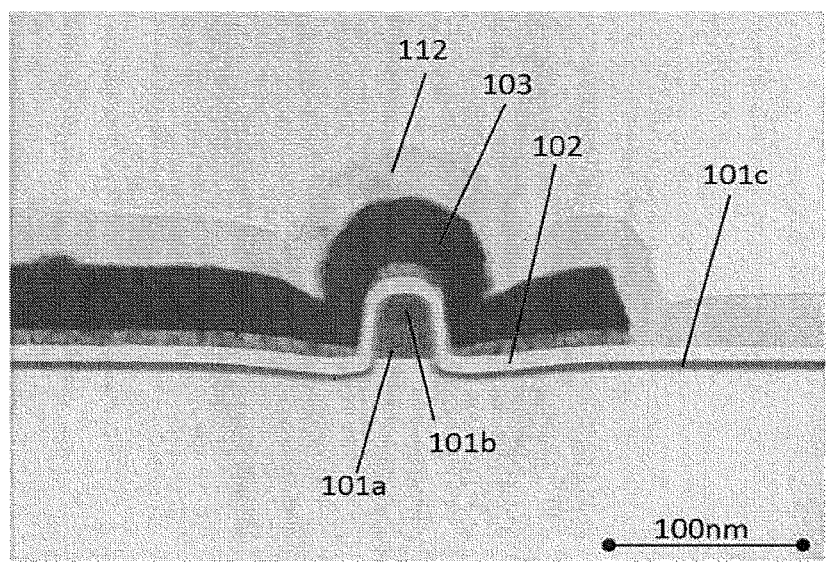

FIGS. 77A and 77B are cross-sectional views in the channel length direction and in the channel width direction, respectively. A minute transistor having a channel length of less than or equal to 30 nm and favorable electrical characteristics was able to be formed.

[Evaluation of Transistor (5)]

Next, the characteristics of the obtained transistor were evaluated. The channel length L of the transistor was 26 nm and the channel width W was 31 nm.

Figure 78:
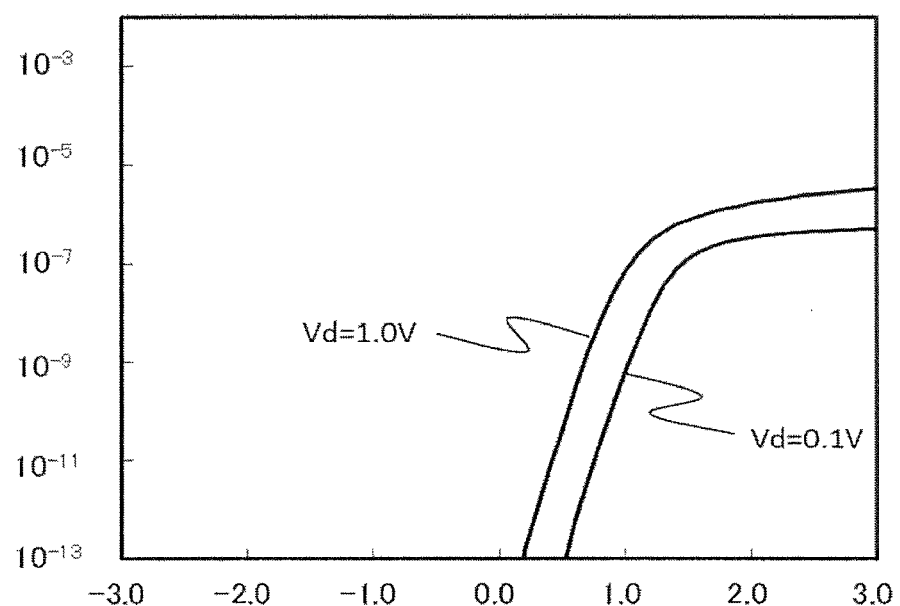
FIG. 78 shows Vg-Id characteristics of a transistor.
Figure 79:
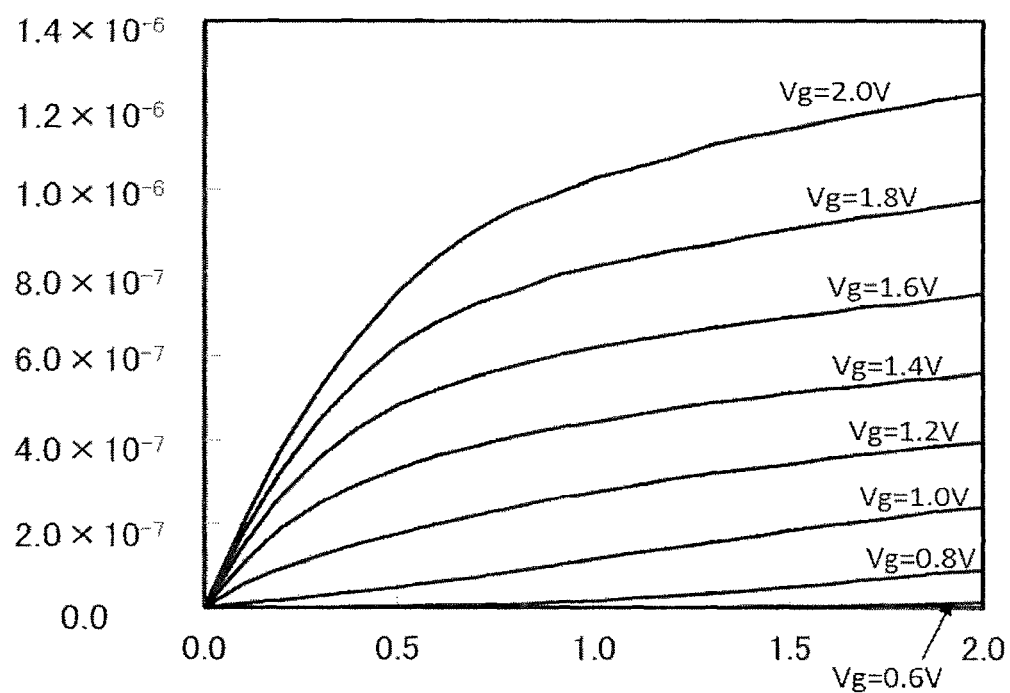
FIG. 79 shows Vd-Id characteristics of a transistor.

FIG. 78 shows Id-Vg characteristics of the transistor. Measurement was performed under two conditions where Vd was 0.1 V and 1 V. FIG. 79 shows Id-Vd characteristics of the transistor. Measurements were successively performed under 11 conditions where Vg was changed from 0 V to 2 V for every 0.2 V, using the same transistor. Here, results under conditions where Vg is 0 V, 0.2 V, and 0.4 V are not shown in FIG. 79. Favorable transistor characteristics were able to be obtained in the minute transistor having a channel length of less than or equal to 30 nm.

Example 9

In this example, evaluation results of an In—Ga—Zn oxide film that is one embodiment of the present invention are described.

[Formation of Sample]

A silicon wafer was used as a substrate. The silicon wafer was thermally oxidized, whereby a 100-nm-thick silicon oxide film was formed. Next, a 40-nm-thick In—Ga—Zn oxide film was deposited over the silicon oxide film. The In—Ga—Zn oxide film was deposited by a sputtering method using a polycrystalline In—Ga—Zn oxide target. Main items of the deposition conditions are listed in Table 22. Here, the atomic ratio of indium to gallium and zinc of the In—Ga—Zn oxide target is shown in Table 22.

TABLE 22

| | Apparatus | Power [kW] | Gas flow rate Ar [sccm] | Gas flow rate $O_2$ [sccm] | Substrate temperature | Pressure [Pa] | Target | Target-substrate distance |
|---|---|---|---|---|---|---|---|---|
| Condition F1 | Apparatus A | 0.5 (DC) | 40 | 5 | 200° C. | 0.7 | In:Ga:Zn = 1:3:4 | 60 mm |
| Condition G1 | Apparatus D | 0.2 (DC) | 20 | 10 | 300° C. | 0.4 | In:Ga:Zn = 1:2:4 | 130 mm |

Next, oxygen ions ($^{16}O^+$) were implanted by an ion implantation method. The implantation conditions were as follows: the accelerating voltage was 60 kV, and three conditions of dosage, $1.0\times10^{16}$ ions/cm$^2$, $1.5\times10^{16}$ ions/cm$^2$, and $2.0\times10^{16}$ ions/cm$^2$, were employed. The tilt angle was 70, and the twist angle was 72°. Through the above process, the sample was formed.

[XRD Evaluation]

Next, the obtained samples were evaluated by XRD. For the XRD evaluation, a multifunction thin film material evaluation X-ray diffractometer, D8 DISCOVER hybrid, manufactured by Bruker AXS. was used. FIGS. 80A to 80C and FIGS. 81A to 81D show the results of XRD evaluation.

Figure 80A:
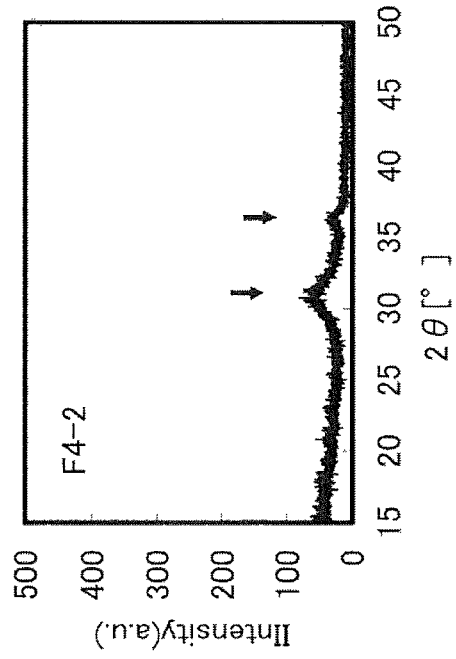
FIGS. 80A to 80C show XRD evaluation results of oxides of one embodiment of the present invention.
Figure 80B:
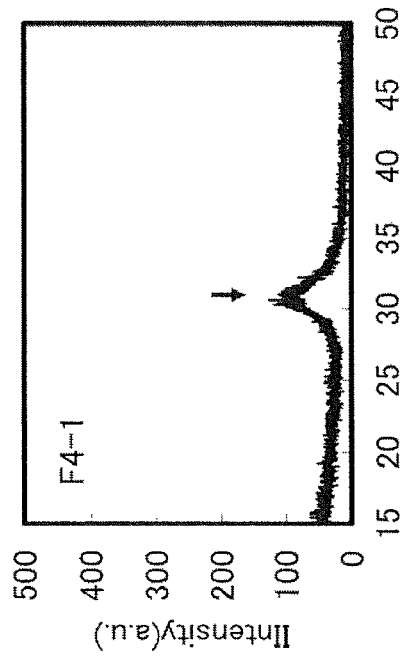
Figure 80C:
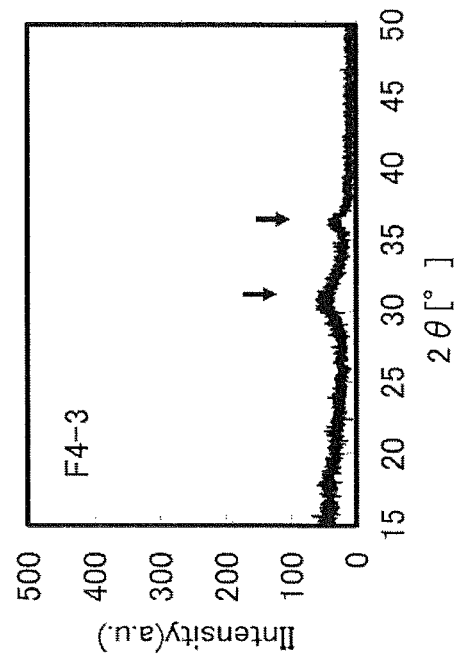

FIGS. 80A to 80C show evaluation results of samples with an In—Ga—Zn oxide film deposited under Condition F1 in Table 22. In Condition F1, an In—Ga—Zn oxide target having an atomic ratio of In:Ga:Zn=1:3:4 was used. FIG. 80A shows evaluation results of a sample which was not subjected to oxygen ion implantation, and FIGS. 80B and 80C show evaluation results of samples subjected to oxygen ion implantation at dosages of $1.0\times10^{16}$ ions/cm$^2$ and $2.0\times10^{16}$ ions/cm$^2$, respectively. By oxygen ion implantation, the intensity of a peak at around 2θ=31° indicated by an arrow was reduced. This peak indicates c-axis alignment. Furthermore, as the dosage of ion implantation was increased, the intensity was reduced. Furthermore, by oxygen ion implantation, a peak at around 2θ=36° indicated by an arrow appeared. This peak indicates a crystal having no c-axis alignment, typically, a spinel crystal structure. Here, of the samples with the In—Ga—Zn oxide films formed under Condition F1, the sample not subjected to oxygen ion implantation is referred to as Sample F4-1, and the samples subjected to oxygen ion implantation at dosages of $1.0 \times 10^{16}$ ions/cm$^2$ and $2.0 \times 10^{16}$ ions/cm$^2$ are referred to as Sample F4-2 and Sample F4-3, respectively.

Figure 81A:
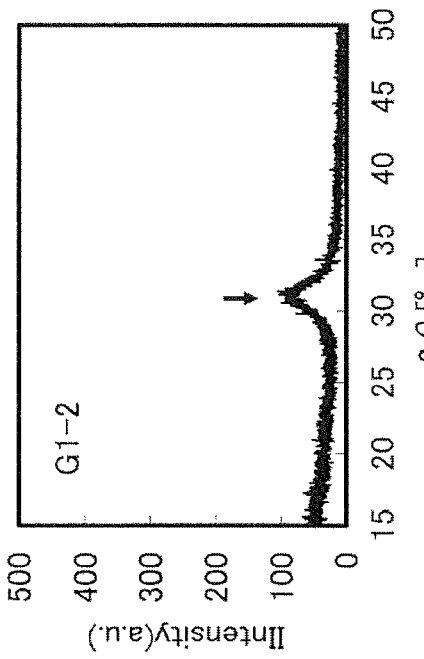
FIGS. 81A to 81D show XRD evaluation results of oxides of one embodiment of the present invention.
Figure 81C:
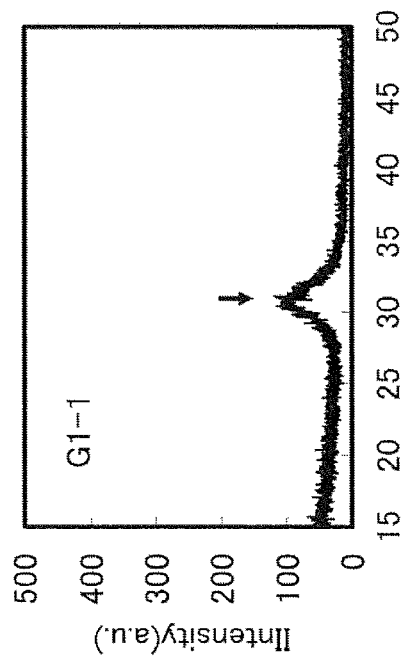
Figure 81B:
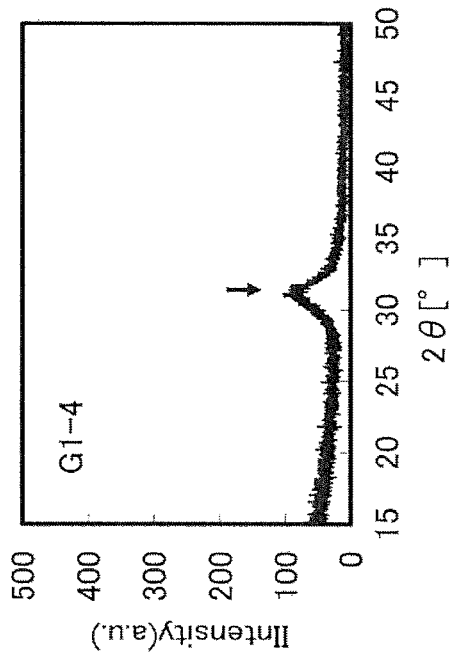
Figure 81D:
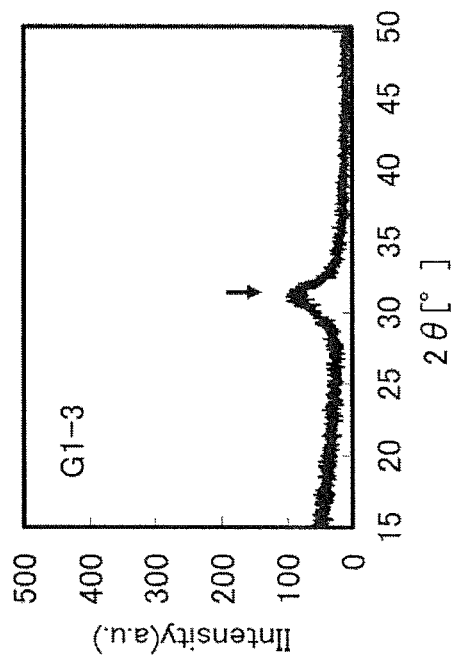

FIGS. 81A to 81D show evaluation results of samples with an In—Ga—Zn oxide film deposited under Condition G1 in Table 22. In Condition G1, an In—Ga—Zn oxide target having an atomic ratio of In:Ga:Zn=1:2:4 was used. FIG. 81A shows evaluation results of a sample which was not subjected to oxygen ion implantation, and FIGS. 81B, 81C, and 81D show evaluation results of samples subjected to oxygen ion implantation at dosages of $1.0 \times 10^{16}$ ions/cm$^2$, $1.5 \times 10^{16}$ ions/cm$^2$, and $2.0 \times 10^{16}$ ions/cm$^2$, respectively. In Condition G1, a peak at around 2θ=36° was not observed even when oxygen ion implantation was performed, and no noticeable change in the intensity of the peak at around 2θ=31° occurred. Here, of the samples with the In—Ga—Zn oxide films formed under Condition G1, the sample not subjected to oxygen ion implantation is referred to as Sample G1-1, and the samples subjected to oxygen ion implantation at dosages of $1.0 \times 10^{16}$ ions/cm$^2$, $1.5 \times 10^{16}$ ions/cm$^2$, and $2.0 \times 10^{16}$ ions/cm$^2$ are referred to as Sample G1-2, Sample G1-3, and Sample G1-4, respectively.

[Plan-View TEM Observation]

Next, the obtained samples were observed by plan-view TEM. The TEM images were obtained with H-9000NAR manufactured by Hitachi High-Technologies Corporation. Note that the accelerating voltage was 300 kV. The samples were thinned by ion milling.

Figure 82A:
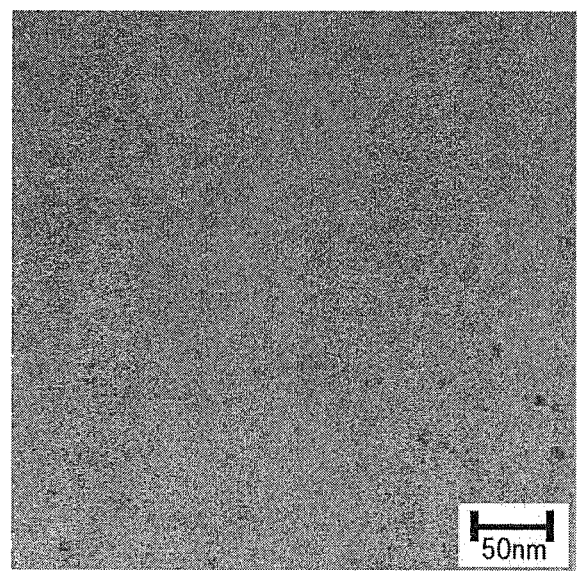
FIGS. 82A and 82B shows observations of oxides by plan-view TEM.
Figure 82B:
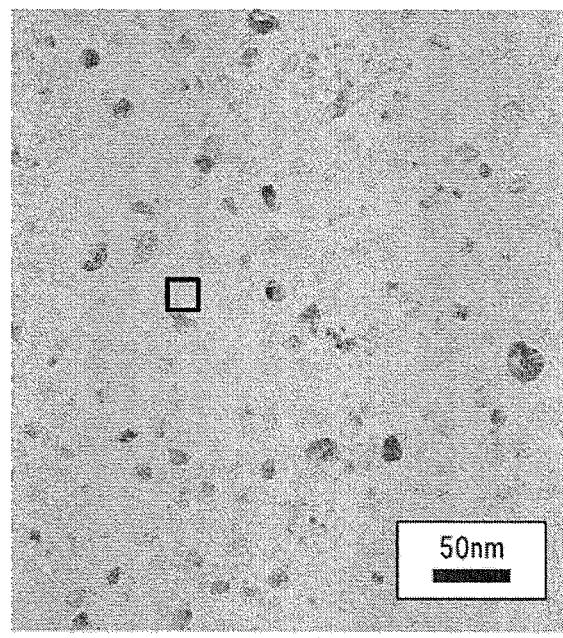
Figure 83A:
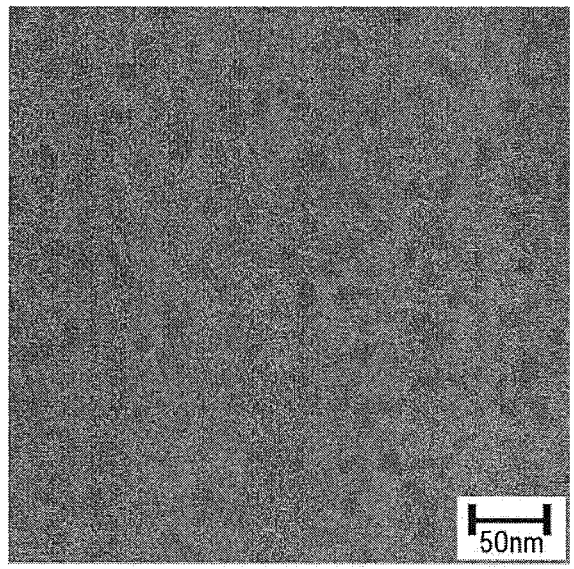
FIGS. 83A and 83B shows observations of oxides by plan-view TEM.
Figure 83B:
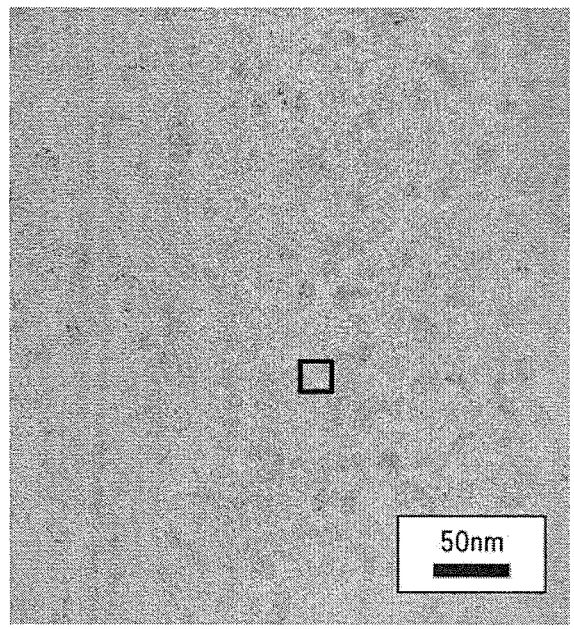
Figure 84A:
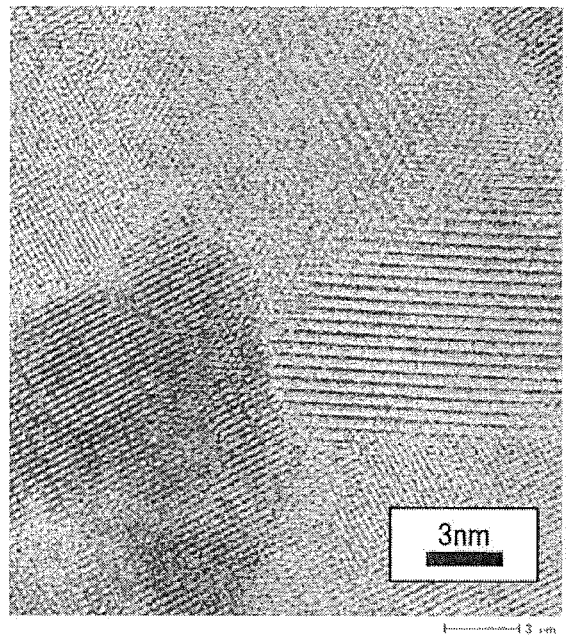
FIGS. 84A and 84B shows observations of oxides by plan-view TEM.
Figure 84B:
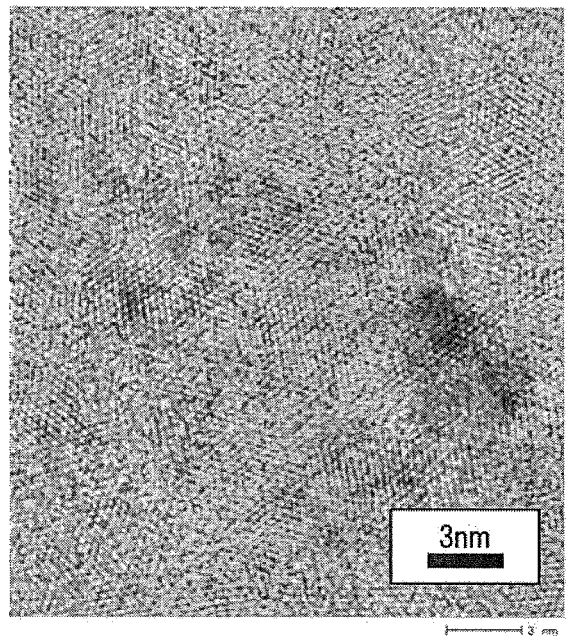

FIGS. 82A and 82B show observations of Sample F4-1 and Sample F4-2, respectively. FIGS. 83A and 83B show observations of Sample G1-1 and Sample G1-2, respectively. FIG. 84A shows an enlarged image of a region in a square in FIG. 82B, and FIG. 84B shows an enlarged image of a region in a square in FIG. 83B.

When the observations of Sample F4-1 and Sample F4-2, which were formed using an In—Ga—Zn oxide target having an atomic ratio of In:Ga:Zn=1:3:4, were compared with each other, regions with distinctly different contrasts were observed in Sample F4-2, which was subjected to oxygen ion implantation. As shown in FIG. 84A, a lattice image and a grain boundary were observed in the regions with different contrasts.

Regions with distinctly different contrasts, like those observed in Sample F4-2, were not observed in Sample G1-1 and Sample G1-2, which were formed using an In—Ga—Zn oxide target having an atomic ratio of In:Ga:Zn=1:2:4.

The XRD evaluations and TEM observations suggest that an In—Ga—Zn oxide film deposited using a target having an atomic ratio of In:Ga:Zn=1:2:4 probably has an atomic ratio in the neighborhood of an atomic ratio represented by Formula 3 in Embodiment 2, which indicates that the In—Ga—Zn oxide film has a high CAAC proportion.

Example 10

In this example, evaluation results of a transistor formed using an In—Ga—Zn oxide film of one embodiment of the present invention are described. To evaluate transistor characteristics, a transistor which has the cross-sectional structure illustrated in FIGS. 66A and 66B was used.

[Formation of Transistor]

As samples including transistors, Samples T11 to T14 were prepared. First, deposition conditions of an In—Ga—Zn oxide film are described. In—Ga—Zn oxide films were deposited as the semiconductor layers 101a to 101c in FIGS. 66A and 66B by a sputtering method. Polycrystalline In—Ga—Zn oxide targets were used. The deposition conditions are listed in Table 23. Here, the atomic ratios of indium to gallium and zinc of the In—Ga—Zn oxide targets are shown in Table 23. Note that only the atomic ratios of the targets of the deposition conditions are shown in Table 23, and the other conditions are shown in Table 24 in detail.

TABLE 23

| | | Condition | | |
|---|---|---|---|---|
| | | | Thickness [nm] | Target |
| Sample T11 | Semiconductor layer 101a | Condition F1 | 40 | In:Ga:Zn = 1:3:4 |
| | Semiconductor layer 101b | Condition A1 | 20 | In:Ga:Zn = 1:1:1 |
| | Semiconductor layer 101c | Condition F4 | 5 | In:Ga:Zn = 1:3:2 |
| Sample T12 | Semiconductor layer 101a | Condition G2 | 40 | In:Ga:Zn = 1:2:4 |
| | Semiconductor layer 101b | Condition A1 | 20 | In:Ga:Zn = 1:1:1 |
| | Semiconductor layer 101c | Condition F4 | 5 | In:Ga:Zn = 1:3:2 |
| Sample T13 | Semiconductor layer 101a | Condition F1 | 40 | In:Ga:Zn = 1:3:4 |
| | Semiconductor layer 101b | Condition E3 | 20 | In:Ga:Zn = 4:2:4.1 |
| | Semiconductor layer 101c | Condition F4 | 5 | In:Ga:Zn = 1:3:2 |
| Sample T14 | Semiconductor layer 101a | Condition G2 | 40 | In:Ga:Zn = 1:2:4 |
| | Semiconductor layer 101b | Condition E3 | 20 | In:Ga:Zn = 4:2:4.1 |
| | Semiconductor layer 101c | Condition F4 | 5 | In:Ga:Zn = 1:3:2 |

TABLE 24

| | Apparatus | Power [kW] | Gas flow rate Ar [sccm] | O$_2$ [sccm] | Substrate temperature | Pressure [Pa] | Target | Taget-substrate distance |
|---|---|---|---|---|---|---|---|---|
| Condition F1 | Apparatus A | 0.5 (DC) | 40 | 5 | 200° C. | 0.7 | In:Ga:Zn = 1:3:4 | 60 mm |
| Condition G2 | Apparatus D | 0.2 (DC) | 20 | 10 | 200° C. | 0.4 | In:Ga:Zn = 1:2:4 | 130 mm |
| Condition A1 | Apparatus A | 0.5 (DC) | 30 | 15 | 300° C. | 0.7 | In:Ga:Zn = 1:1:1 | 60 mm |
| Condition E3 | Apparatus A | 0.5 (DC) | 30 | 15 | 200° C. | 0.7 | In:Ga:Zn = 4:2:4.1 | 60 mm |
| Condition F4 | Apparatus B | 0.5 (DC) | 30 | 15 | 200° C. | 0.4 | In:Ga:Zn = 1:3:2 | 60 mm |

Next, a method for forming Samples T11 to T14 including transistors is described.

As the substrate 50, a p-type CZ crystal silicon wafer with a plane orientation (100) was prepared. After the substrate was cleaned, the insulating film 51 was formed. The insulating film 51 was formed of a stack including a first silicon oxide film, a silicon nitride oxide film, a second silicon oxide film, a third silicon oxide film, and an aluminum oxide film. The first silicon oxide film was formed by thermal oxidation at 950° C. to have a thickness of 400 nm. After that, the silicon nitride oxide film having a thickness of 280 nm was deposited with a PECVD apparatus. The deposition conditions were as follows: the substrate temperature was 325° C.; the flow rates of silane, nitrous oxide, ammonia, and hydrogen were 40 sccm, 30 sccm, 300 sccm, and 900 sccm, respectively; the pressure was 160 Pa; the deposition power (RF) was 250 W (27 MHz); and the distance between electrodes was 20 mm. After that, the second silicon oxide film with a thickness of 300 nm was deposited with a PECVD apparatus. The deposition conditions were as follows: the substrate temperature was 300° C.; the gas flow rates of tetraethyl ortho silicate (TEOS) and oxygen were 15 sccm and 750 sccm, respectively; the pressure was 100 Pa; the deposition power (RF) was 300 W (27 MHz); and the distance between electrodes was 14 mm. After formation of the insulating film 51, planarization treatment was performed by a CMP method. After deposition, heat treatment was performed at 590° C. for 10 hours in a nitrogen atmosphere.

Next, the third silicon oxide film with a thickness of 300 nm was deposited with a PECVD apparatus. The deposition conditions were the same as those of the second silicon oxide film. After the deposition, heat treatment was performed at 590° C. for 10 hours in a nitrogen atmosphere.

Next, a 50-nm-thick aluminum oxide film was formed by a sputtering method. Through the above steps, the insulating film 51 was formed.

Next, as a conductive film to be the conductive layer 105, a 50-nm-thick first tungsten film was deposited by a sputtering method. Next, the first tungsten film was processed by etching using a resist mask to form the conductive layer 105.

Next, a 70-nm-thick oxynitride film was deposited as the insulating film 114 by a PECVD method. The oxynitride film was formed under the conditions where the substrate temperature was 500° C., the gas flow rates of silane and nitrous oxide were 1 sccm and 800 sccm, respectively, the pressure was 40 Pa, the deposition power (RF) was 150 W (60 MHz), and the distance between electrodes was 28 mm.

Next, a 40-nm-thick first semiconductor film to be the semiconductor layer 101a was deposited over the insulating film 114. The first semiconductor film to be the semiconductor layer 101a was deposited by a sputtering method under the conditions shown in Table 6 and Table 7. Here, Samples T11 and T13 were each formed using an In—Ga—Zn oxide target having an atomic ratio of In:Ga:Zn=1:3:4, and Samples T12 and T14 were each formed using an In—Ga—Zn oxide target having an atomic ratio of In:Ga:Zn=1:2:4.

Next, oxygen ions ($^{16}$O$^+$) were implanted by an ion implantation method. The implantation conditions were as follows: the accelerating voltage was 5 kV, the dosage was 1.0×10$^{16}$ ions/cm$^2$, the tilt angle was 7°, and the twist angle was 72°.

Next, a 20-nm-thick second semiconductor film to be the semiconductor layer 101b was deposited. The second semiconductor film to be the semiconductor layer 101b was deposited by a sputtering method under the conditions shown in Table 6 and Table 7. Here, Samples T11 and T12 were each formed using an In—Ga—Zn oxide target having an atomic ratio of In:Ga:Zn=1:1:1, and Samples T13 and T14 were each formed using an In—Ga—Zn oxide target having an atomic ratio of In:Ga:Zn=4:2:4.1.

Next, heat treatment was performed at 450° C. for 1 hour in a nitrogen atmosphere and heat treatment was subsequently performed at 450° C. for 1 hour in an oxygen atmosphere in the same treatment chamber.

Next a 20-nm-thick second tungsten film was deposited by a sputtering method. The second tungsten film was deposited under the conditions where a tungsten target was used, the flow rate of argon was 80 sccm, the pressure was 0.8 Pa, the power supply (DC) was 1 kW, and the distance between the substrate and the target was 60 mm. The substrate temperature was approximately 130° C. In addition, argon at a flow rate of 10 sccm was supplied to the rear surface of the substrate. Next, although not illustrated in FIGS. 66A and 66B, an opening reaching the conductive layer 105 was formed. Specifically, an opening was formed in the second tungsten film, the first semiconductor film, and the second semiconductor film, and then an opening was formed in the insulating film 114 using the second tungsten film as a mask.

Next, a 150-nm-thick third tungsten film was deposited by a sputtering method.

Next, the third tungsten film was etched using a resist mask to form the conductive layer 104a and the conductive layer 104b.

After that, a resist mask was formed and the first and second semiconductor films were processed by etching, whereby the island-shaped first semiconductor layer 101a and the island-shaped second semiconductor layer 101b were formed. Note that an ICP etching method was used for the etching. The etching was performed under the conditions where the substrate temperature was 70° C., a BCl$_3$ gas at a flow rate of 80 sccm was used, the power supply was 450 W, the bias power was 100 W, and the pressure was 1.2 Pa.

Next, a 5-nm-thick third semiconductor film to be the semiconductor layer 101c was deposited. The third semiconductor film to be the semiconductor layer 101c was deposited by a sputtering method under the conditions shown in Table 6 and Table 7. Here, an In—Ga—Zn oxide target having an atomic ratio of In:Ga:Zn=1:3:2 was used.

Next, a 20-nm-thick silicon oxynitride film was deposited as the gate insulating film 102 by a PECVD method. The silicon oxynitride film was formed under the conditions where the substrate temperature was 350° C., the gas flow rates of silane and nitrous oxide were 1 sccm and 800 sccm, respectively, the pressure was 200 Pa, the deposition power (RF) was 150 W (60 MHz), and the distance between electrodes was 28 mm.

Next, as a conductive film to be the gate electrode 103, a 30-nm-thick tantalum nitride film was formed and then a 135-nm-thick fourth tungsten film was formed. The tantalum nitride film and the tungsten film were formed by a sputtering method. Then, the conductive film to be the gate electrode 103 was processed by etching, whereby the gate electrode 103 was formed.

Next, the shapes of the gate insulating film 102 and the third semiconductor film were processed by etching using a resist mask to form the gate insulating film 102 with a processed shape and the semiconductor layer 101c.

Then, a 140-nm-thick aluminum oxide film was formed as the insulating film 112 to cover the transistor. The aluminum oxide film was formed by a sputtering method.

After that, a 300-nm-thick silicon oxynitride film was formed as the insulating film 113. The silicon oxynitride film was formed by a PECVD method.

Then, openings reaching the conductive layer 104a and the conductive layer 104b were formed by etching. An ICP etching method was used for the etching.

Next, in the openings and over the insulating film 113, a conductive film in which a 50-nm-thick titanium film, a 300-nm-thick aluminum film, and a 5-nm-thick titanium film were stacked in this order was formed by a sputtering method. Next, the shapes of the conductive film in the openings and over the insulating film 113 was processed by etching to form wirings. Then, a 1.6-μm-thick polyimide film was formed by a coating method, and heat treatment was performed at 300° C. for approximately 1 hour in an air atmosphere.

Through the above process, Samples T11 to T14 were formed.

[Evaluation of Transistor Characteristics]

Figure 85A:
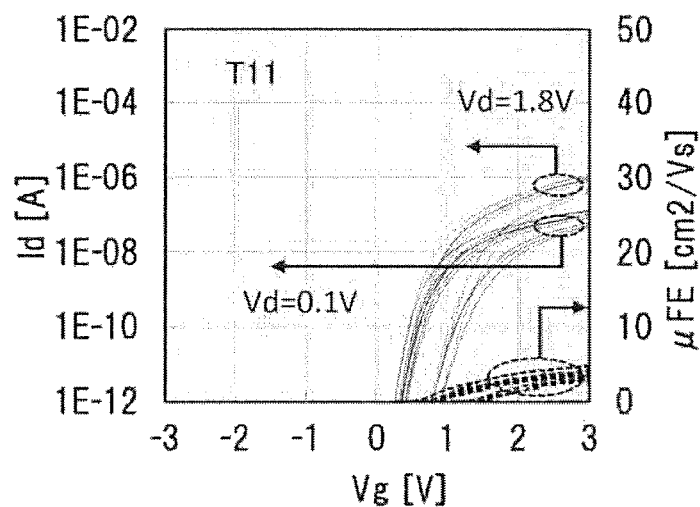
FIGS. 85A and 85B show Vg-Id characteristics of transistors.
Figure 85B:
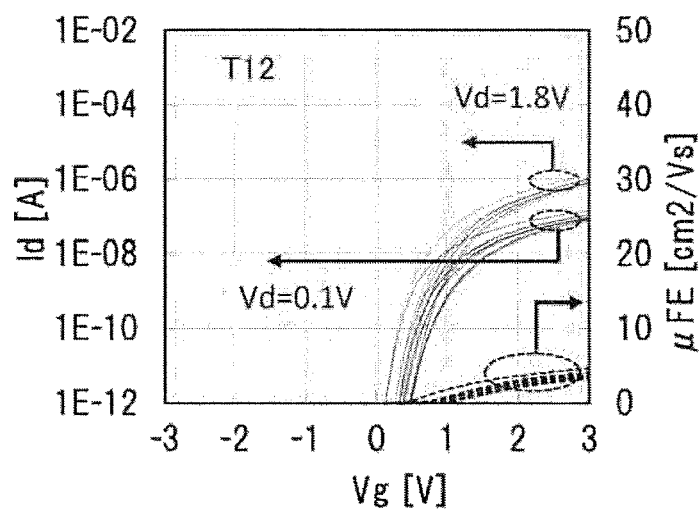
Figure 86A:
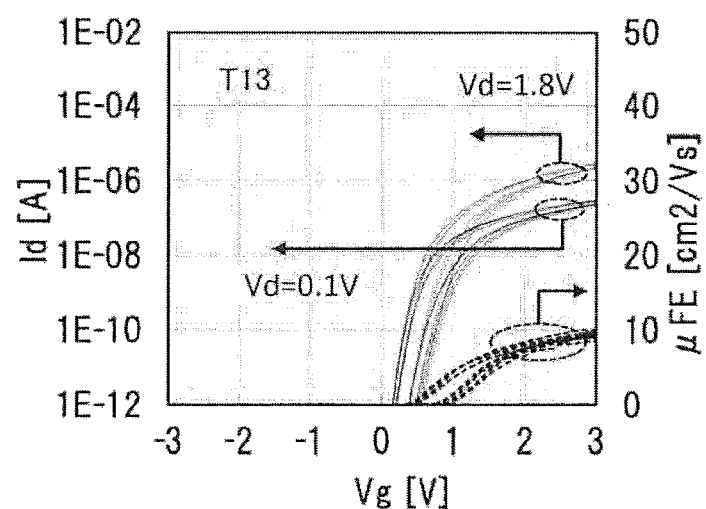
FIGS. 86A and 86B show Vg-Id characteristics of transistors.
Figure 86B:
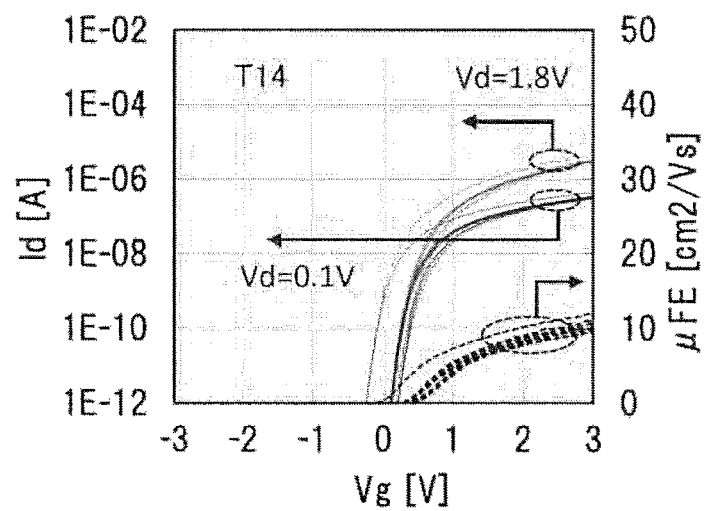

The characteristics of the transistors included in Samples T11 to T14 were evaluated. Vg-Id characteristics were measured as initial characteristics of transistors. Out of n-channel transistors that had a channel length L of 0.83 μm and a channel width W of 0.8 μm, 25 transistors were evaluated. FIGS. 85A and 85B show Vg-Id characteristics of Sample T11 and Sample T12, respectively. FIGS. 86A and 86B show Vg-Id characteristics of Sample T13 and Sample T14, respectively. Here, Vg corresponds to voltage between the source and the gate, and Id corresponds to current between the source and the drain. Furthermore, the horizontal axis represents gate voltage Vg, and the vertical axis on the left side represents drain voltage Vd, and the vertical axis on the right side represents field-effect mobility $\mu_{FE}$. Two conditions where the drain voltage Vd was 0.1 V and 1.8 V were employed. Here, a voltage of 0 V was applied between the source and the conductive layer 105 functioning as a second gate electrode. The field-effect mobility calculated when Vd=0.1 V is shown.

In addition, an S-value calculated from the Vg-Id characteristics of the n-channel transistors each having a channel length L of 0.83 μm and a channel width W of 0.8 μm was 126.9 mV/dec in Sample T11, 122.3 mV/dec in Sample T12, 103.0 mV/dec in Sample T13, and 90.5 mV/dec in Sample T14.

Next, a change in Vg-Id characteristics of the transistor before and after stress application was evaluated in each of Samples T12 and T14. With regard to stress conditions, three conditions of voltage application, i.e., two conditions where the gate voltage Vg was +3.3 V and −3.3 V and a condition where the drain voltage was +1.8 V, were employed; the temperature was 150° C.; and the time for stress application was one hour. In any of the stress application conditions, a voltage of 0 V was applied to the conductive layer 105.

Figure 87A:
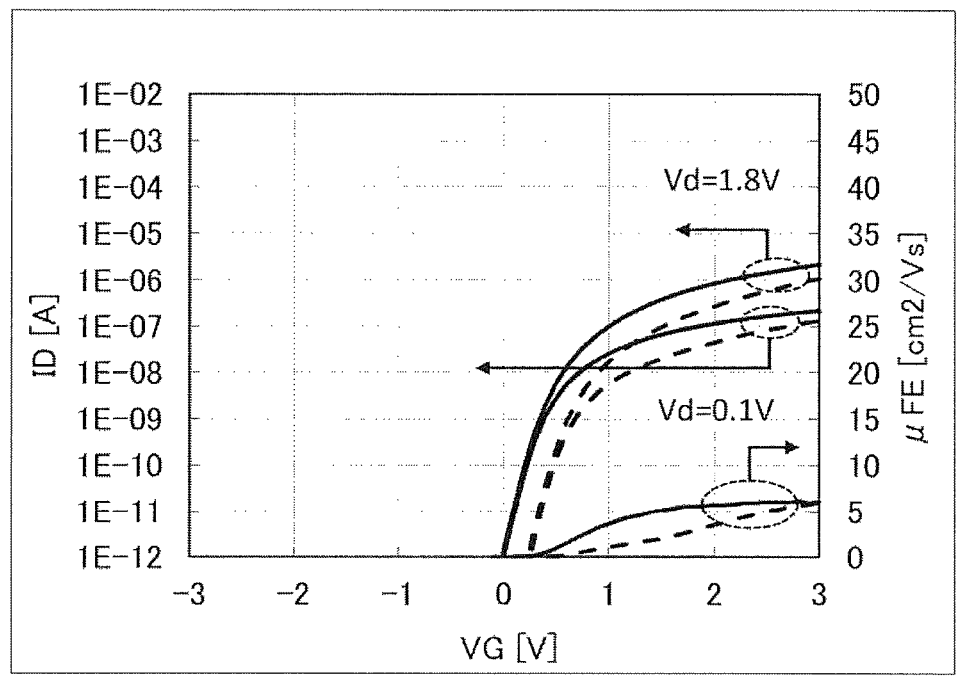
FIGS. 87A and 87B show Vg-Id characteristics of transistors.
Figure 87B:
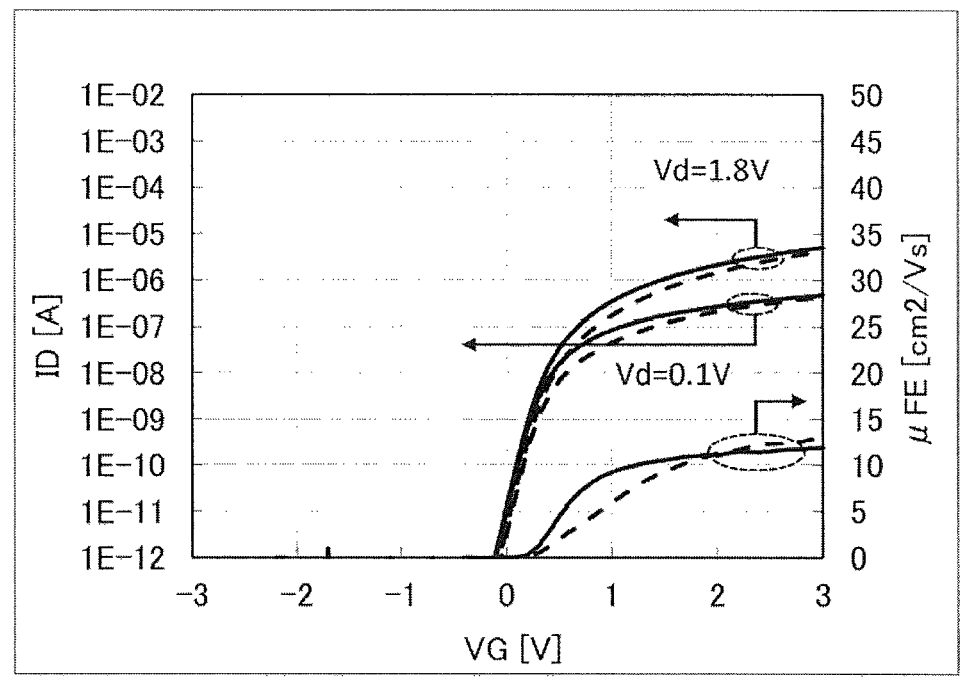

FIGS. 87A and 87B each show change in Vg-Id characteristics after a Vg of +3.3 V was applied for 1 hour at 150° C. A solid line represents a result before stress application, and a dashed line represents a result after stress application. FIGS. 87A and 87B correspond to the results of Sample T12 and Sample T14, respectively.

Figure 88A:
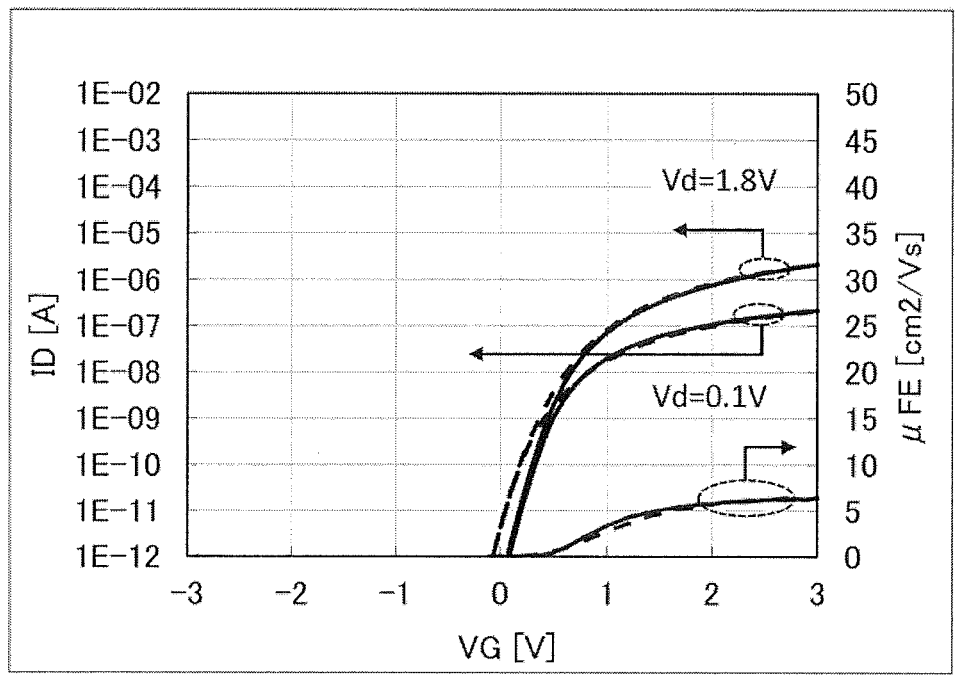
FIGS. 88A and 88B show Vg-Id characteristics of transistors.
Figure 88B:
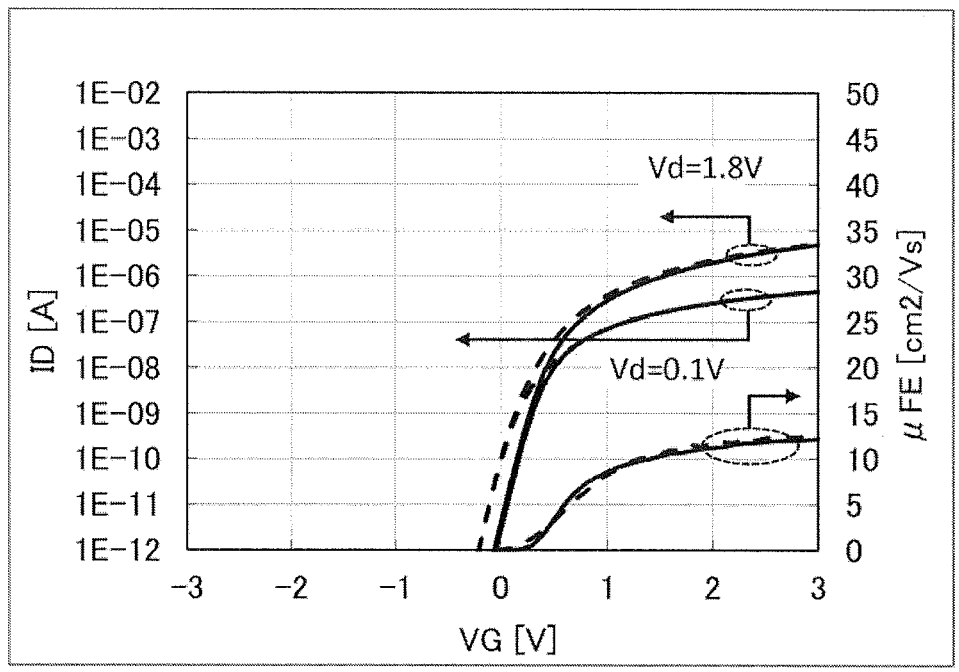

FIGS. 88A and 88B each show change in Vg-Id characteristics after a Vg of −3.3 V was applied for 1 hour at 150° C. A solid line represents a result before stress application, and a dashed line represents a result after stress application. FIGS. 88A and 88B correspond to the results of Sample T12 and Sample T14, respectively.

Figure 89A:
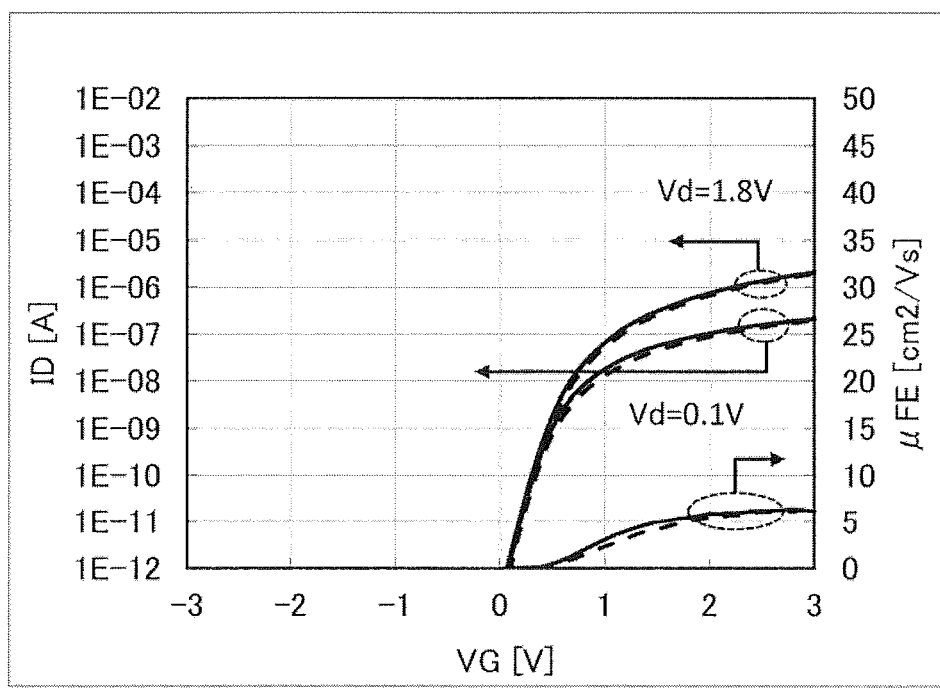
FIGS. 89A and 89B show Vg-Id characteristics of transistors.
Figure 89B:
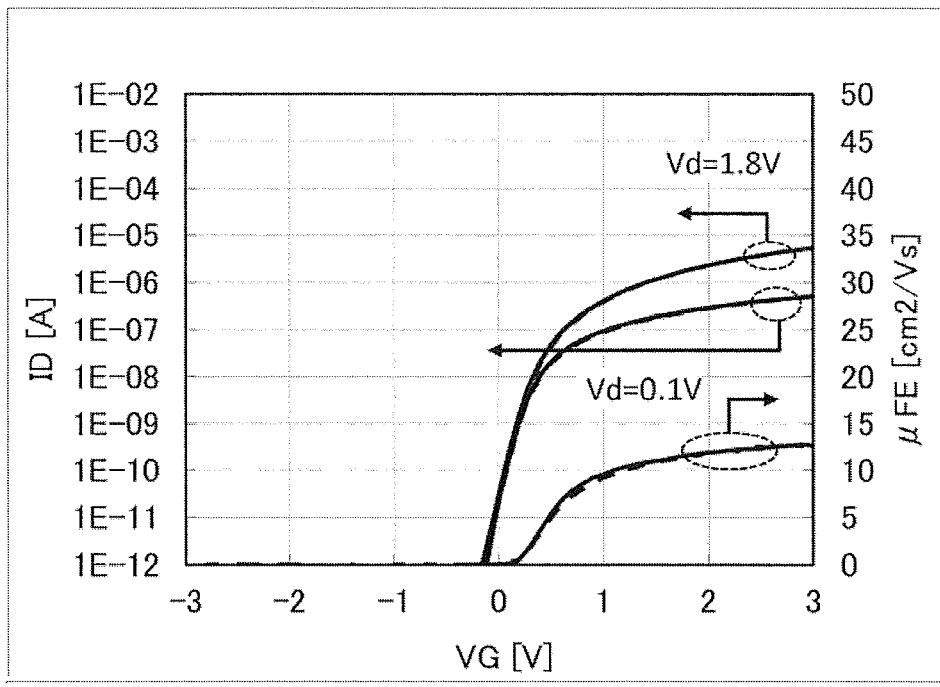

FIGS. 89A and 89B each show change in Vg-Id characteristics after a Vg of +1.8 V was applied for 1 hour at 150° C. A solid line represents a result before stress application, and a dashed line represents a result after stress application. FIGS. 89A and 89B correspond to the results of Sample T12 and Sample T14 , respectively.

The results of FIG. 87A to FIG. 89B indicate that change due to stress was small under any of the stress conditions in each of Samples T12 and T14, and the amount of change was smaller in Sample T14 with application of Vg=+3.3 V.

This application is based on Japanese Patent Application serial no. 2014-032192 filed with Japan Patent Office on Feb. 21, 2014, Japanese Patent Application serial no. 2014-098071 filed with Japan Patent Office on May 9, 2014, Japanese Patent Application serial no. 2014-122792 filed with Japan Patent Office on Jun. 13, 2014, Japanese Patent Application serial no. 2014-131834 filed with Japan Patent Office on Jun. 26, 2014, and Japanese Patent Application serial no. 2014-218310 filed with Japan Patent Office on Oct. 27, 2014, the entire contents of which are hereby incorporated by reference.

What is claimed is:

1. A semiconductor device comprising:
an oxide semiconductor layer comprising In, Ga, and Zn; and
an insulating layer that contains oxygen in excess of the stoichiometric composition,
wherein the insulating layer and the oxide semiconductor layer overlap each other,
wherein an atomic ratio of In to Ga and Zn in the oxide semiconductor layer satisfies In:Ga:Zn=x:y:z,
wherein, in an equilibrium diagram with vertices of the three elements of In, Ga, and Zn, the atomic ratio is within a range of an area surrounded by line segments that connect first coordinates (x:y:z=35:20:22), second coordinates (x:y:z=7:4:11), third coordinates (x:y:z=5:

1:6), fourth coordinates (x:y:z=25:10:14), and the first coordinates, in this order, and wherein the oxide semiconductor layer includes a plurality of crystals.

2. The semiconductor device according to claim 1, wherein the oxide semiconductor layer includes a nanocrystal.

3. The semiconductor device according to claim 1, wherein the oxide semiconductor layer includes a plurality of c-axis aligned crystals.

4. A transistor comprising the semiconductor device according to claim 1, wherein the oxide semiconductor layer includes a channel region.

5. The semiconductor device according to claim 1, further comprising:
a second oxide layer; and
a third oxide layer,
wherein the oxide semiconductor layer is in contact with a top surface of the second oxide layer, and
wherein the third oxide layer is in contact with a top surface of the oxide semiconductor layer.

6. The semiconductor device according to claim 5, wherein the third oxide layer is in contact with a side surface of the second oxide layer, and a side surface and the top surface of the oxide semiconductor layer.

7. The semiconductor device according to claim 5, wherein electron affinity of oxide included in the oxide semiconductor layer is larger than electron affinity of oxide included in the second oxide layer and electron affinity of oxide included in the third oxide layer.

8. A semiconductor device comprising:
an oxide semiconductor layer comprising In, an element M, and Zn, and
an insulating layer that contains oxygen in excess of the stoichiometric composition,
wherein the insulating layer and the oxide semiconductor layer overlap each other,
wherein the element M is at least one of aluminum, gallium, yttrium, and tin,
wherein an atomic ratio of In to the element M and Zn in the oxide semiconductor layer satisfies In:M:Zn=x:y:z,
wherein, in an equilibrium diagram with vertices of the three elements of In, the element M, and Zn, the atomic ratio is within a range of an area surrounded by line segments that connect first coordinates (x:y:z=35:20:22), second coordinates (x:y:z=7:4:11), third coordinates (x:y:z=5:1:6), fourth coordinates (x:y:z=25:10:14), and the first coordinates, in this order, and
wherein the oxide semiconductor layer includes a plurality of crystals.

9. The semiconductor device according to claim 8, wherein the oxide semiconductor layer includes a nanocrystal.

10. The semiconductor device according to claim 9, wherein the oxide semiconductor layer includes a plurality of c-axis aligned crystals.

11. A transistor comprising the semiconductor device according to claim 8, wherein the oxide semiconductor layer includes a channel region.

12. The semiconductor device according to claim 8, further comprising:
a second oxide layer; and
a third oxide layer,
wherein the oxide semiconductor layer is in contact with a top surface of the second oxide layer, and
wherein the third oxide layer is in contact with a top surface of the oxide semiconductor layer.

13. The semiconductor device according to claim 12, wherein the third oxide layer is in contact with a side surface of the second oxide layer, and a side surface and the top surface of the oxide semiconductor layer.

14. The semiconductor device according to claim 12, wherein electron affinity of oxide included in the oxide semiconductor layer is larger than electron affinity of oxide included in the second oxide layer and electron affinity of oxide included in the third oxide layer.

15. An semiconductor device comprising:
an oxide semiconductor layer comprising In, Ga, and Zn; and
an insulating layer that contains oxygen in excess of the stoichiometric composition,
wherein the insulating layer and the oxide semiconductor layer overlap each other,
wherein an atomic ratio of In to Ga and Zn in the oxide semiconductor layer satisfies In:Ga:Zn=x:y:z,
wherein, in an equilibrium diagram with vertices of the three elements of In, Ga, and Zn, the atomic ratio is within a range of an area surrounded by line segments that connect first coordinates (x:y:z=35:20:22), second coordinates (x:y:z=7:4:11), third coordinates (x:y:z=5:1:6), fourth coordinates (x:y:z=25:10:14), and the first coordinates, in this order,
wherein the oxide semiconductor layer includes a plurality of crystals, and
wherein In:Ga=2:1.

16. The semiconductor device according to claim 15, wherein the oxide semiconductor layer includes a nanocrystal.

17. The semiconductor device according to claim 15, wherein the oxide semiconductor layer includes a plurality of c-axis aligned crystals.

18. A transistor comprising the semiconductor device according to claim 15, wherein the oxide semiconductor layer includes a channel region.

19. The semiconductor device according to claim 15, further comprising:
a second oxide layer; and
a third oxide layer,
wherein the oxide semiconductor layer is in contact with a top surface of the second oxide layer, and
wherein the third oxide layer is in contact with a top surface of the oxide semiconductor layer.

20. The semiconductor device according to claim 19, wherein the third oxide layer is in contact with a side surface of the second oxide layer, and a side surface and the top surface of the oxide semiconductor layer.

21. The semiconductor device according to claim 19, wherein electron affinity of oxide included in the oxide semiconductor layer is larger than electron affinity of oxide included in the second oxide layer and electron affinity of oxide included in the third oxide layer.

* * * * *

UNITED STATES PATENT AND TRADEMARK OFFICE
CERTIFICATE OF CORRECTION

| | |
|---|---|
| PATENT NO. | : 9,559,174 B2 |
| APPLICATION NO. | : 15/068708 |
| DATED | : January 31, 2017 |
| INVENTOR(S) | : Shimomura et al. |

It is certified that error appears in the above-identified patent and that said Letters Patent is hereby corrected as shown below:

In the Specification

Column 5, Line 12, replace "(1+62)" with --(1+ $\beta$)--;

Column 5, Line 13, replace "(1-3)" with --(1- $\beta$)--;

Column 20, Line 12, replace "Mare" with --M are--;

Column 20, Line 58, replace "(i" with --(m--;

Column 30, Line 33, replace "Mare" with --M are--;

Column 33, Line 49, replace "Mare" with --M are--;

Column 101, Line 17, replace "hIn-Ga-Zn" with --In-Ga-Zn--;

Column 104, Line 47, replace "ofa" with --of a--;

Column 112, Line 16, replace "$\in$" with --$\varepsilon$--;

Column 112, Line 21, replace "$\in$" with --$\varepsilon$--;

Column 112, Line 25, replace "$\in$" with --$\varepsilon$--;

Column 116, Line 40, replace "70," with --7°,--; and

Signed and Sealed this
Third Day of October, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,559,174 B2

In the Claims

Column 123, Line 54, in Claim 10, after "claim" replace "9," with --8,--.